US010367147B2

(12) United States Patent
Kim et al.

(10) Patent No.: US 10,367,147 B2
(45) **Date of Patent: *Jul. 30, 2019**

(54) ORGANIC LIGHT-EMITTING DEVICE

(71) Applicant: SAMSUNG DISPLAY CO., LTD., Yongin-si, Gyeonggi-do (KR)

(72) Inventors: Seulong Kim, Yongin-si (KR); Naoyuki Ito, Yongin-si (KR); Younsun Kim, Yongin-si (KR); Dongwoo Shin, Yongin-si (KR); Jungsub Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/158,479

(22) Filed: May 18, 2016

(65) Prior Publication Data

US 2016/0351818 A1 Dec. 1, 2016

(30) Foreign Application Priority Data

May 27, 2015 (KR) ........................ 10-2015-0073932
Jan. 27, 2016 (KR) ........................ 10-2016-0010082

(51) Int. Cl.

*H01L 51/00* (2006.01)
*C09K 11/02* (2006.01)
(Continued)

(52) U.S. Cl.

CPC ........ *H01L 51/0052* (2013.01); *C09K 11/025* (2013.01); *C09K 11/06* (2013.01);
(Continued)

(58) Field of Classification Search

CPC ............. H01L 51/5012; H01L 51/5092; H01L 51/5072; H01L 51/506; H01L 51/504;
(Continued)

(56) References Cited

U.S. PATENT DOCUMENTS 7,839,074 B2 11/2010 Ikeda et al.
8,999,525 B2 * 4/2015 Lee ...................... C07D 401/14 257/40
(Continued)

FOREIGN PATENT DOCUMENTS

CN 102282130 A 12/2011
CN 104478650 A 4/2015
(Continued)

OTHER PUBLICATIONS

Jeon, et al., "Deep-blue OLEDs using novel efficient spiro-type dopant materials," Organic Electronics, 11 (2010), pp. 1844-1852.
(Continued)

*Primary Examiner* — Golam Mowla
(74) *Attorney, Agent, or Firm* — Lewis Roca Rothgerber Christie LLP

(57) ABSTRACT

An organic light-emitting device includes: a first electrode; a second electrode; and an organic layer between the first
(Continued)

electrode and the second electrode, the organic layer including an emission layer, wherein the organic layer includes a first compound represented by Formula 1 and a second compound represented by Formula 2:

<Formula 1>

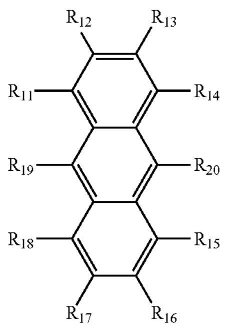

<Formula 2>

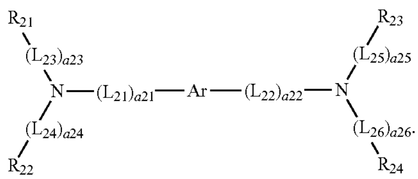

20 Claims, 2 Drawing Sheets

(51) Int. Cl.
*C09K 11/06* (2006.01)
*H01L 51/50* (2006.01)

(52) U.S. Cl.
CPC ........ *H01L 51/006* (2013.01); *H01L 51/0055* (2013.01); *H01L 51/0058* (2013.01); *H01L 51/0061* (2013.01); *H01L 51/0071* (2013.01); *H01L 51/0072* (2013.01); *H01L 51/0073* (2013.01); *H01L 51/0074* (2013.01); *H01L 51/0094* (2013.01); *H01L 51/5004* (2013.01); *H01L 51/504* (2013.01); *C09K 2211/1007* (2013.01); *C09K 2211/1011* (2013.01); *C09K 2211/1014* (2013.01); *C09K 2211/1029* (2013.01); *C09K 2211/1088* (2013.01); *C09K 2211/1092* (2013.01); *H01L 51/0056* (2013.01); *H01L 51/0067* (2013.01); *H01L 51/506* (2013.01); *H01L 51/5012* (2013.01); *H01L 51/5072* (2013.01); *H01L 51/5092* (2013.01); *H01L 2251/301* (2013.01); *H01L 2251/552* (2013.01)

(58) Field of Classification Search
CPC ............. H01L 51/5004; H01L 51/0052; H01L 51/0055; H01L 51/0056; H01L 51/0058; H01L 51/006; H01L 51/0061; H01L 51/0067; H01L 51/0073; H01L 51/0074; H01L 51/0094; H01L 51/0071; H01L 51/0072; H01L 2251/301; H01L 2251/552; C09K 2211/1007; C09K 2211/1092; C09K 2211/1088; C09K 2211/1029; C09K 2211/1014; C09K 2211/1011; C09K 11/025; C09K 11/06
See application file for complete search history.

(56) References Cited

U.S. PATENT DOCUMENTS

| | | | | |
|---|---|---|---|---|
| 9,012,042 | B2 * | 4/2015 | Kim ..................... | C07D 471/04 313/504 |
| 9,475,792 | B2 | 10/2016 | Parham et al. | |
| 9,520,568 | B2 * | 12/2016 | Kim .................... | H01L 51/0058 |
| 2003/0143422 | A1 | 7/2003 | Chen | |
| 2004/0065544 | A1 | 4/2004 | Igarashi et al. | |
| 2006/0043858 | A1 | 3/2006 | Ikeda et al. | |
| 2008/0160347 | A1 | 7/2008 | Wang et al. | |
| 2008/0160348 | A1 | 7/2008 | Smith | |
| 2008/0315754 | A1 | 12/2008 | Kawamura et al. | |
| 2009/0267491 | A1 | 10/2009 | Takashima et al. | |
| 2010/0032658 | A1 | 2/2010 | Lee et al. | |
| 2010/0219400 | A1 | 9/2010 | Arakane et al. | |
| 2011/0220886 | A1 | 9/2011 | Takeshima et al. | |
| 2012/0104940 | A1 | 5/2012 | Shin et al. | |
| 2012/0138914 | A1 | 6/2012 | Kawamura et al. | |
| 2012/0181520 | A1 | 7/2012 | Kim et al. | |
| 2014/0027723 | A1 | 1/2014 | Kim et al. | |
| 2014/0183500 | A1 | 7/2014 | Ikeda et al. | |
| 2014/0246657 | A1 | 9/2014 | Kim et al. | |
| 2014/0319510 | A1 | 10/2014 | Kageyama | |
| 2014/0326961 | A1 | 11/2014 | Han et al. | |
| 2015/0325800 | A1 | 11/2015 | Ito et al. | |
| 2016/0141515 | A1 | 5/2016 | Hayama et al. | |
| 2016/0149139 | A1 | 5/2016 | Xia et al. | |
| 2016/0181542 | A1 | 6/2016 | Kawamura et al. | |
| 2016/0181543 | A1 | 6/2016 | Ito et al. | |
| 2016/0254450 | A1 | 9/2016 | Herron et al. | |
| 2016/0351816 | A1 | 12/2016 | Kim et al. | |
| 2016/0351818 | A1 | 12/2016 | Kim et al. | |
| 2017/0062729 | A1 | 3/2017 | Cha et al. | |
| 2017/0117469 | A1 | 4/2017 | Ito et al. | |
| 2017/0179401 | A1 | 6/2017 | Kim et al. | |
| 2017/0200899 | A1 | 7/2017 | Kim et al. | |

FOREIGN PATENT DOCUMENTS

| | | | |
|---|---|---|---|
| CN | 105492413 | A | 4/2016 |
| CN | 106458953 | A | 2/2017 |
| EP | 3144302 | A1 | 3/2017 |
| JP | 2011-37838 | A | 2/2011 |
| JP | 2015-18883 | A | 1/2015 |
| KR | 10-2010-0007780 | A | 1/2010 |
| KR | 10-2010-0108903 | A | 10/2010 |
| KR | 10-2012-0038402 | A | 4/2012 |
| KR | 10-2012-0066390 | A | 6/2012 |
| KR | 10-2012-0135501 | A | 12/2012 |
| KR | 10-2014-0049186 | A | 4/2014 |
| KR | 10-2014-0078096 | A | 6/2014 |
| KR | 10-2014-0115636 | A | 10/2014 |
| KR | 10-2014-0128879 | A | 11/2014 |
| WO | WO 2010/032447 | A1 | 3/2010 |
| WO | WO 2010/062107 | A1 | 6/2010 |
| WO | WO 2014/058232 | A2 | 4/2014 |
| WO | WO 2014/061963 | A1 | 4/2014 |
| WO | WO 2014/104144 | A1 | 7/2014 |
| WO | WO 2014/141725 | A1 | 9/2014 |
| WO | WO 2014/199637 | A1 | 12/2014 |
| WO | WO 2015/033559 | A1 | 3/2015 |
| WO | WO 2015/151965 | A1 | 10/2015 |
| WO | WO 2015/174682 | A1 | 11/2015 |
| WO | WO 2016/013184 | A1 | 1/2016 |
| WO | WO 2016/017919 | A2 | 2/2016 |
| WO | WO 2016/042781 | A1 | 3/2016 |
| WO | WO 2016/079944 | A1 | 5/2016 |
| WO | WO 2016/088759 | A1 | 6/2016 |
| WO | WO 2016/104289 | A1 | 6/2016 |
| WO | WO 2016/108419 | A1 | 7/2016 |
| WO | WO 2016/125706 | A1 | 8/2016 |

(56) References Cited

FOREIGN PATENT DOCUMENTS

| | | |
|---|---|---|
| WO | WO 2016/126022 A1 | 8/2016 |
| WO | WO 2016/152544 A1 | 9/2016 |

OTHER PUBLICATIONS

U.S. Office Action dated Sep. 6, 2017, issued in cross-reference U.S. Appl. No. 15/157,140 (30 pages).
EPO Office Action dated Sep. 28, 2017, for corresponding European Patent Application No. 16171798.8 (5 pages).
U.S. Office Action dated Dec. 8, 2017, issued in U.S. Appl. No. 15/154,622 (7 pages).
U.S. Advisory Action dated Apr. 16, 2018, issued in U.S. Appl. No. 15/157,140 (4 pages).
U.S. Office Action dated Oct. 2, 2018, issued in U.S. Appl. No. 15/157,140 (45 pages).
Chinese Office Action, for Patent Application No. 201610365892.4, dated Dec. 28, 2018, 7 pages.
U.S. Final Office Action dated Jan. 28, 2019, issued in U.S. Appl. No. 15/157,140 (22 pages).

* cited by examiner

ORGANIC LIGHT-EMITTING DEVICE

CROSS-REFERENCE TO RELATED APPLICATIONS

This application claims priority to and the benefit of Korean Patent Application Nos. 10-2015-0073932, filed on May 27, 2015, and 10-2016-0010082, filed on Jan. 27, 2016 in the Korean Intellectual Property Office, the entire content of each of which is incorporated herein by reference.

BACKGROUND

1. Field

One or more aspects of embodiments of the present disclosure relate to an organic light-emitting device.

2. Description of the Related Art

Organic light emitting devices are self-emission devices that have wide viewing angles, high contrast ratios, short response times, and excellent luminance, driving voltage, and response speed characteristics, and can produce full-color images.

An example of such organic light-emitting devices may include a first electrode disposed (e.g., positioned) on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, may then recombine in the emission layer to produce excitons. These excitons transition from an excited state to a ground state, thereby generating light.

SUMMARY

One or more aspects of embodiments of the present disclosure are directed toward an organic light-emitting device.

Additional aspects will be set forth in part in the description which follows and, in part, will be apparent from the description, or may be learned by practice of the presented embodiments.

According to one or more embodiments, an organic light-emitting device includes a first electrode, a second electrode, and an organic layer between the first electrode and the second electrode, the organic layer including an emission layer;

wherein the organic layer includes a first compound represented by Formula 1 and a second compound represented by Formula 2:

Formula 1

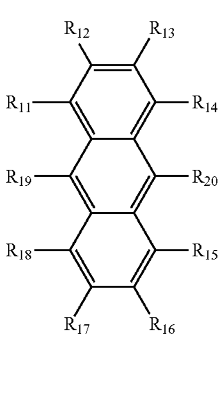

-continued

Formula 1A $$*\text{—}(L_{101})_{a101}\text{—}R_{101}$$

Formula 2

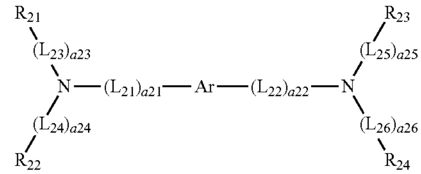

Formula 2A

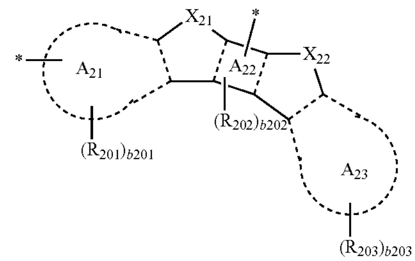

Formula 2B

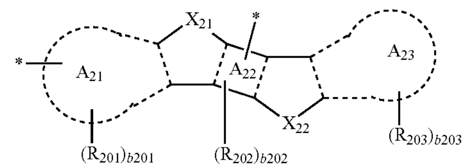

In Formulae 1, 1A, 2, 2A, and 2B, $R_{11}$ to $R_{20}$ may each independently be selected from a group represented by Formula 1A, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, provided that at least one selected from $R_{11}$ to $R_{20}$ is a group represented by Formula 1A;

$L_{101}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a101 may be selected from 0, 1, 2, and 3;

$R_{101}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$;

Ar may be selected from a group represented by Formula 2A and a group represented by Formula 2B;

$A_{21}$ may be selected from a $C_5$-$C_{20}$ carbocyclic group and a $C_1$-$C_{20}$ heterocyclic group;

$A_{22}$ may be selected from a $C_6$-$C_{20}$ arene group and a $C_1$-$C_{20}$ heteroarene group;

$A_{23}$ may be selected from a $C_5$-$C_{20}$ carbocyclic group and a $C_1$-$C_{20}$ heterocyclic group;

$X_{21}$ may be selected from oxygen, sulfur, $N(R_{204})$, and $C(R_{204})(R_{205})$;

$X_{22}$ may be selected from oxygen, sulfur, $N(R_{206})$, and $C(R_{206})(R_{207})$;

$L_{21}$ to $L_{26}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 to a26 may each independently be selected from 0, 1, 2, and 3;

$R_{21}$ to $R_{24}$ may each independently be selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; $R_{21}$ and $R_{22}$ may optionally be linked to each other to form a saturated ring or an unsaturated ring, $R_{23}$ and $R_{24}$ may optionally be linked to each other to form a saturated ring or an unsaturated ring;

$R_{201}$ to $R_{207}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, $R_{204}$ and $R_{205}$ may optionally be linked to each other to form a saturated ring or an unsaturated ring, $R_{206}$ and $R_{207}$ may optionally be linked to each other to form a saturated ring or an unsaturated ring;

b201 to b203 may each independently be selected from 1, 2, 3, 4, 5, 6, 7, 8, 9, and 10;

$Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group and a terphenyl group; and

* indicates a binding site to a neighboring atom.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
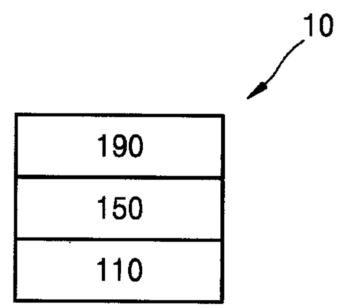
FIG. 1 is a schematic cross-sectional view of an organic light-emitting device according to an embodiment.

The present disclosure will now be described more fully with reference to example embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features of the present invention, and how to achieve them, will become more apparent by reference to the embodiments that will be described later in more detail, together with the accompanying drawings. This invention may, however, be embodied in many different forms and should not be limited to the example embodiments.

Hereinafter, embodiments are described in more detail by referring to the attached drawings, and in the drawings, like reference numerals denote like elements, and redundant explanations thereof will not be provided herein.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The expression "an (organic layer) includes a first compound" may refer to a case in which an (organic layer) includes one or more of the same first compound represented by Formula 1 and a case in which an (organic layer) includes two or more different first compounds represented by Formula 1.

The term "organic layer" used herein may refer to a single layer and/or a plurality of layers between a first electrode and a second electrode in an organic light-emitting device. A material included in the "organic layer" is not limited to an organic material.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

According to one or more example embodiments, an organic light-emitting device includes a first electrode, a second electrode, and an organic layer between the first electrode and the second electrode, wherein the organic layer may include a first compound represented by Formula 1 and a second compound represented by Formula 2:

Formula 1

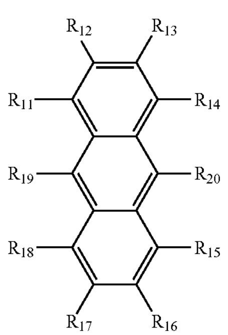

Formula 1A $$*-(L_{101})_{a101}-R_{101}$$

Formula 2

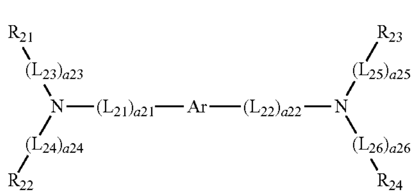

-continued

Formula 2A

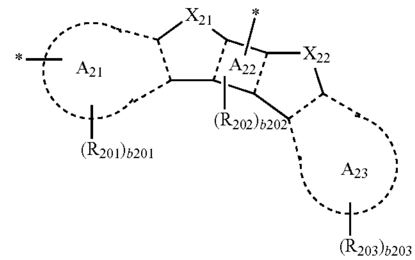

Formula 2B

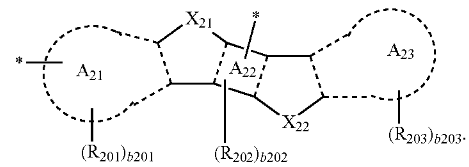

In Formula 1, $R_{11}$ to $R_{20}$ may each independently be selected from a group represented by Formula 1A, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, provided that at least one selected from $R_{11}$ to $R_{20}$ may be a group represented by Formula 1A;

$Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In various embodiments, $R_{19}$ in Formula 1 may be a group represented by Formula 1A, but is not limited thereto.

In various embodiments, $R_{20}$ in Formula 1 may be a group represented by Formula 1A, but is not limited thereto.

In various embodiments, $R_{19}$ and $R_{20}$ in Formula 1 may each be a group represented by Formula 1A, but are not limited thereto.

In various embodiments, $R_{11}$ to $R_{20}$ in Formula 1 may each independently be selected from a group represented by Formula 1A, hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$), wherein $Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments are not limited thereto.

In various embodiments, $R_{11}$ to $R_{20}$ in Formula 1 may each independently be selected from a group represented by Formula 1A, hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$); and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group, wherein $Q_1$ to $Q_3$ may each independently be selected from a $C_1$-$C_{60}$ alkyl group, a $C_6$-$C_{60}$ aryl group, a biphenyl group, and a terphenyl group, but embodiments are not limited thereto.

In various embodiments, $R_{11}$ to $R_{20}$ in Formula 1 may each independently be selected from the group consisting of:

a group represented by Formula 1A, hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —N($Q_1$)($Q_2$), and —Si($Q_1$)($Q_2$)($Q_3$); and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group, wherein $Q_1$ to $Q_3$ may each independently be selected from a methyl group, an ethyl group, an n-propyl group, an iso-propyl group, and a phenyl group, but embodiments are not limited thereto.

$L_{101}$ in Formula 1A may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In various embodiments, $L_{101}$ in Formula 1A may be selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group, each substituted with at least one selected from deuterium, —F, —Cl, —Br, —I, a cyano group, a $C_1$-$C_{20}$ alkyl group, a $C_1$-$C_{20}$ alkoxy group, a cyclopropyl group, a cyclobutyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from hydrogen, a $C_1$-$C_{20}$ alkyl group, a phenyl group, a naphthyl group, a biphenyl group, and a terphenyl group, but embodiments are not limited thereto.

In various embodiments, $L_{101}$ in Formula 1A may be selected from the group consisting of:

a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group; and a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group, each substituted with at least one selected from deuterium, —F, —Cl, —Br, —I, a cyano group, a methyl group, an ethyl group, an n-propyl group, an iso-propyl group, a tert-butyl group, a methoxy group, an ethoxy group, an n-propoxy group, an iso-propoxy group, ter-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from hydrogen, a methyl group, an ethyl group, an n-propyl group, an iso-propyl group, a tert-butyl group, a phenyl group, a naphthyl group, a biphenyl group, and a terphenyl group, but embodiments are not limited thereto.

In various embodiments, $L_{101}$ in Formula 1A may be selected from groups represented by Formulae 3-1 to 3-179, but is not limited thereto:

3-1

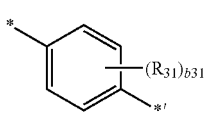

3-2

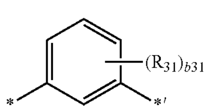

3-3

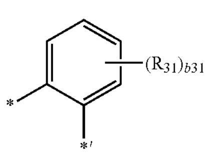

3-4

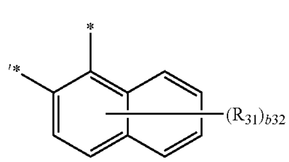

3-5

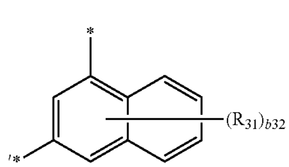

-continued 3-6

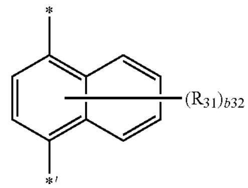

3-7

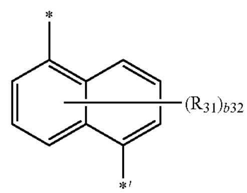

3-8

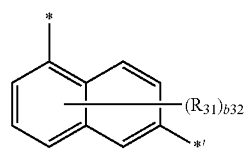

3-9

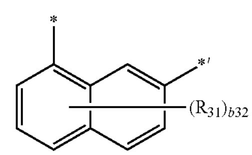

3-10

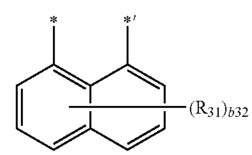

3-11

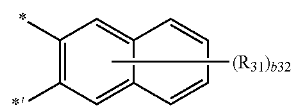

3-12

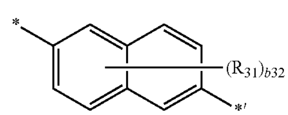

3-13

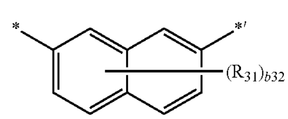

3-14

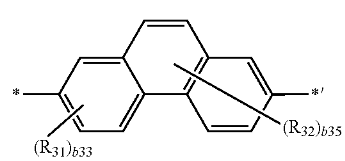

3-15

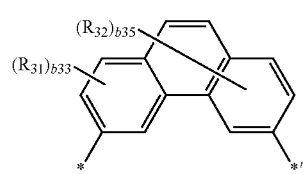

-continued
3-16
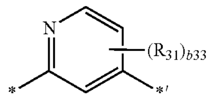
3-17
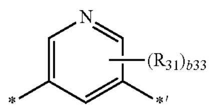
3-18
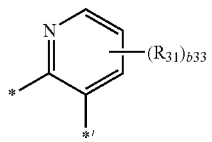
3-19
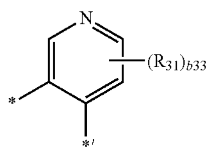
3-20
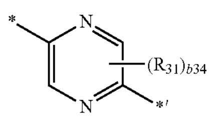
3-21
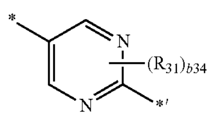
3-22
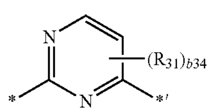
3-23
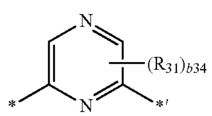
3-24
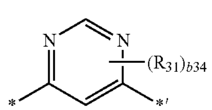
3-25
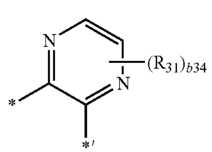
3-26
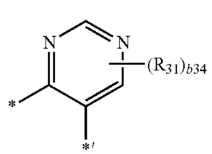
3-27
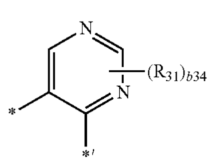
-continued
3-28
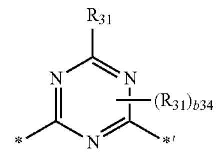
3-29
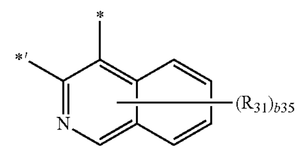
3-30
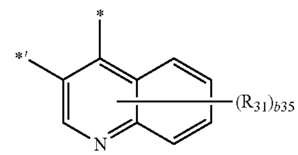
3-31
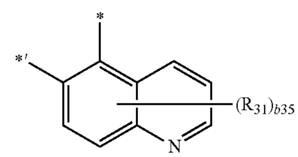
3-32
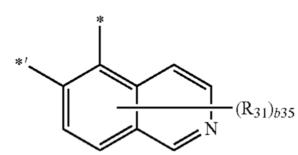
3-33
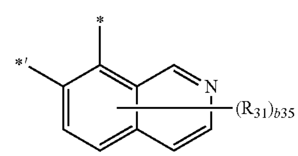
3-34
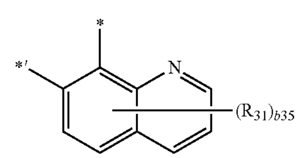
3-35
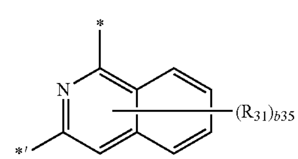
3-36
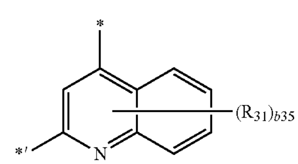
3-37
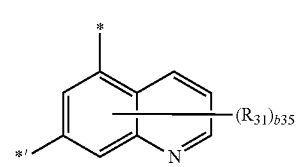

-continued
3-38
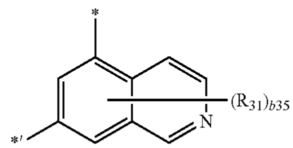
3-39
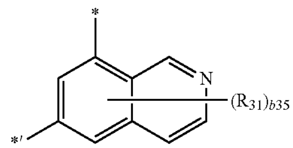
3-40
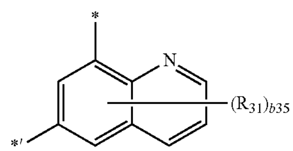
3-41
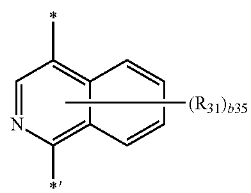
3-42
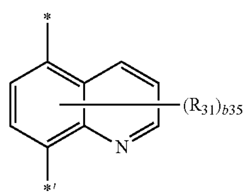
3-43
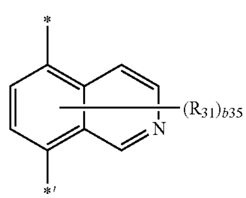
3-44
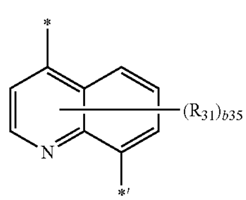
3-45
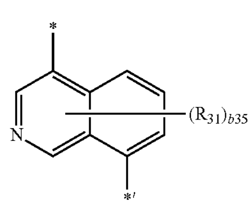
-continued
3-46
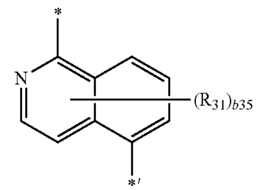
3-47
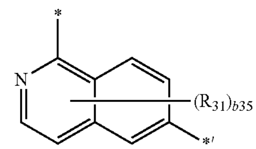
3-48
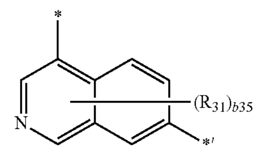
3-49
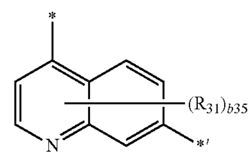
3-50
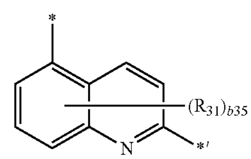
3-51
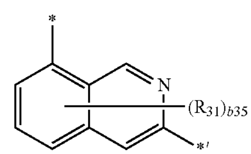
3-52
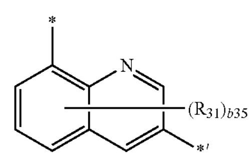
3-53
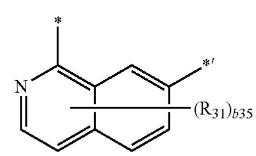
3-54
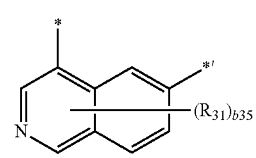
3-55
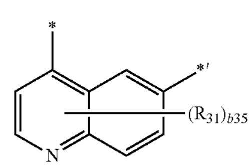

-continued
3-56
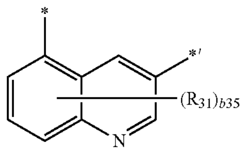
3-57
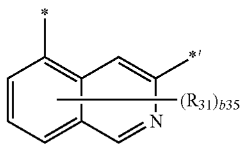
3-58
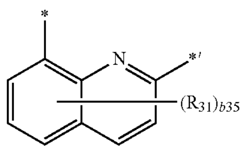
3-59
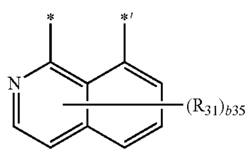
3-60
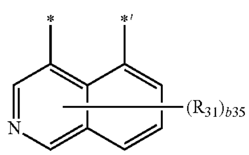
3-61
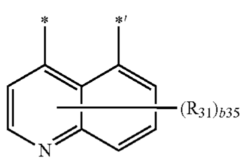
3-62
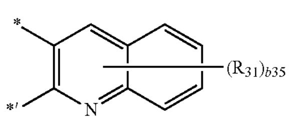
3-63
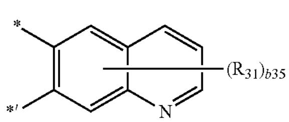
3-64
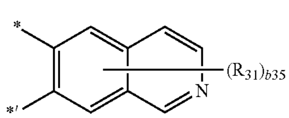
3-65
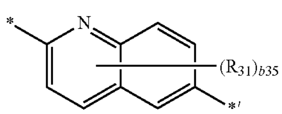
3-66
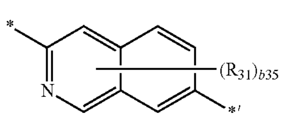
-continued
3-67
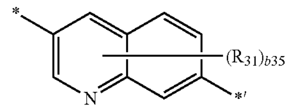
3-68
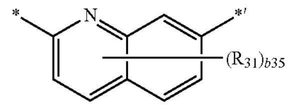
3-69
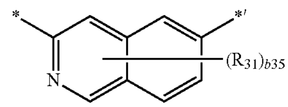
3-70
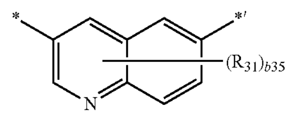
3-71
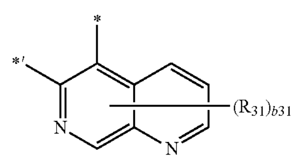
3-72
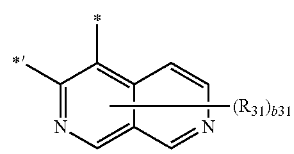
3-73
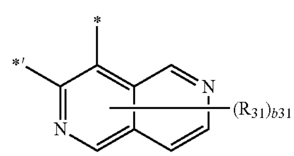
3-74
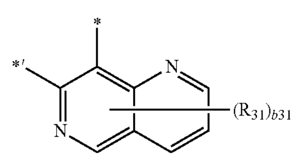
3-75
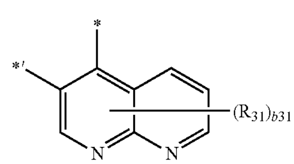
3-76
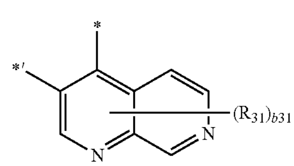
3-77
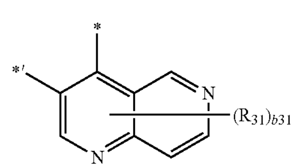

-continued
3-78
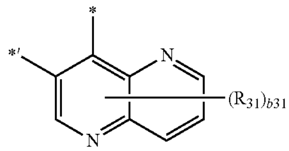
3-79
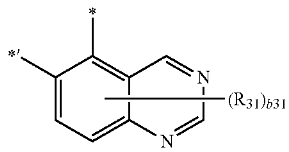
3-80
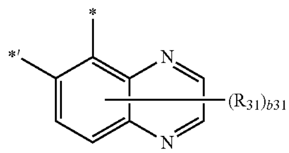
3-81
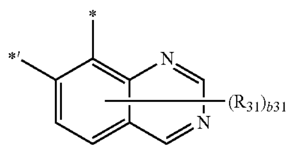
3-82
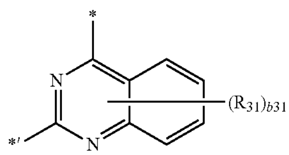
3-83
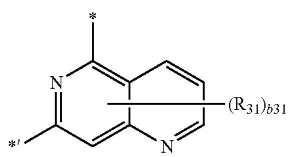
3-84
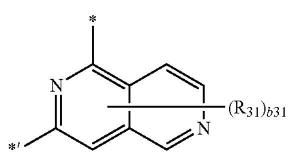
3-85
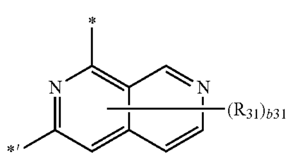
3-86
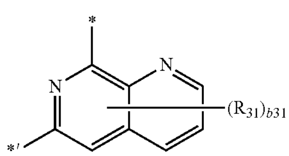
3-87
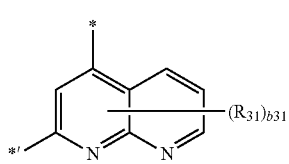
-continued
3-88
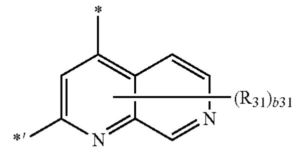
3-89
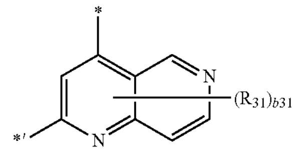
3-90
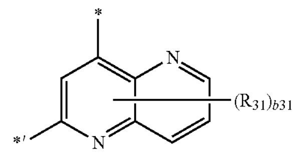
3-91
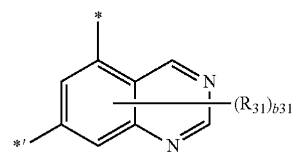
3-92
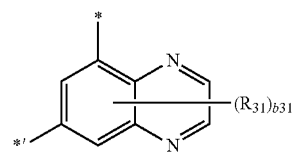
3-93
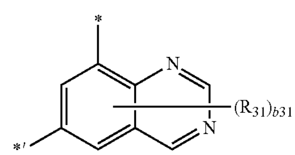
3-94
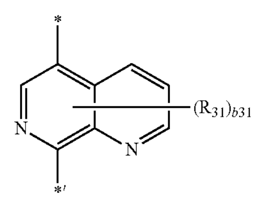
3-95
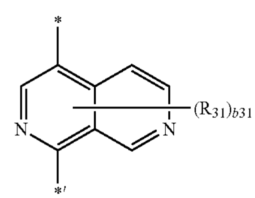
3-96
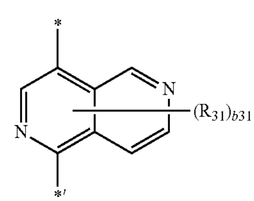

-continued
3-97
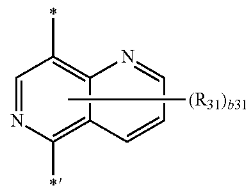
3-98
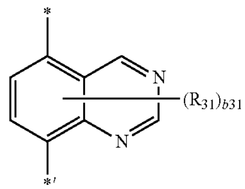
3-99
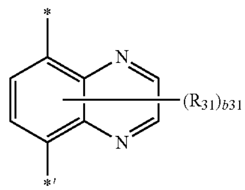
3-100
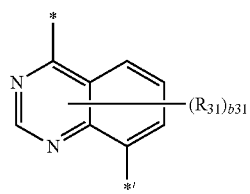
3-101
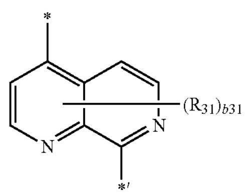
3-102
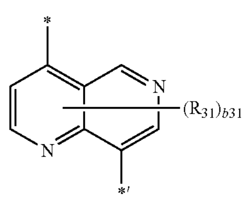
3-103
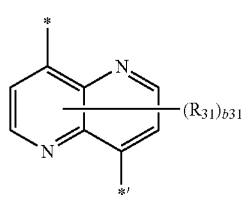
3-104
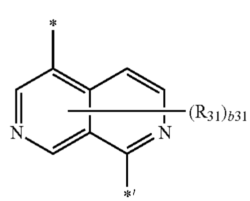
-continued
3-105
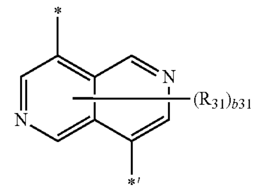
3-106
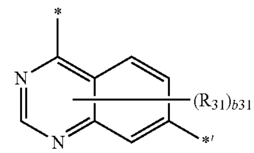
3-107
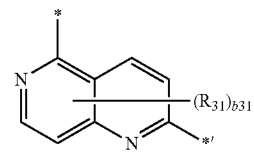
3-108
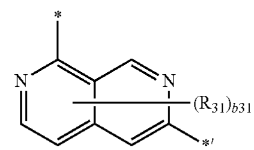
3-109
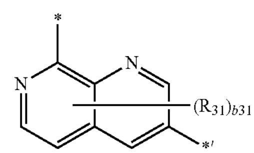
3-110
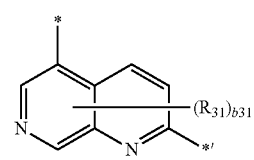
3-111
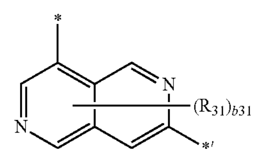
3-112
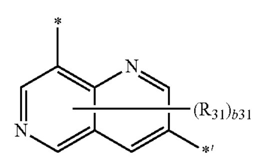
3-113
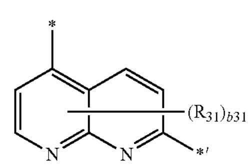
3-114
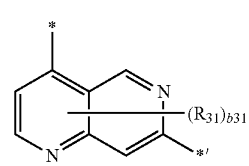

-continued
3-115
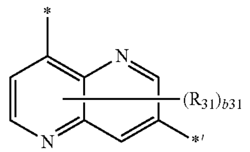
3-116
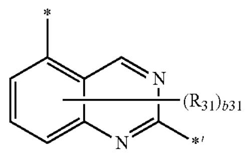
3-117
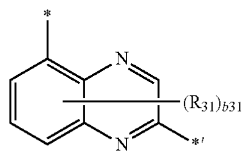
3-118
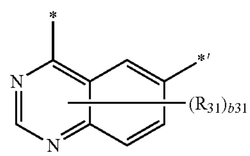
3-119
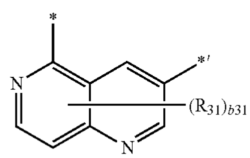
3-120
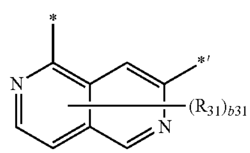
3-121
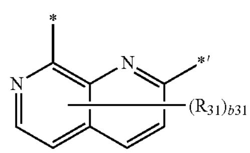
3-122
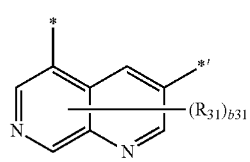
3-123
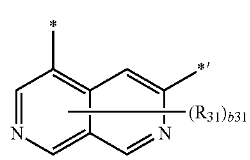
3-124
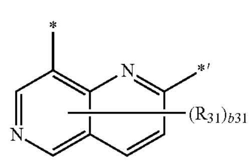
-continued
3-125
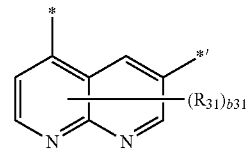
3-126
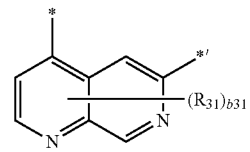
3-127
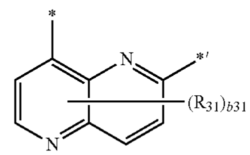
3-128
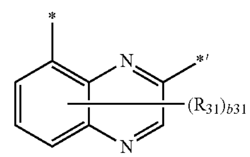
3-129
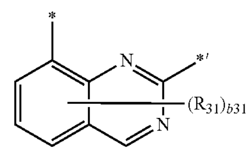
3-130
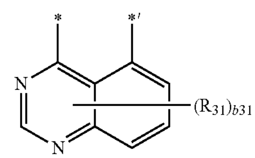
3-131
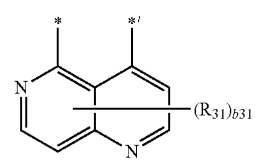
3-132
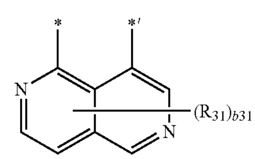
3-133
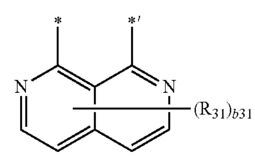
3-134
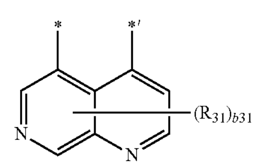

-continued
3-135
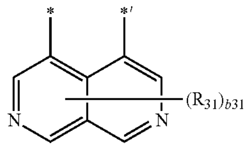
3-136
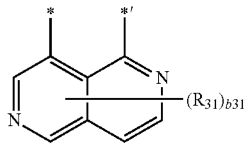
3-137
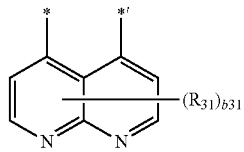
3-138
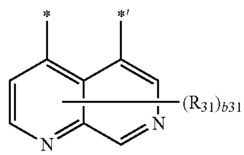
3-139
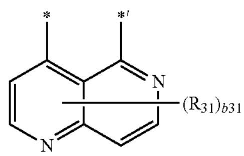
3-140
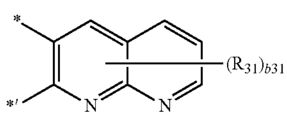
3-141
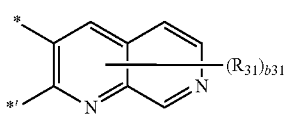
3-142
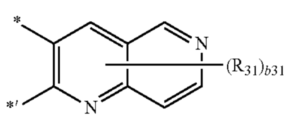
3-143
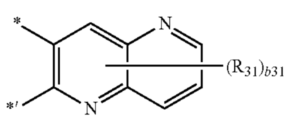
3-144
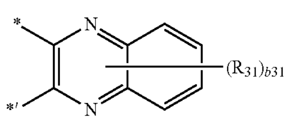
3-145
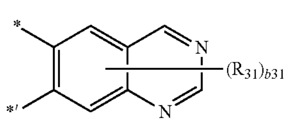
-continued
3-146
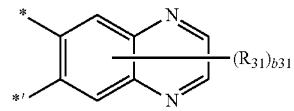
3-147
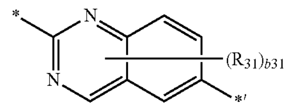
3-148
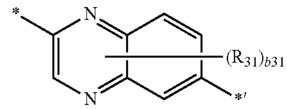
3-149
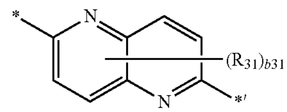
3-150
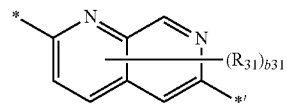
3-151
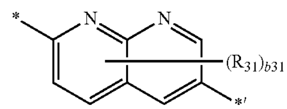
3-152
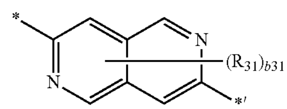
3-153
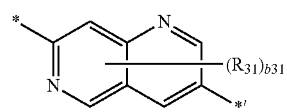
3-154
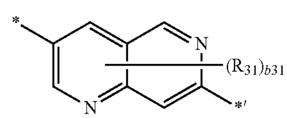
3-155
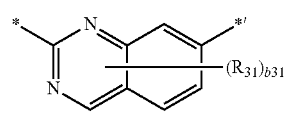
3-156
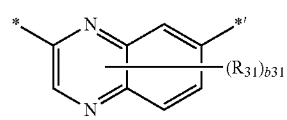
3-157
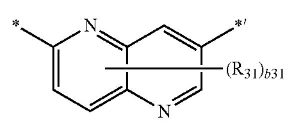
3-158
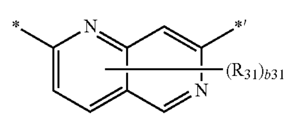

3-159
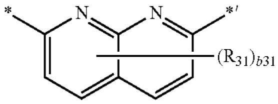
3-160
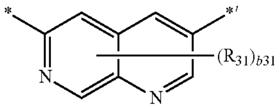
3-161
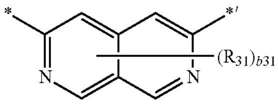
3-162
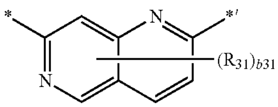
3-163
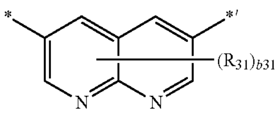
3-164
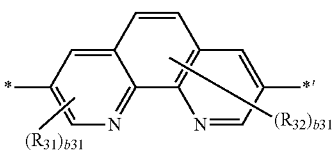
3-165
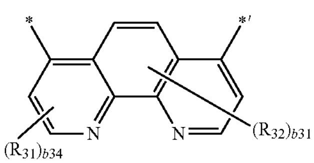
3-166
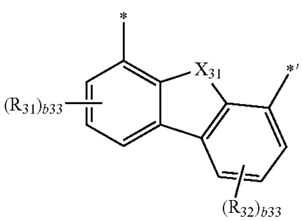
3-167
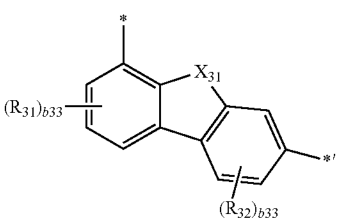
3-168
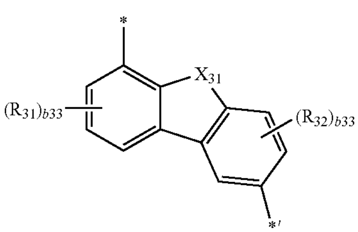
3-169
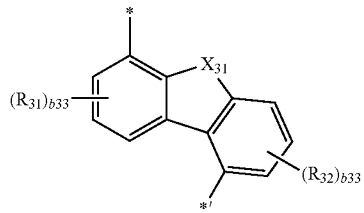
3-170
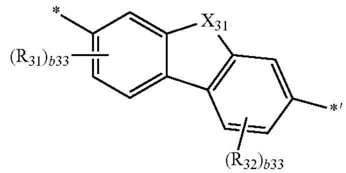
3-171
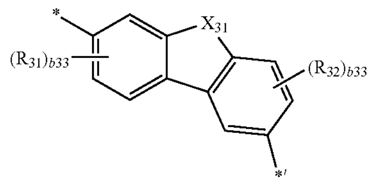
3-172
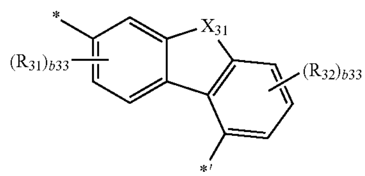
3-173
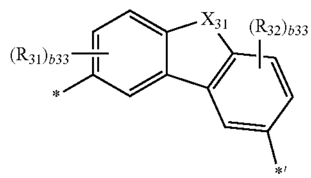
3-174
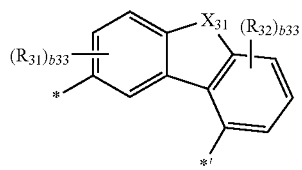
3-175
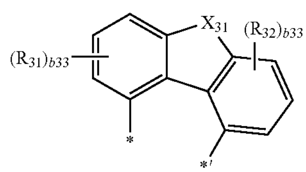
3-176
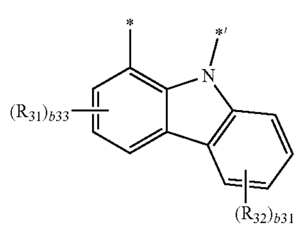

-continued 3-177

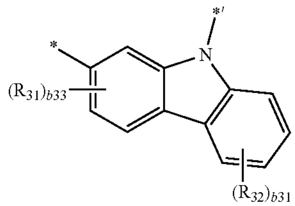

3-178

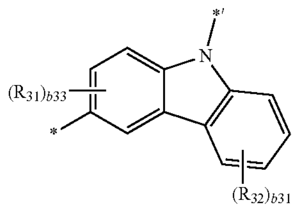

3-179

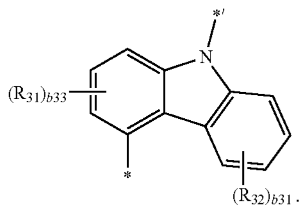

In Formulae 3-1 to 3-179, $X_{31}$ may be selected from O, S, N($R_{33}$), and C($R_{33}$)($R_{34}$);

$R_{31}$ to $R_{34}$ may each independently be selected from hydrogen, deuterium, —F, —Cl, —Br, —I, a cyano group, a methyl group, an ethyl group, an n-propyl group, an iso-propyl group, a tert-butyl group, a methoxy group, an ethoxy group, an n-propoxy group, an iso-propoxy group, ter-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), $Q_{31}$ to $Q_{33}$ may each independently be selected from hydrogen, a methyl group, an ethyl group, an n-propyl group, an iso-propyl group, a tert-butyl group, a phenyl group, a naphthyl group, a biphenyl group, and a terphenyl group;

b31 may be selected from 1, 2, 3, and 4;

b32 may be selected from 1, 2, 3, 4, 5, and 6;

b33 may be selected from 1, 2, and 3;

b34 may be selected from 1 and 2;

b35 may be selected from 1, 2, 3, 4, and 5;

* and *' may each indicate a binding site to a neighboring atom.

In Formula 1A, a101 indicates the number of $L_{101}$(s), and a101 may be selected from 0, 1, 2, and 3. When a101 is 0, $(L_{101})_{a101}$ may be a single bond, and when a101 is two or more, a plurality of $L_{101}$(s) may be identical to or different from each other.

In various embodiments, a101 in Formula 1A may be selected from 0 and 1, but is not limited thereto.

$R_{101}$ in Formula 1A may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments are not limited thereto.

In various embodiments, $R_{101}$ in Formula 1A may be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments are not limited thereto.

In various embodiments, $R_{101}$ in Formula 1A may be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyridinyl group substituted with deuterium, a pyridinyl group substituted with a methyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ may each independently be selected from a $C_1$-$C_{20}$ alkyl group, a $C_6$-$C_{60}$ aryl group, a biphenyl group, and a terphenyl group, but embodiments are not limited thereto.

In various embodiments, $R_{101}$ in Formula 1A may be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, —$CDH_2$, —$CD_2H$, —$CD_3$, —$CFH_2$, —$CF_2H$, —$CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_6$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group, and a naphthyl group, but embodiments are not limited thereto.
In various embodiments, $R_{101}$ in Formula 1A may be selected from groups represented by Formulae 5-1 to 5-128, but is not limited thereto:
5-1
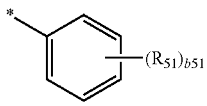
5-2
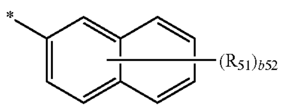
5-3
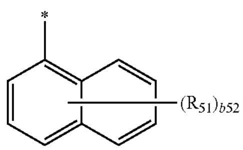
5-4
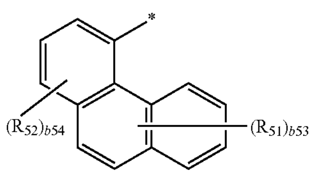
5-5
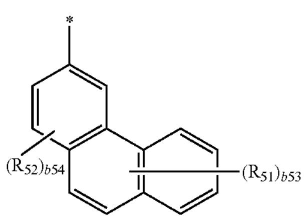
5-6
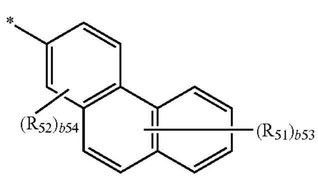
5-7
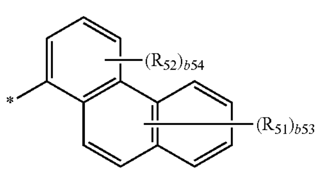
5-8
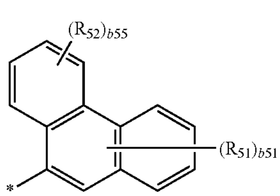
-continued
5-9
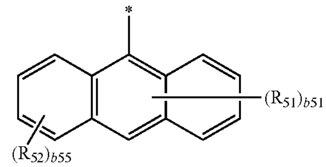
5-10
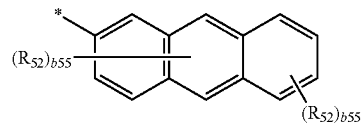
5-11
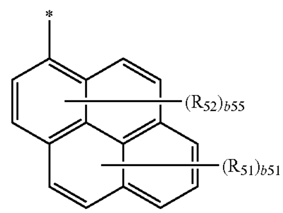
5-12
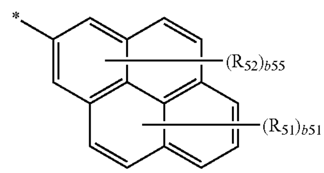
5-13
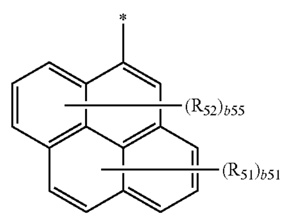
5-14
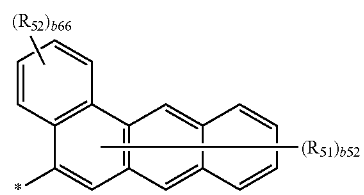
5-15
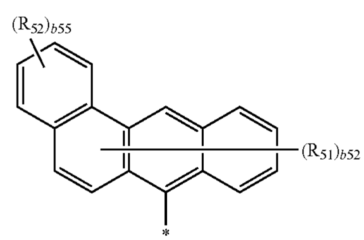
5-16
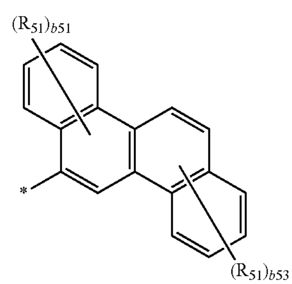

-continued
5-17
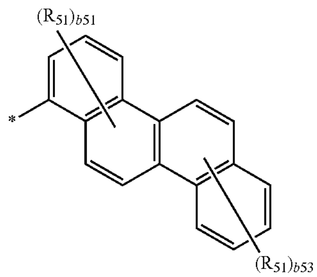
5-18
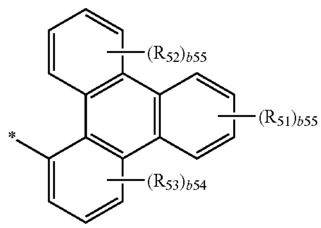
5-19
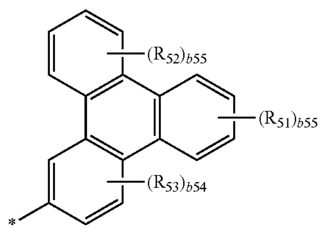
5-20
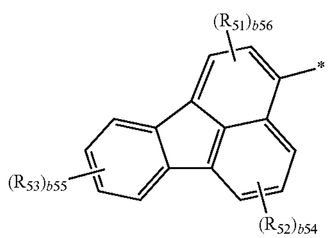
5-21
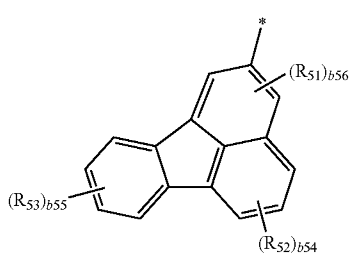
5-22
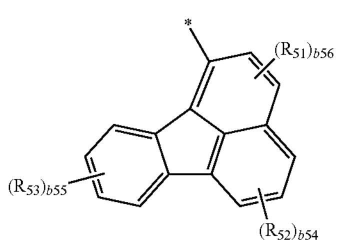
-continued
5-23
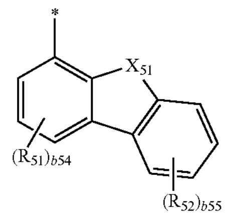
5-24
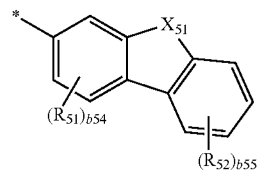
5-25
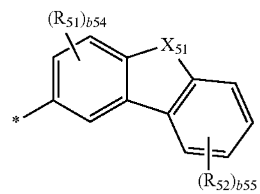
5-26
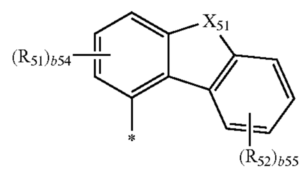
5-27
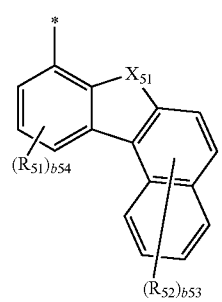
5-28
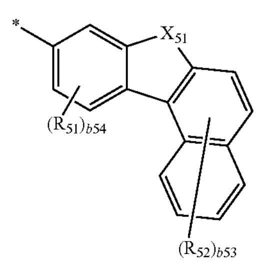
5-29
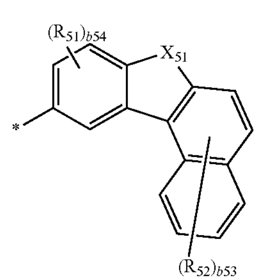

-continued
5-30
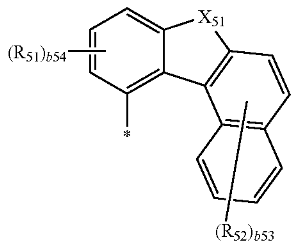
5-31
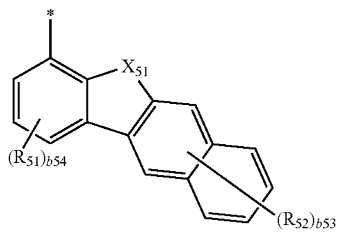
5-32
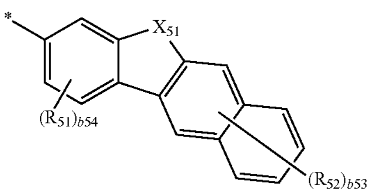
5-33
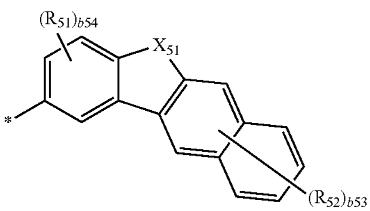
5-34
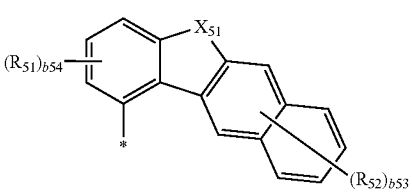
5-35
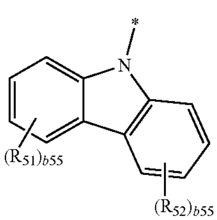
5-36
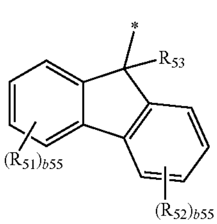
-continued
5-37
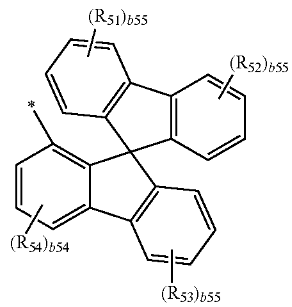
5-38
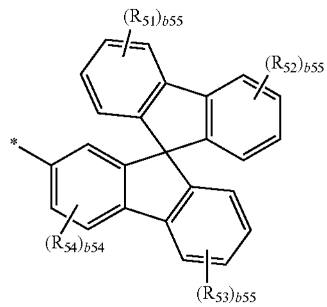
5-39
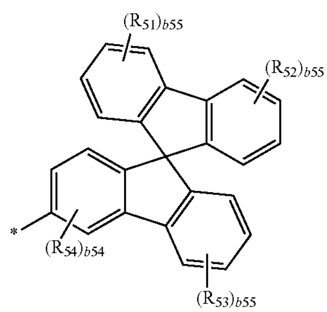
5-40
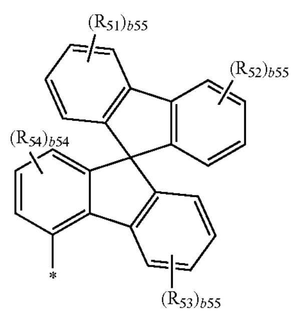
5-41
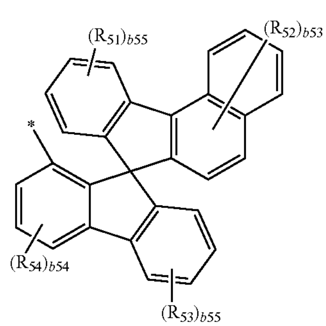

5-42
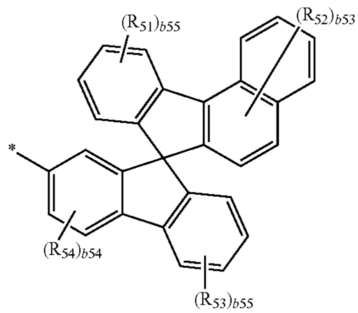
5-43
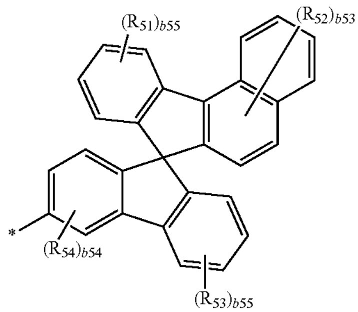
5-44
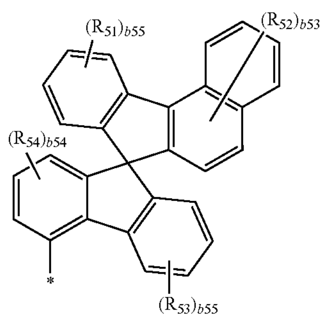
5-45
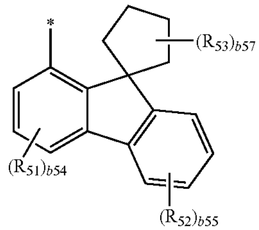
5-46
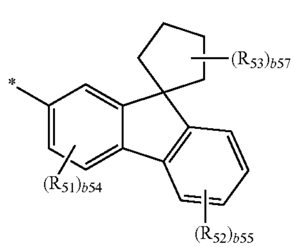
5-47
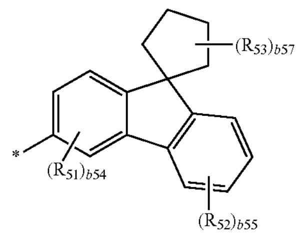
5-48
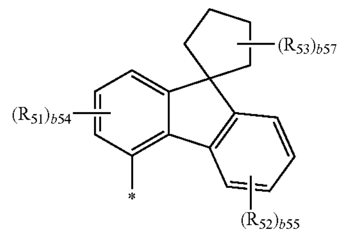
5-49
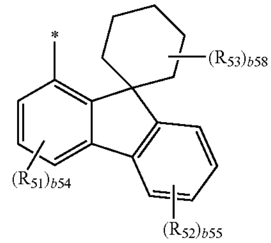
5-50
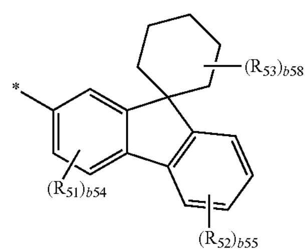
5-51
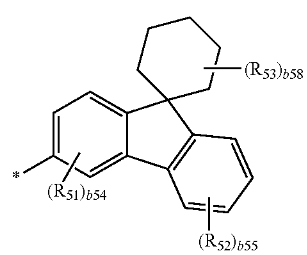
5-52
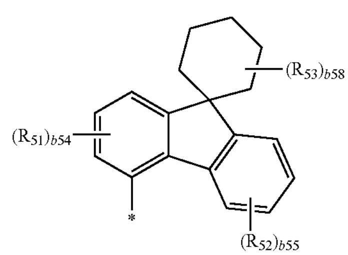
5-53
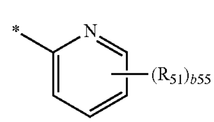

-continued
5-54
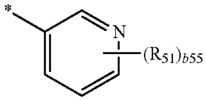
5-55
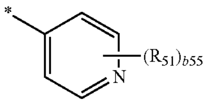
5-56
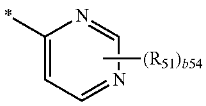
5-57
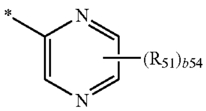
5-58
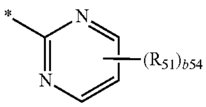
5-59
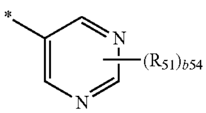
5-60
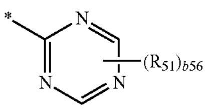
5-61
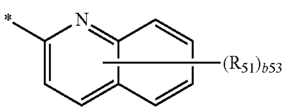
5-62
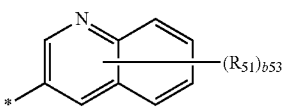
5-63
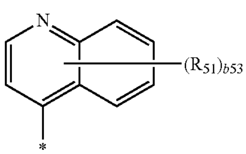
5-64
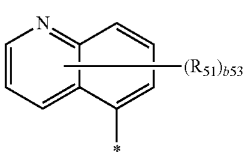
5-65
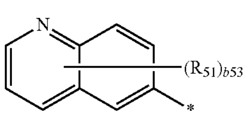
5-66
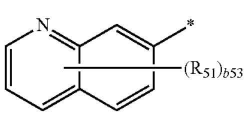
-continued
5-67
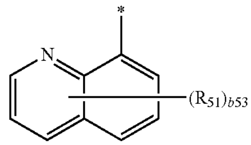
5-68
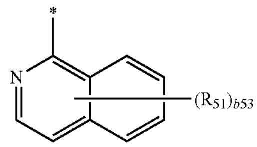
5-69
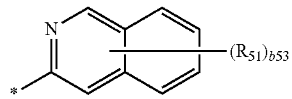
5-70
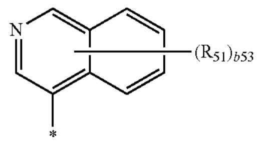
5-71
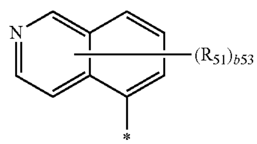
5-72
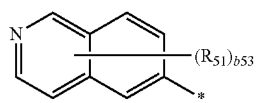
5-73
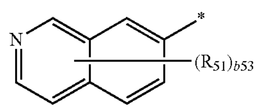
5-74
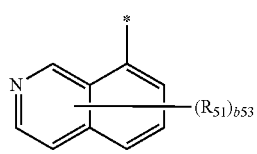
5-75
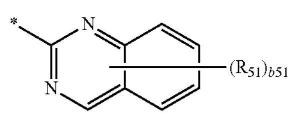
5-76
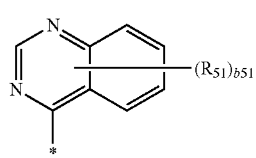
5-77
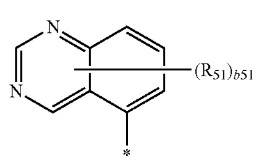

-continued
5-78
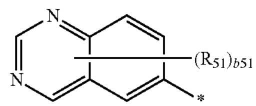
5-79
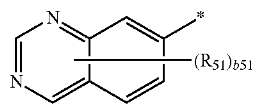
5-80
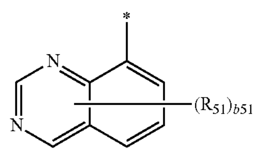
5-81
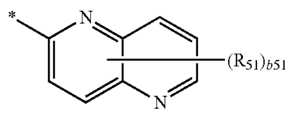
5-82
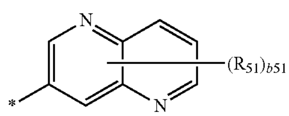
5-83
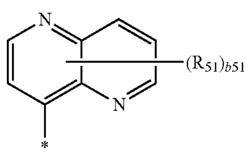
5-84
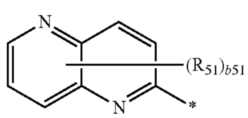
5-85
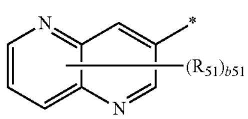
5-86
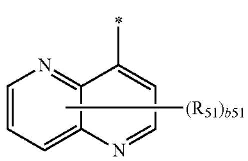
5-87
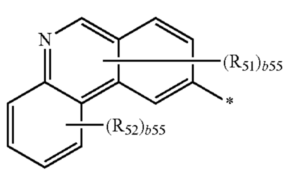
5-88
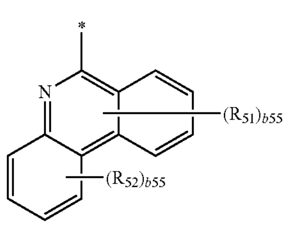
-continued
5-89
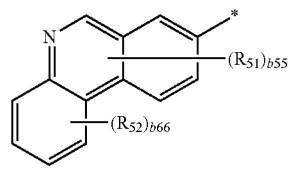
5-90
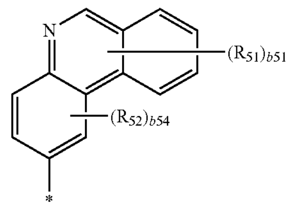
5-91
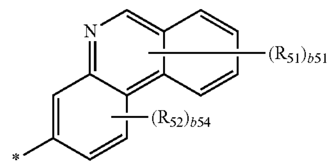
5-92
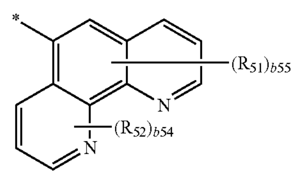
5-93
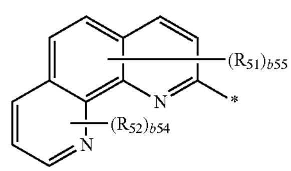
5-94
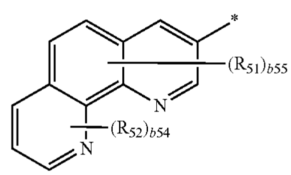
5-95
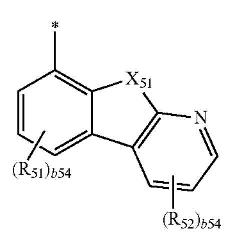
5-96
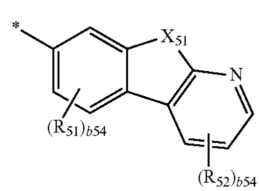

-continued
5-97
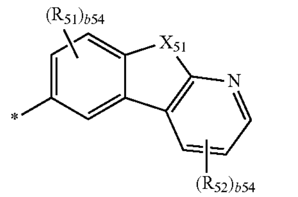
5-98
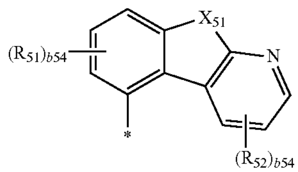
5-99
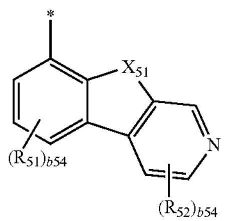
5-100
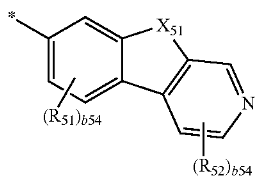
5-101
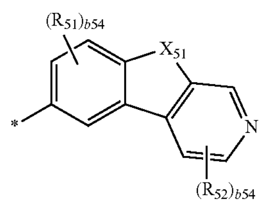
5-102
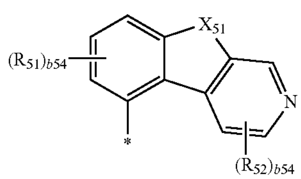
5-103
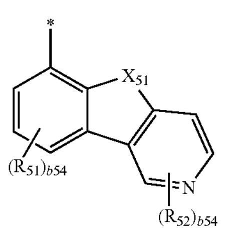
5-104
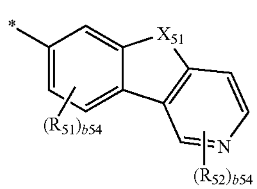
-continued
5-105
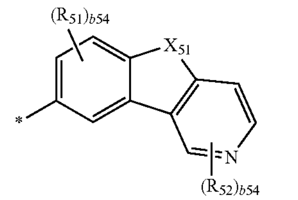
5-106
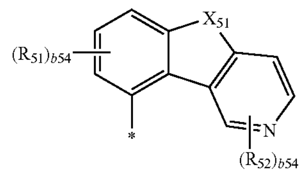
5-107
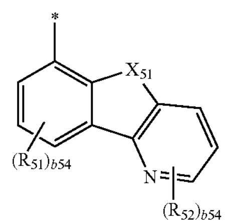
5-108
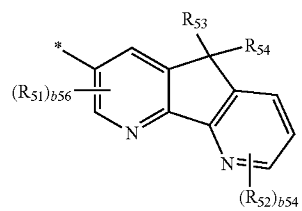
5-109
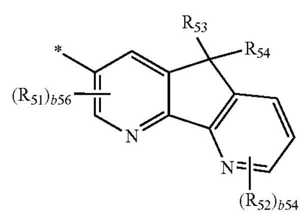
5-110
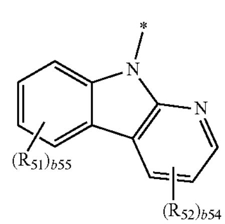
5-111
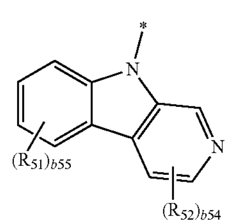

-continued
5-112
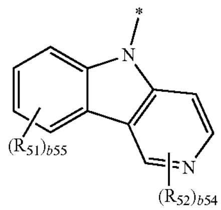
5-113
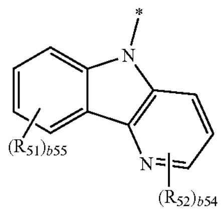
5-114
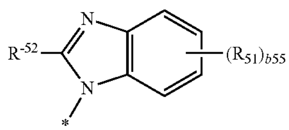
5-115
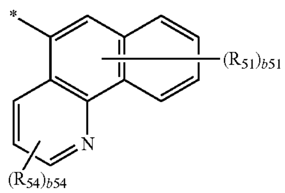
5-116
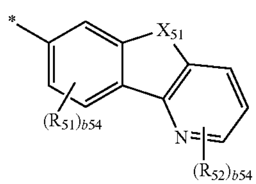
5-117
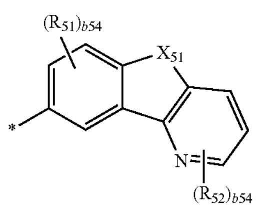
5-118
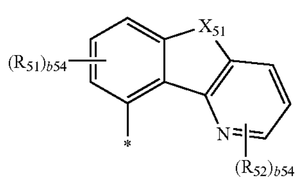
5-119
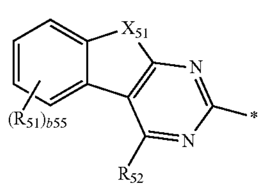
-continued
5-120
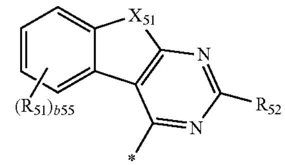
5-121
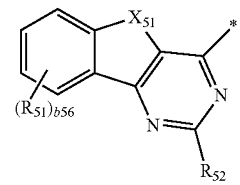
5-122
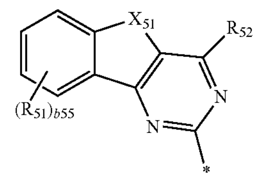
5-123
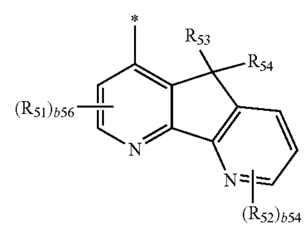
5-124
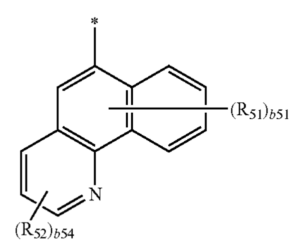
5-125
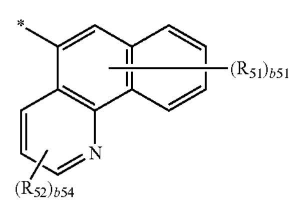
5-126
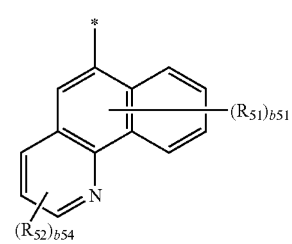
5-127
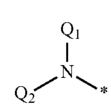

-continued 5-128

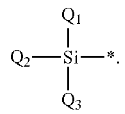

In Formulae 5-1 to 5-128, $X_{51}$ may be selected from O, S, $N(R_{53})$, and $C(R_{53})(R_{54})$;

$R_{51}$ to $R_{54}$ may each independently be selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, $—CDH_2$, $—CD_2H$, $—CD_3$, $—CFH_2$, $—CF_2H$, $—CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_6$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, $—N(Q_{31})(Q_{32})$, and $—Si(Q_{31})(Q_{32})(Q_{33})$;

$Q_1$ to $Q_3$ and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group, and a naphthyl group;

b51 may be selected from 1, 2, 3, 4, and 5;

b52 may be selected from 1, 2, 3, 4, 5, 6, and 7;

b53 may be selected from 1, 2, 3, 4, 5, and 6;

b54 may be selected from 1, 2, and 3;

b55 may be selected from 1, 2, 3, and 4;

b56 may be selected from 1 and 2;

b57 may be selected from 1, 2, 3, 4, 5, 6, 7, and 8;

b58 may be selected from 1, 2, 3, 4, 5, 6, 7, 8, 9, and 10; and

* indicates a binding site to a neighboring atom.

Ar in Formula 2 may be selected from a group represented by Formula 2A and a group represented by Formula 2B.

$X_{21}$ in Formulae 2A and 2B may be selected from oxygen, sulfur, $N(R_{204})$, and $C(R_{204})(R_{205})$, and $R_{204}$ and $R_{205}$ are as described below.

$X_{22}$ in Formulae 2A and 2B may be selected from oxygen, sulfur, $N(R_{206})$, and $C(R_{206})(R_{207})$, and $R_{206}$ and $R_{207}$ are as described below.

$A_{21}$ in Formulae 2A and 2B may be selected from a $C_5$-$C_{20}$ carbocyclic group and a $C_1$-$C_{20}$ heterocyclic group.

$A_{22}$ in Formulae 2A and 2B may be selected from a $C_6$-$C_{20}$ arene group and a $C_1$-$C_{20}$ heteroarene group.

$A_{23}$ in Formulae 2A and 2B may be selected from a $C_5$-$C_{20}$ carbocyclic group and a $C_1$-$C_{20}$ heterocyclic group.

In various embodiments, $A_{21}$ and $A_{23}$ in Formulae 2A and 2B may each independently be selected from a benzene group, a naphthalene group, a phenanthrene group, an anthracene group, a triphenylene group, a pyrene group, a chrysene group, a furan group, a thiophene group, a pyrrole group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, furopyridine group, thienopyridine group, a cyclopentapyridine group, a pyrrolopyridine group, a dibenzofuran group, a dibenzothiophene group, a fluorene group, a carbazole group, a benzofuropyrrole group, a benzothienopyrrole group, an indenopyrrole group, an indolopyrrole group, a benzofurothiophene group, a benzothienothiophene group, an indenothiophene group, an indolothiophene group, a benzofurofuran group, a benzothienofuran group, an indenofuran group, an indolofuran group, a benzofurothiophene group, a benzothienothiophene group, an indenothiophene group, an indolothiophene group, a benzofuropyridine group, a benzothienopyridine group, an indenopyridine group, an indolopyridine group, a benzofuropyrimidine group, a benzothienopyrimidine group, an indenopyrimidine group, an indolopyrimidine group, a benzofuroindole group, a benzothienoindole group, an indenoindole group, an indoloindole group, a benzofurobenzofuran group, a benzothienobenzofuran group, an indenobenzofuran group, an indolobenzofuran group, a benzofurobenzothiophene group, a benzothienobenzothiophene group, an indenobenzothiophene group, an indolobenzothiophene group, a benzofuroquinoline group, a benzothienoquinoline group, an indenoquinoline group, an indoloquinoline group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a cyclopentanaphthalene group, a spiro-bifluorene group, and a spiro-fluorene-indene group, but are not limited thereto.

In various embodiments, $A_{21}$ and $A_{23}$ in Formulae 2A and 2B may each independently be selected from a benzene group, a naphthalene group, a phenanthrene group, a pyridine group, a pyrazine group, a pyrimidine group, a quinoline group, an isoquinoline group, a benzoquinoline group, a benzoisoquinoline group, a dibenzofuran group, a dibenzothiophene group, a fluorene group, a carbazole group, and an indolopyridine group, but are not limited thereto.

In various embodiments, $A_{21}$ and $A_{23}$ in Formulae 2A and 2B may each independently be selected from a benzene group, a naphthalene group, a phenanthrene group, a pyridine group, a quinoline group, an isoquinoline group, a benzoquinoline group, a benzoisoquinoline group, a dibenzofuran group, a dibenzothiophene group, a fluorene group, a carbazole group, and an indolopyridine group, but are not limited thereto.

In various embodiments, $A_{22}$ in Formulae 2A and 2B may be selected from a benzene group, a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, and a phenanthroline group, but is not limited thereto.

In various embodiments, $A_{22}$ in Formulae 2A and 2B may be selected from a benzene group, a naphthalene group, a pyridine group, a quinoline group, and an isoquinoline group, but is not limited thereto.

In various embodiments, $A_{22}$ in Formulae 2A and 2B may be selected from a benzene group and a naphthalene group, but is not limited thereto.

$L_{21}$ to $L_{26}$ in Formula 2 may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In various embodiments, $L_{21}$ to $L_{26}$ in Formula 2 may each independently be selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group, each substituted with at least one selected from deuterium, —F, —Cl, —Br, —I, a cyano group, a $C_1$-$C_{20}$ alkyl group, a $C_1$-$C_{20}$ alkoxy group, a cyclopropyl group, a cyclobutyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ may each independently be selected from hydrogen, a $C_1$-$C_{20}$ alkyl group, a phenyl group, a naphthyl group, a biphenyl group, and a terphenyl group, but embodiments are not limited thereto.

In various embodiments, $L_{21}$ to $L_{26}$ in Formula 2 may each independently be selected from the group consisting of:

a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group; and a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group, each substituted with at least one selected from deuterium, —F, —Cl, —Br, —I, a cyano group, a methyl group, an ethyl group, an n-propyl group, an iso-propyl group, a tert-butyl group, a methoxy group, an ethoxy group, an n-propoxy group, an iso-propoxy group, ter-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ may each independently be selected from hydrogen, a methyl group, an ethyl group, an n-propyl group, an iso-propyl group, a tert-butyl group, a phenyl group, a naphthyl group, a biphenyl group, and a terphenyl group, but embodiments are not limited thereto.

In various embodiments, $L_{21}$ to $L_{26}$ in Formula 2 may each independently be selected from groups represented by Formulae 3-1 to 3-179, but are not limited thereto:

3-1

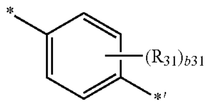

3-2

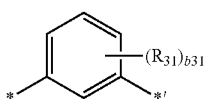

3-3

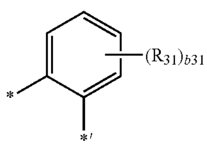

3-4

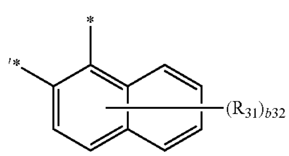

3-5

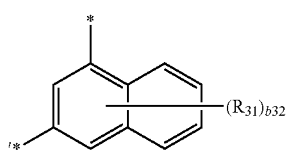

3-6

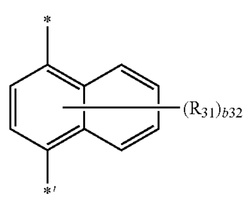

3-7

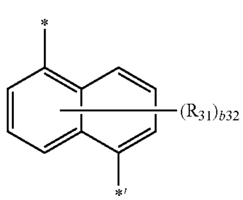

3-8

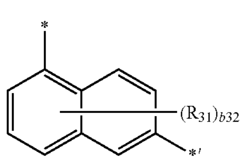

-continued 3-9

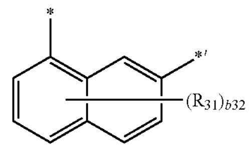

3-10

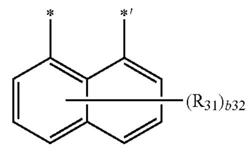

3-11

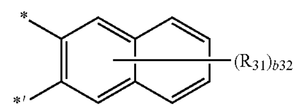

3-12

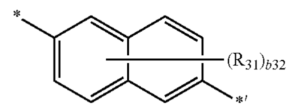

3-13

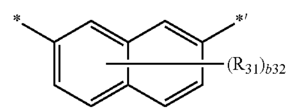

3-14

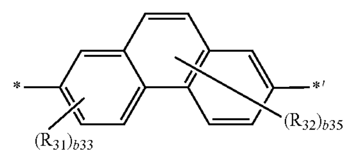

3-15

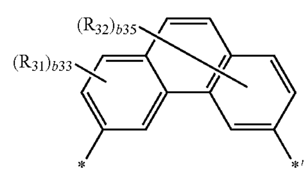

3-16

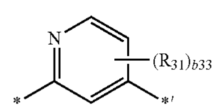

3-17

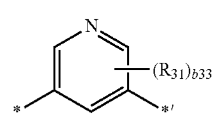

3-18

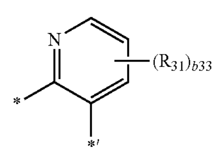

3-19

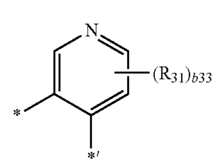

-continued
3-20
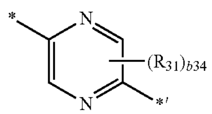
3-21
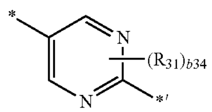
3-22
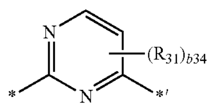
3-23
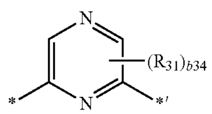
3-24
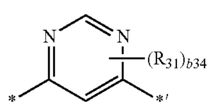
3-25
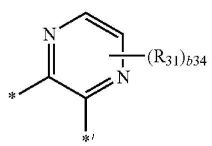
3-26
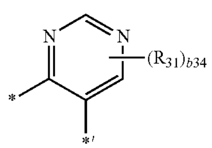
3-27
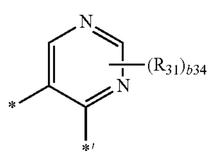
3-28
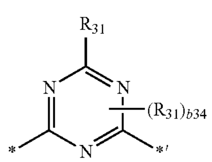
3-29
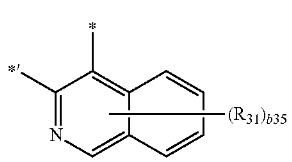
3-30
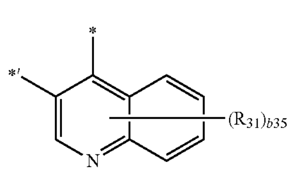
-continued
3-31
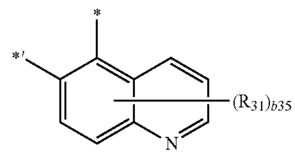
3-32
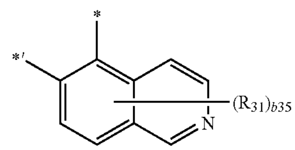
3-33
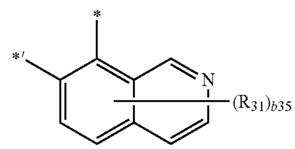
3-34
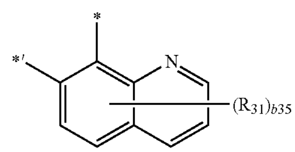
3-35
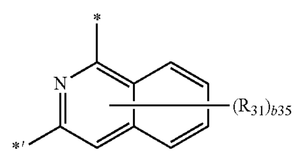
3-36
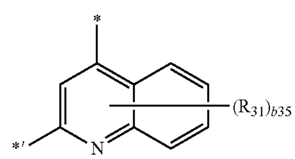
3-37
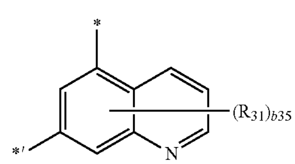
3-38
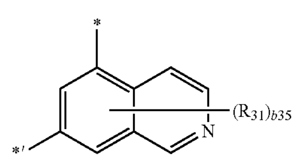
3-39
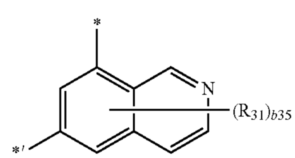
3-40
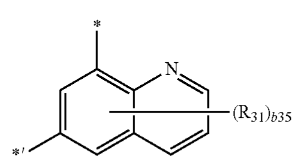

-continued
3-41
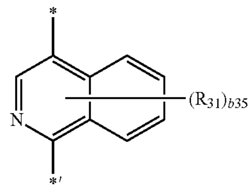
3-42
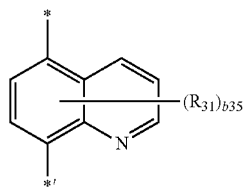
3-43
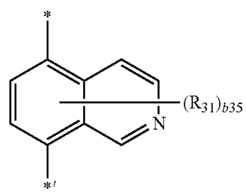
3-44
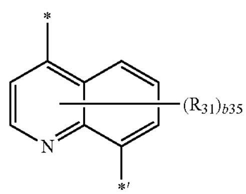
3-45
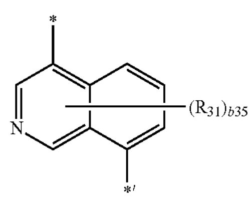
3-46
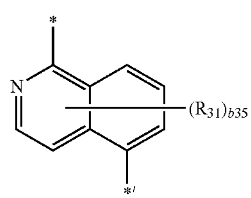
3-47
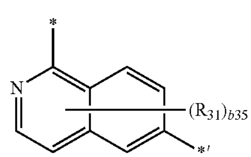
3-48
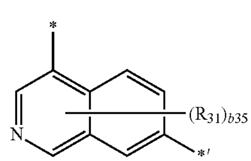
-continued
3-49
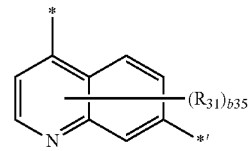
3-50
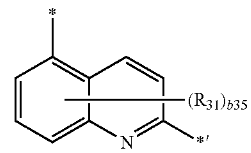
3-51
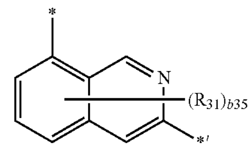
3-52
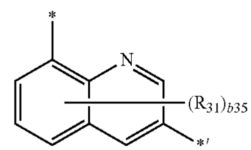
3-53
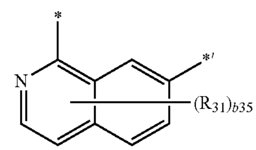
3-54
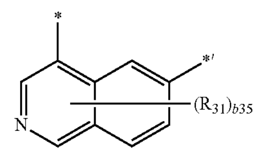
3-55
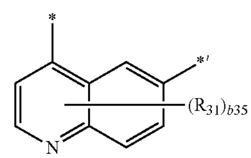
3-56
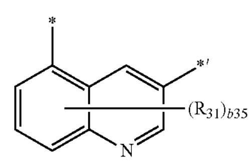
3-57
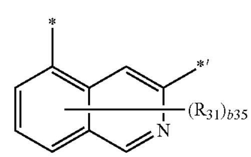
3-58
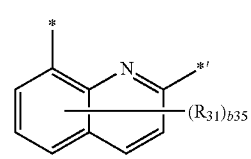

-continued
3-59
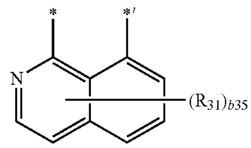
3-60
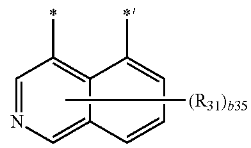
3-61
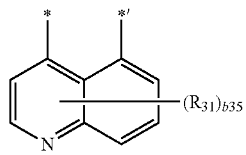
3-62
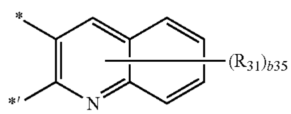
3-63
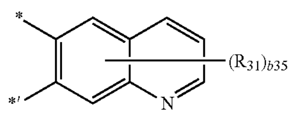
3-64
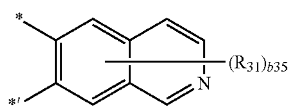
3-65
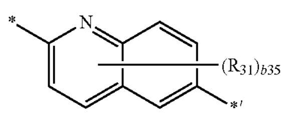
3-66
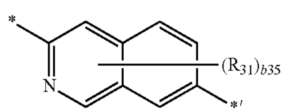
3-67
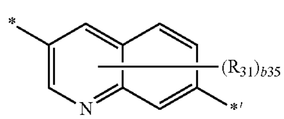
3-68
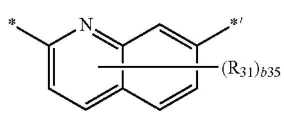
3-69
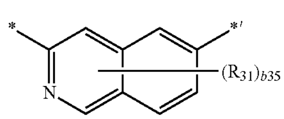
3-70
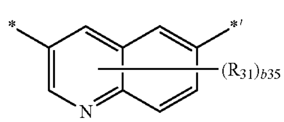
-continued
3-71
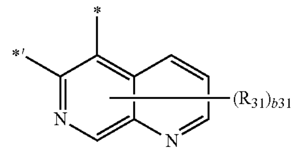
3-72
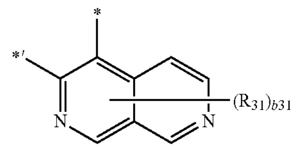
3-73
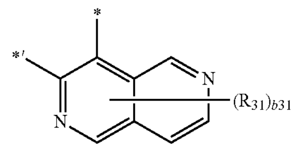
3-74
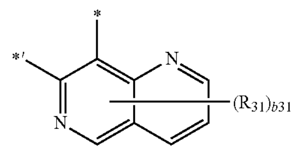
3-75
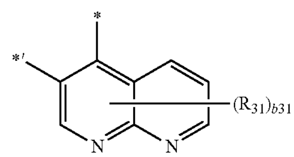
3-76
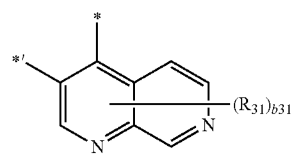
3-77
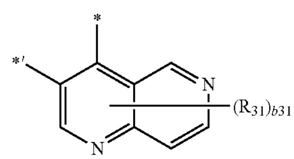
3-78
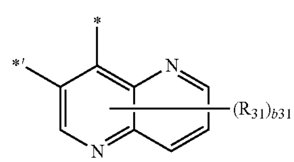
3-79
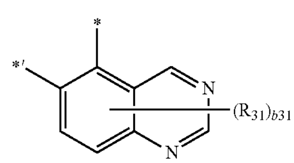
3-80
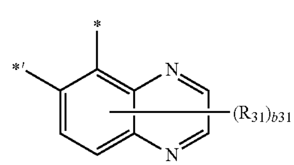

-continued
3-81
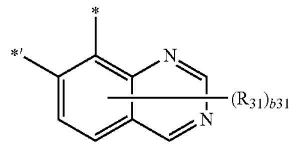
3-82
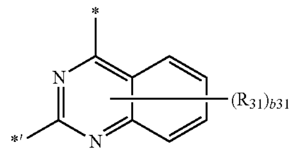
3-83
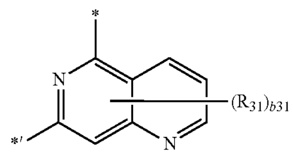
3-84
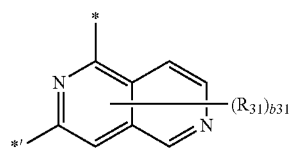
3-85
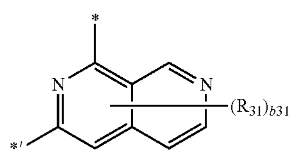
3-86
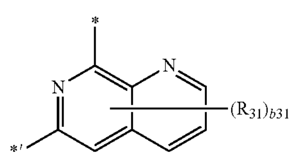
3-87
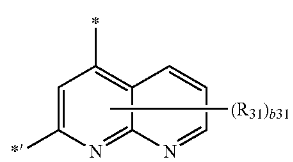
3-88
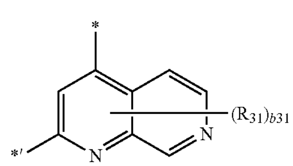
3-89
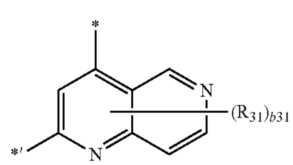
3-90
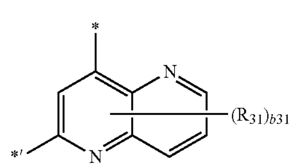
-continued
3-91
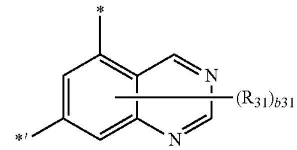
3-92
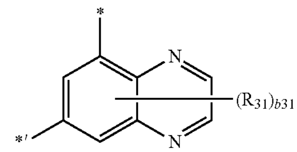
3-93
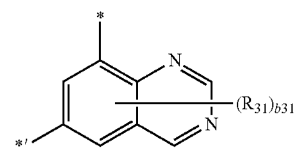
3-94
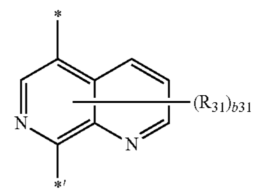
3-95
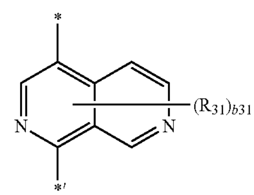
3-96
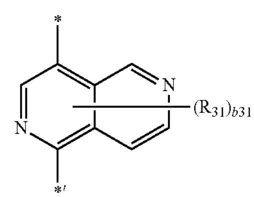
3-97
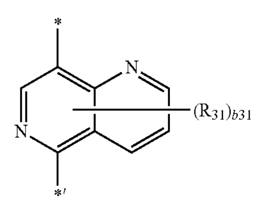
3-98
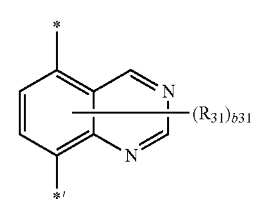

-continued
3-99
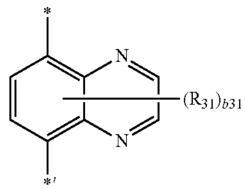
3-100
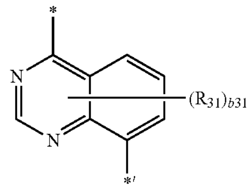
3-101
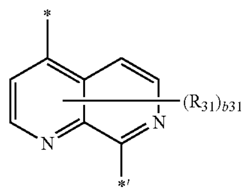
3-102
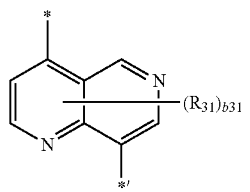
3-103
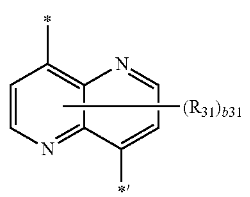
3-104
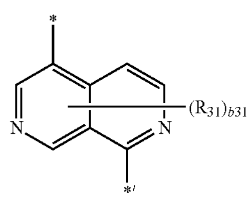
3-105
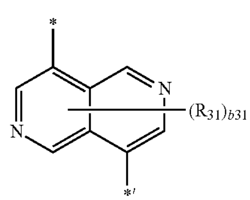
3-106
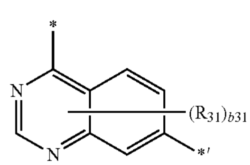
-continued
3-107
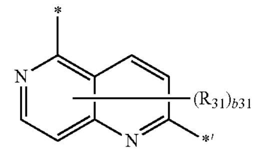
3-108
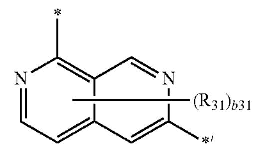
3-109
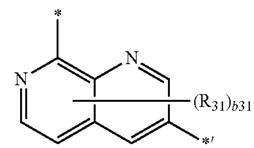
3-110
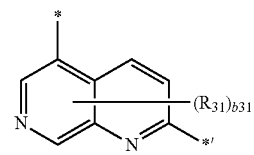
3-111
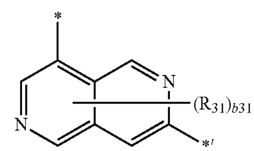
3-112
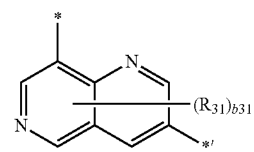
3-113
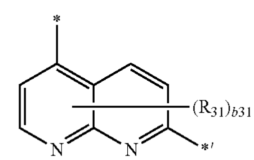
3-114
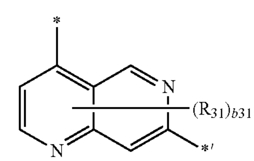
3-115
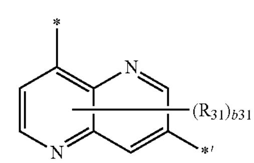
3-116
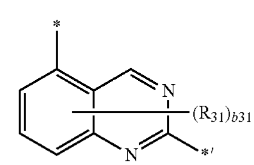

-continued
3-117
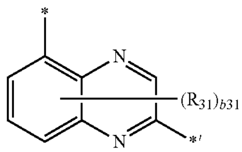
3-118
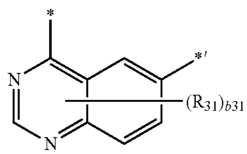
3-119
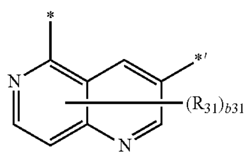
3-120
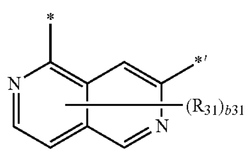
3-121
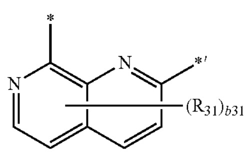
3-122
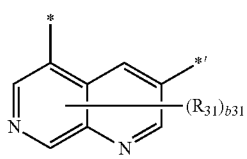
3-123
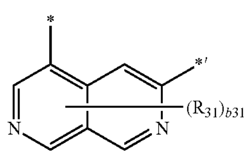
3-124
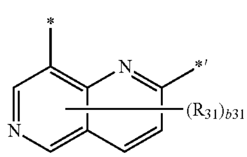
3-125
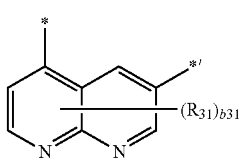
3-126
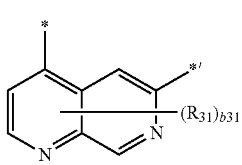
-continued
3-127
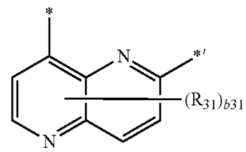
3-128
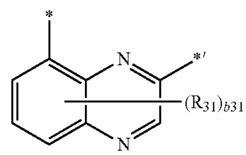
3-129
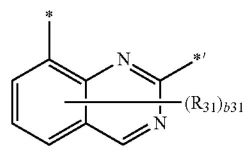
3-130
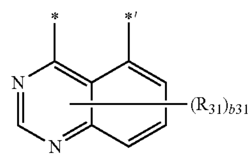
3-131
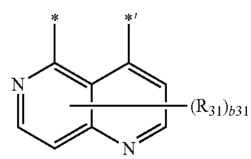
3-132
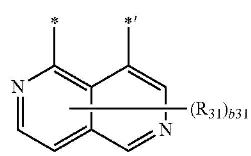
3-133
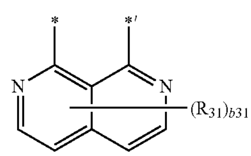
3-134
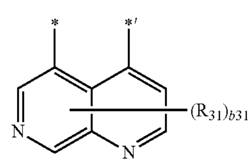
3-135
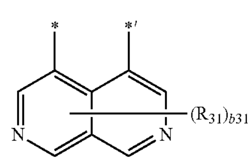
3-136
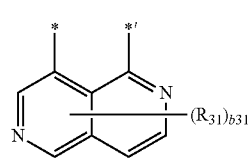

-continued
3-137
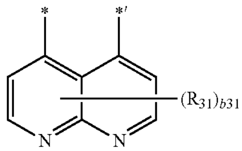
3-138
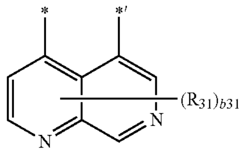
3-139
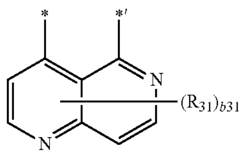
3-140
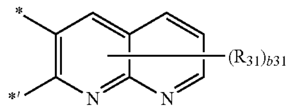
3-141
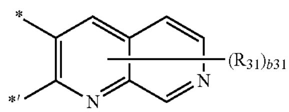
3-142
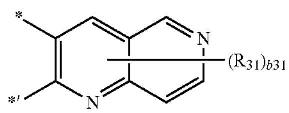
3-143
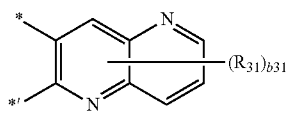
3-144
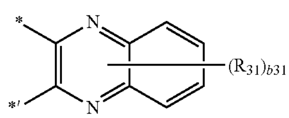
3-145
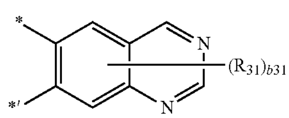
3-146
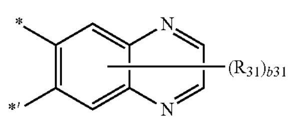
3-147
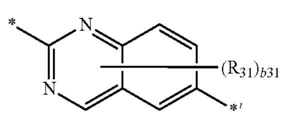
3-148
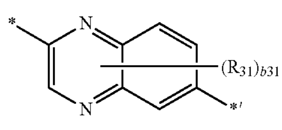
-continued
3-149
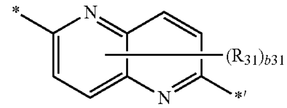
3-150
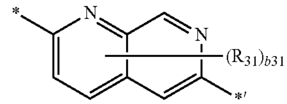
3-151
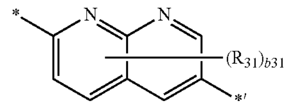
3-152
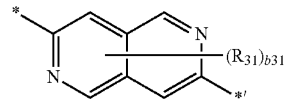
3-153
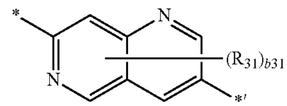
3-154
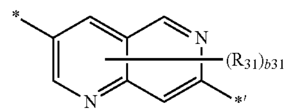
3-155
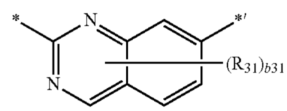
3-156
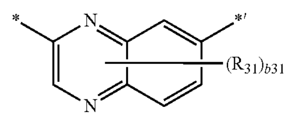
3-157
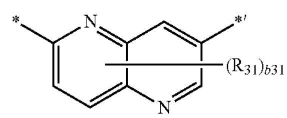
3-158
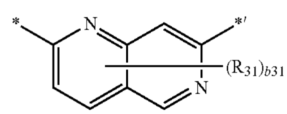
3-159
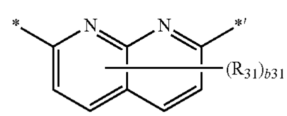
3-160
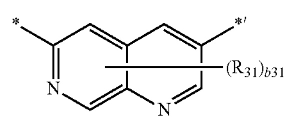
3-161
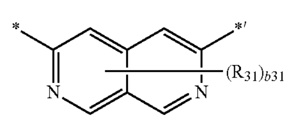

-continued
3-162
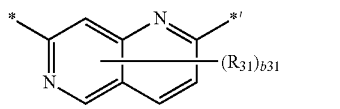
3-163
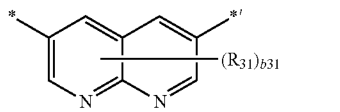
3-164
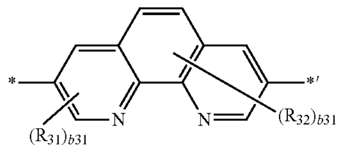
3-165
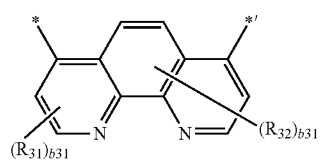
3-166
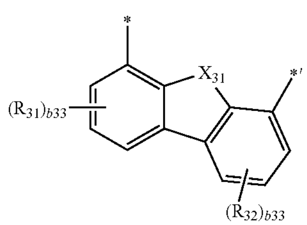
3-167
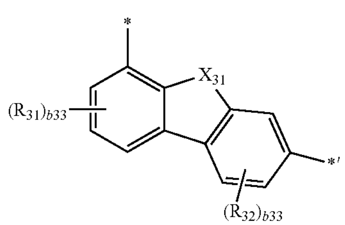
3-168
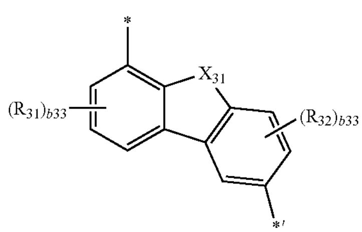
3-169
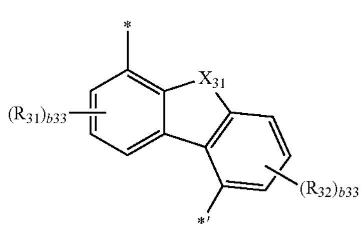
3-170
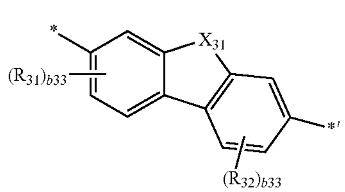
-continued
3-171
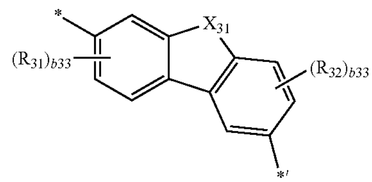
3-172
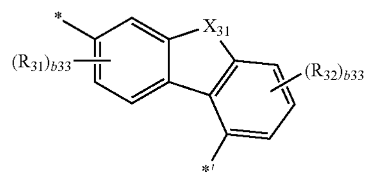
3-173
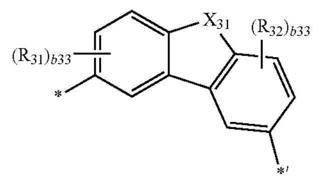
3-174
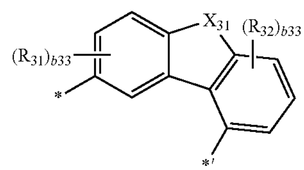
3-175
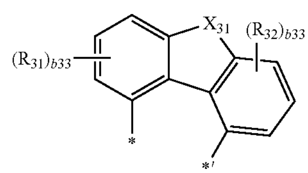
3-176
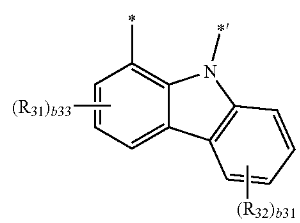
3-177
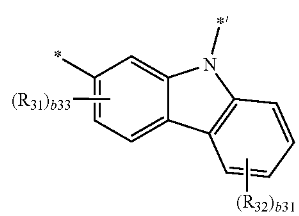
3-178
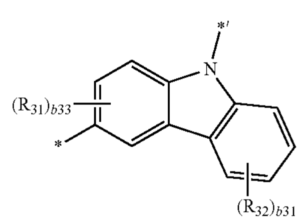

-continued 3-179

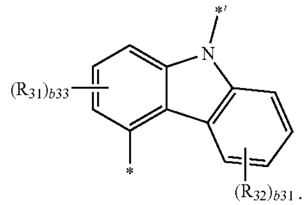

In Formulae 3-1 to 3-179, $X_{31}$ may be selected from O, S, $N(R_{33})$, and $C(R_{33})(R_{34})$;

$R_{31}$ to $R_{34}$ may each independently be selected from hydrogen, deuterium, —F, —Cl, —Br, —I, a cyano group, a methyl group, an ethyl group, an n-propyl group, an iso-propyl group, a tert-butyl group, a methoxy group, an ethoxy group, an n-propoxy group, an iso-propoxy group, ter-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, $Q_{31}$ to $Q_{33}$ may each independently be selected from hydrogen, a methyl group, an ethyl group, an n-propyl group, an iso-propyl group, a tert-butyl group, a phenyl group, a naphthyl group, a biphenyl group, and a terphenyl group;

b31 may be selected from 1, 2, 3 and 4;

b32 may be selected from 1, 2, 3, 4, 5 and 6;

b33 may be selected from 1, 2 and 3;

b34 may be selected from 1 and 2;

b35 may be selected from 1, 2, 3, 4 and 5; and

* and *' each indicate a binding site to a neighboring atom.

a21 in Formula 2 indicates the number of $L_{21}$(s), and a21 may be selected from 0, 1, 2, and 3. When a21 is 0, $(L_{21})_{a21}$ may be a single bond. When a21 is two or more, a plurality of $L_{21}$(s) may be identical to or different from each other. Descriptions of a22 to a26 in Formula 2 may be each independently understood by referring to the description provided in connection with a21 and the structure of Formula 2. For example, a22 to a26 may each independently be selected from 0, 1, 2, and 3.

In various embodiments, a21 to a26 in Formula 2 may each independently be selected from 0 and 1, but are not limited thereto.

In various embodiments, $L_{23}$ to $L_{26}$ in Formula 2 may each independently be selected from groups represented by Formulae 3-1 to 3-15; and a23 to a26 may each independently be selected from 0 and 1, but embodiments are not limited thereto.

$R_{21}$ to $R_{24}$ in Formula 2 may each independently be selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; $R_{21}$ and $R_{22}$ may optionally be linked to each other to form a saturated ring or an unsaturated ring, and $R_{23}$ and $R_{24}$ may optionally be linked to each other to form a saturated ring or an unsaturated ring.

In various embodiments, $R_{21}$ to $R_{24}$ in Formula 2 may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$); and —N($Q_1$)($Q_2$) and —Si($Q_1$)($Q_2$)($Q_3$), wherein $Q_1$ to $Q_3$ and $Q_{31}$ to $Q_{33}$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments are not limited thereto.

In various embodiments, $R_{21}$ to $R_{24}$ in Formula 2 may each independently be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyridinyl group substituted with deuterium, a pyridinyl group substituted with a methyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$); and —N($Q_1$)($Q_2$) and —Si($Q_1$)($Q_2$)($Q_3$), and wherein $Q_1$ to $Q_3$ and $Q_{31}$ to $Q_{33}$ may each independently be selected from a $C_1$-$C_{20}$ alkyl group, a $C_6$-$C_{60}$ aryl group, a biphenyl group, and a terphenyl group, but embodiments are not limited thereto.

In various embodiments, $R_{21}$ to $R_{24}$ in Formula 2 may each independently be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, —$CDH_2$, —$CD_2H$, —$CD_3$, —$CFH_2$, —$CF_2H$, —$CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_6$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$); and —N($Q_1$)($Q_2$) and —Si($Q_1$)($Q_2$)($Q_3$), wherein $Q_1$ to $Q_3$ and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group and a naphthyl group, but embodiments are not limited thereto.

In various embodiments, $R_{21}$ to $R_{24}$ in Formula 2 may each independently be selected from groups represented by Formulae 5-1 to 5-128, but are not limited thereto.

$R_{201}$ to $R_{207}$ in Formulae 2A and 2B may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —$B(Q_1)(Q_2)$, —$C(=O)(Q_1)$, —$S(=O)_2(Q_1)$, and —$P(=O)(Q_1)(Q_2)$; and $R_{204}$ and $R_{205}$ may optionally be linked to each other to form a saturated ring or an unsaturated ring, and $R_{206}$ and $R_{207}$ may optionally be linked to each other to form a saturated ring or an unsaturated ring, wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In various embodiments, $R_{201}$ to $R_{207}$ in Formulae 2A and 2B may each independently be selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, and —$Si(Q_1)(Q_2)(Q_3)$;

$Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and $R_{204}$ and $R_{205}$ may optionally be linked to each other to form a saturated ring or an unsaturated ring, and $R_{206}$ and $R_{207}$ may optionally be linked to each other to form a saturated ring or an unsaturated ring, but are not limited thereto.

In various embodiments, $R_{201}$ to $R_{207}$ in Formulae 2A and 2B may each independently be selected from the group consisting of:

hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_1)(Q_2)$, and —$Si(Q_1)(Q_2)(Q_3)$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group;

where $Q_1$ to $Q_3$ may each independently be selected from a $C_1$-$C_{60}$ alkyl group, a $C_6$-$C_{60}$ aryl group, a biphenyl group, and a terphenyl group; and $R_{204}$ and $R_{205}$ may optionally be linked to each other to form a saturated ring or an unsaturated ring, and $R_{206}$ and $R_{207}$ may optionally be linked to each other to form a saturated ring or an unsaturated ring, but are not limited thereto.

In various embodiments, $R_{201}$ to $R_{207}$ in Formulae 2A and 2B may each independently be selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —$N(Q_1)(Q_2)$, and —$Si(Q_1)(Q_2)(Q_3)$; and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group;

where $Q_1$ to $Q_3$ may each independently be selected from a methyl group, an ethyl group, an n-propyl group, an iso-propyl group, and a phenyl group; and $R_{204}$ and $R_{205}$ may optionally be linked to each other to form a saturated ring or an unsaturated ring, and $R_{206}$ and $R_{207}$ may optionally be linked to each other to form a saturated ring or an unsaturated ring, but are not limited thereto.

In various embodiments, in Formulae 2A and 2B, when $X_{21}$ is $C(R_{204})(R_{206})$, $R_{204}$ and $R_{206}$ may be optionally linked to each other to form a group represented by one of Formulae 9-1 and 9-2; and when $X_{22}$ is $C(R_{206})(R_{207})$, $R_{206}$ and $R_{207}$ may optionally be linked to each other to form a group represented by one of Formulae 9-1 and 9-2, but they are not limited thereto:

Formula 9-1

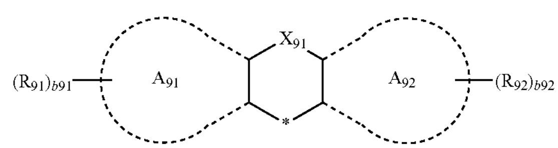

Formula 9-2

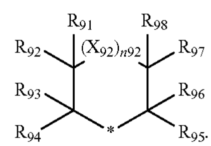

In Formulae 9-1 and 9-2, $X_{91}$ may be selected from a single bond, O, S, Se, $C(R_{93})(R_{94})$, $Si(R_{93})(R_{94})$, and $Ge(R_{93})(R_{94})$;

$X_{92}$ may be $C(R_{99})(R_{100})$;

n92 may be selected from 0, 1, and 2;

$A_{91}$ and $A_{92}$ may each independently be selected from a $C_6$-$C_{20}$ arene group and a $C_1$-$C_{20}$ heteroarene group; and $R_{91}$ to $R_{100}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group;

b91 and b92 may each independently be selected from 1, 2, 3, 4, 5, 6, 7, 8, 9, and 10; and

* indicates a carbon atom in Formulae 2-1 and 2-2 (e.g., the carbon atom in $C(R_{206})(R_{207})$).

In various embodiments, n92 in Formulae 9-1 and 9-2 may be selected from 0 and 1, but is not limited thereto. When n92 is 0, $(X_{92})_{n92}$ indicates a single bond.

In various embodiments, $A_{91}$ and $A_{92}$ in Formulae 9-1 and 9-2 may each independently be selected from a benzene group, a naphthalene group, a pyridine group, a quinoline group, and an isoquinoline group, but are not limited thereto.

In various embodiments, $A_{91}$ and $A_{92}$ in Formulae 9-1 and 9-2 may each independently be selected from a benzene group, a naphthalene group, and a pyridine group, but are not limited thereto.

In various embodiments, $R_{91}$ to $R_{100}$ in Formulae 9-1 and 9-2 may each independently be selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, and —$Si(Q_1)(Q_2)(Q_3)$, wherein $Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but are not limited thereto.

In various embodiments, $R_{91}$ to $R_{100}$ in Formulae 9-1 and 9-2 may each independently be selected from the group consisting of:

hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —$N(Q_1)(Q_2)$, and —$Si(Q_1)(Q_2)(Q_3)$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group, wherein $Q_1$ to $Q_3$ may each independently be selected from a $C_1$-$C_{60}$ alkyl group, a $C_6$-$C_{60}$ aryl group, a biphenyl group, and a terphenyl group, but are not limited thereto.

In various embodiments, $R_{91}$ to $R_{100}$ in Formulae 9-1 and 9-2 may each independently be selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —$N(Q_1)(Q_2)$, and —$Si(Q_1)(Q_2)(Q_3)$; and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group, wherein $Q_1$ to $Q_3$ may each independently be selected from a methyl group, an ethyl group, an n-propyl group, an iso-propyl group, and a phenyl group, but are not limited thereto.

b201 in Formulae 2A and 2B indicates the number of $R_{201}$(s), and b201 may be selected from 1, 2, 3, 4, 5, 6, 7, 8, 9, and 10. When b201 is 2 or more, a plurality of $R_{201}$(s) may be identical to or different from each other. Descriptions of b202 and b203 in Formulae 2A and 2B may be each independently understood by referring to the description of b201 and the corresponding structures of Formulae 2A and 2B, for example, b202 and b203 may each independently be selected from 1, 2, 3, 4, 5, 6, 7, 8, 9, and 10.

In various embodiments, the group represented by Formula 2A may be represented by one of Formulae 2A-1 to 2A-5, and the group represented by Formula 2B may be represented by one of Formulae 2B-1 to 2B-3, but these groups are not limited thereto:

2A-1

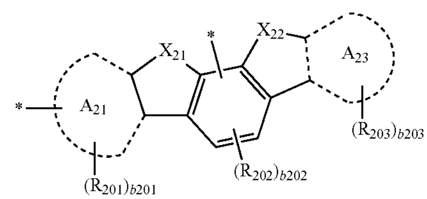

2A-2

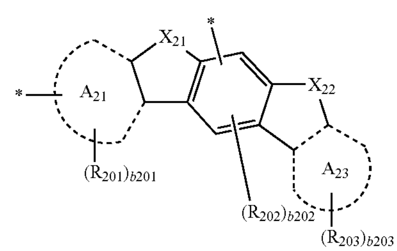

2A-3

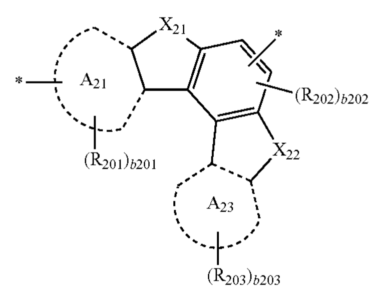

-continued

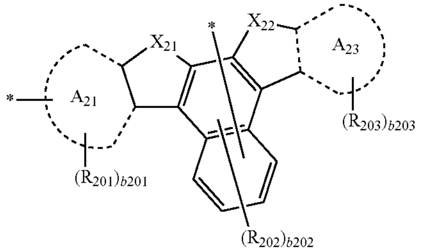
2A-4

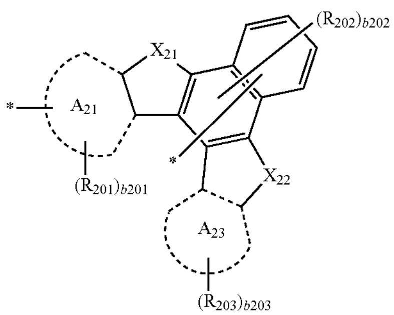
2A-5

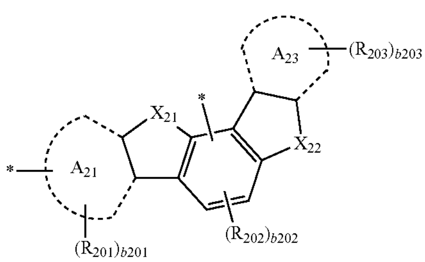
2B-1

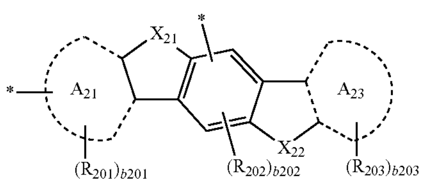
2B-2

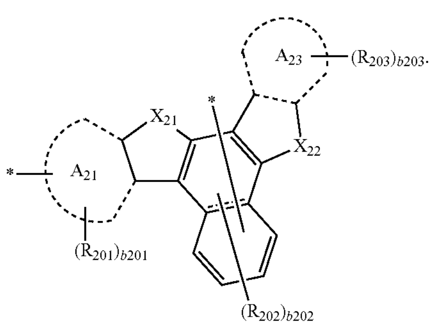
2B-3

In Formulae 2A-1 to 2A-5 and 2B-1 to 2B-3, $X_{21}$, $X_{22}$, $A_{21}$, $A_{23}$, $R_{201}$ to $R_{203}$ and b201 to b203 may be understood by referring to the descriptions thereof provided in connection with Formulae 2A and 2B; and

* indicates a binding site to a neighboring atom.

In one embodiment, the first compound represented by Formula 1 may be selected from Compounds H1 to H116, but is not limited thereto:

H1

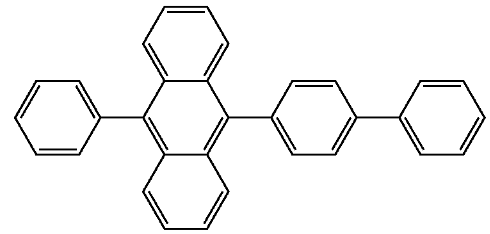 [SMILES: c1ccc(-c2ccc(-c3c4ccccc4c(-c4ccccc4)c4ccccc34)cc2)cc1]

H2

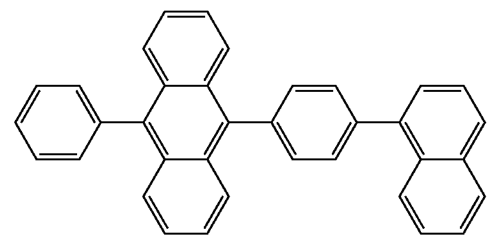

H3

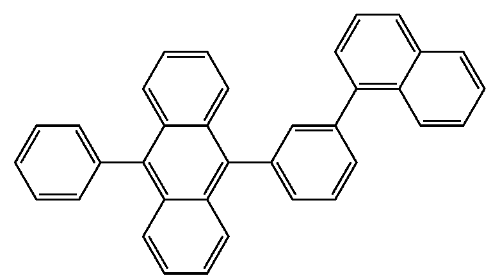

H4

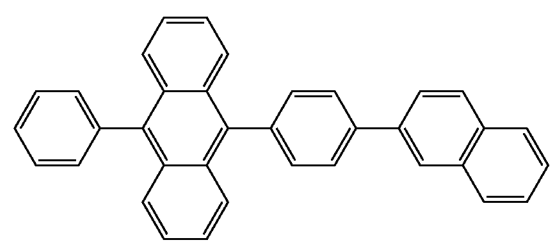

H5

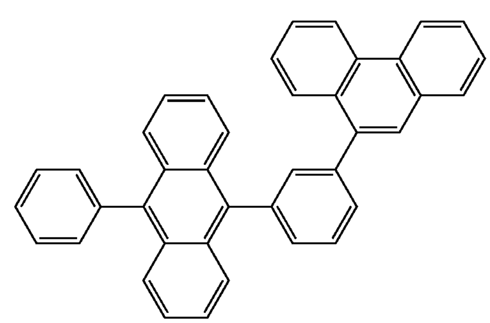

H6

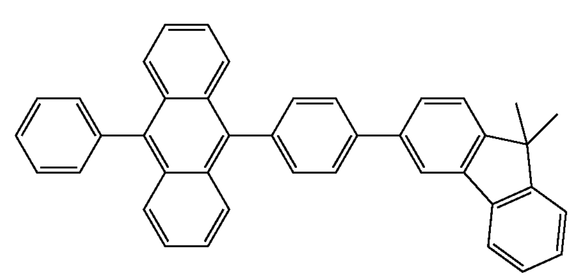 [SMILES: CC1(C)c2ccccc2-c2cc(-c3ccc(-c4c5ccccc5c(-c5ccccc5)c5ccccc45)cc3)ccc21]

-continued
H7
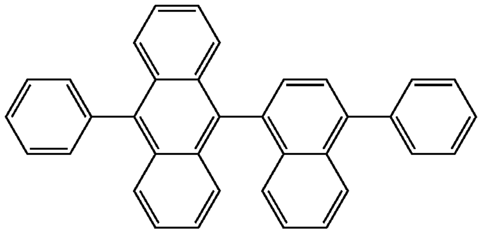 [SMILES: c1ccc(-c2ccc(-c3c4ccccc4c(-c4ccccc4)c4ccccc34)c3ccccc23)cc1]
H8
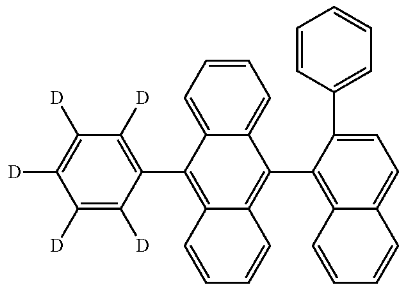
H9
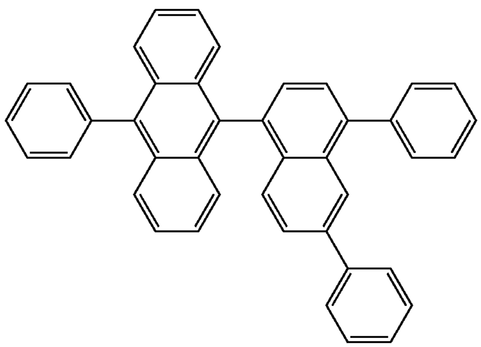
H10
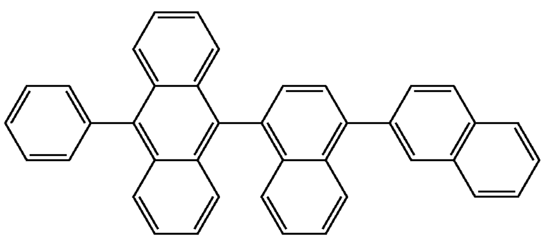
H11
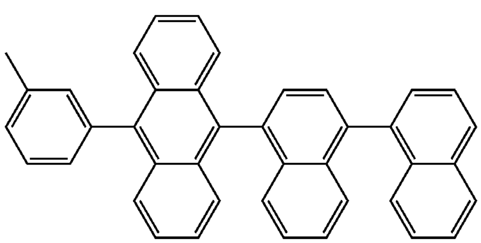
H12
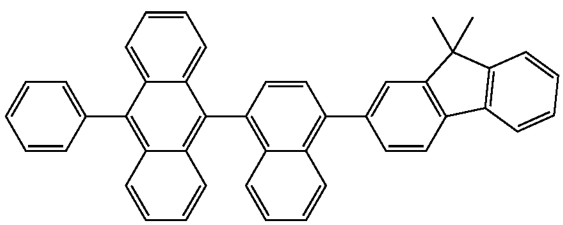
-continued
H13
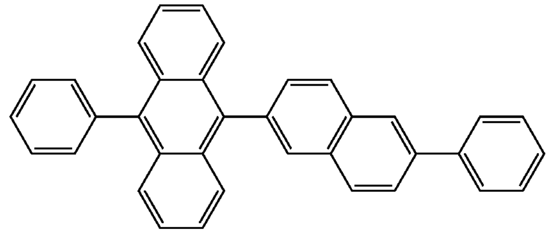
H14
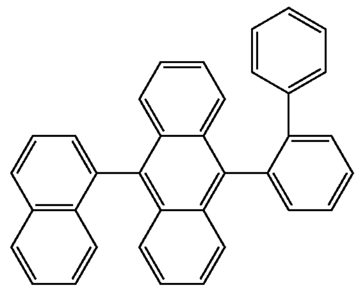
H15
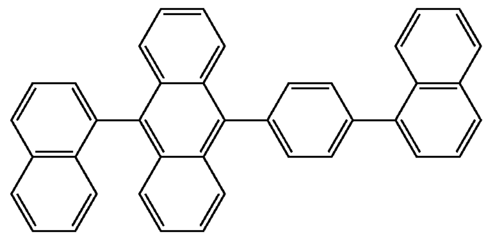
H16
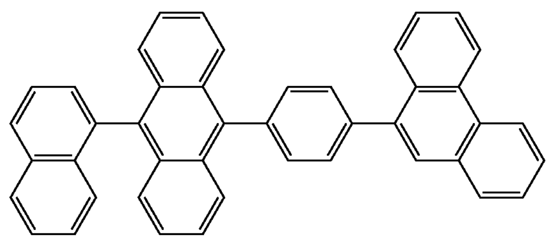 [SMILES: c1ccc2c(-c3c4ccccc4c(-c4ccc(-c5cc6ccccc6c6ccccc56)cc4)c4ccccc34)cccc2c1]
H17
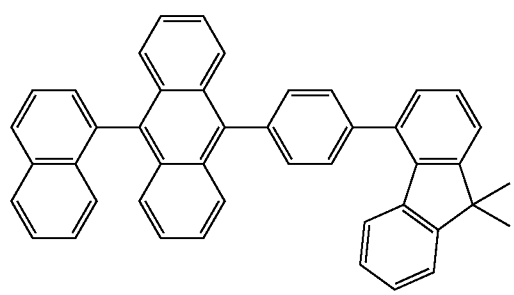
H18
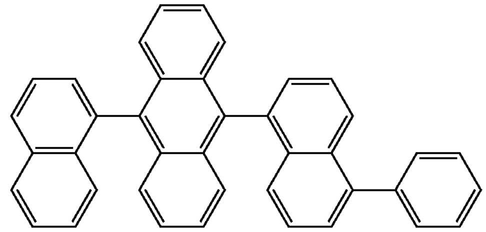

H19
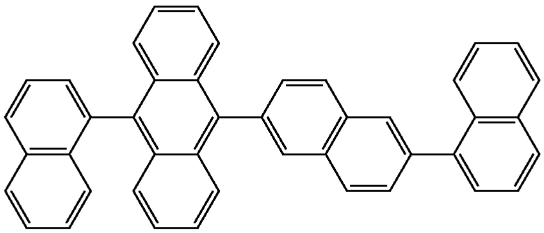
H20
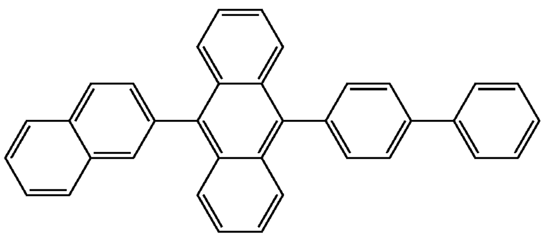
H21
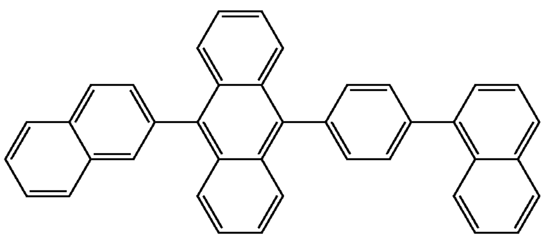
H22
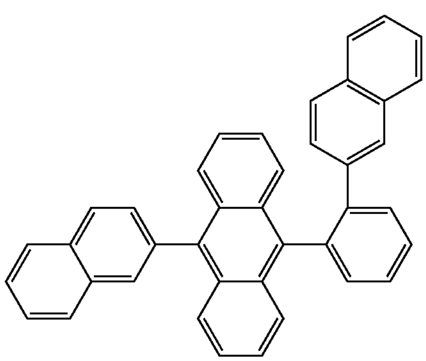
H23
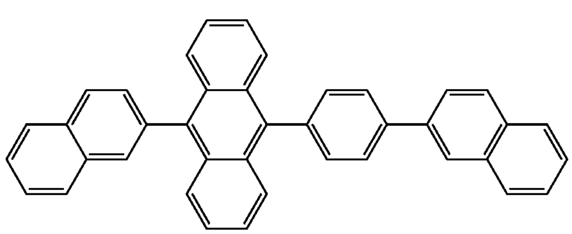 [SMILES: c1ccc2cc(-c3ccc(-c4c5ccccc5c(-c5ccc6ccccc6c5)c5ccccc45)cc3)ccc2c1]
H24
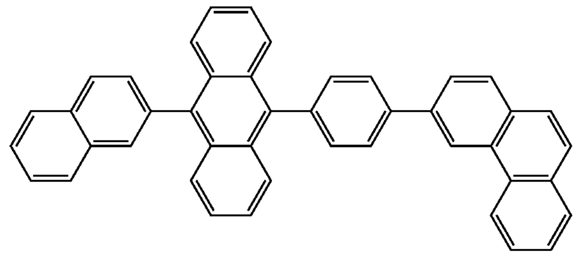
H25
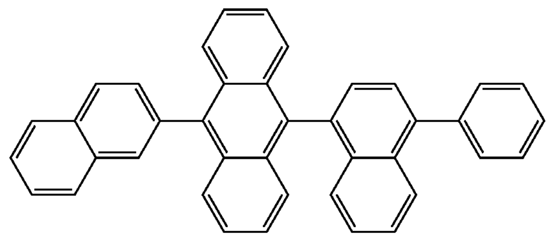
H26
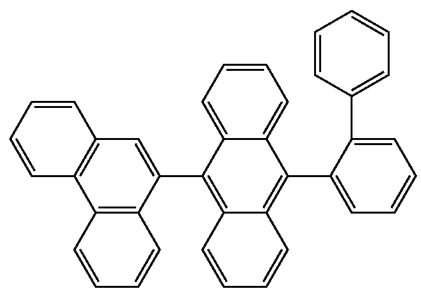
H27
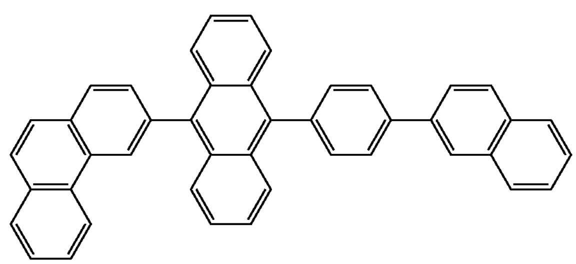
H28
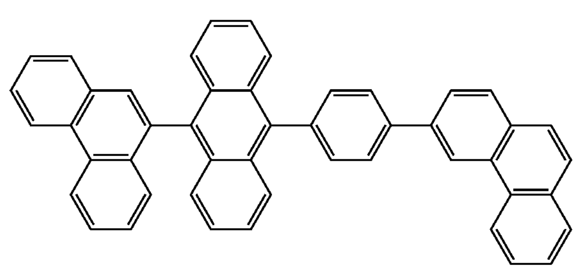

-continued
H29
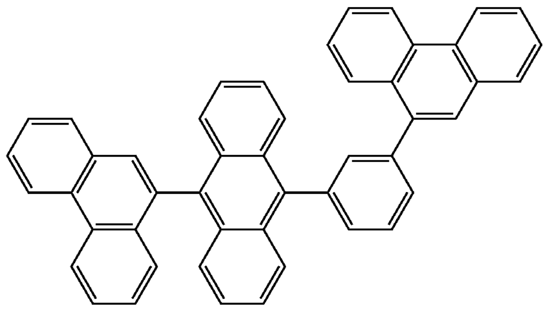
H30
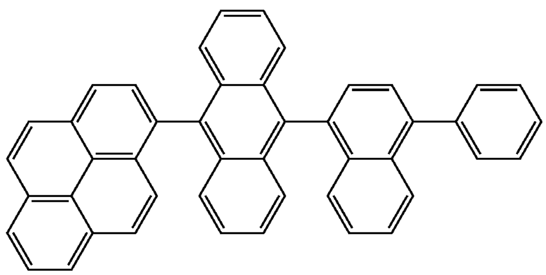
H31
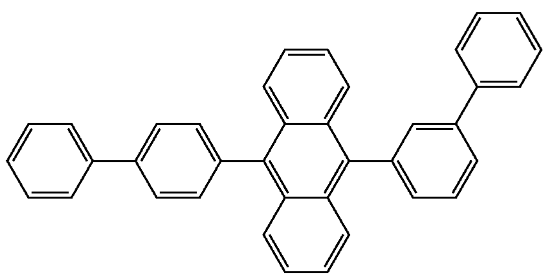
H32
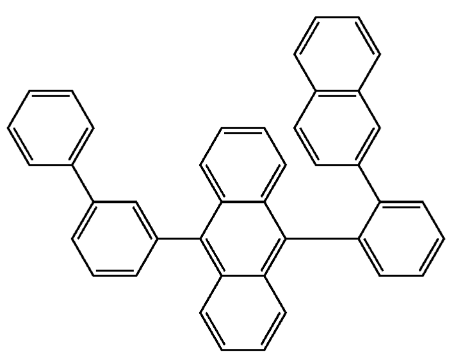
H33
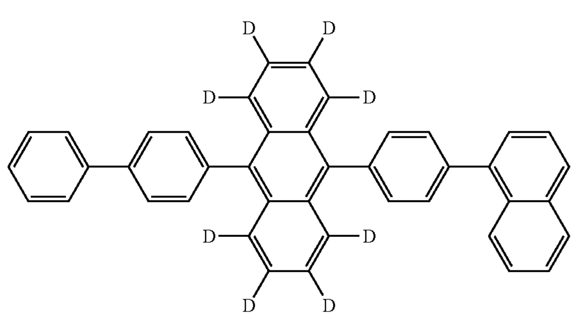
-continued
H34
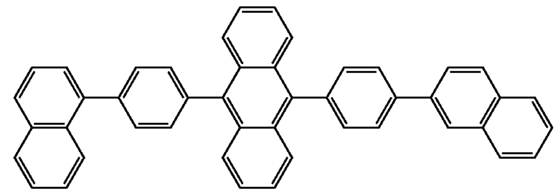
H35
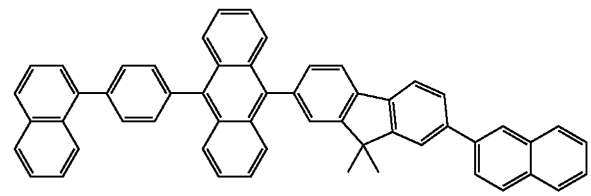
H36
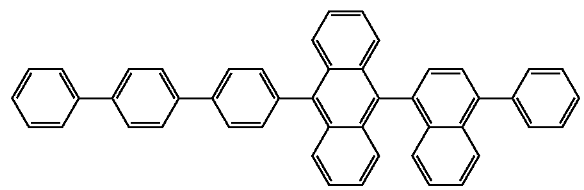
H37
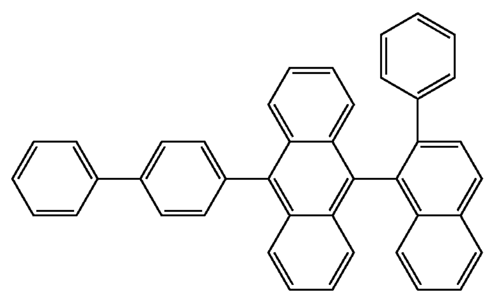
H38
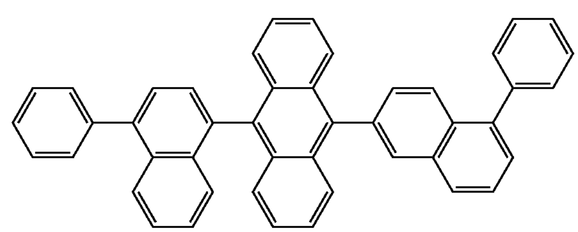
H39
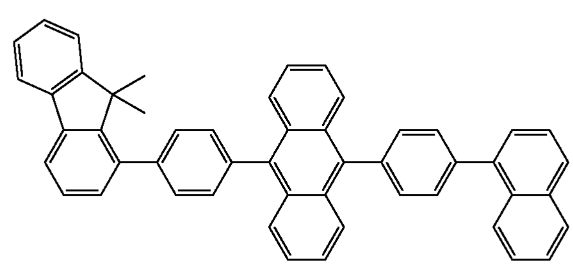

-continued
H40
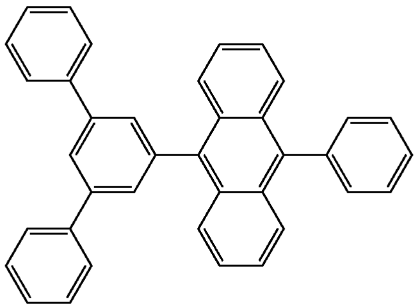
H41
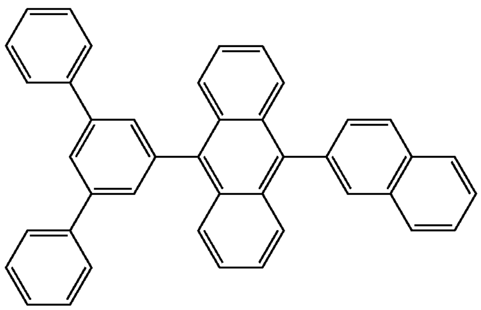
H42
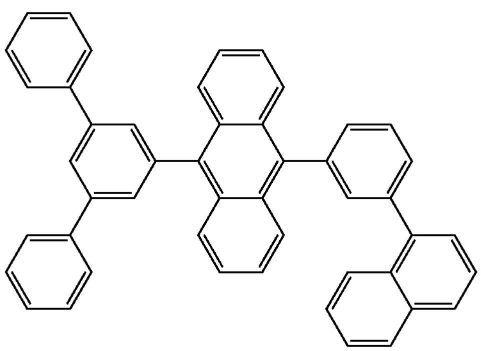
H43
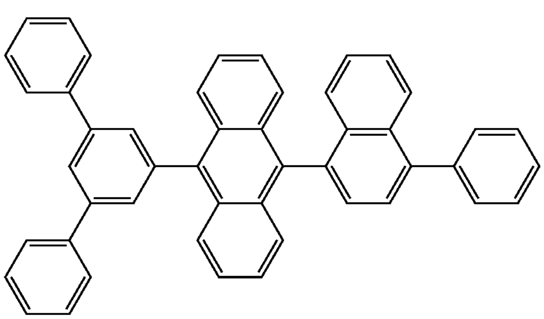
H44
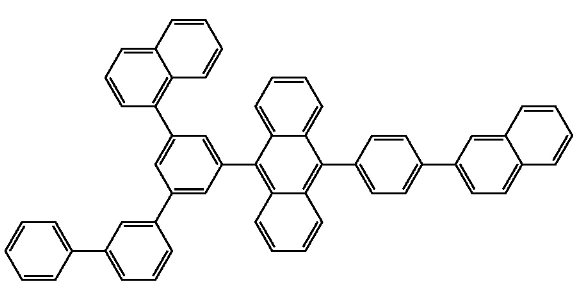
-continued
H45
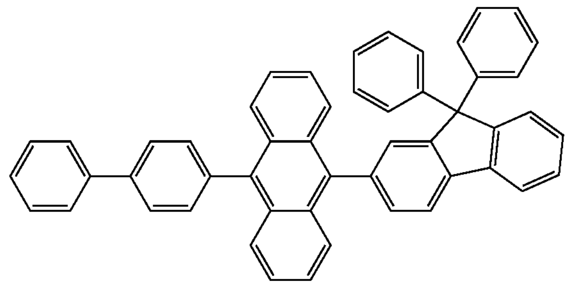
H46
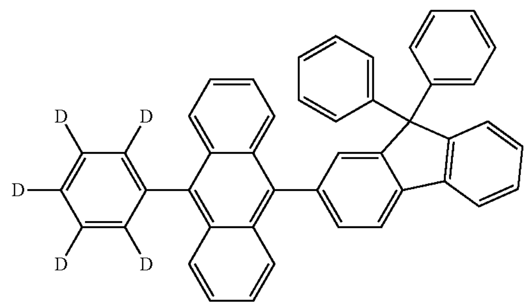
H47
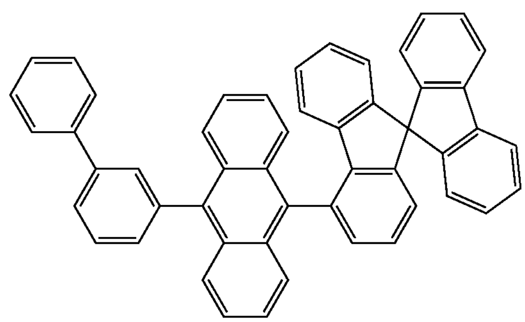
H48
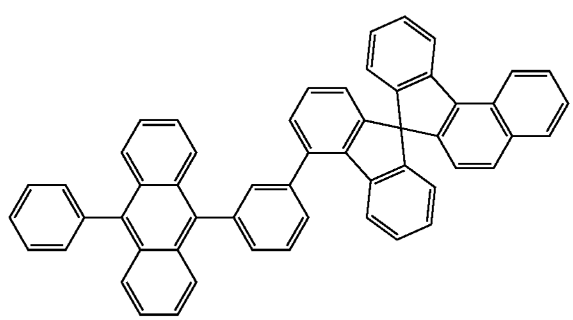
H49
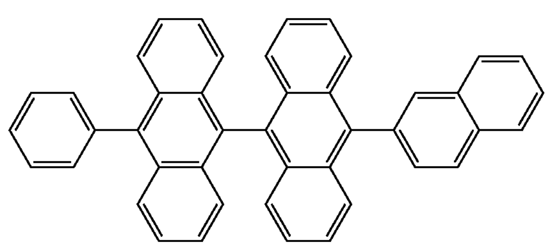

-continued
H50
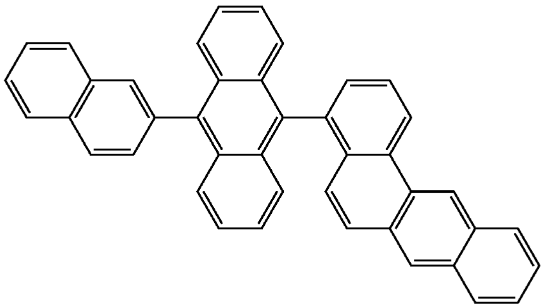
H51
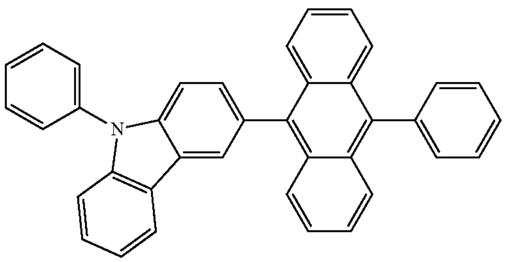
H52
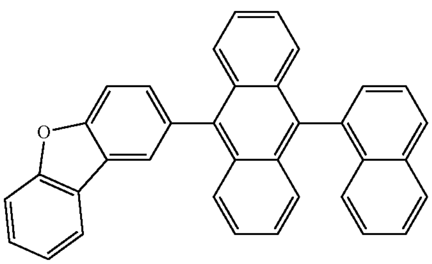 [SMILES: c1ccc2c(-c3c4ccccc4c(-c4ccc5oc6ccccc6c5c4)c4ccccc34)cccc2c1]
H53
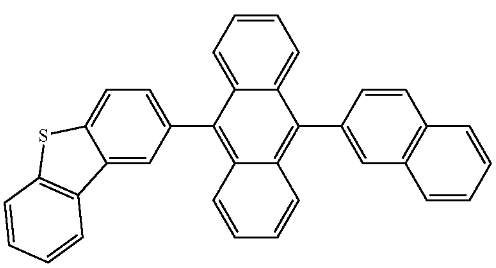
H54
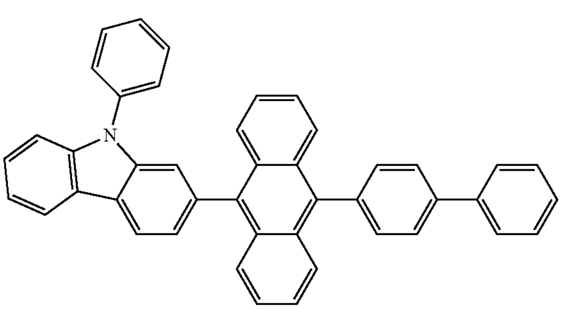
-continued
H55
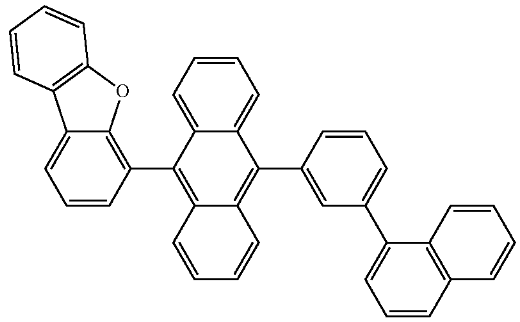
H56
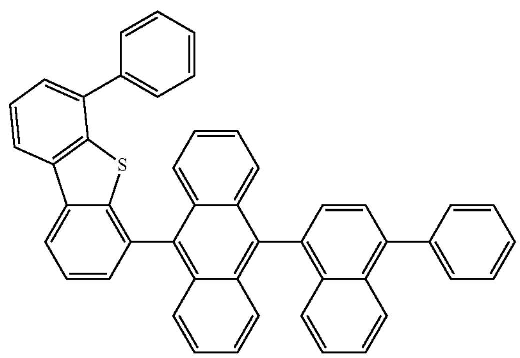
H57
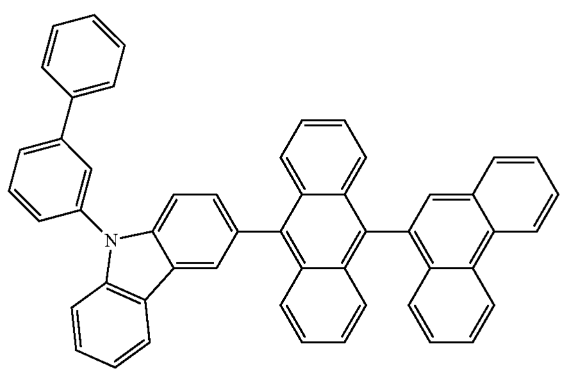
H58
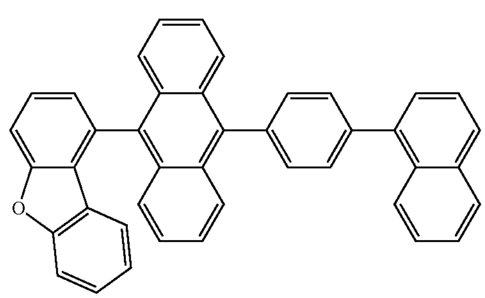

-continued
H59
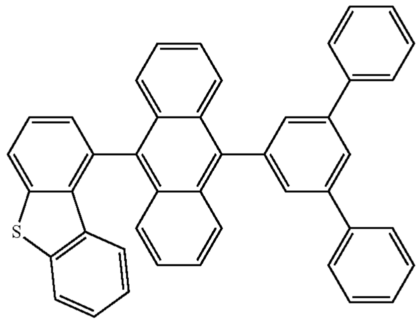
H60
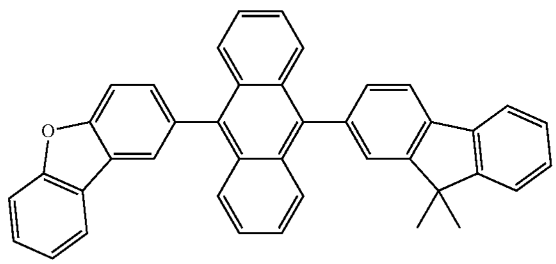 [SMILES: CC1(C)c2ccccc2-c2ccc(-c3c4ccccc4c(-c4ccc5oc6ccccc6c5c4)c4ccccc34)cc21]
H61
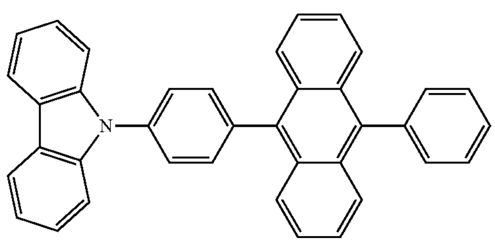 [SMILES: c1ccc(-c2c3ccccc3c(-c3ccc(-n4c5ccccc5c5ccccc54)cc3)c3ccccc23)cc1]
H62
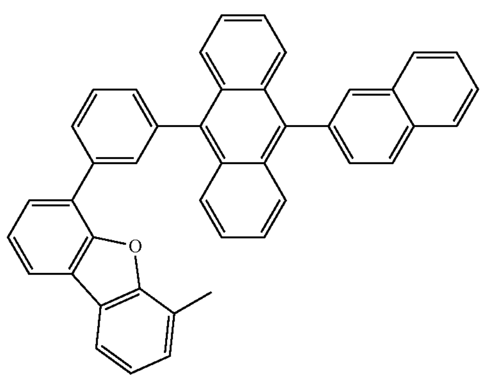
H63
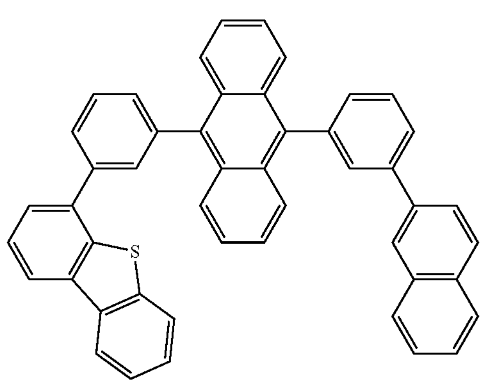
-continued
H64
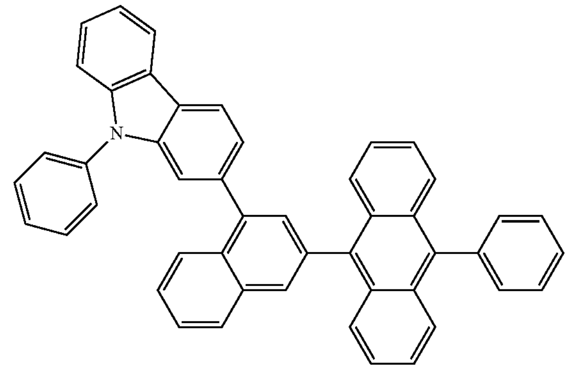
H65
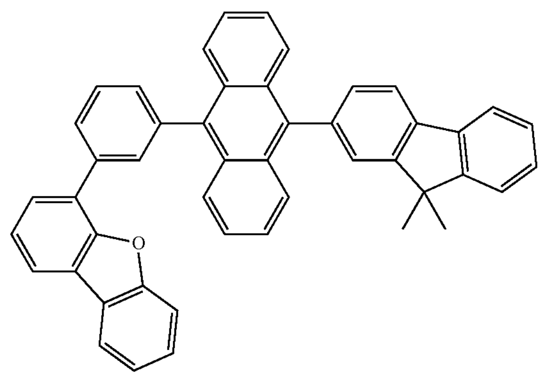
H66
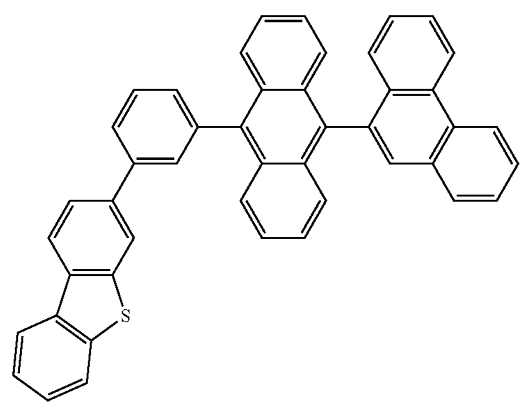
H67
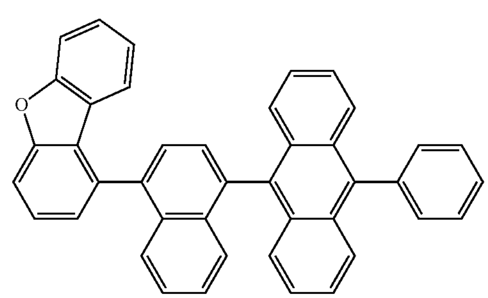 [SMILES: c1ccc(-c2c3ccccc3c(-c3ccc(-c4cccc5oc6ccccc6c45)c4ccccc34)c3ccccc23)cc1]

-continued
H68
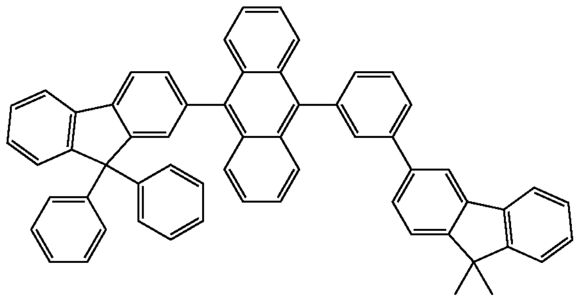
H69
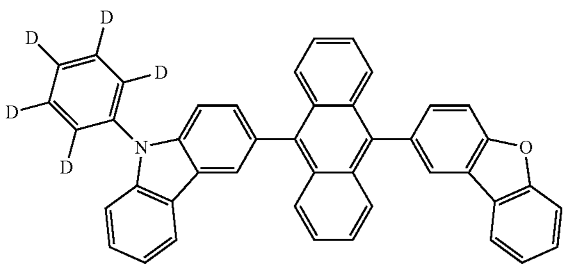
H70
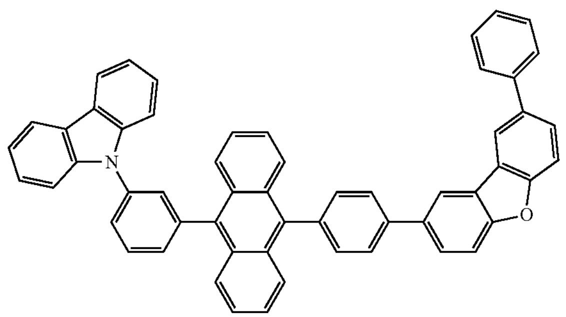
H71
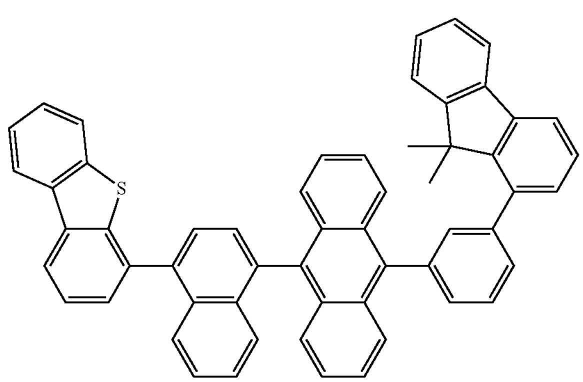
H72
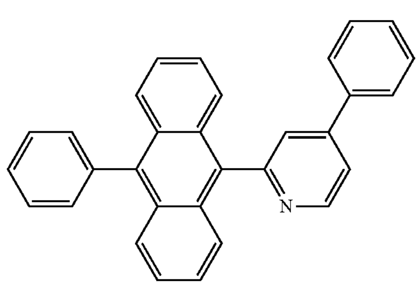
-continued
H73
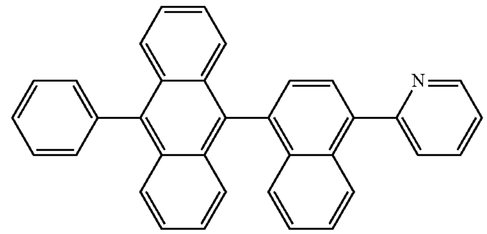
H74
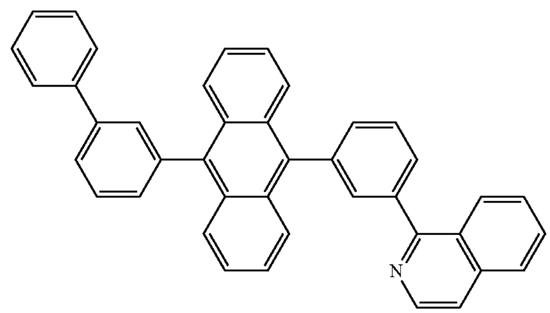
H75
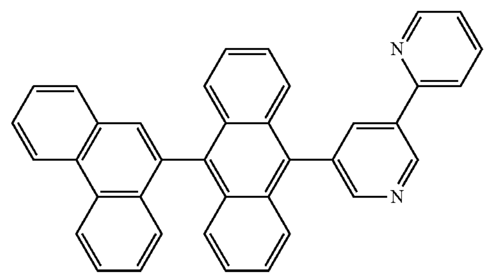
H76
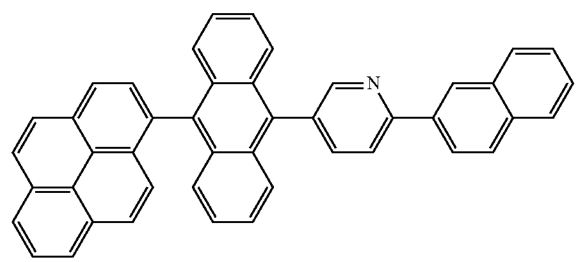
H77
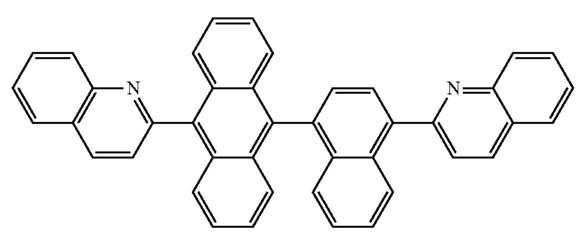
H78
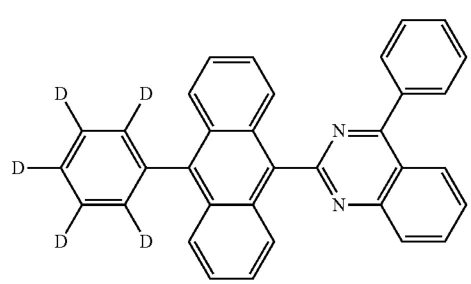

-continued
H79
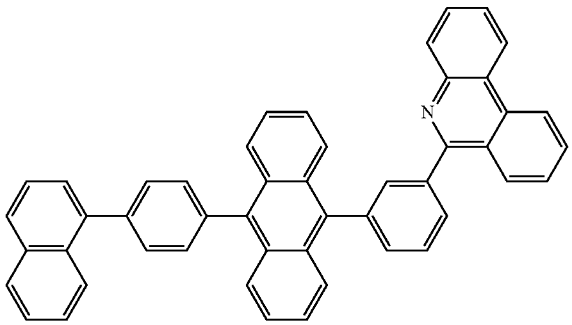
H80
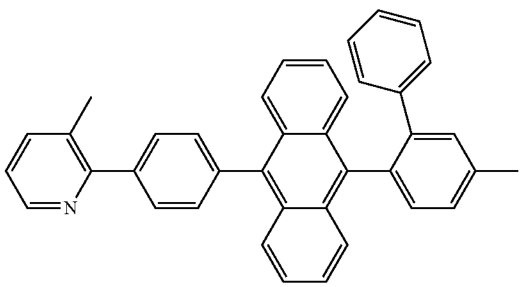
H81
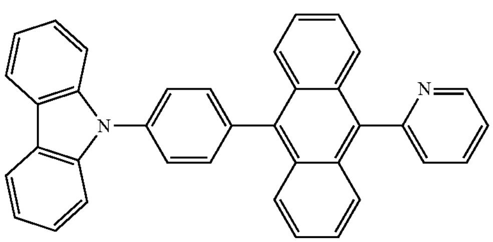
H82
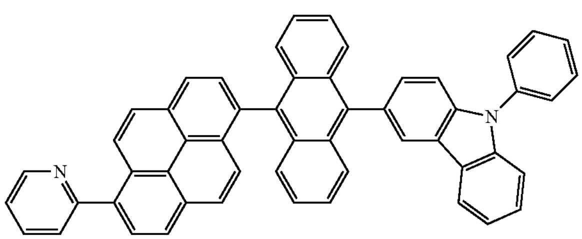
H83
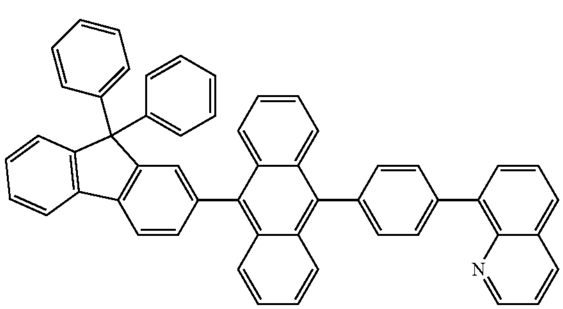
-continued
H84
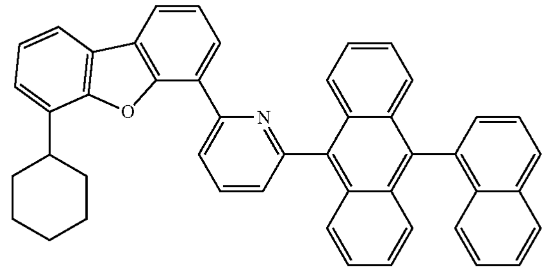
H85
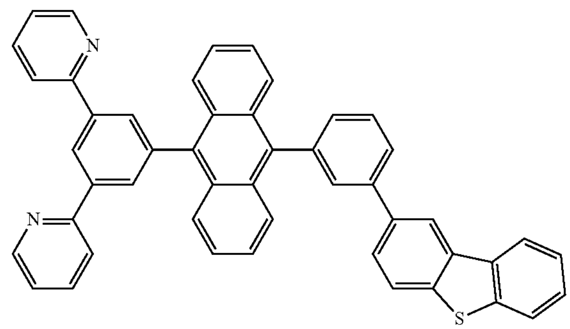
H86
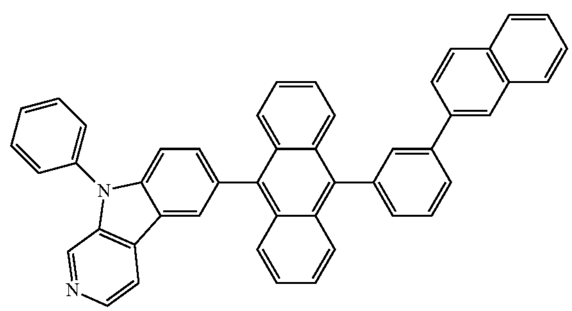
H87
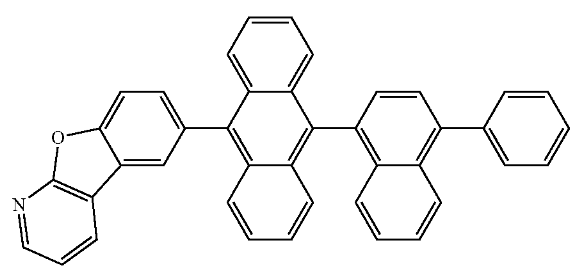

-continued
H88
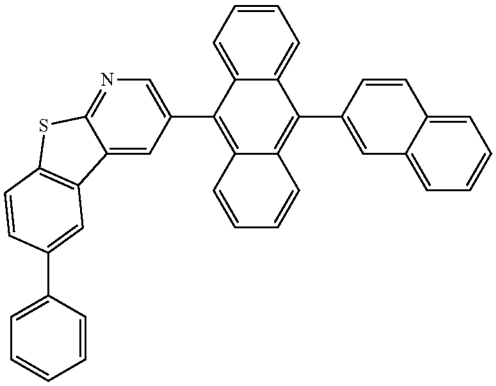
H89
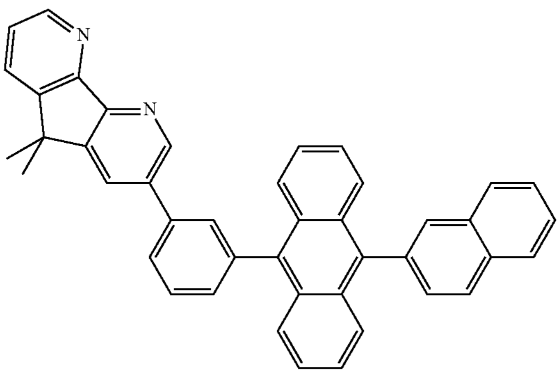
H90
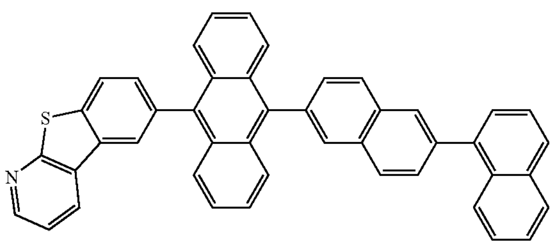
H91
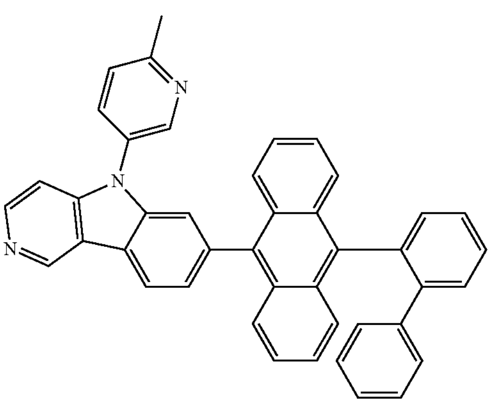
-continued
H92
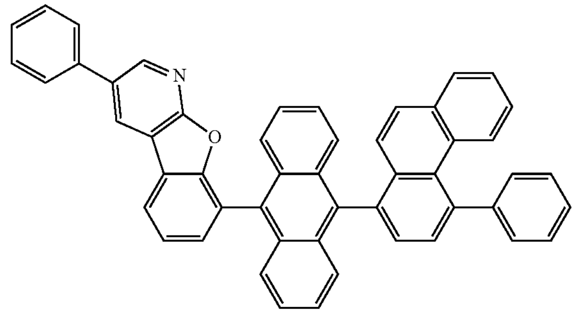
H93
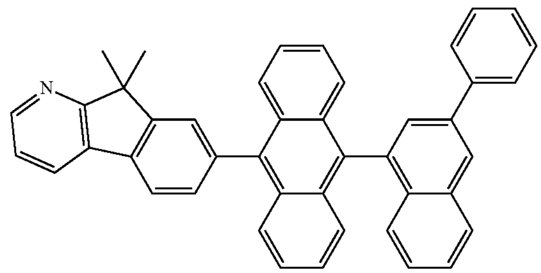
H94
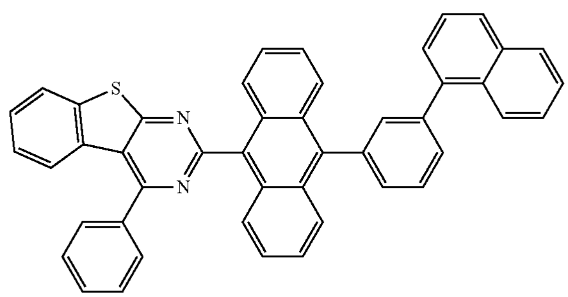
H95
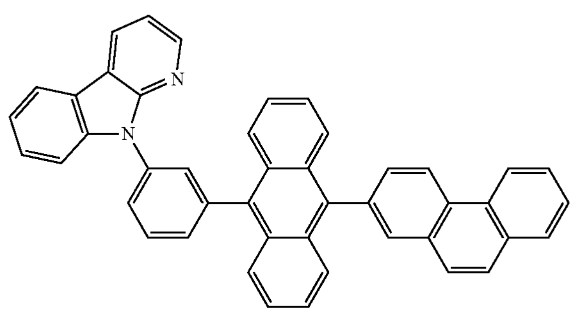

H96
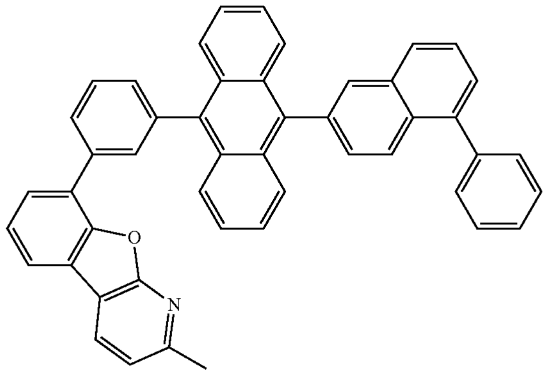
H97
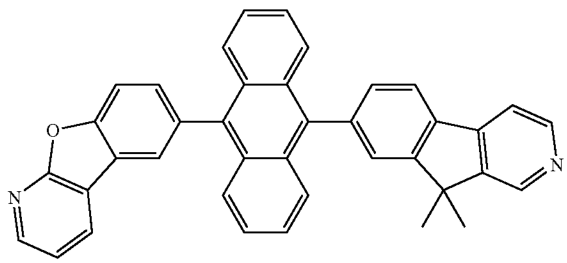
H98
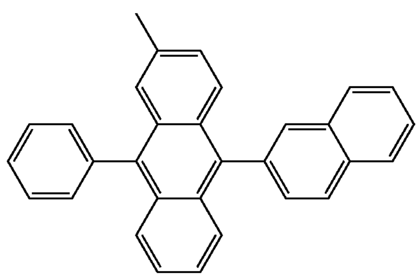
H99
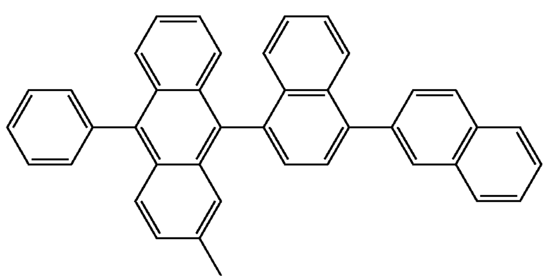
H100
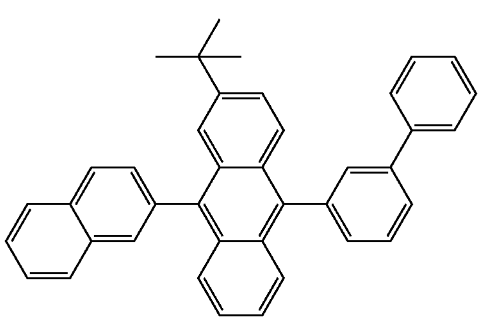
H101
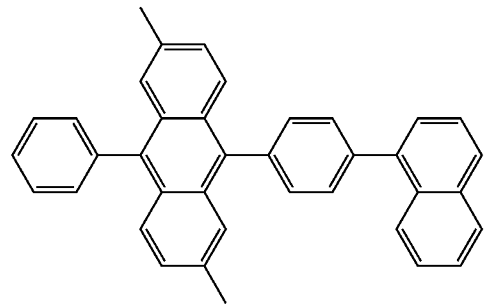
H102
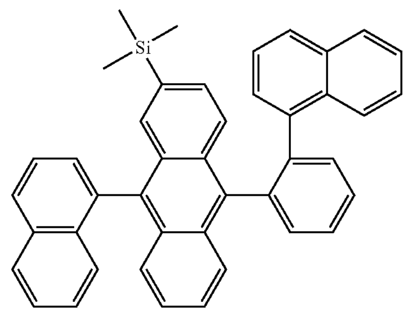
H103
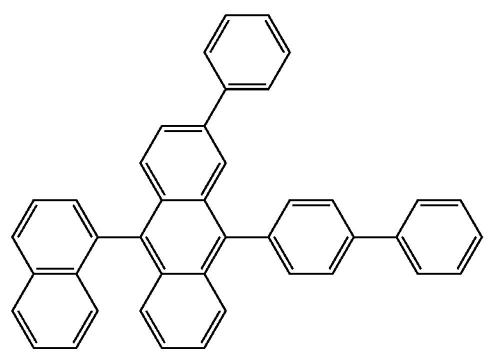
H104
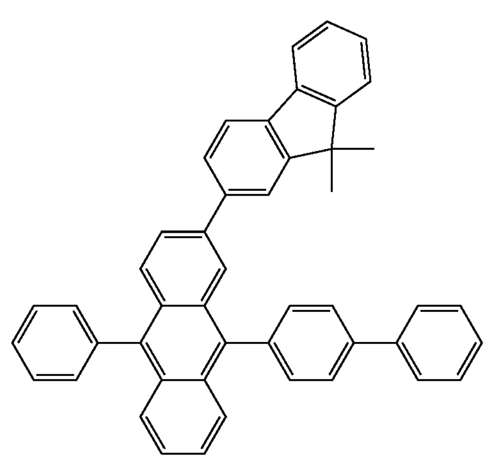

H105
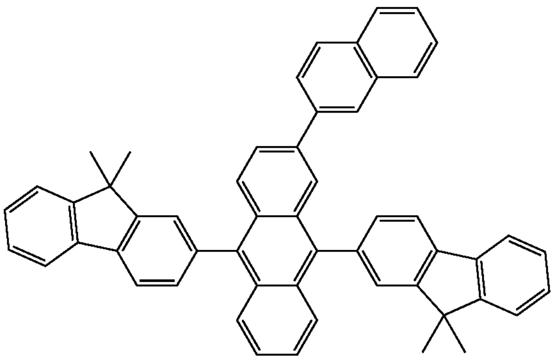
H106
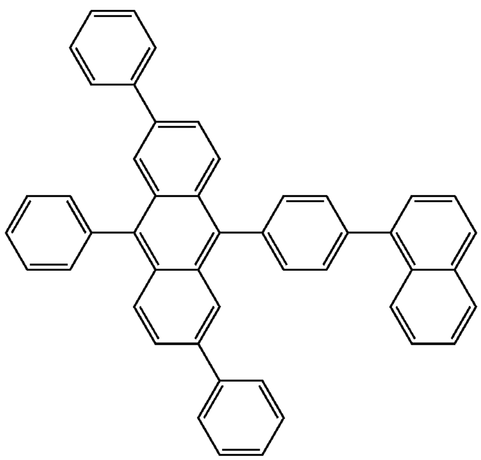
H107
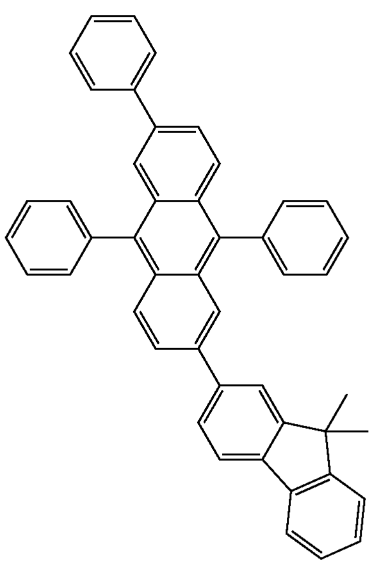
H108
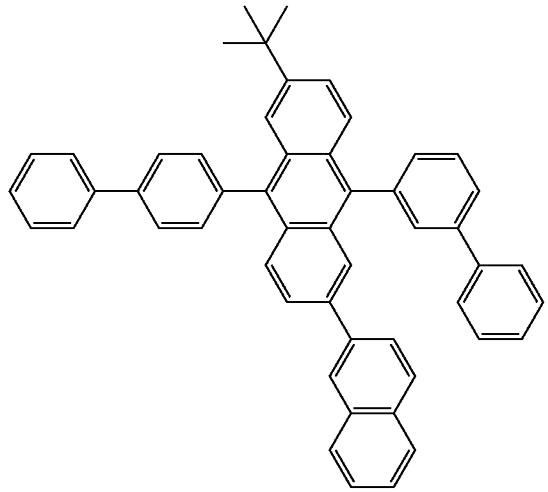
H109
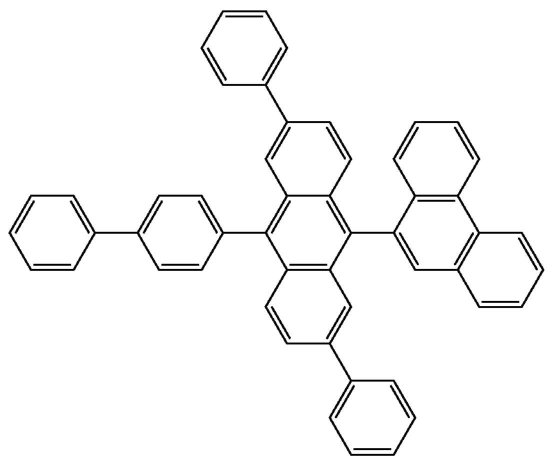
H110
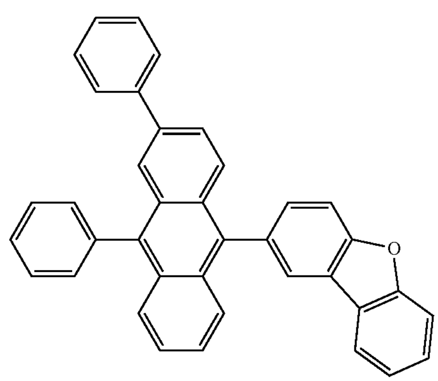

H111
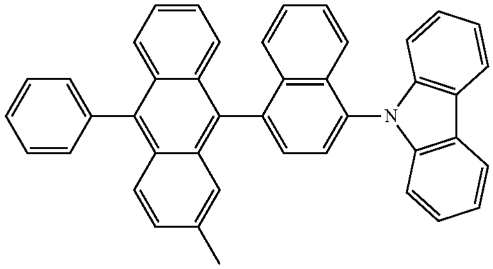
H112
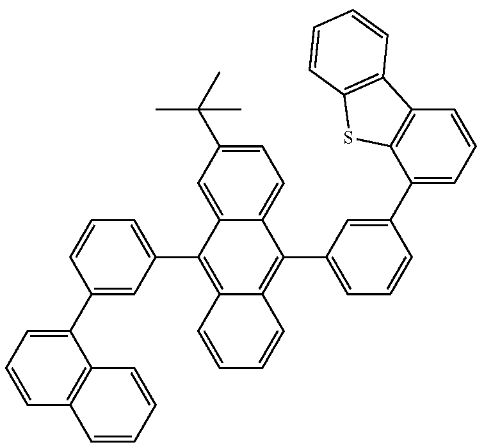
H113
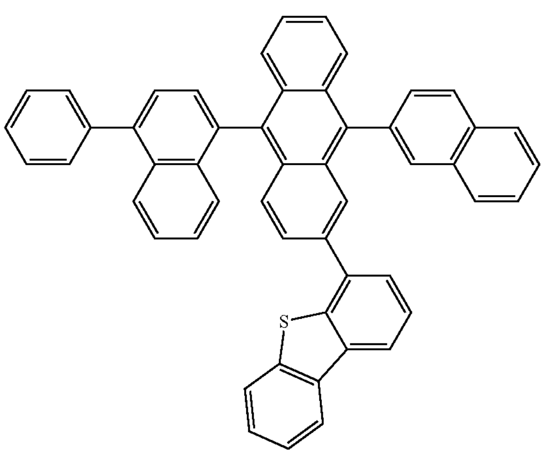
H114
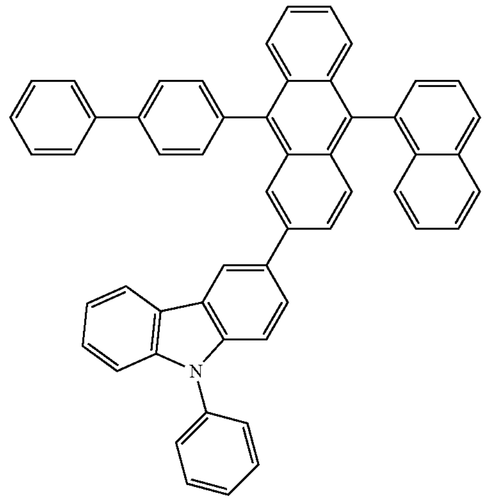
H115
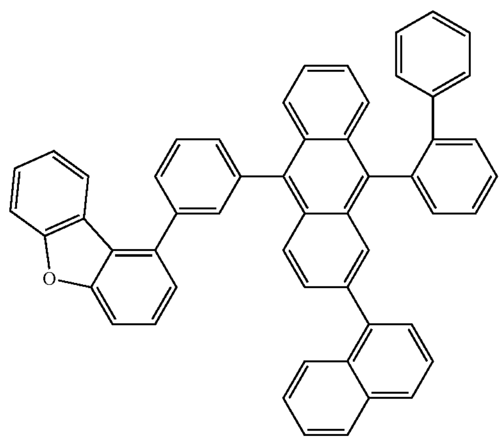
H116
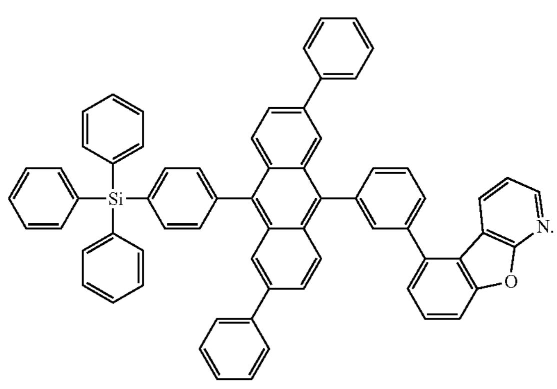
In one embodiment, the second compound represented by Formula 2 may be selected from Compounds D1 to D212, but is not limited thereto:

D1
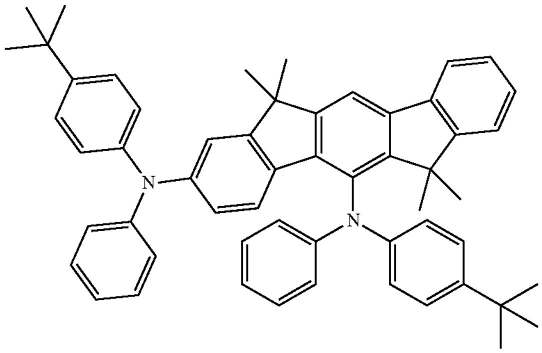
D2
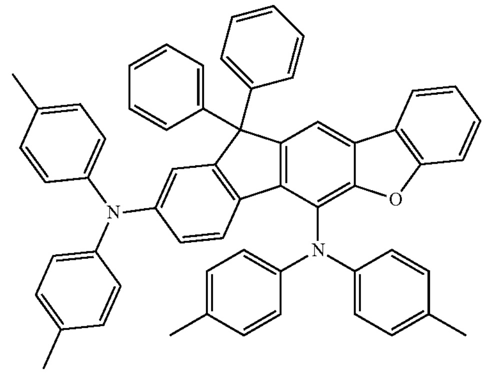
D3
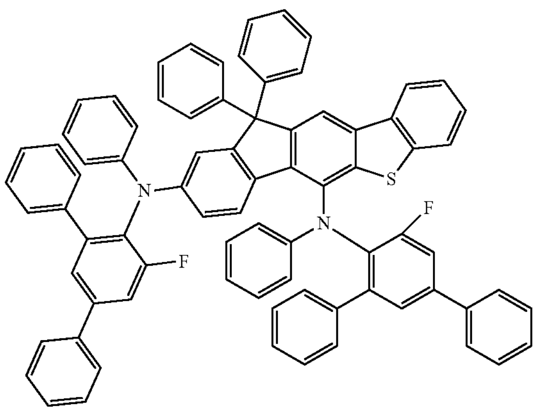
D4
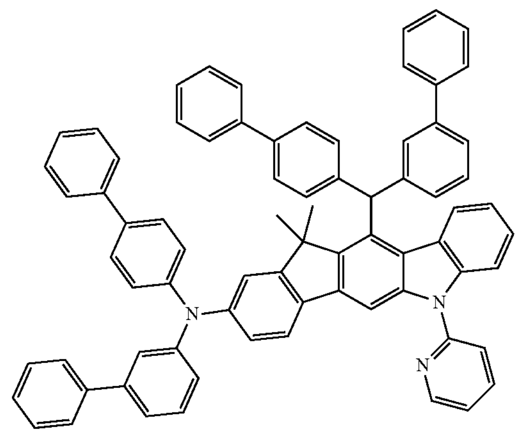
D5
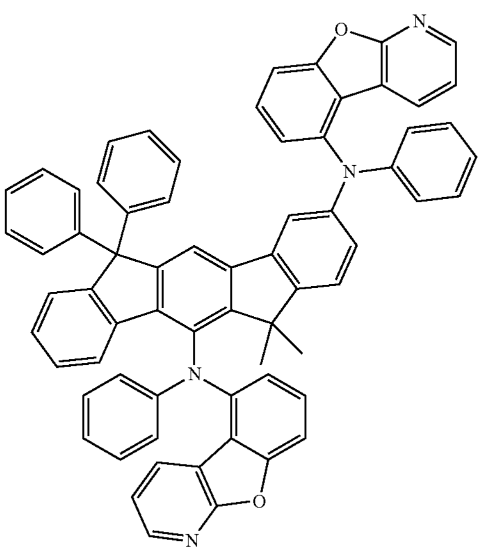
D6
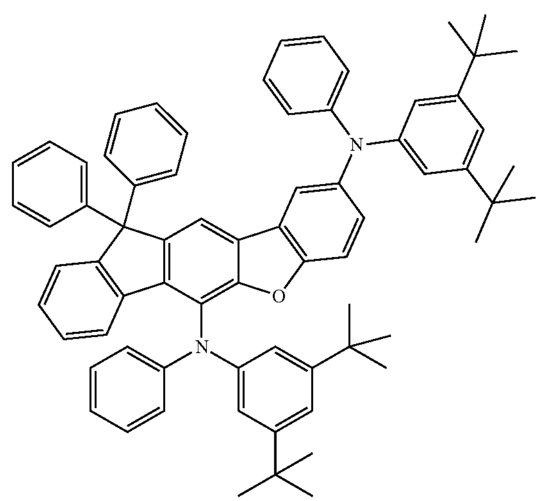

-continued
D7
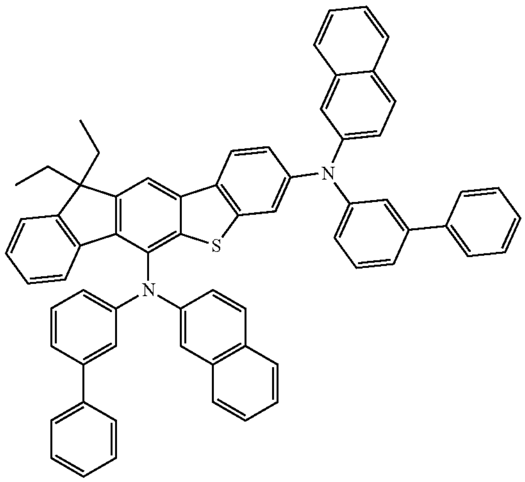
D8
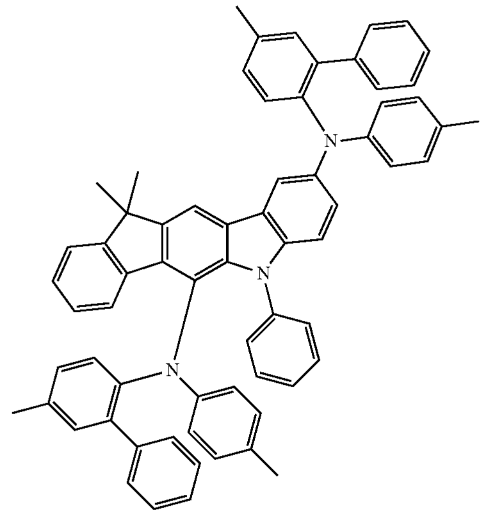
D9
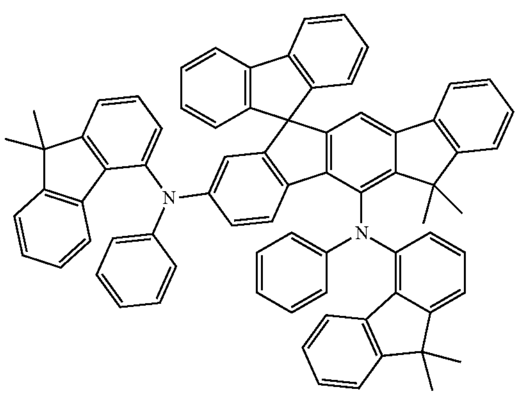
D10
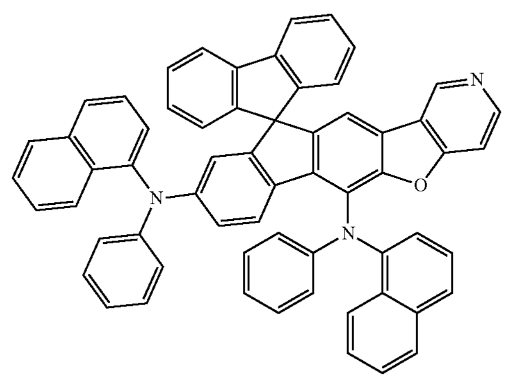
D11
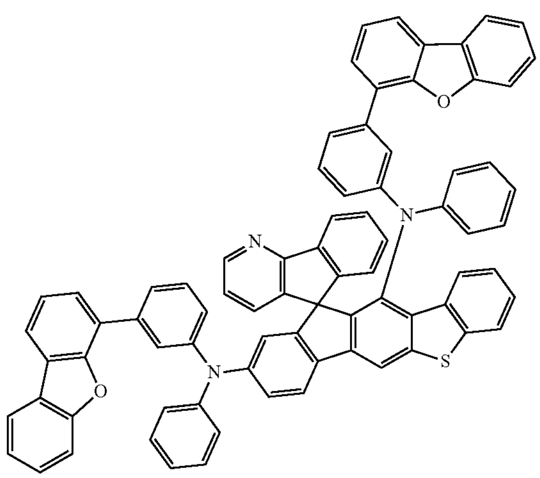
D12
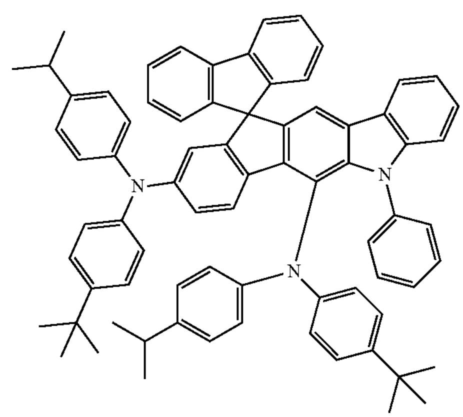

-continued
D13
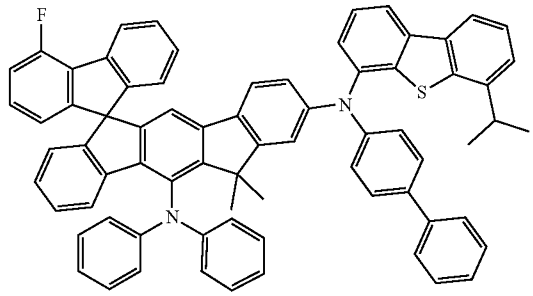
D14
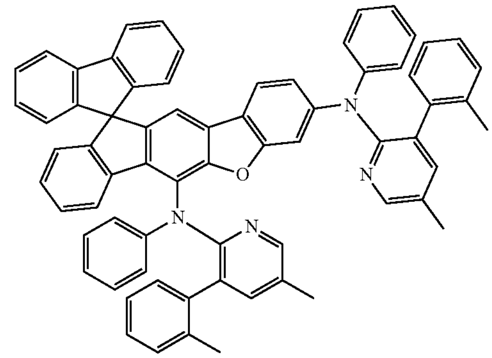
D15
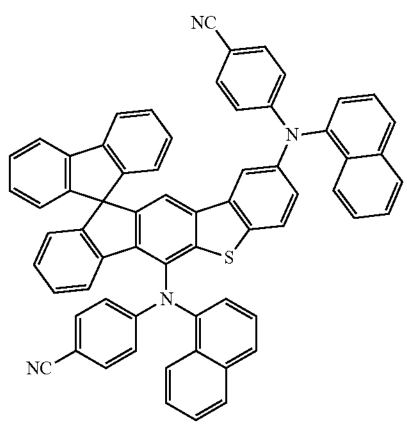
D16
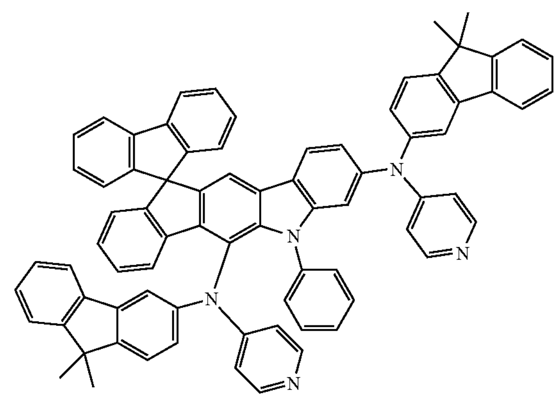
D17
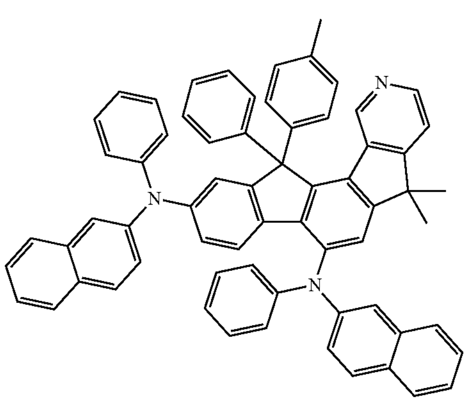
D18
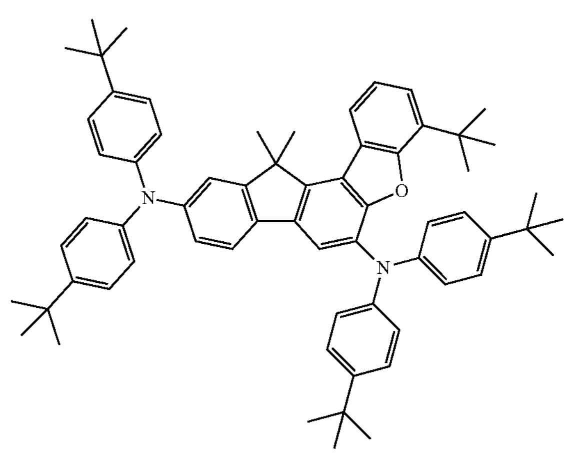

-continued
D19
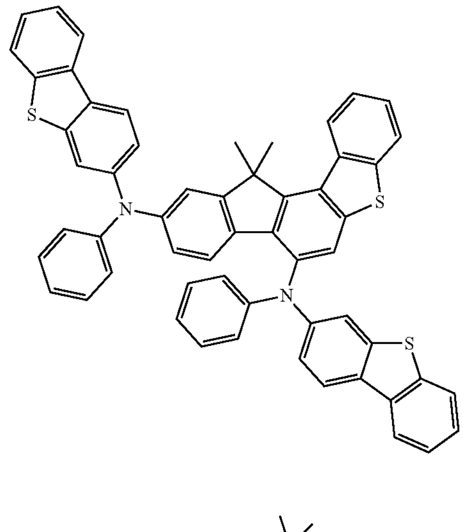
D20
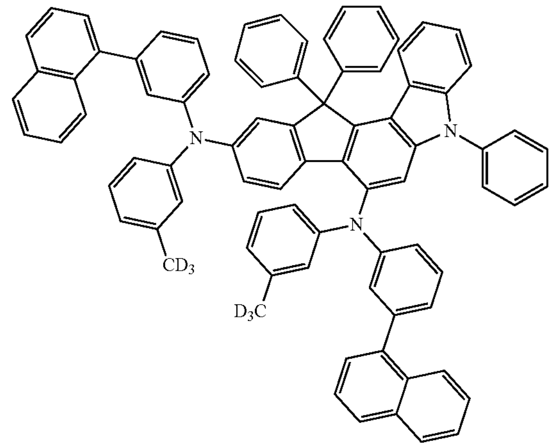
D21
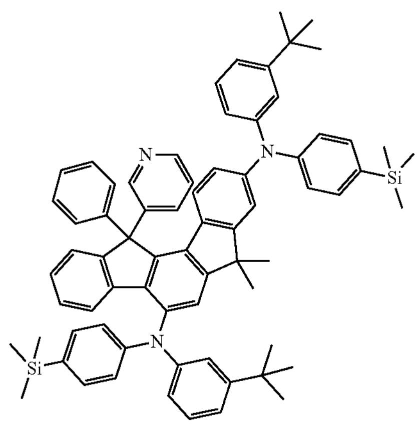
D22
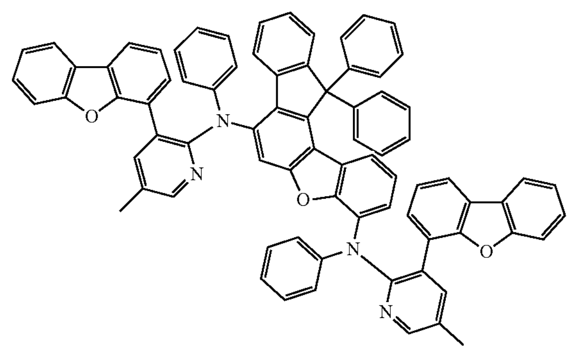
D23
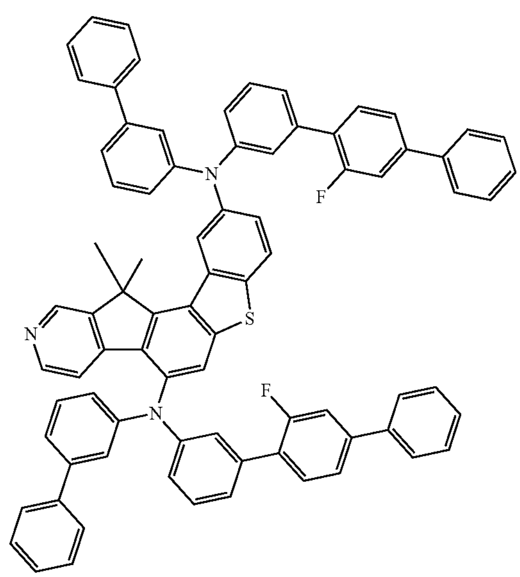
D24
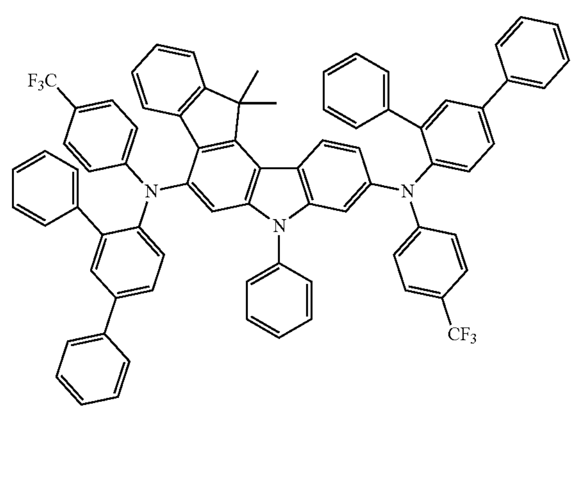

-continued
D25
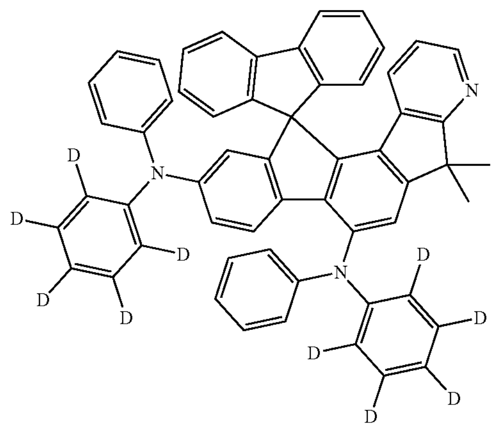
D26
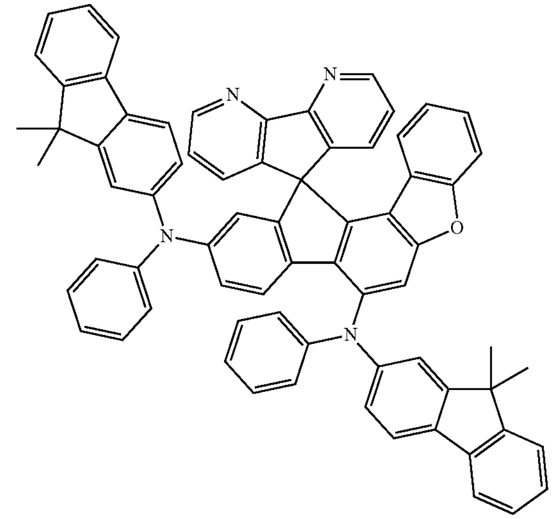
D27
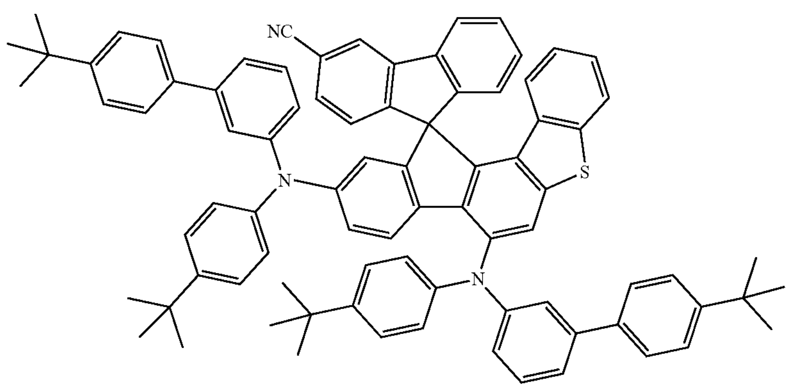
D28
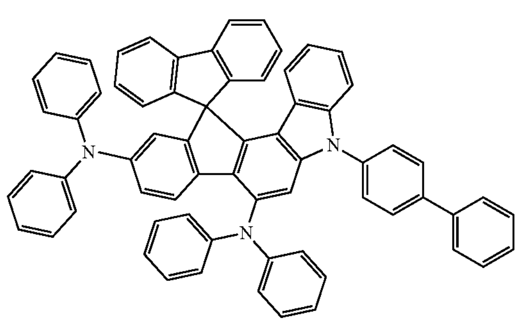
D29
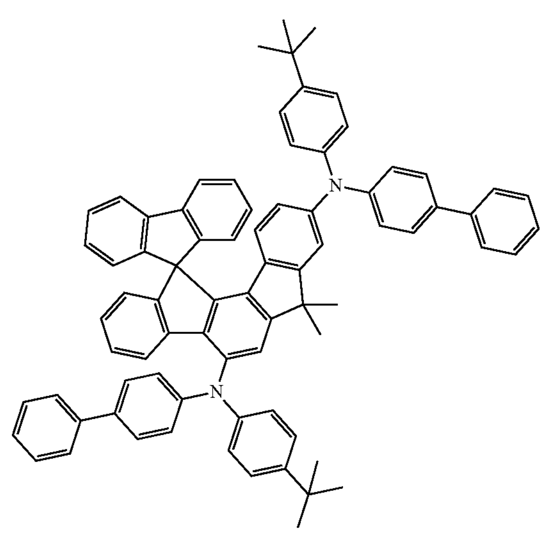

-continued
D30
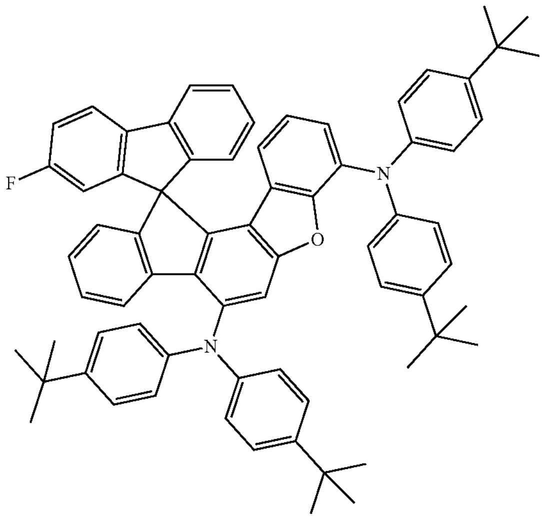
D31
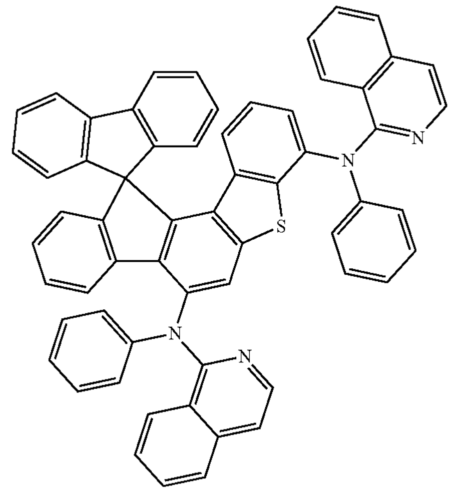
D32
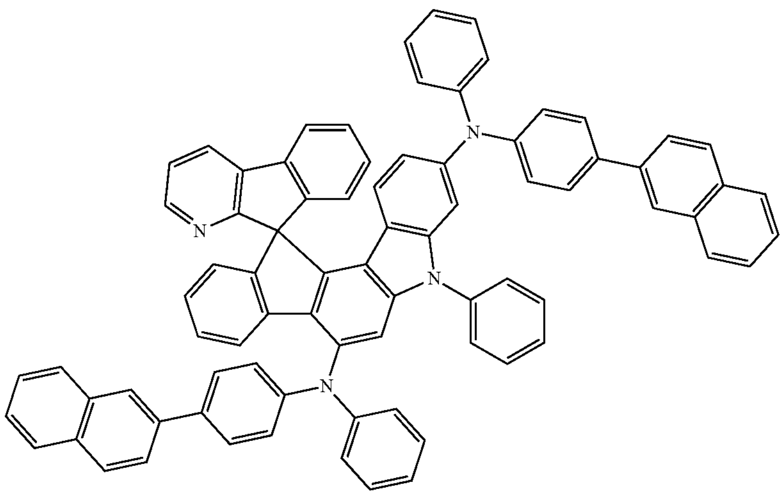
D33
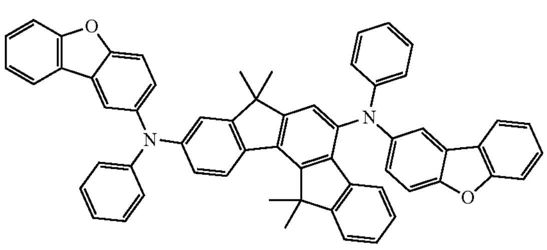
D34
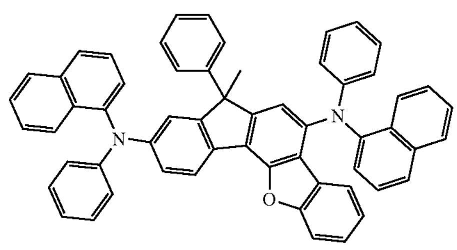
D35
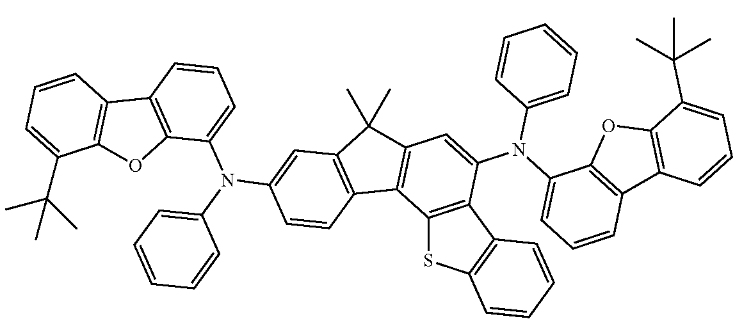

-continued
D36
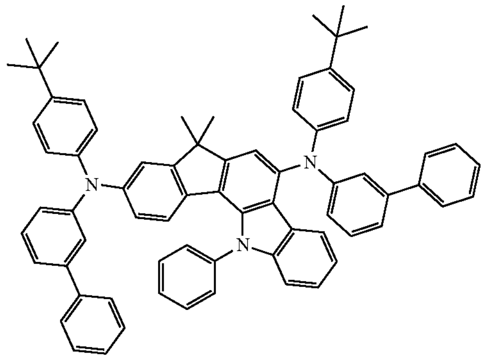
D37
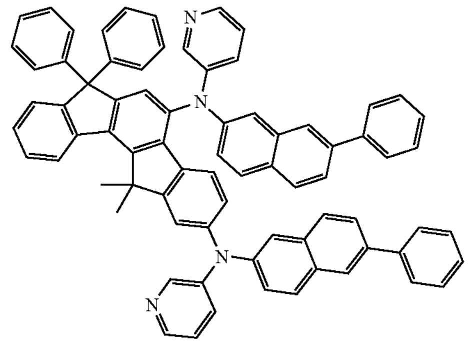
D38
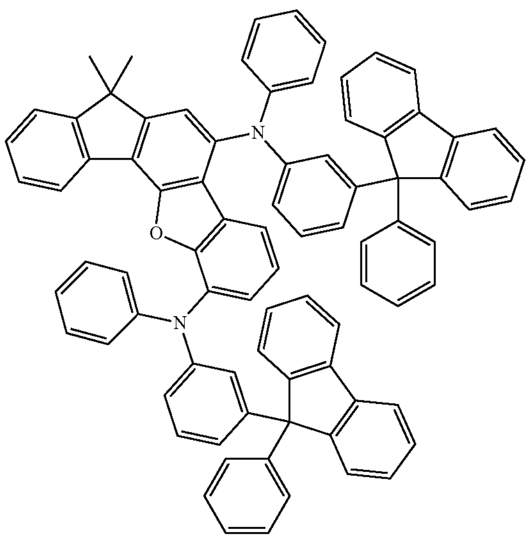
D39
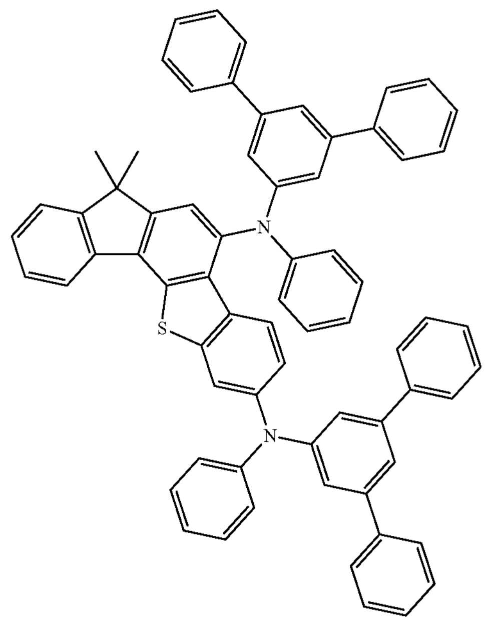
D40
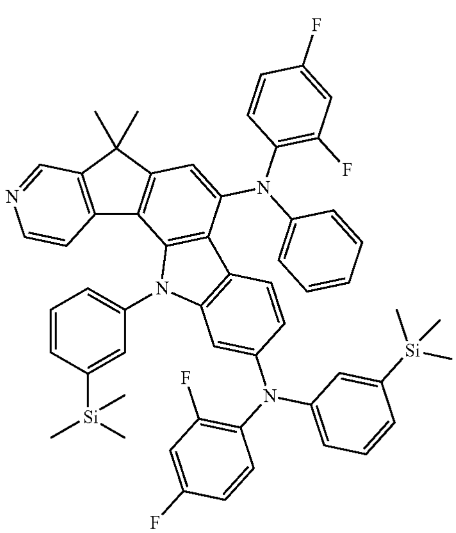
D41
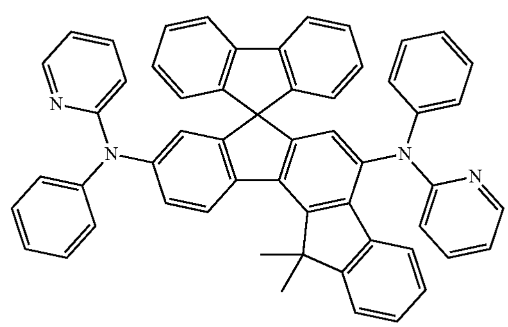

-continued
D42
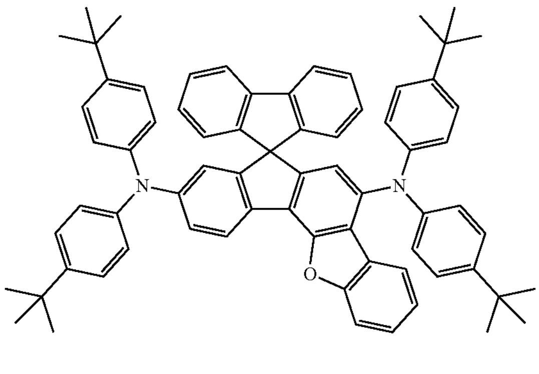
D43
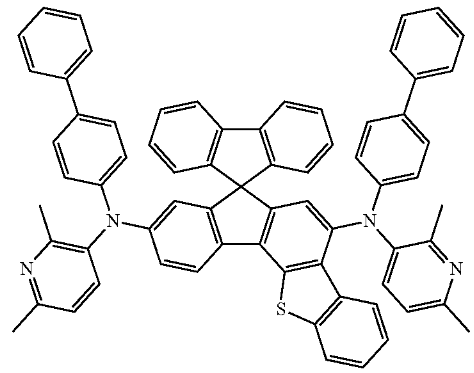
D44
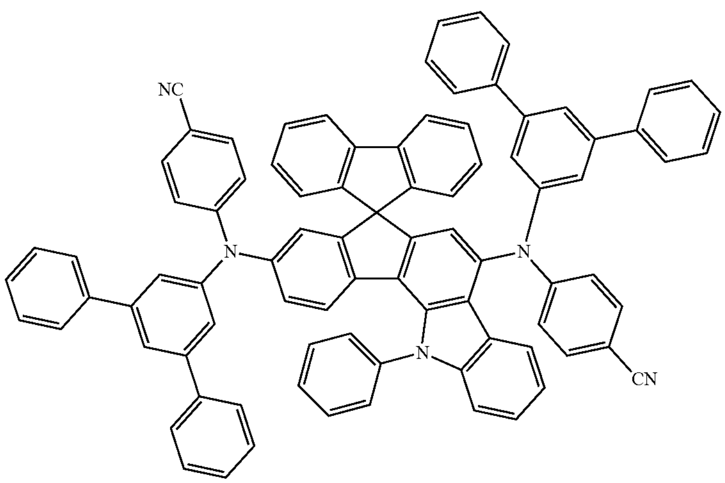
D45
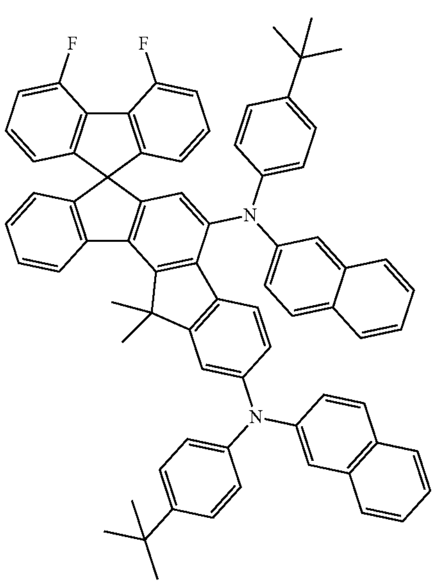
D46
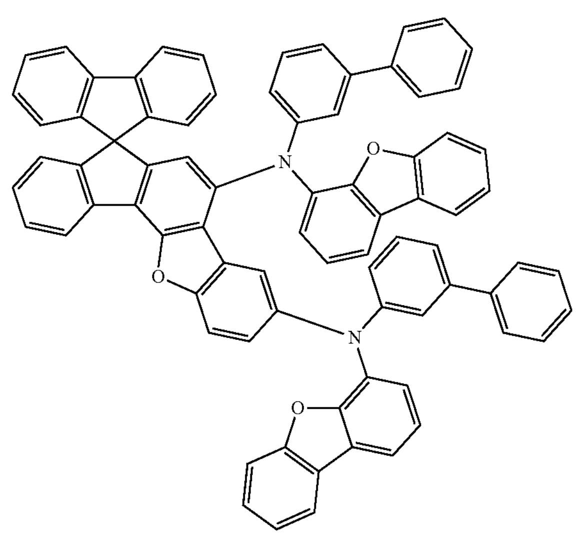

-continued
D47
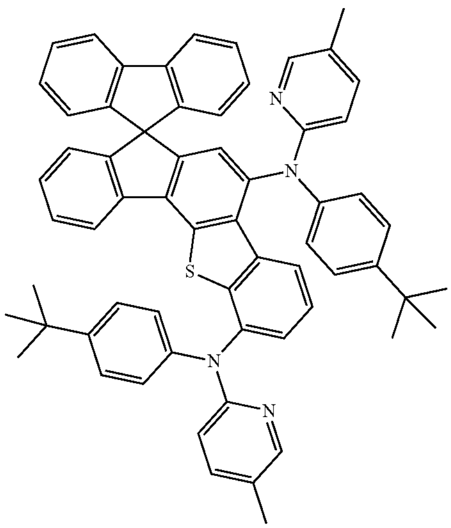
D48
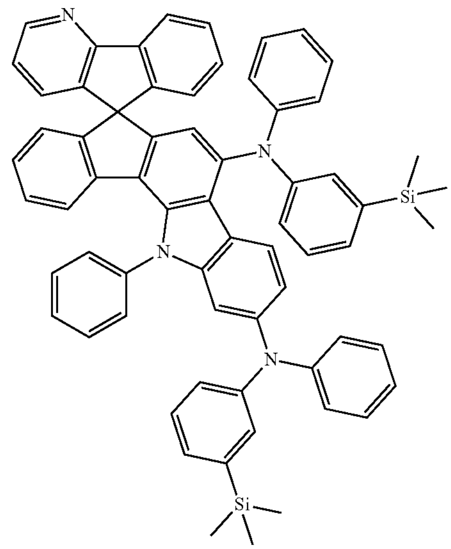
D49
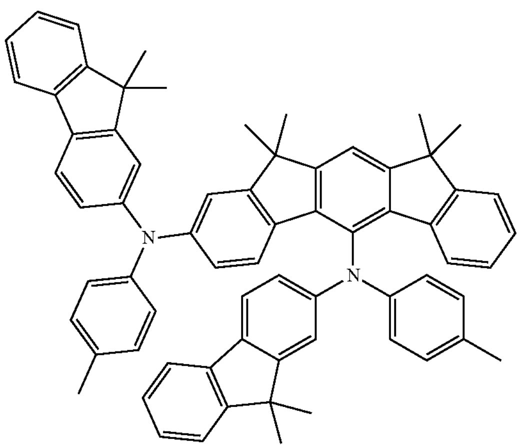
D50
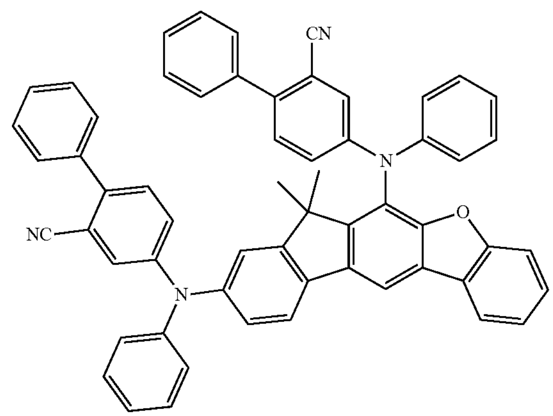
D51
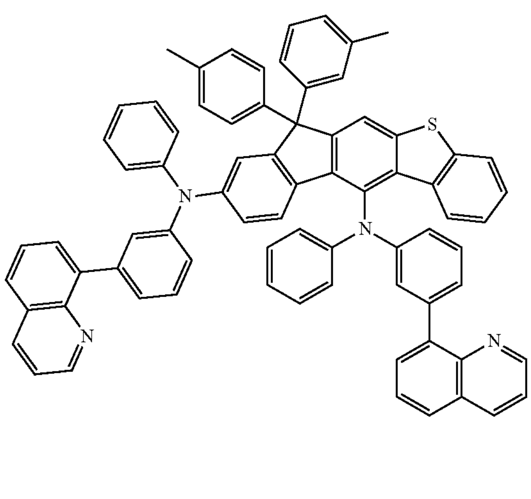
D52
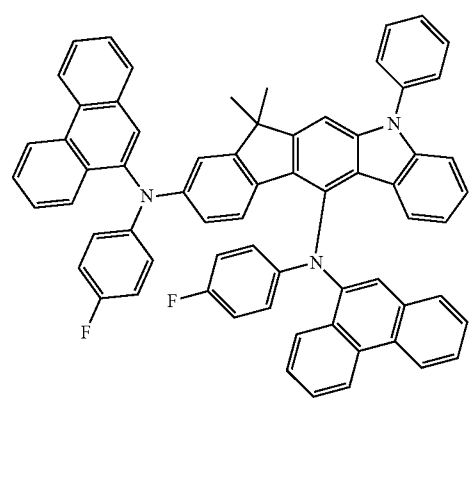

-continued
D53
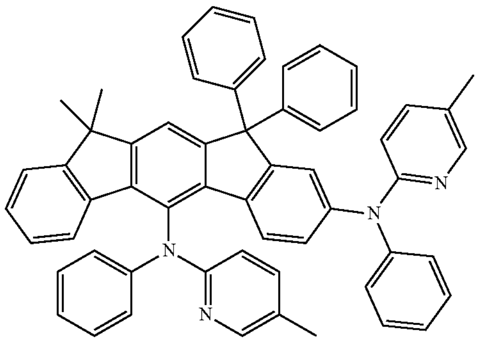
D54
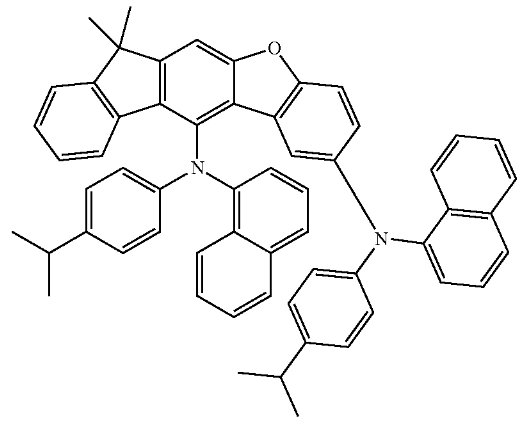
D55
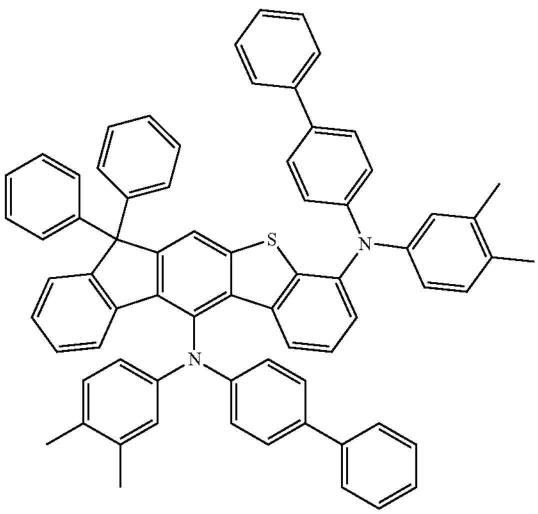
D56
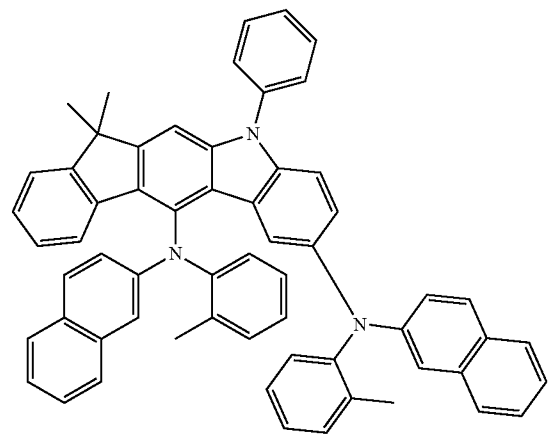
D57
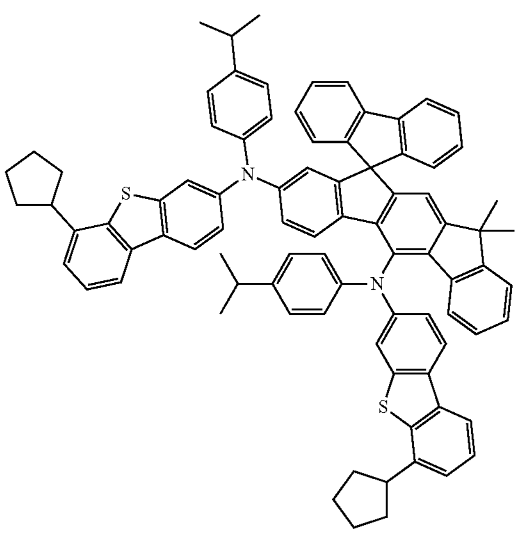
D58
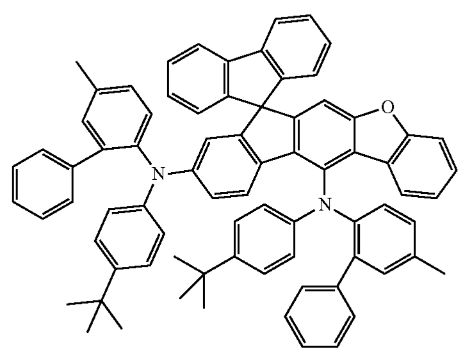

-continued
D59
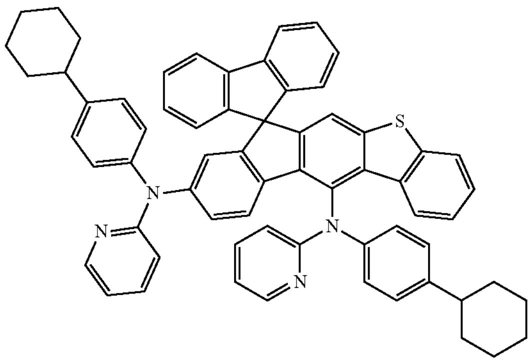
D60
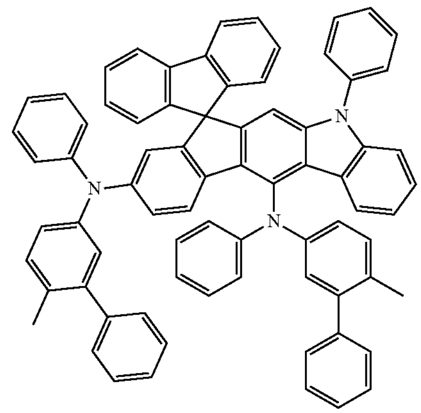
D61
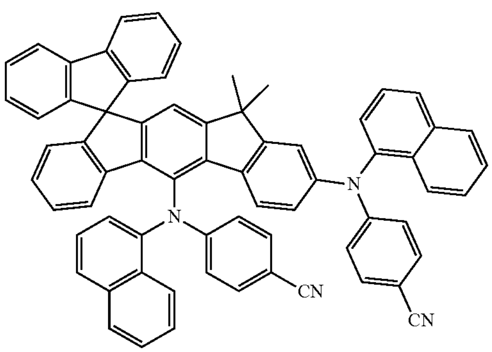
D62
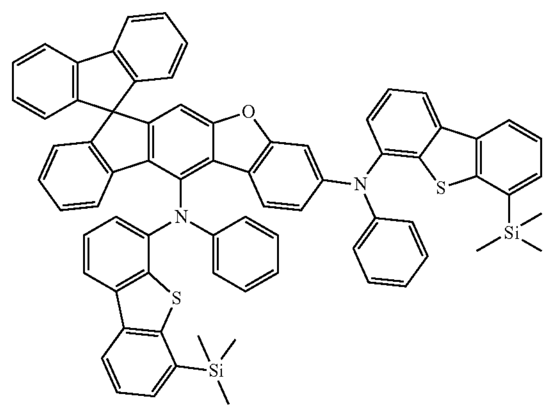
D63
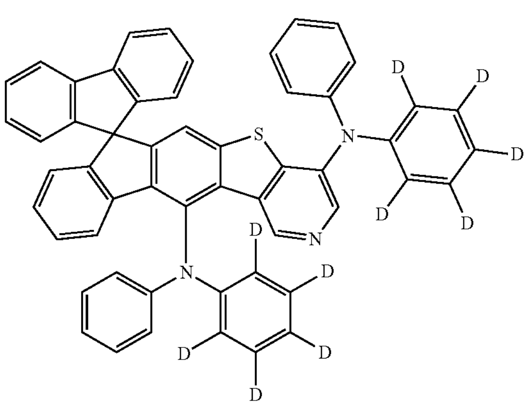
D64
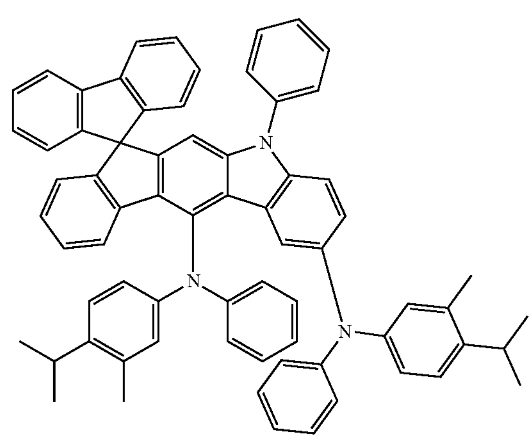

-continued
D65
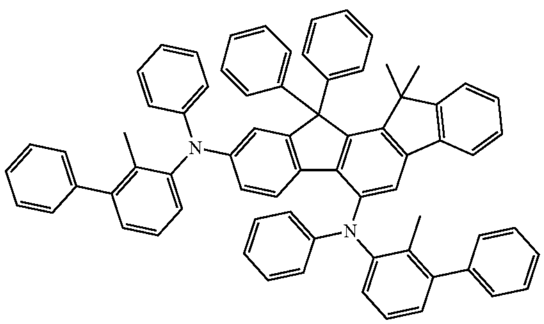
D66
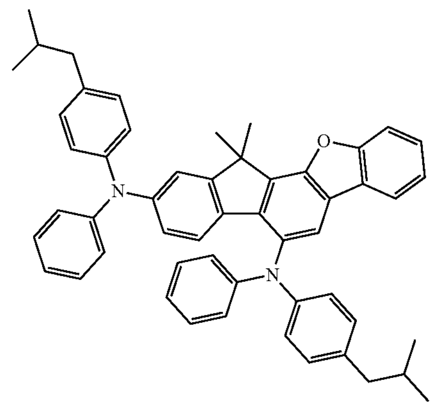
D67
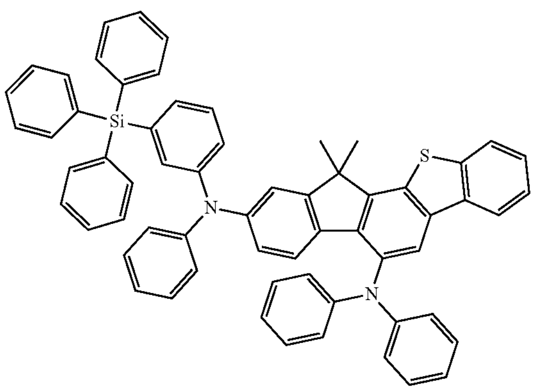
D68
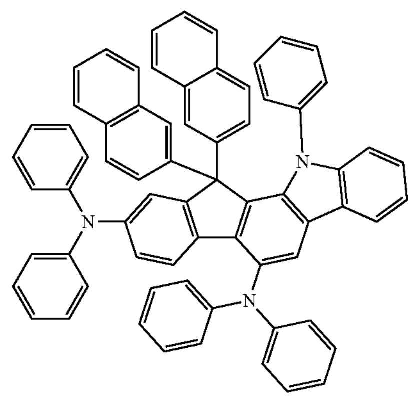
D69
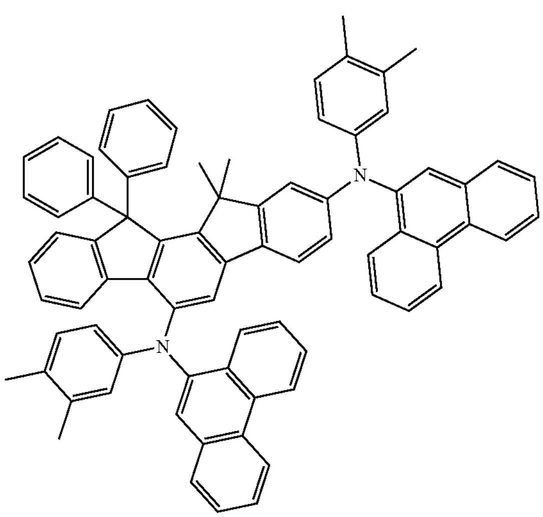
D70
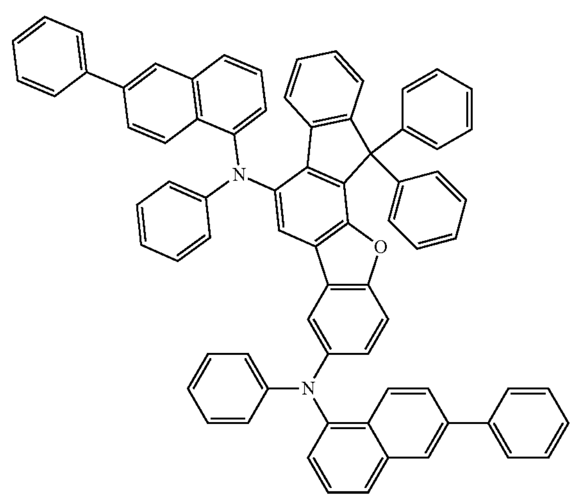

-continued
D71
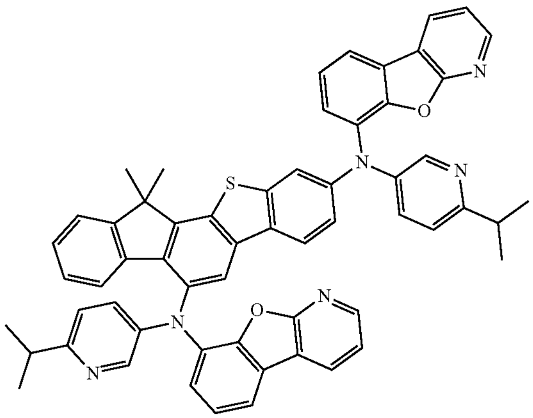
D72
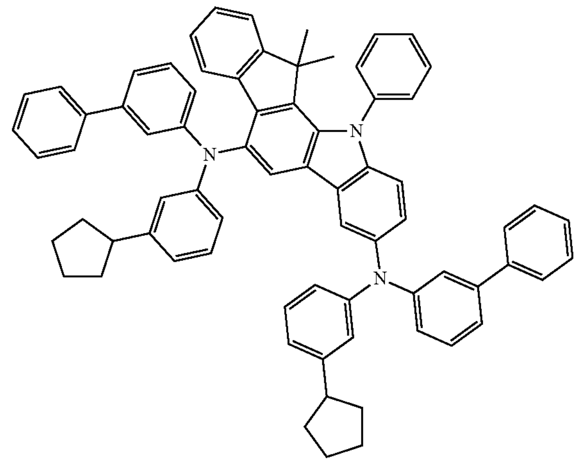
D73
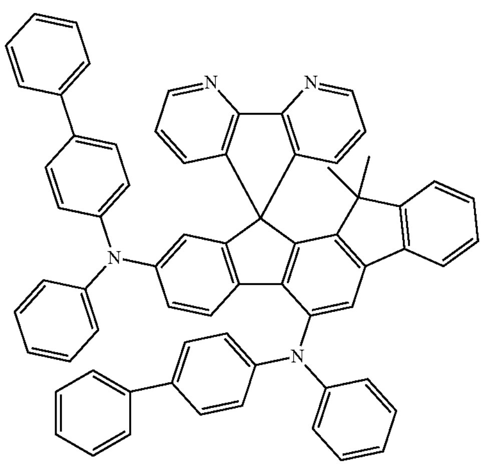
D74
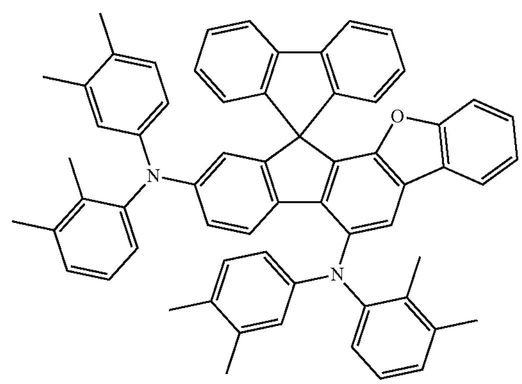
D75
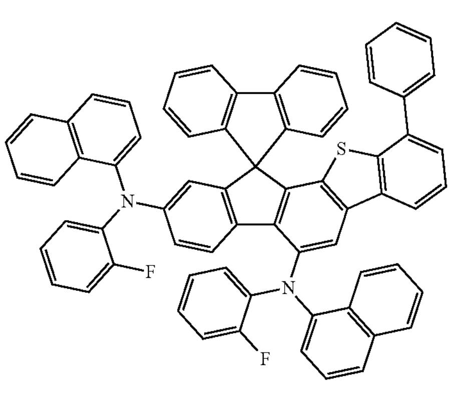
D76
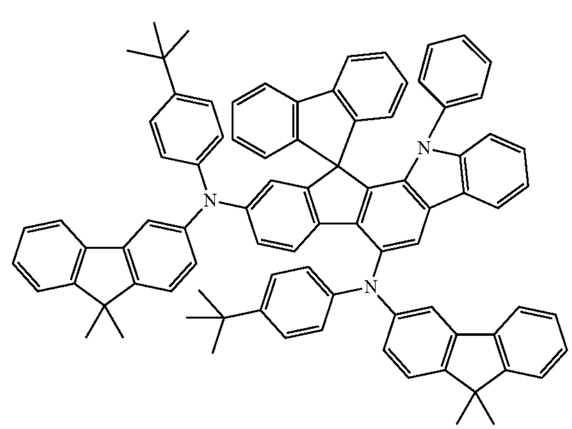

-continued
D77
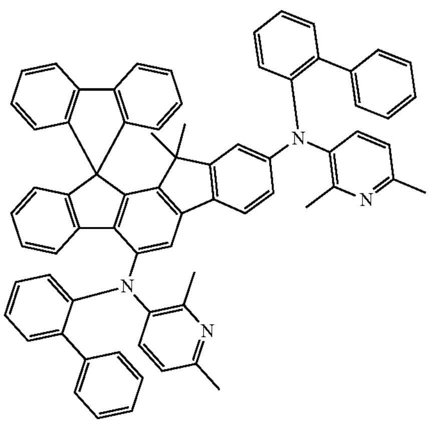
D78
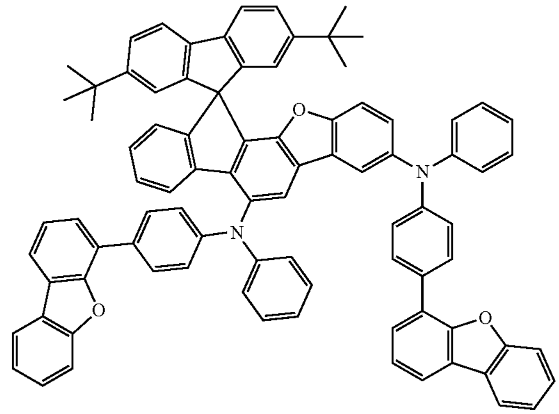
D79
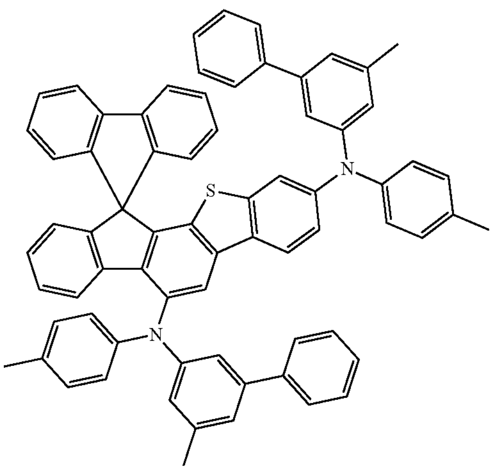
D80
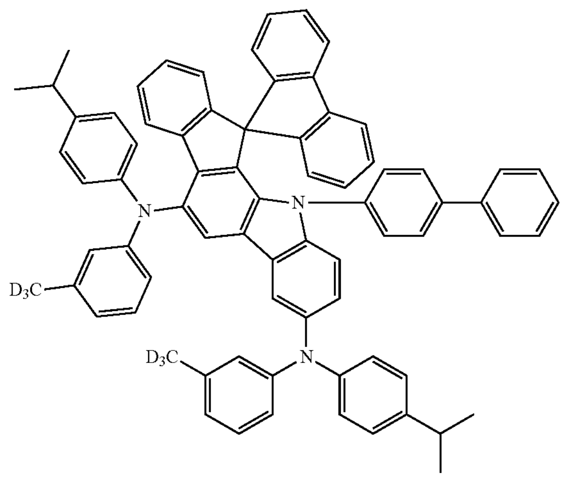
D81
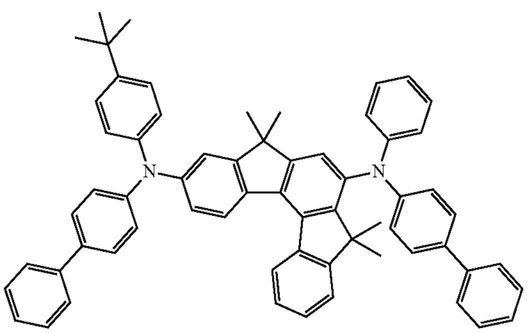
D82
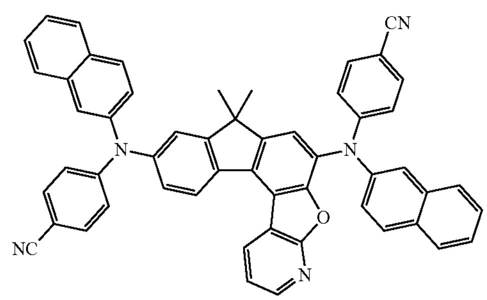
D83
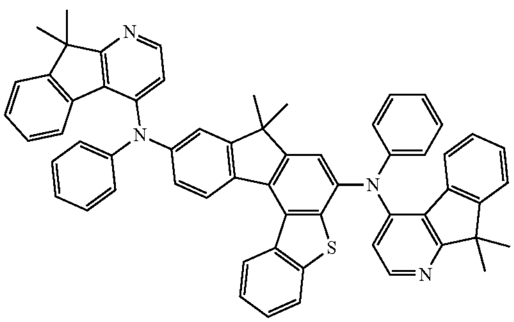
D84
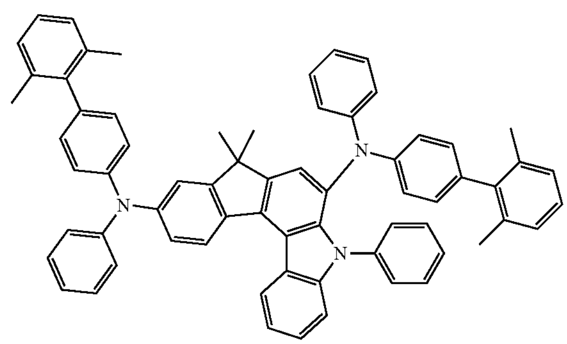

-continued
D85
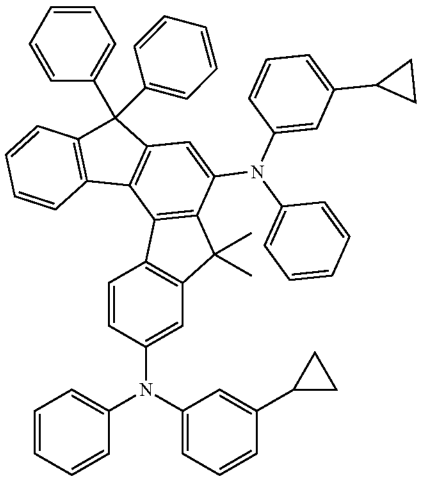
D86
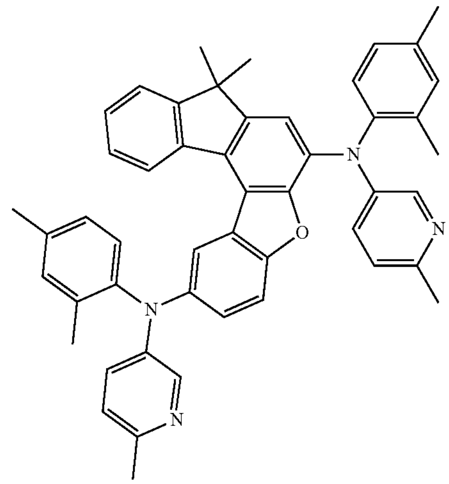
D87
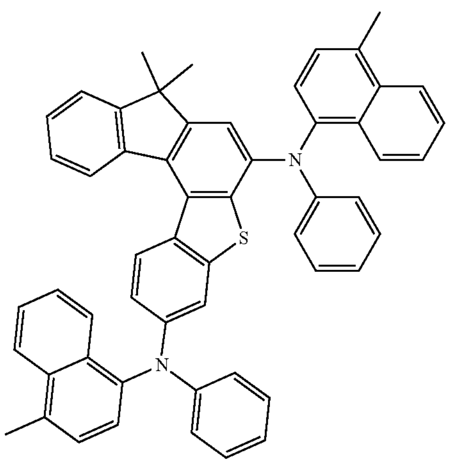
D88
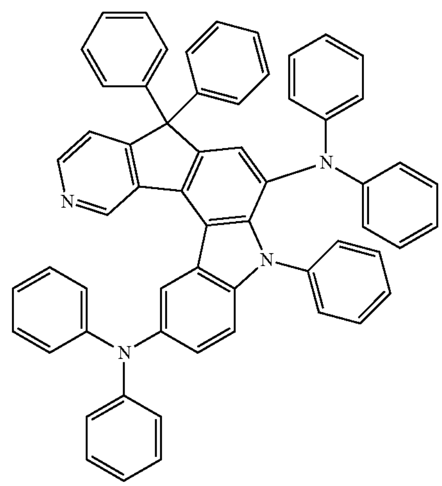
D89
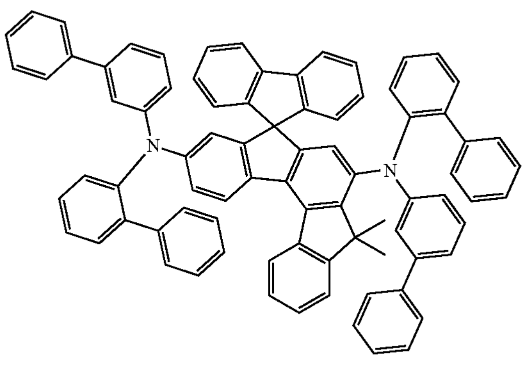
D90
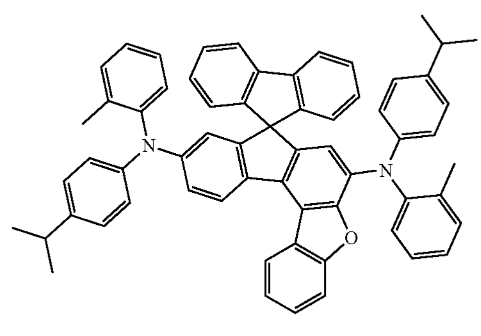

-continued
D91
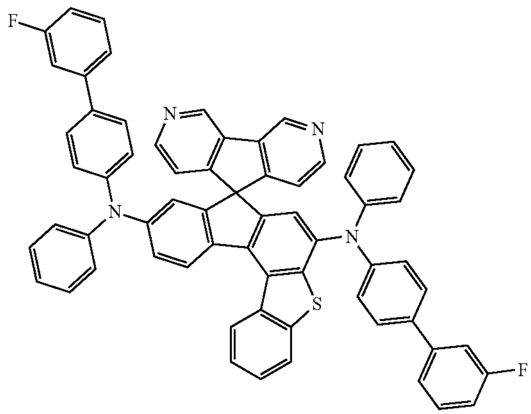
D92
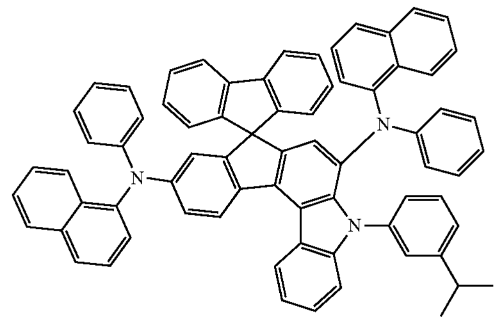
D93
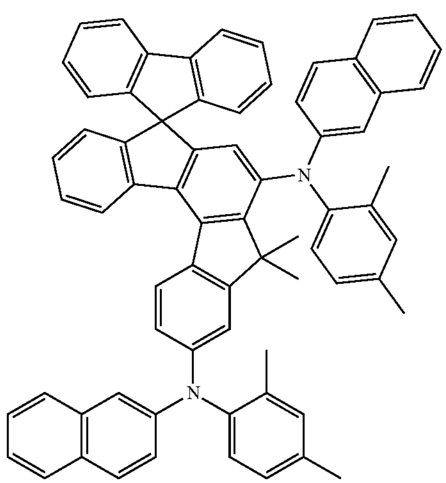
D94
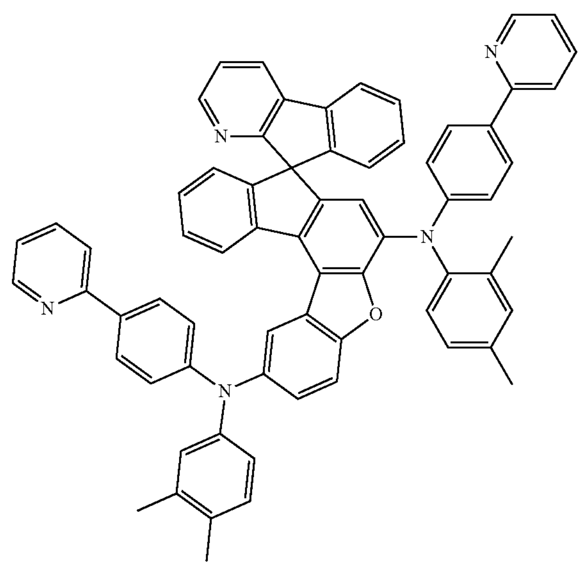
D95
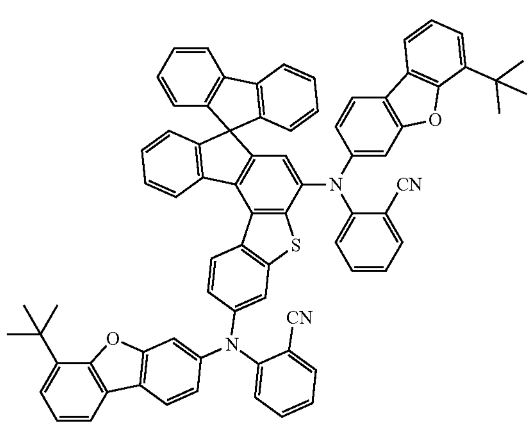
D96
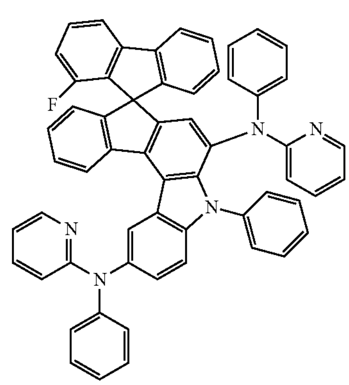

-continued
D97
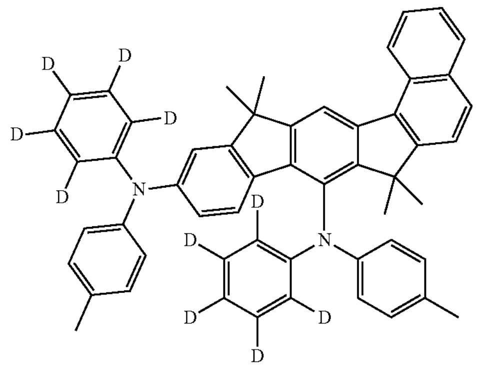
D98
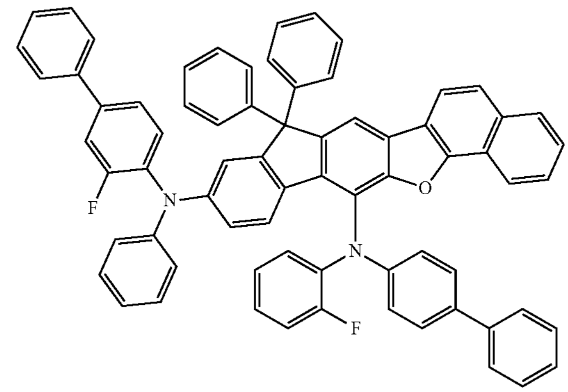
D99
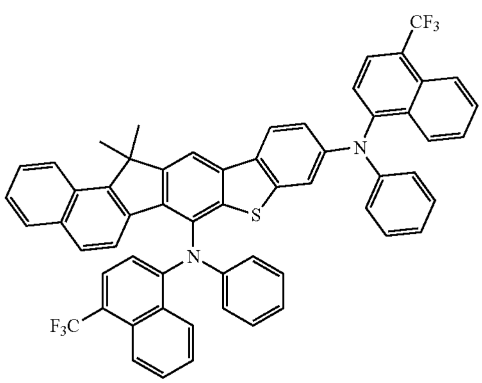
D100
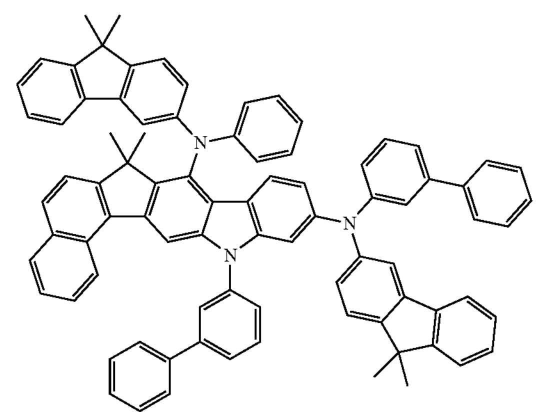
D101
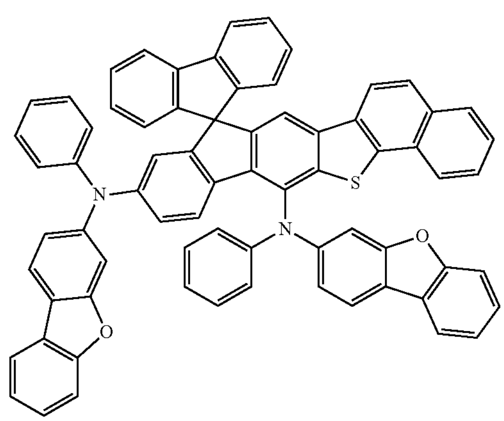
D102
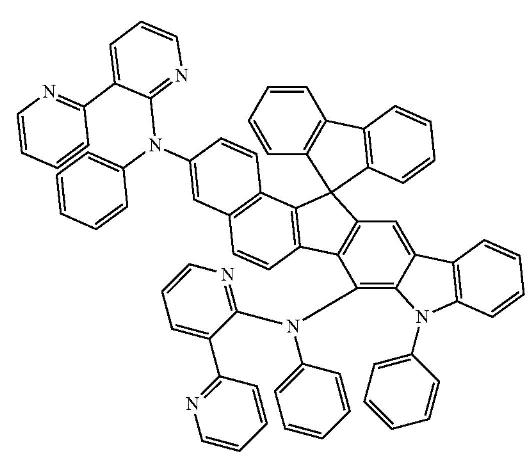

-continued
D103
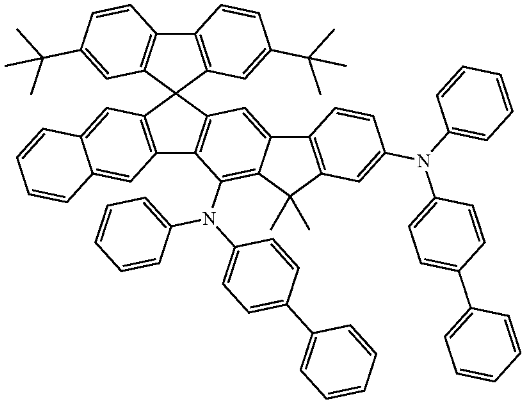
D104
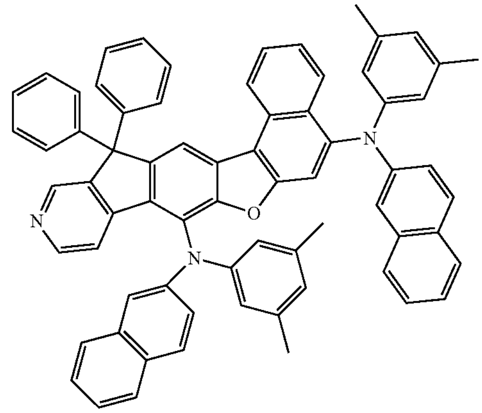
D105
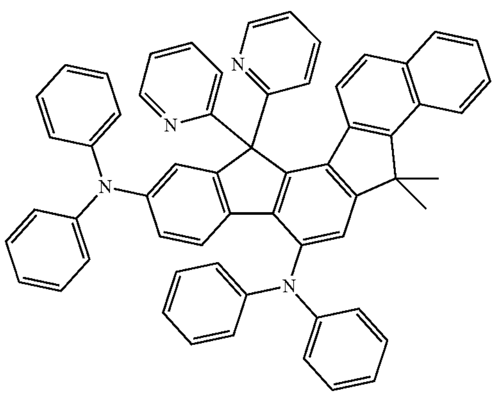
D106
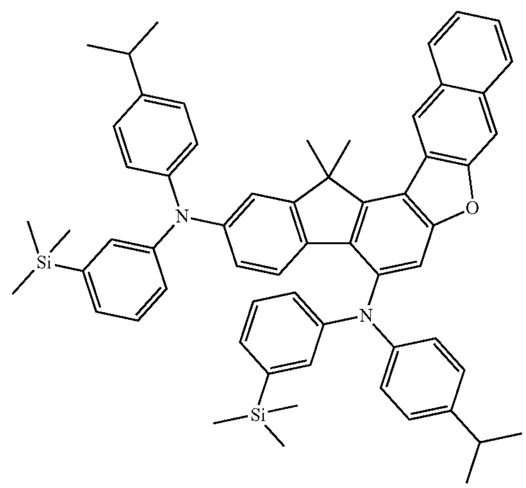
D107
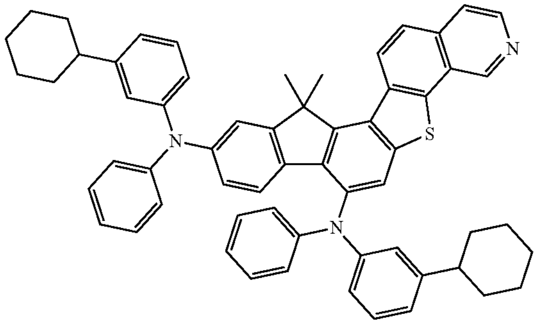
D108
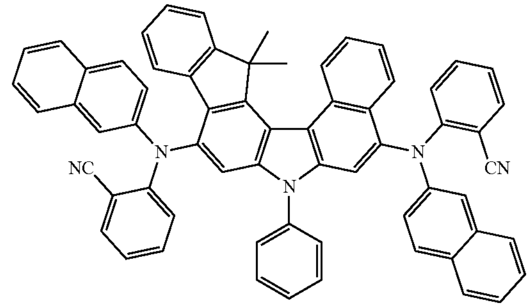

-continued
D109
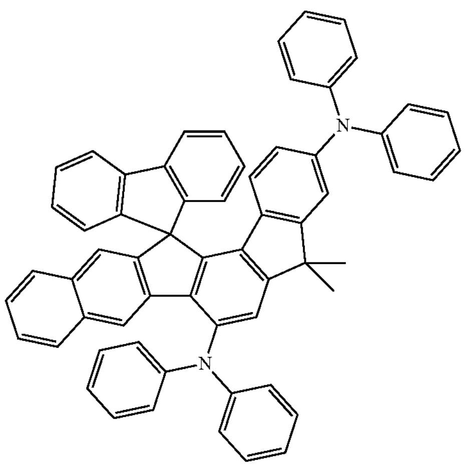
D110
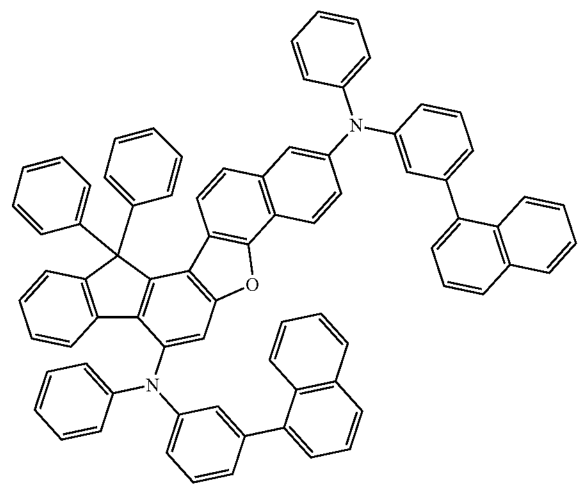
D111
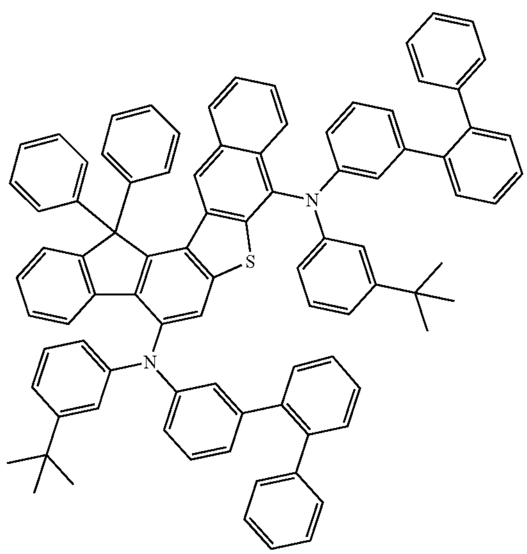
D112
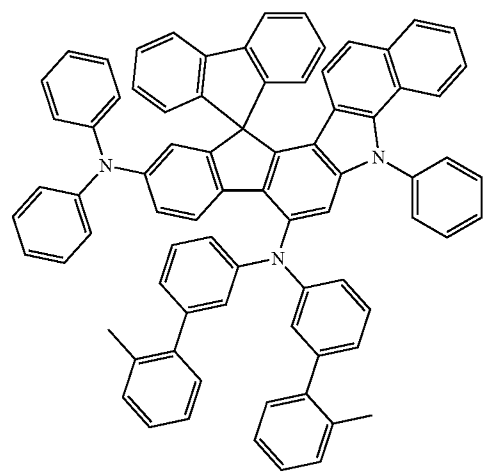
D113
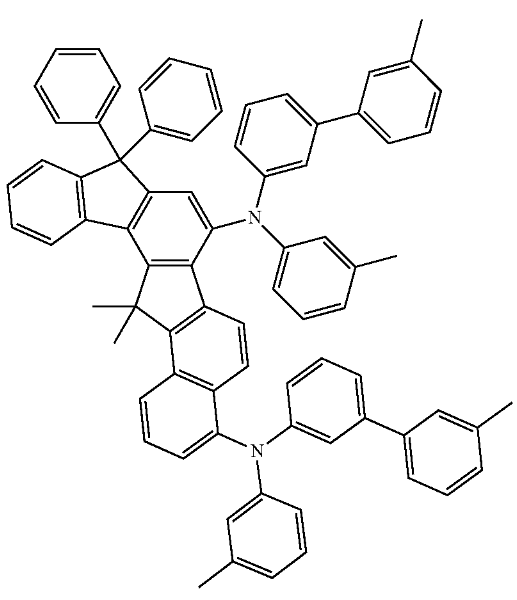
D114
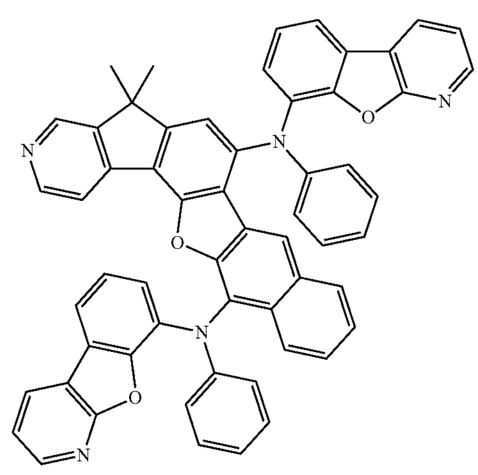

-continued
D115
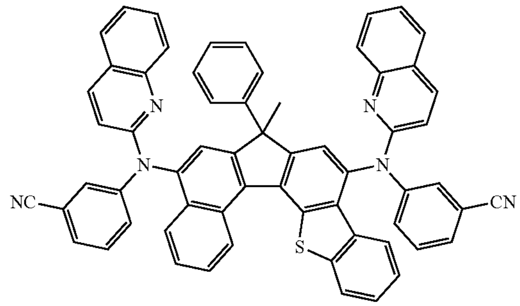
D116
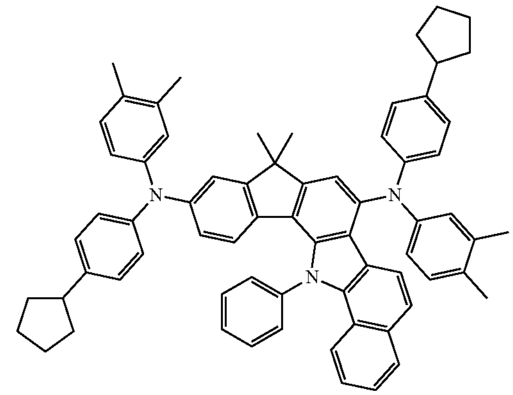
D117
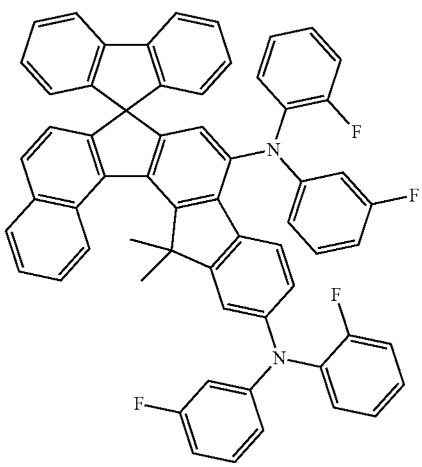
D118
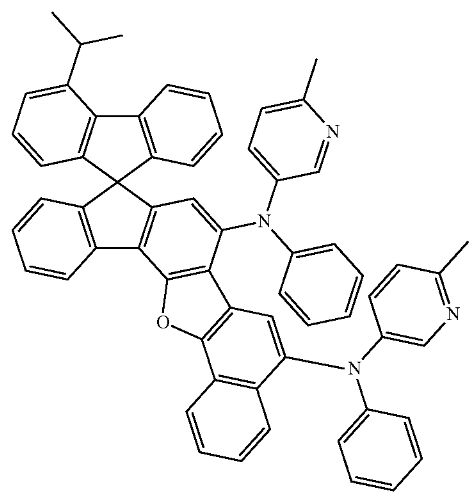
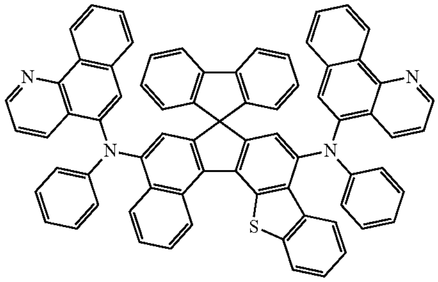
D120
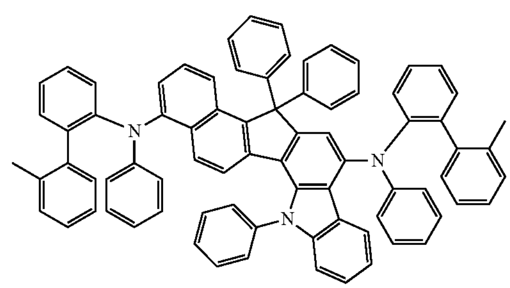

-continued
D121
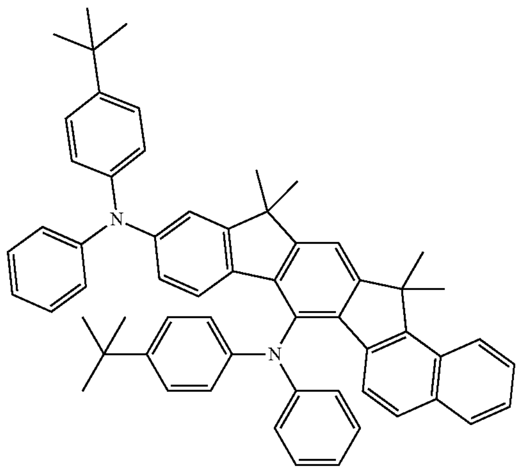
D122
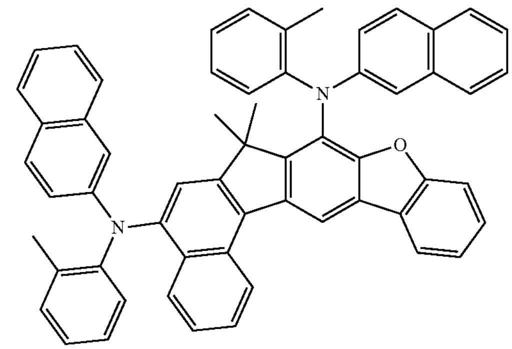
D123
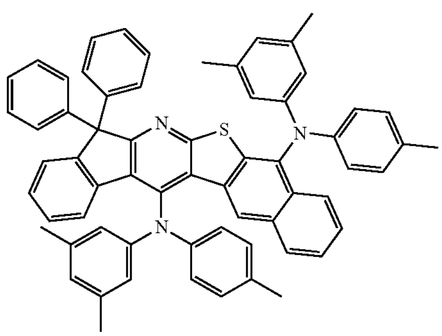
D124
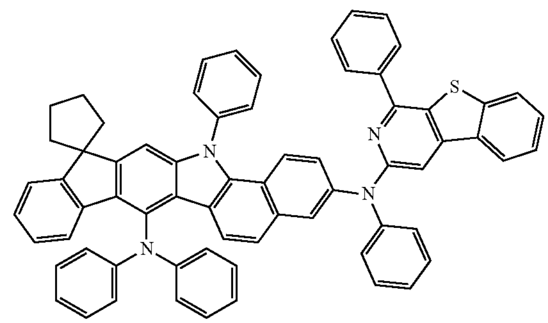
D125
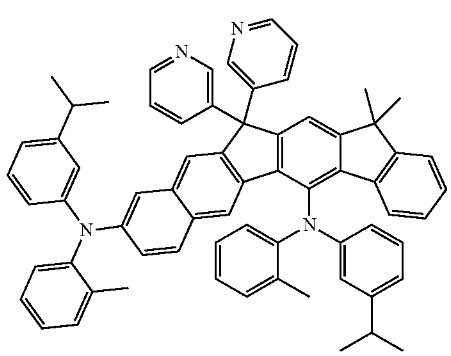
D126
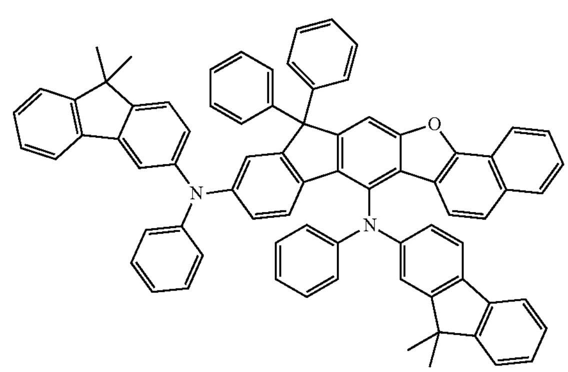

-continued
D127
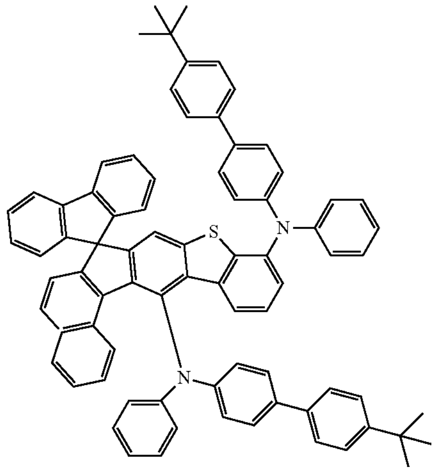
D128
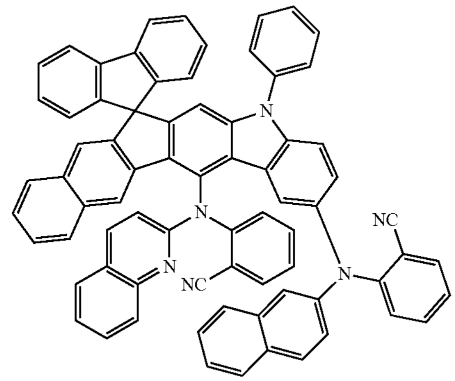
D129
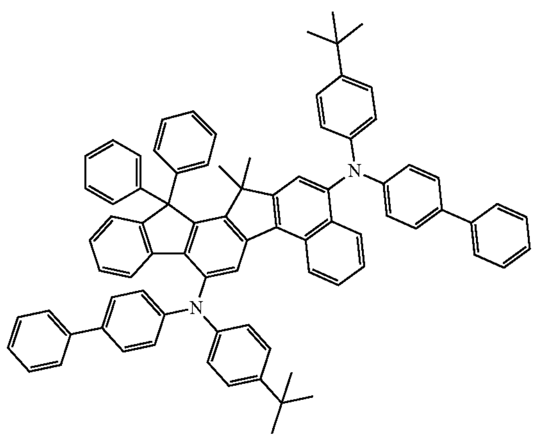
D130
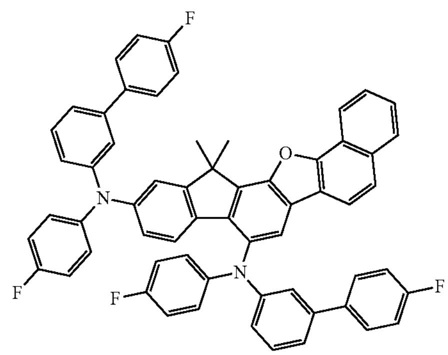
D131
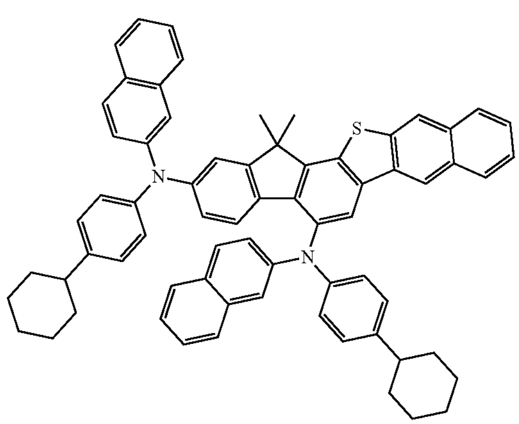
D132
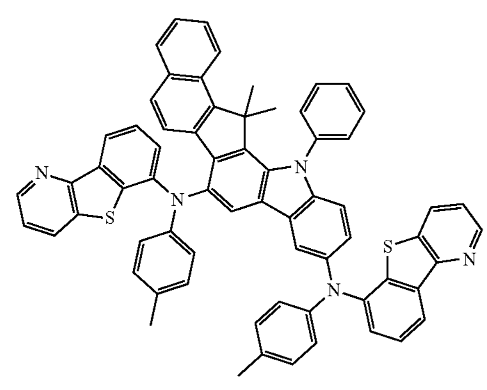

-continued
D133
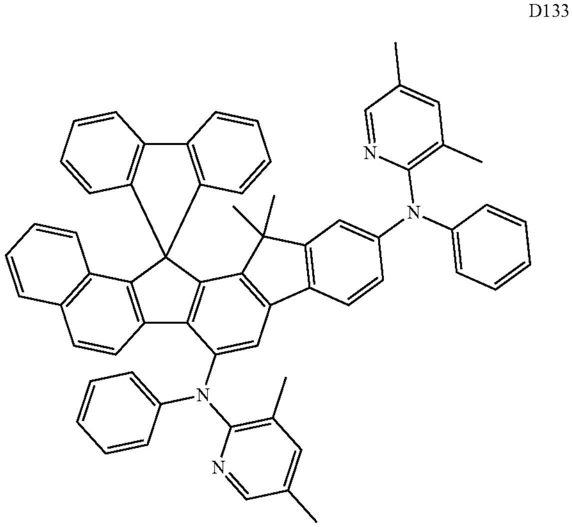
D134
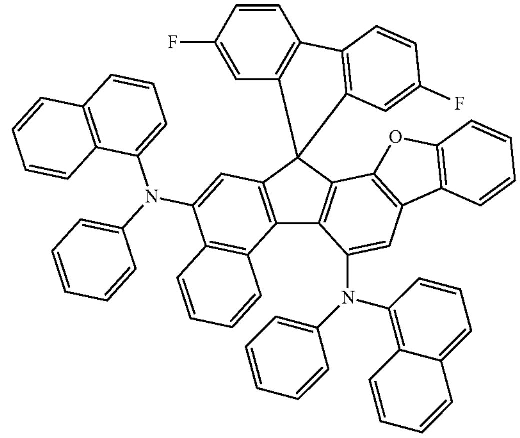
D135
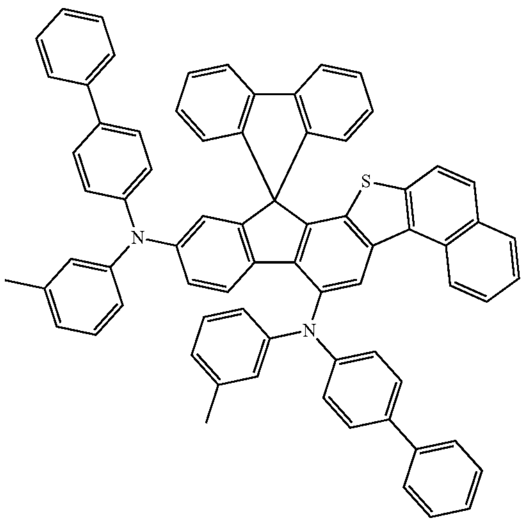
D136
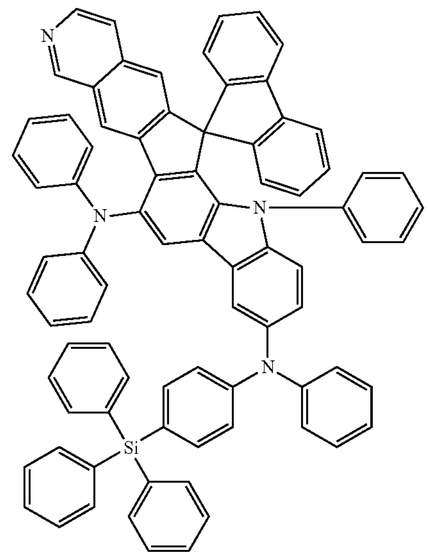
D137
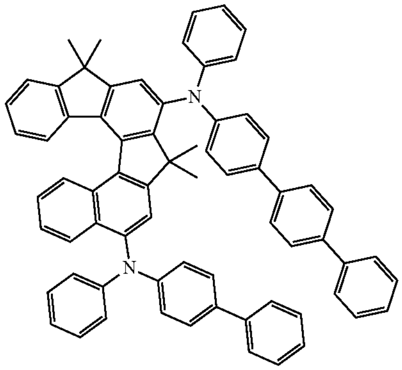
D138
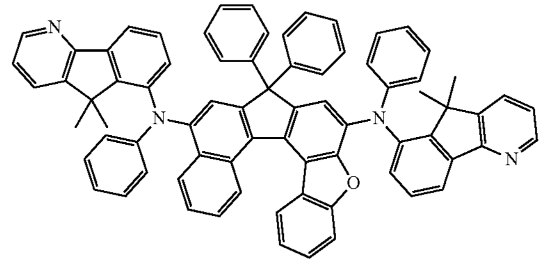

-continued
D139
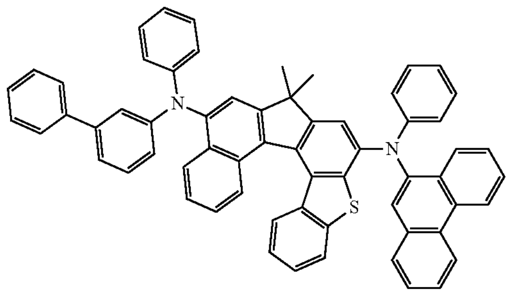
D140
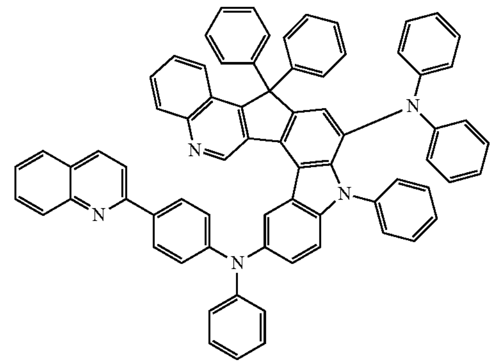
D141
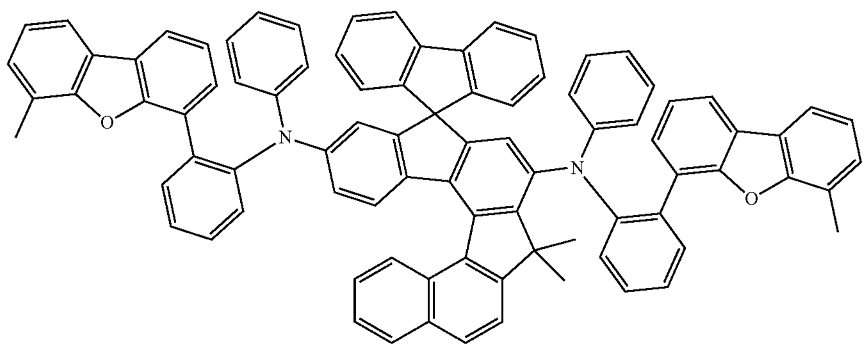
D142
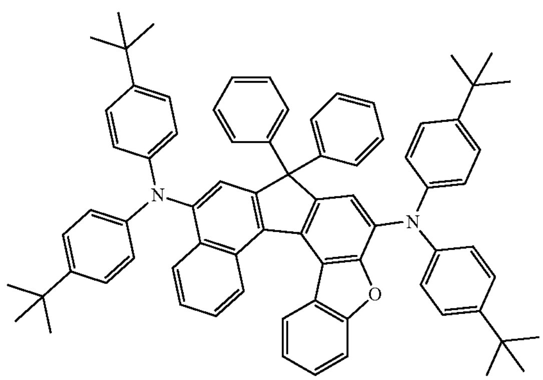
D143
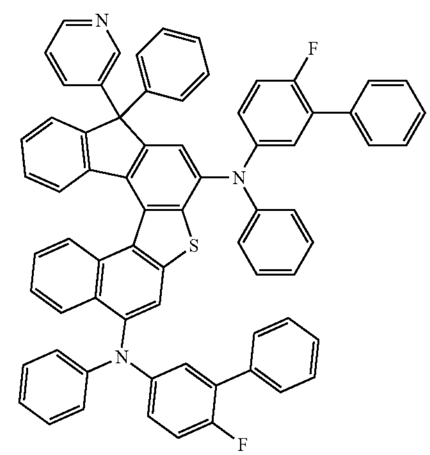
D144
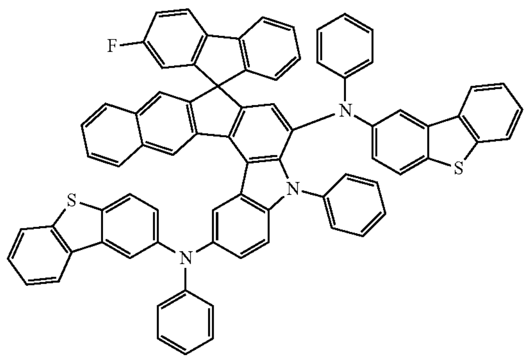
D145
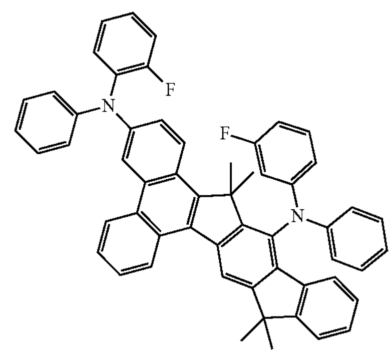

-continued
D146
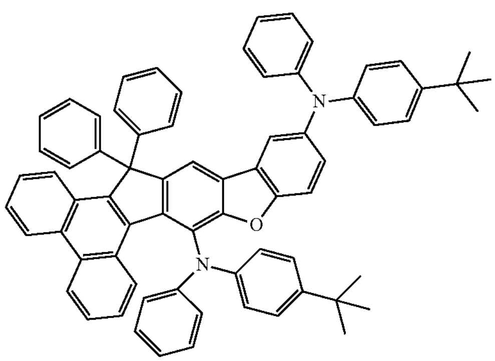
D147
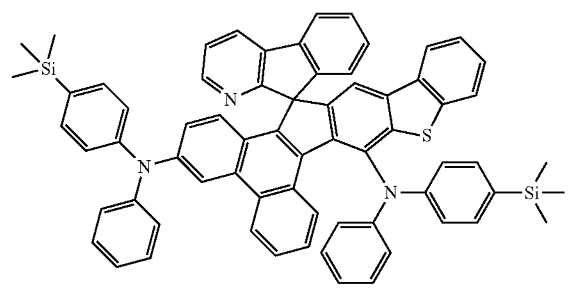
D148
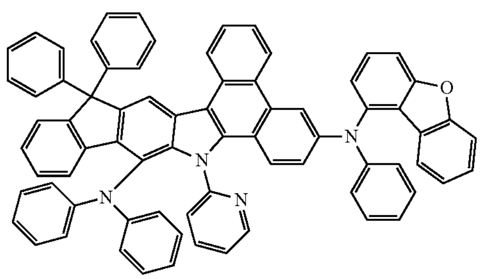
D149
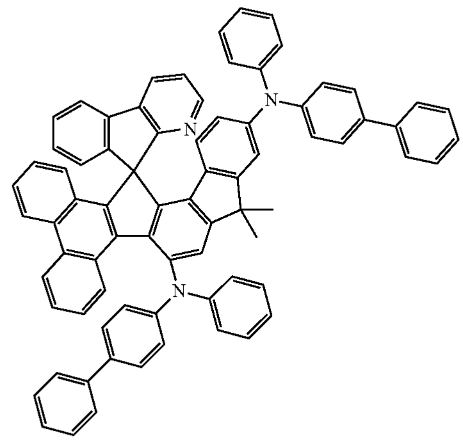
D150
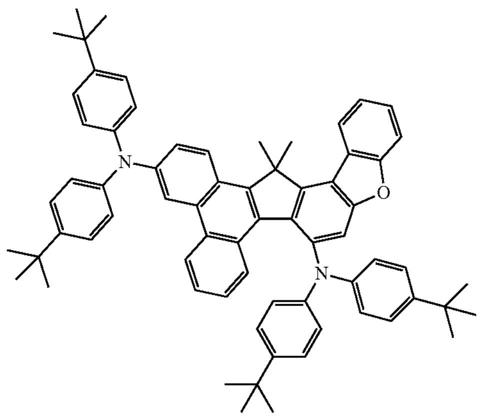
D151
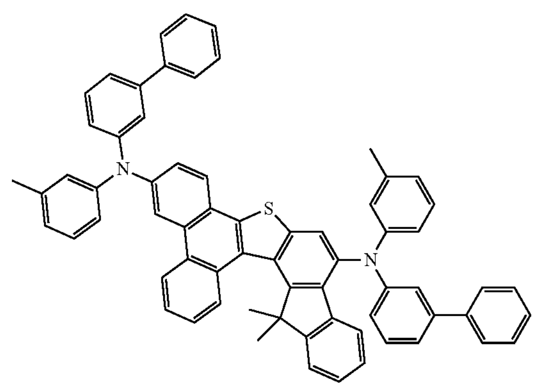
D152
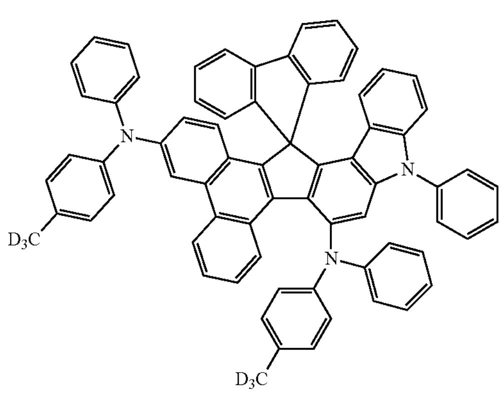
D153
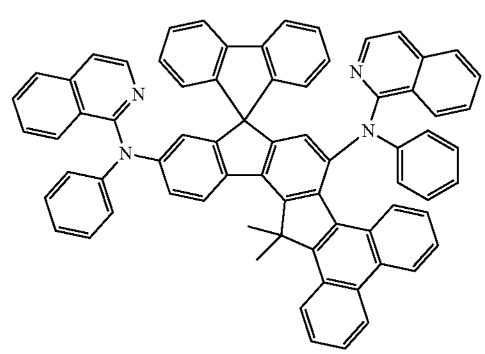

-continued
D154
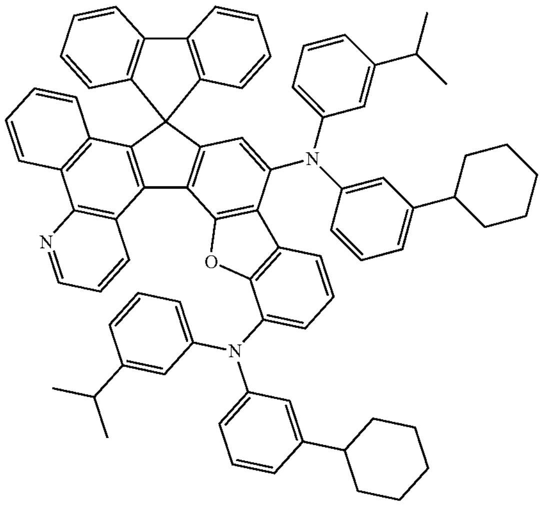
D155
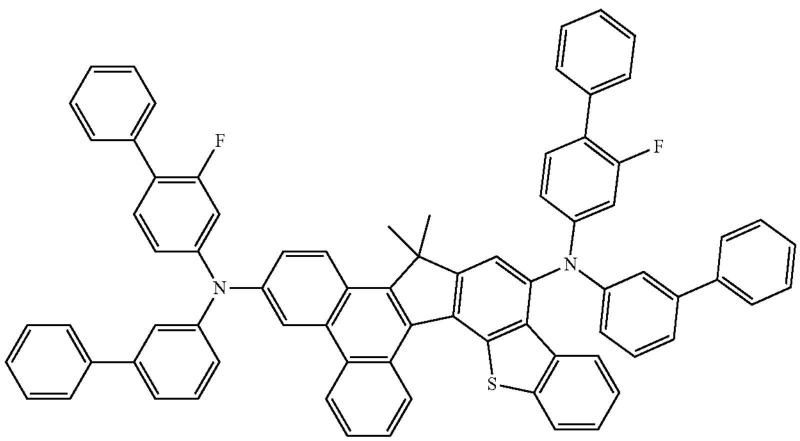
D156
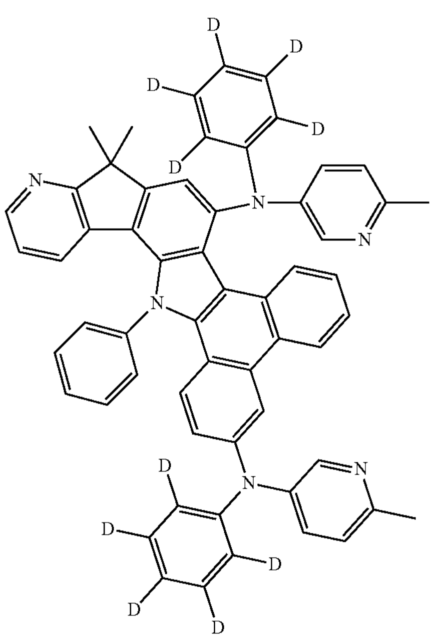
D157
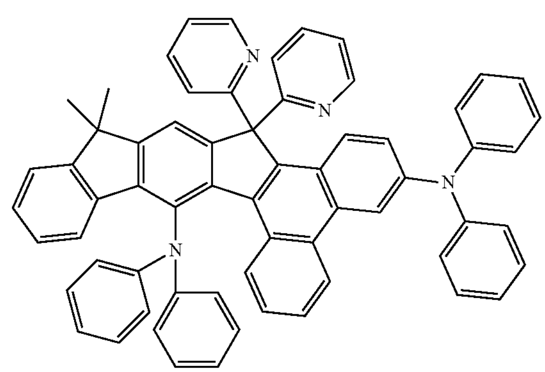

-continued
D158
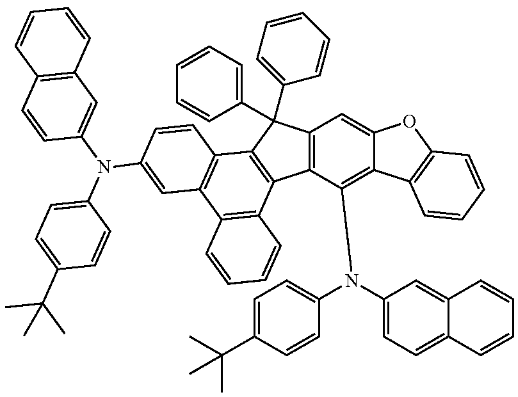
D159
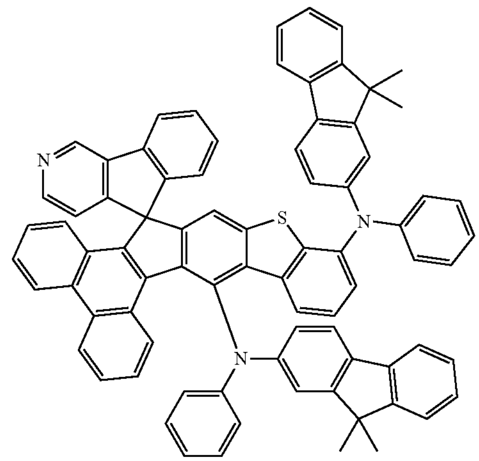
D160
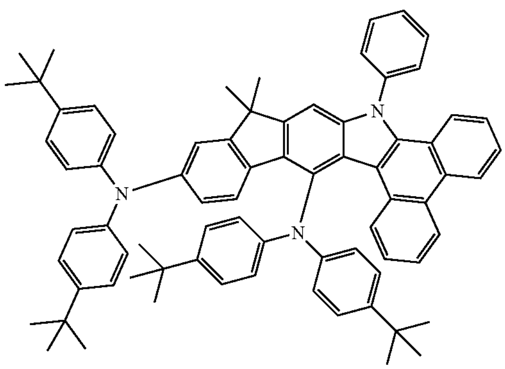
D161
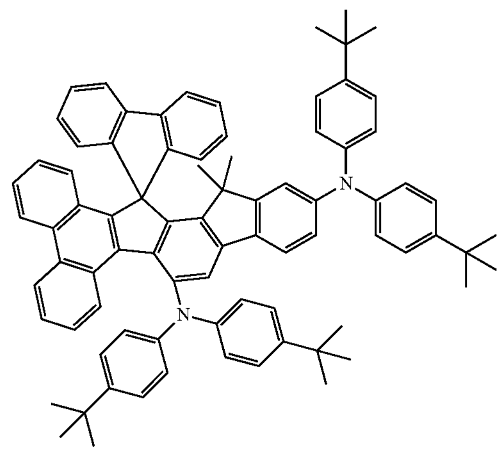
D162
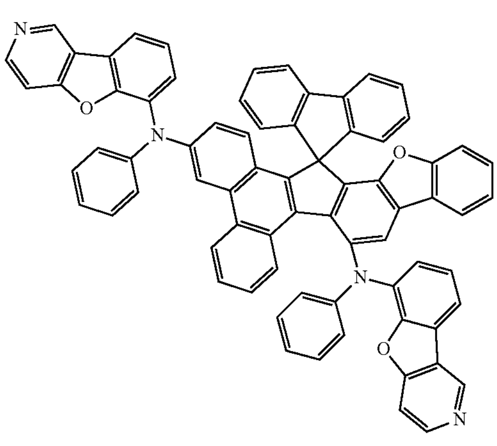
D163
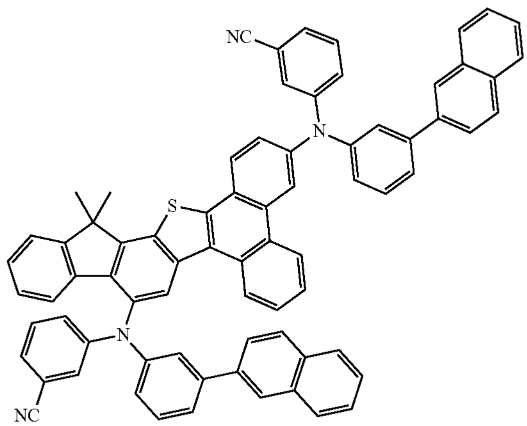

-continued
D164
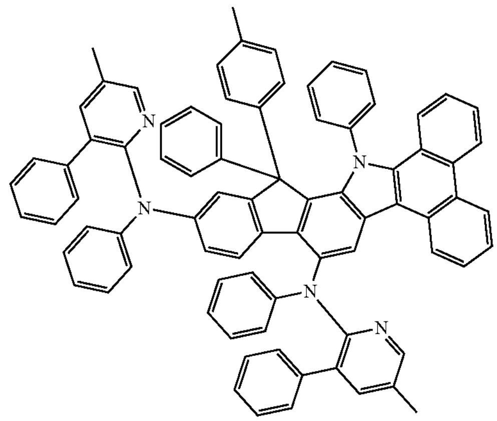
D165
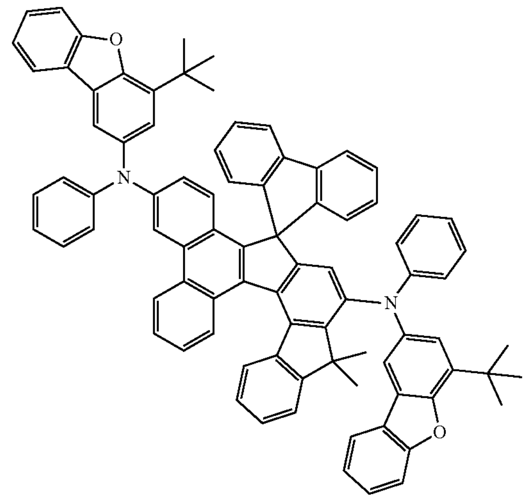
D166
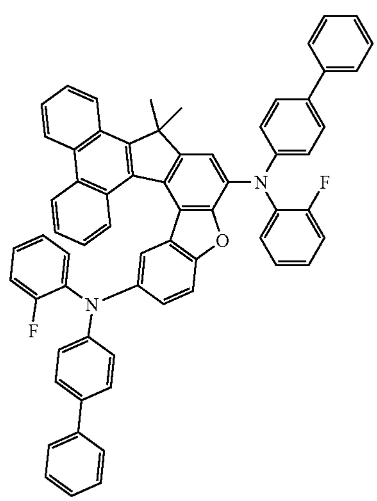
D167
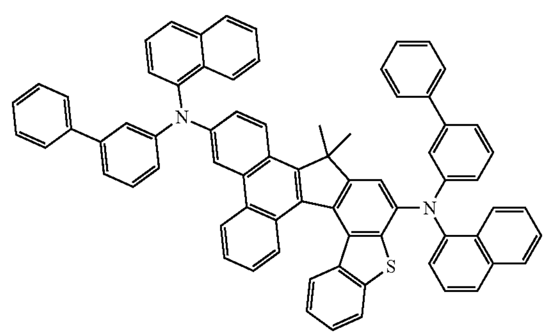
D168
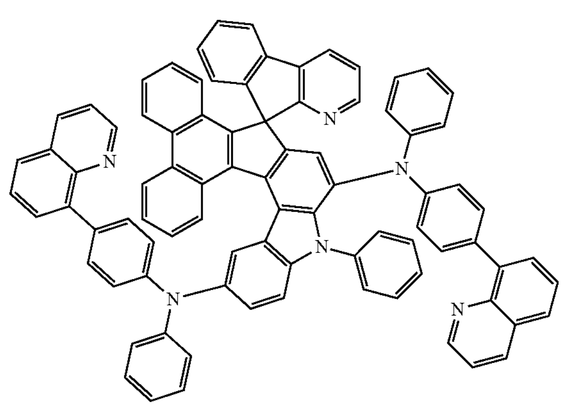
D169
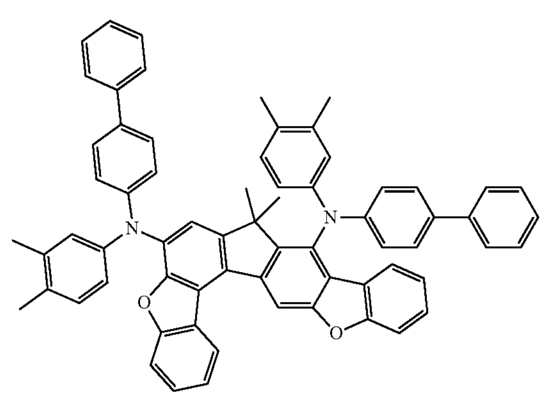

-continued
D170
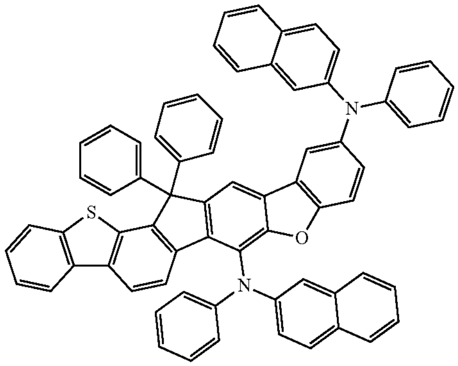
D171
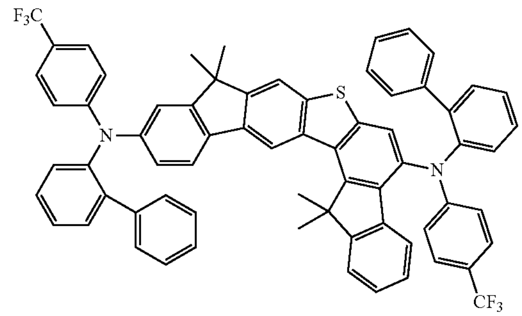
D172
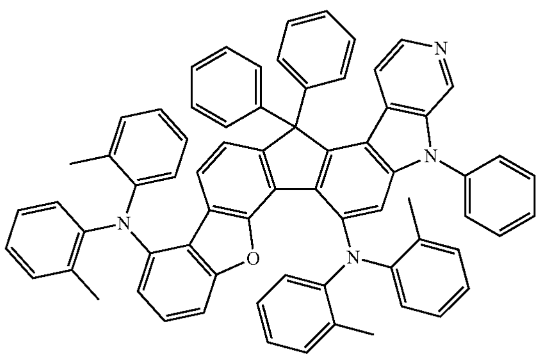
D173
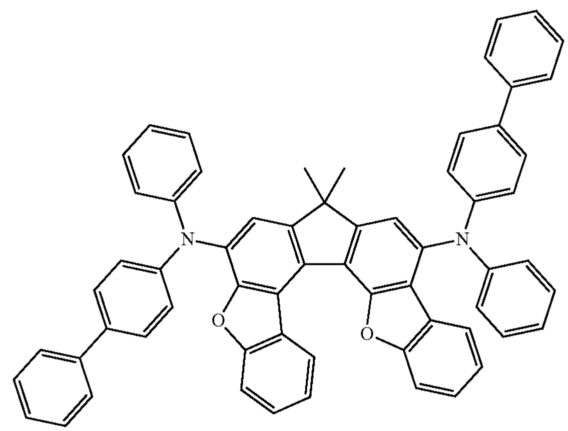
D174
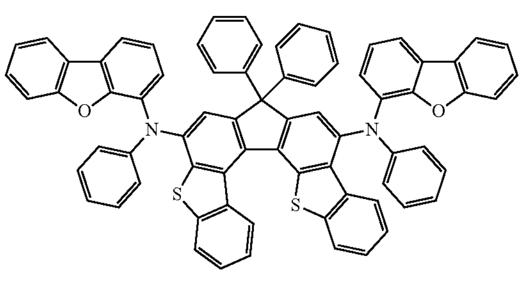
D175
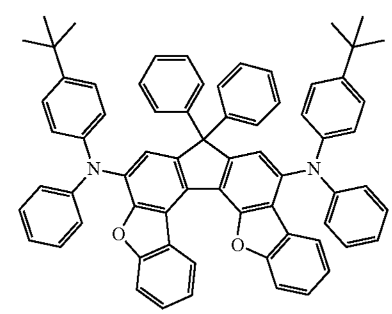
D176
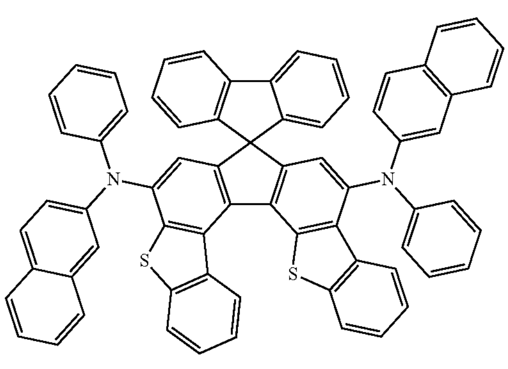
D177
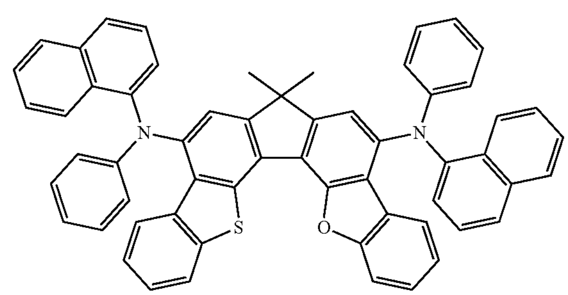

-continued
D178
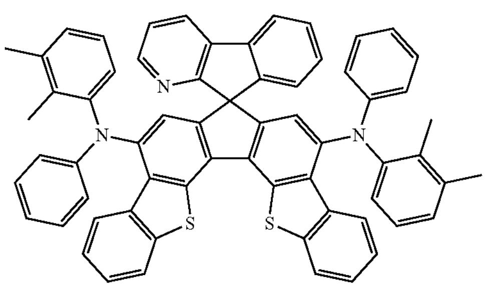
D179
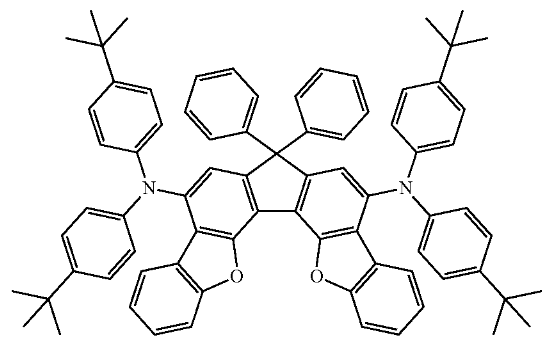
D180
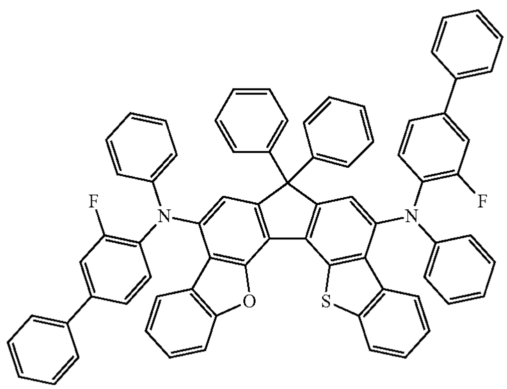
D181
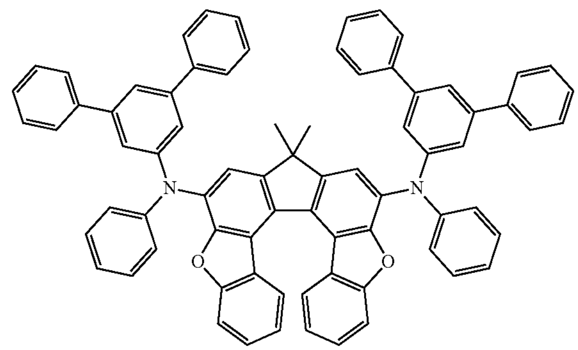
D182
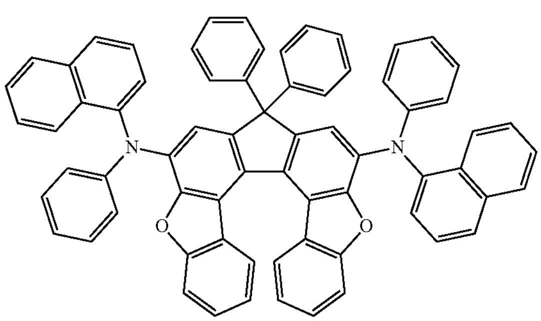
D183
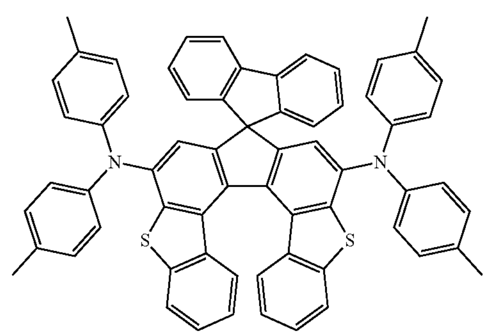
D184
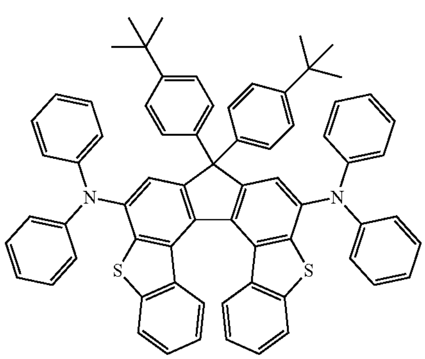
D185
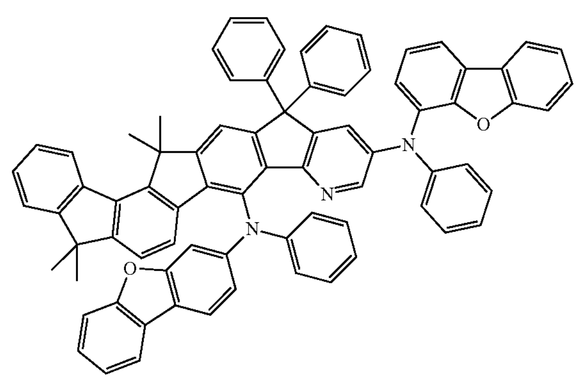

-continued
D186
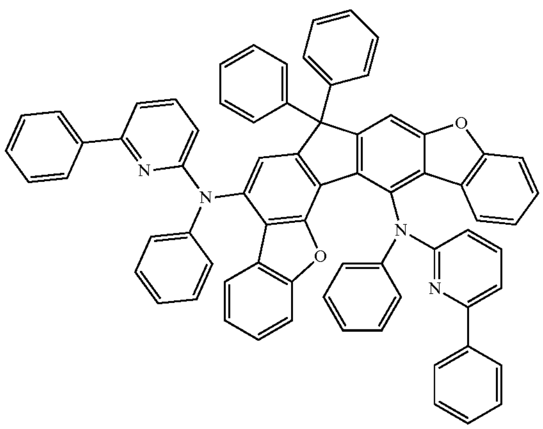
D187
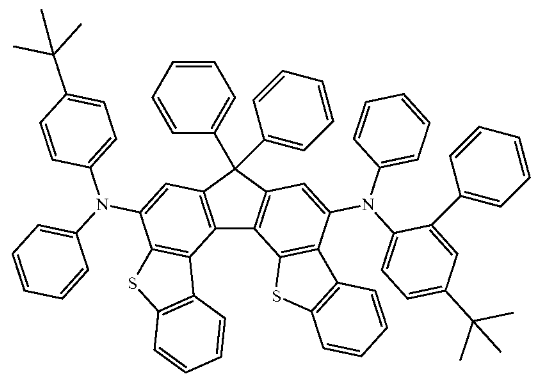
D188
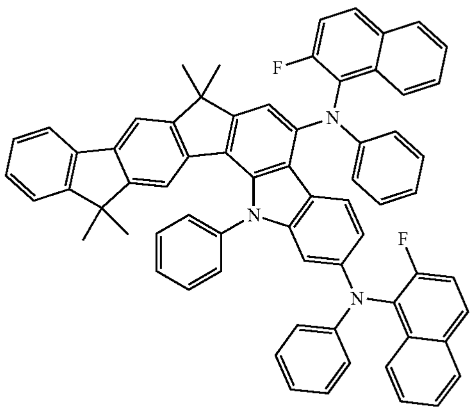
D189
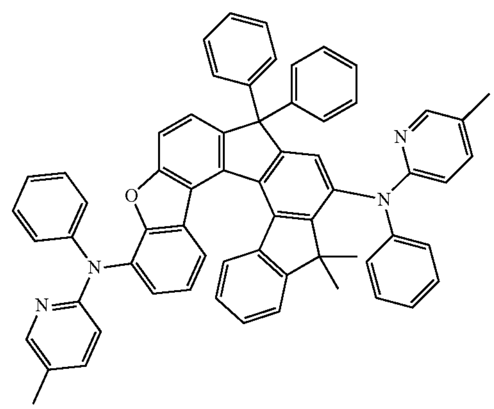
D190
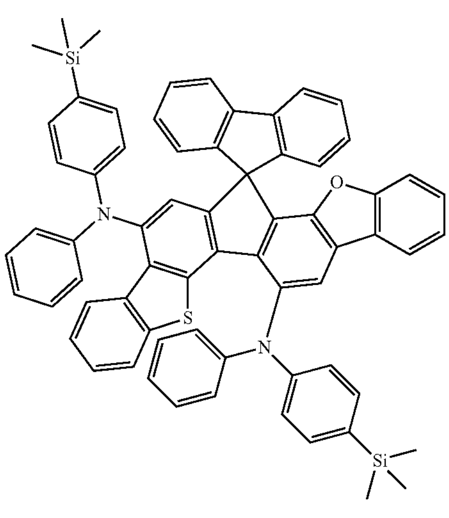
D191
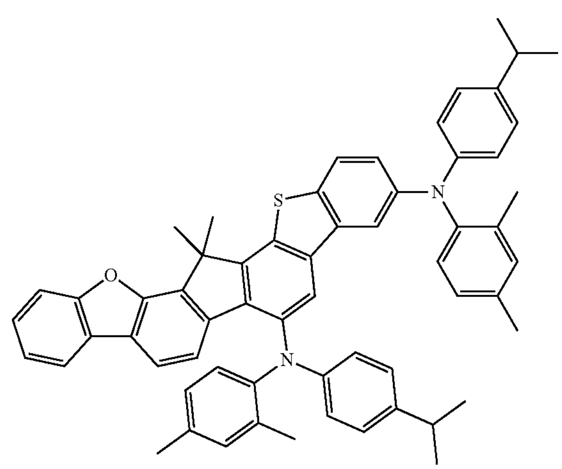

-continued
D192
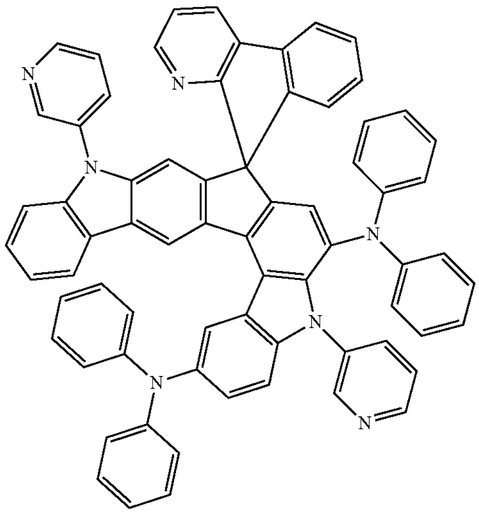
D193
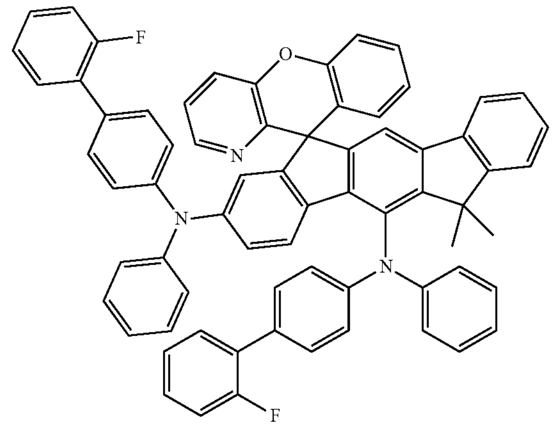
D194
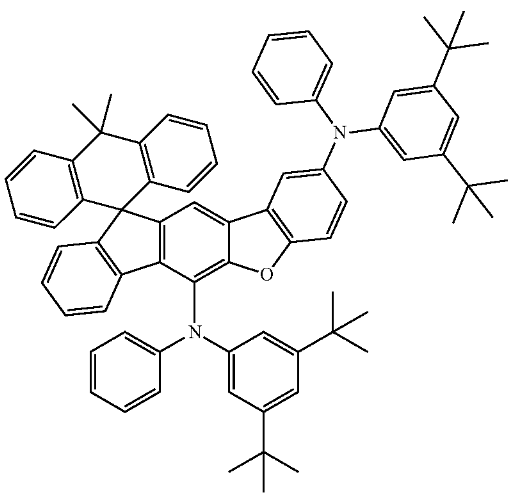
D195
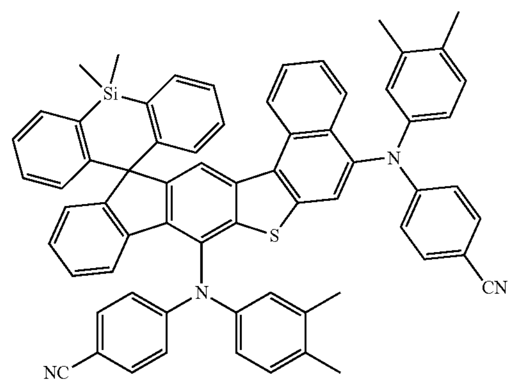
D196
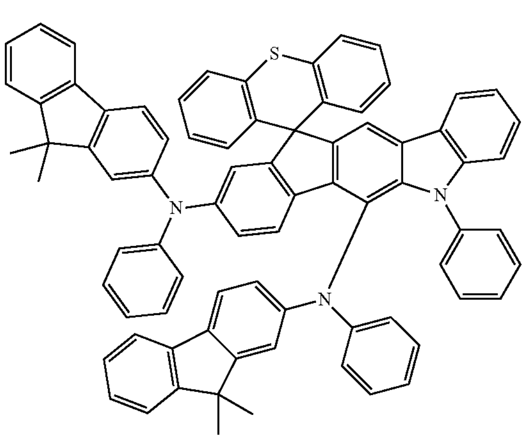
D197
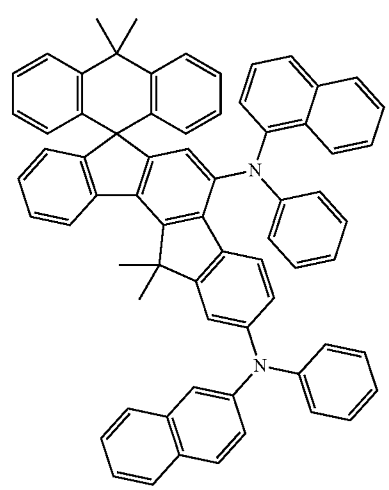

-continued
D198
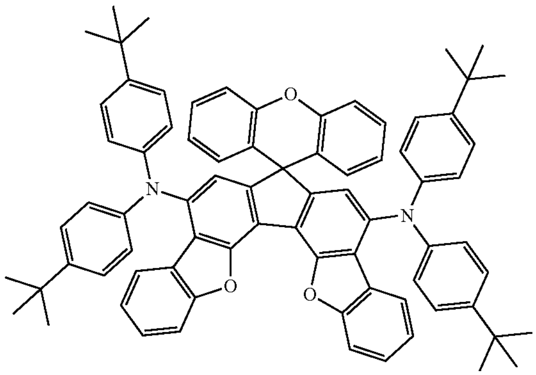
D199
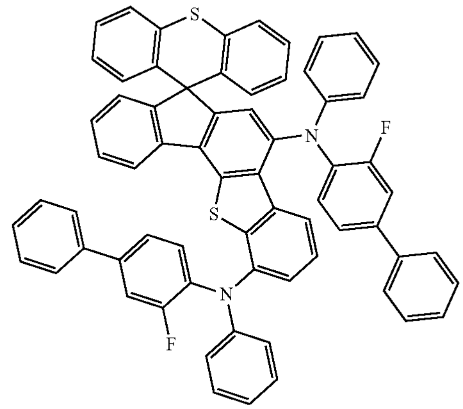
D200
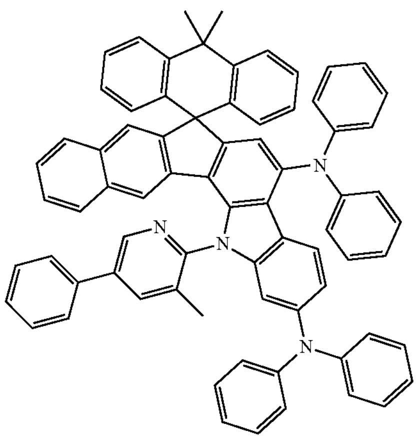
D201
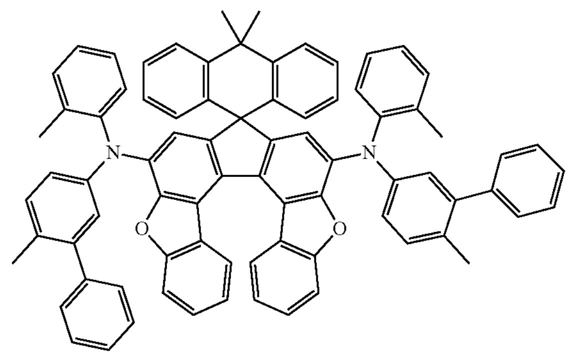
D202
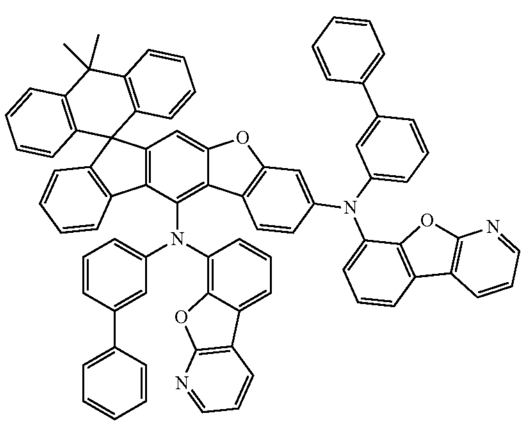
D203
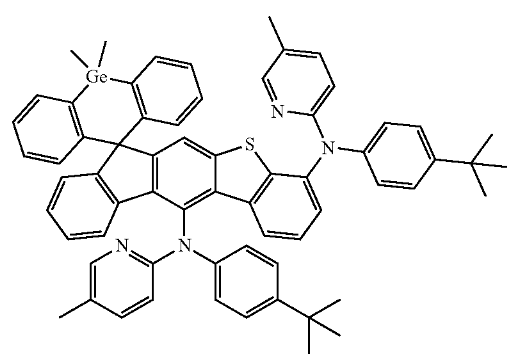

-continued
D204
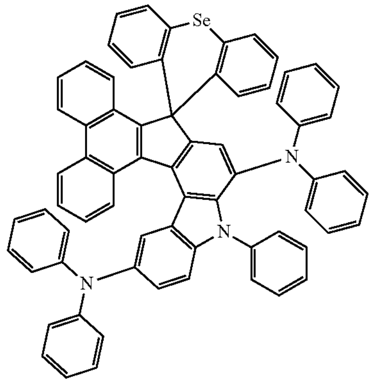
D205
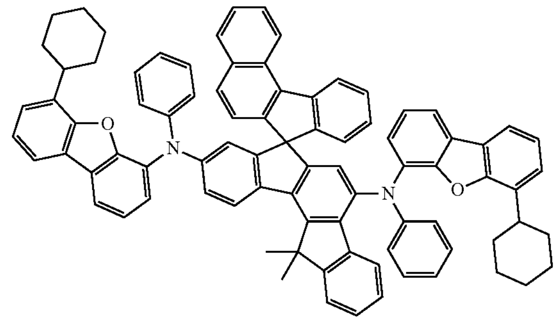
D206
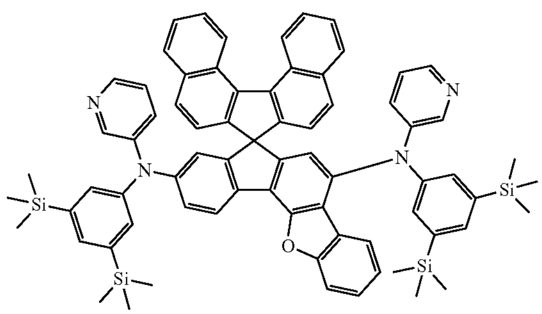
D207
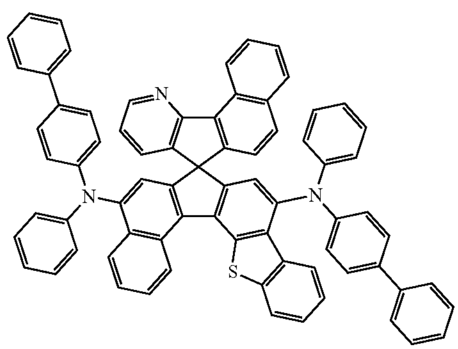
D208
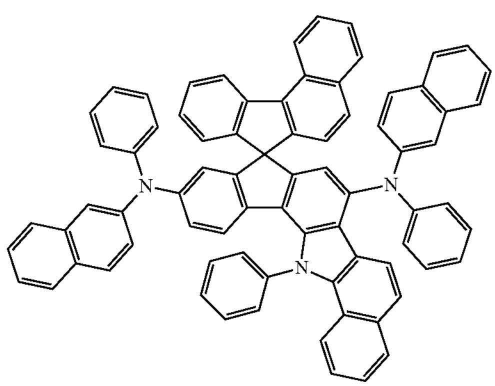
D209
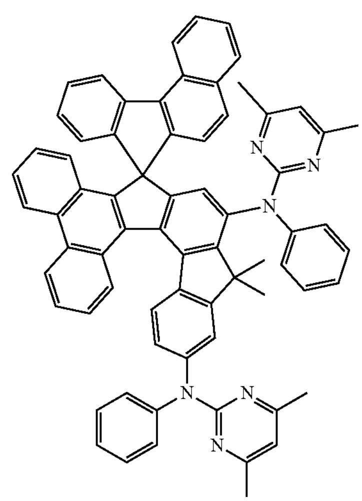

-continued

D210

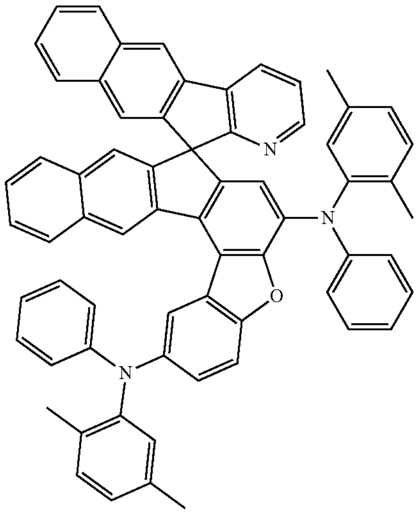

D211

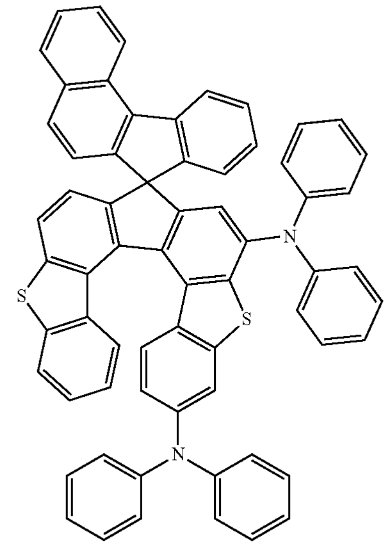

D212

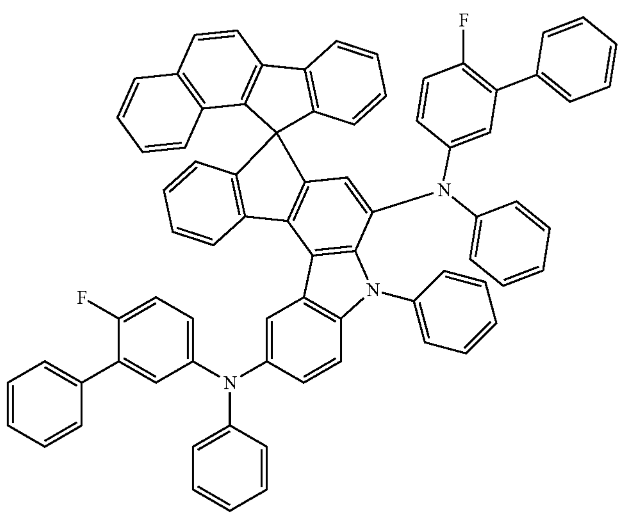

A compound that has an anthracene moiety as a core and a symmetric structure is known to have poor film-forming properties. However, since the first compound represented by Formula 1 has an asymmetric structure, the first compound may be suitable for forming a film therefrom.

The second compound represented by Formula 2 has a condensed cyclic moiety as a core, as shown in Formula 2-1' and 2-2'. Since the second compound represented by Formula 2 has the condensed cyclic moiety as a core, an organic light-emitting device manufactured using the second compound may have a long lifespan and high efficiency.

2-1′

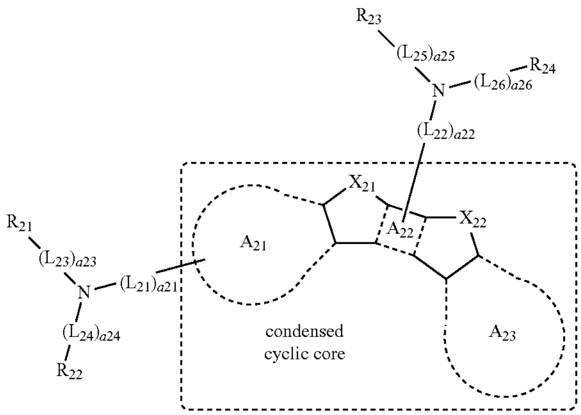

2-2′

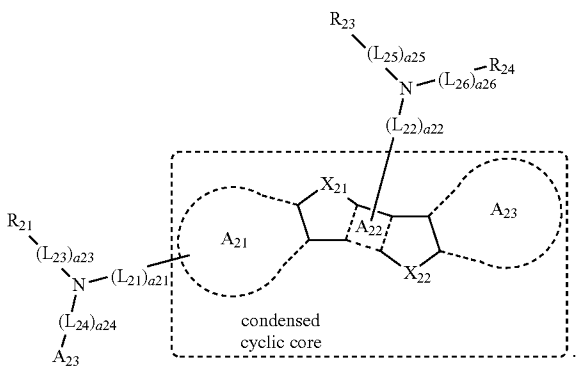

The second compound represented by Formula 2 may have amine groups respectively coupled to $A_{21}$ and $A_{22}$ of Formulae 2A and 2B, as shown in Formulae 2-1" and 2-2". Due to the inclusion of amine groups in a certain position of the second compound represented by Formula 2, an organic light-emitting device including the second compound may have improved efficiency and lifespan characteristics. When an organic light-emitting device includes the second compound and an anthracene-based compound (e.g., the first compound), molecular association may be less likely to occur between the anthracene compound and the second compound, thus contributing to higher interior quantum efficiency.

2-1″

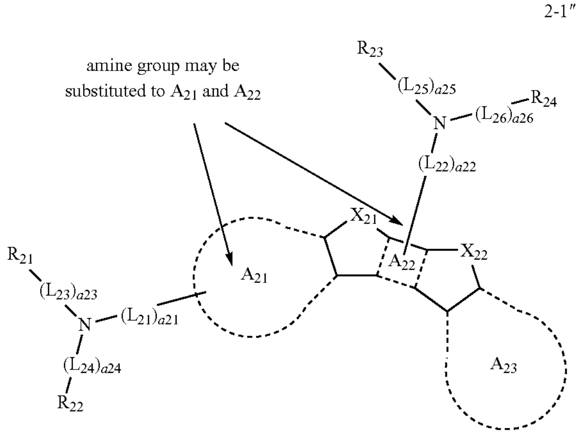

-continued 2-2″

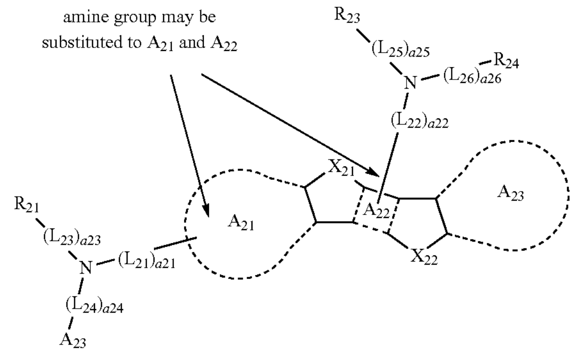

In the second compound, a distance between amine groups is short. Accordingly, an organic light-emitting device including the second compound may have high efficiency.

Thus, an organic light-emitting device including the second compound represented by Formula 2 may have high efficiency and a long lifespan.

The first compound represented by Formula 1 and the second compound represented by Formula 2 may be synthesized by using any suitable organic synthetic methods.

[Description of FIG. 1]

FIG. 1 is a schematic view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

[First Electrode 110]

In FIG. 1, a substrate may be additionally disposed (e.g., positioned) under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing or sputtering a material for forming the first electrode 110 on the substrate. When the first electrode 110 is an anode, the material for forming the first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming the first electrode may be selected from indium tin oxide (ITO), indium zinc oxide (IZO), tin oxide ($SnO_2$), zinc oxide (ZnO), and any combinations thereof, but is not limited thereto. In various embodiments, when the first electrode 110 is a semi-transmissive electrode or a reflective electrode, a material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but is not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

[Organic Layer 150]

The organic layer 150 may be disposed on the first electrode 110. The organic layer 150 may include an emission layer.

The organic layer 150 may further include a hole transport region between the first electrode 110 and the emission layer, and an electron transport region between the emission layer and the second electrode 190.

[Hole Transport Region in the Organic Layer 150]

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer (HIL), a hole transport layer (HTL), an emission auxiliary layer, and an electron blocking layer (EBL).

For example, the hole transport region may have a single-layer structure including a single layer including a plurality of different materials, or a multi-layer structure having a structure of hole injection layer/hole transport layer, hole injection layer/hole transport layer/emission auxiliary layer, hole injection layer/emission auxiliary layer, hole transport layer/emission auxiliary layer or hole injection layer/hole transport layer/electron blocking layer, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (also referred to as NPD), β-NPB, TPD, Spiro-TPD, Spiro-NPB, methylated NPB, TAPC, HMTPD, 4,4',4"-tris(N-carbazolyl) triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (PANI/PSS), a compound represented by Formula 201, and a compound represented by Formula 202:

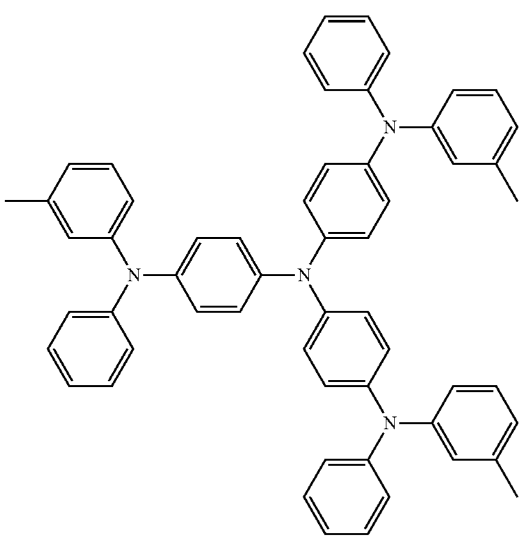

m-MTDATA

-continued

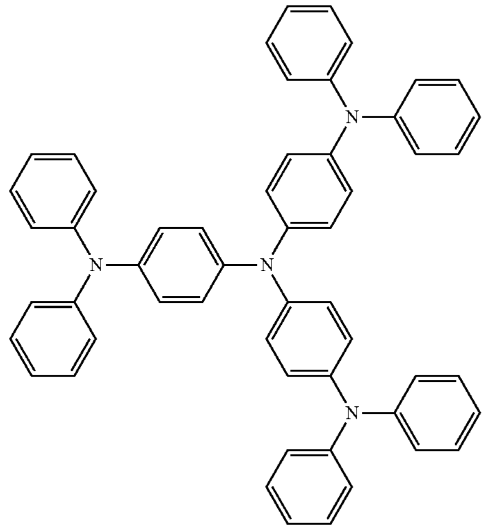

TDATA

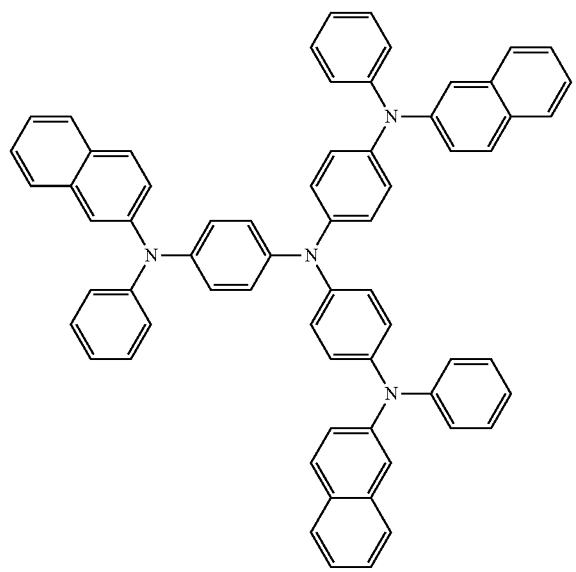

2-TNATA

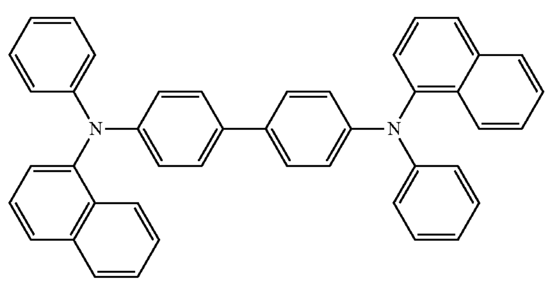

NPB

-continued

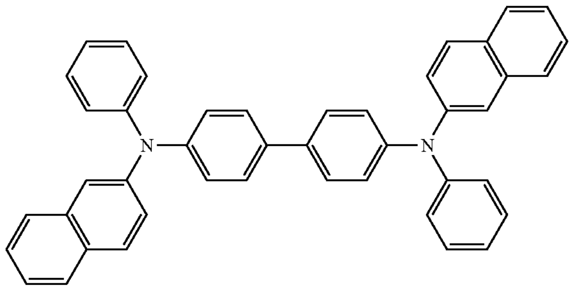

β-NPB

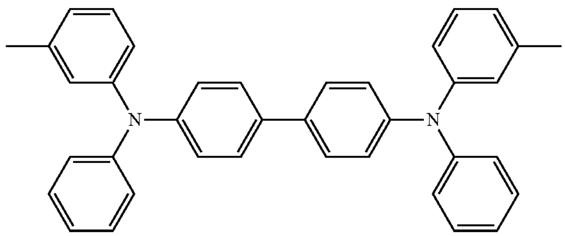

TPD

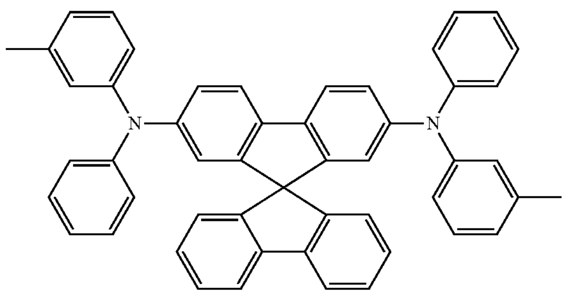

Spiro-TPD

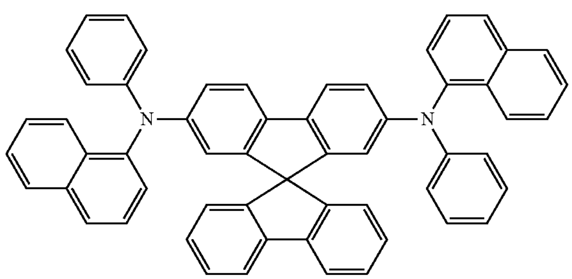

Spiro-NPB

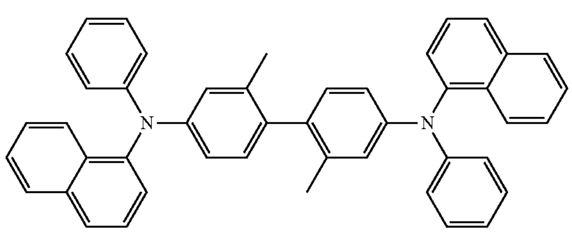

methylated NPB

-continued

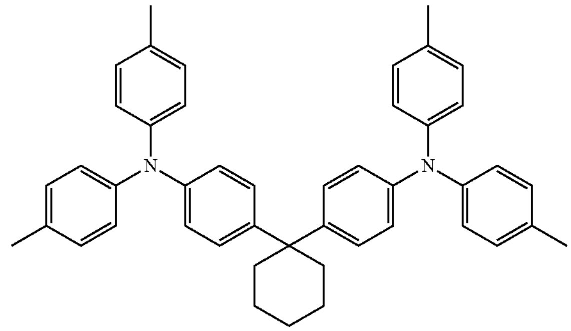

TAPC

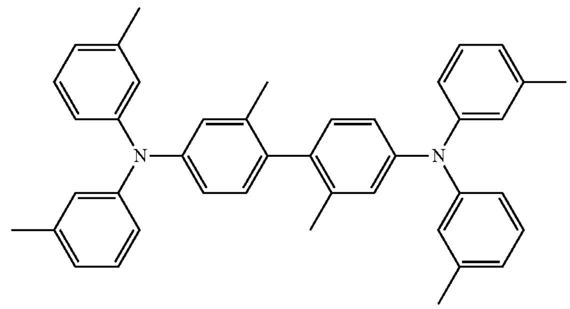

HMTPD

Formula 201

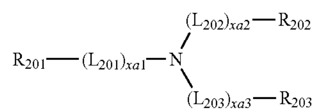

Formula 202

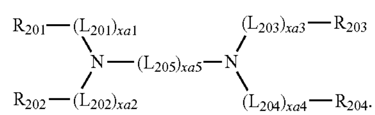

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In various embodiments, $R_{201}$ and $R_{202}$ in Formula 202 may optionally be linked to each other via a single bond, a dimethyl-methylene group, or a diphenyl-methylene group; and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xa1 to xa4 may each independently be 0, 1, or 2.

In various embodiments, xa5 may be 1, 2, 3, or 4.

In various embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ are the same as described above.

In various embodiments, at least one selected from $R_{201}$ to $R_{203}$ in Formula 201 may each independently be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In various embodiments, in Formula 202, i) $R_{201}$ and $R_{202}$ may be linked to each other via a single bond, and/or ii) $R_{203}$ and $R_{204}$ may be linked to each other via a single bond.

In various embodiments, at least one selected from $R_{201}$ to $R_{204}$ in Formula 202 may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but are not limited thereto.

The compound represented by Formula 201 may be represented by Formula 201A:

Formula 201A

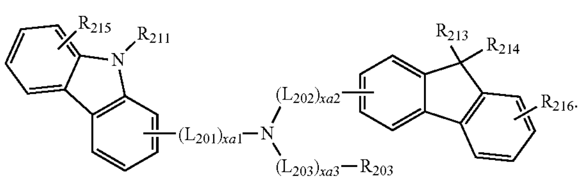

In various embodiments, the compound represented by Formula 201 may be represented by Formula 201A(1), but is not limited thereto:

Formula 201A(1)

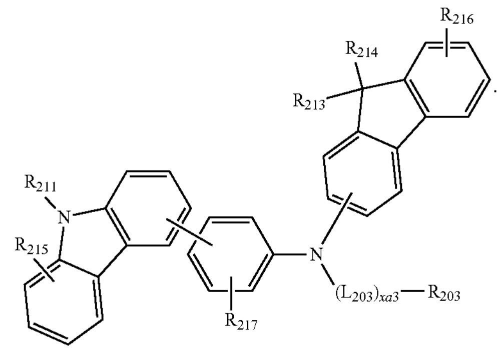

In various embodiments, the compound represented by Formula 201 may be represented by Formula 201A-1, but is not limited thereto:

Formula 201A-1

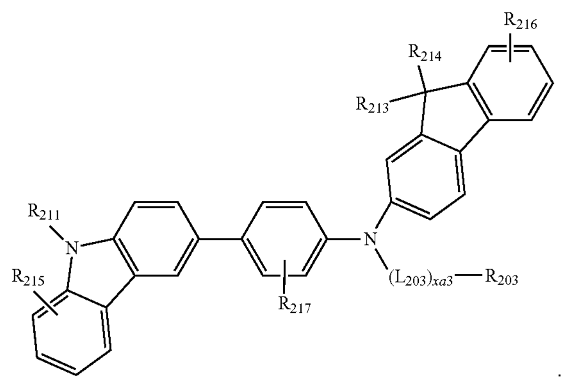

The compound represented by Formula 202 may be represented by Formula 202A:

Formula 202A

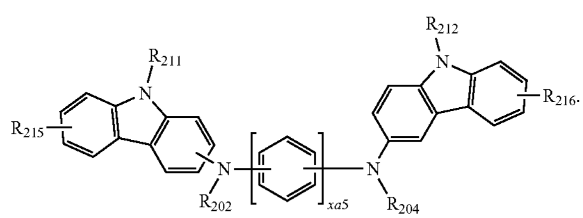

In various embodiments, the compound represented by Formula 202 may be represented by Formula 202A-1:

Formula 202A-1

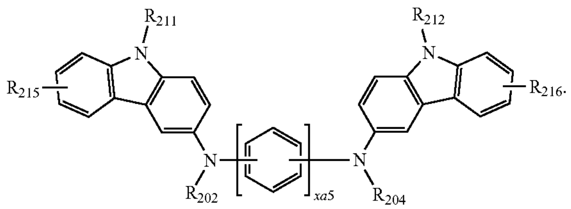

In Formulae 201A, 201A(1), 201A-1, 202A, and 202A-1, $L_{201}$ to $L_{203}$, xa1 to xa3, xa5, and $R_{202}$ to $R_{204}$ are the same as described above, descriptions of $R_{211}$ and $R_{212}$ may each independently be the same as the description provided in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but a material to be included in the hole transport region is not limited thereto:

HT1

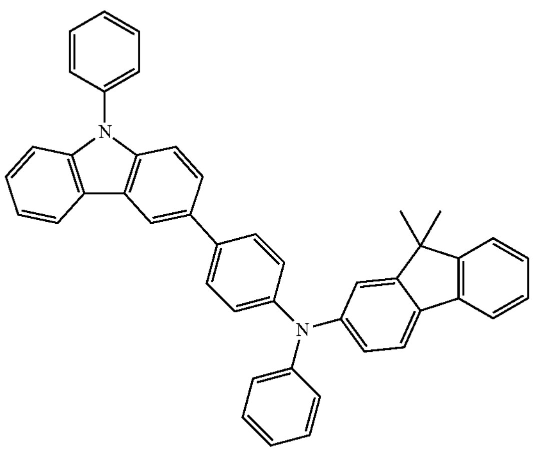

HT2

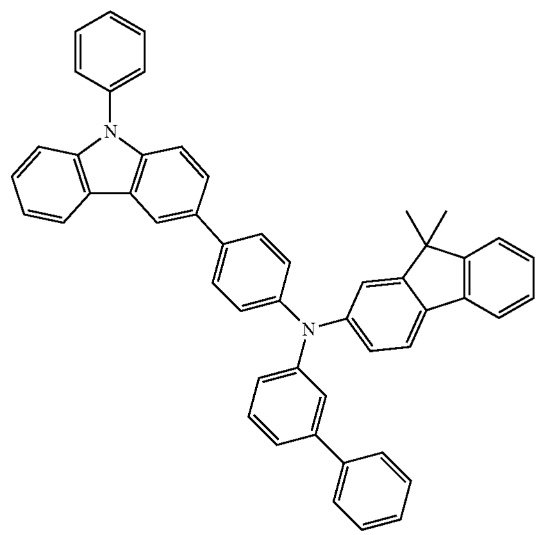

HT3

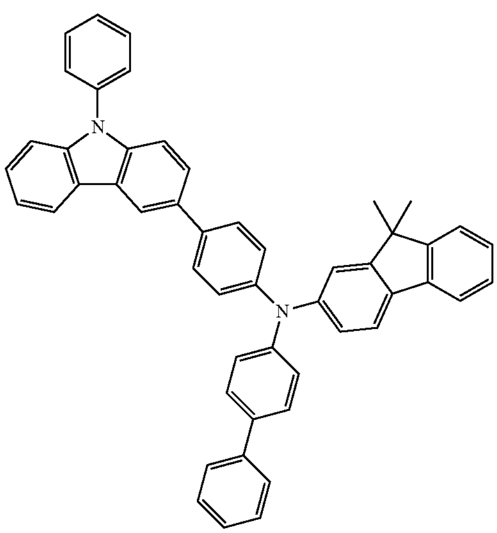

HT4

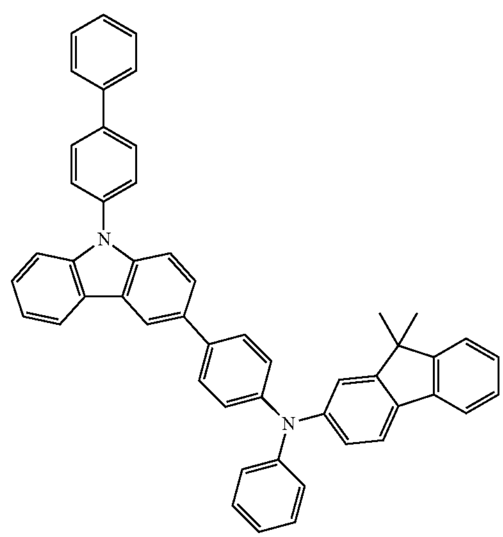

-continued
HT5
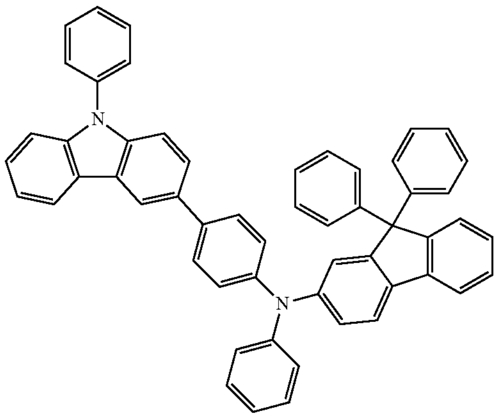
HT6
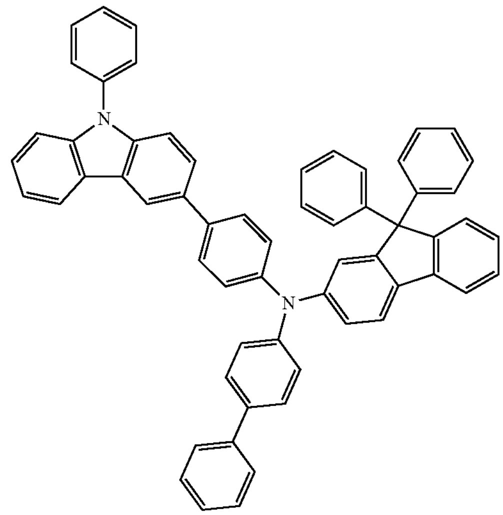
HT7
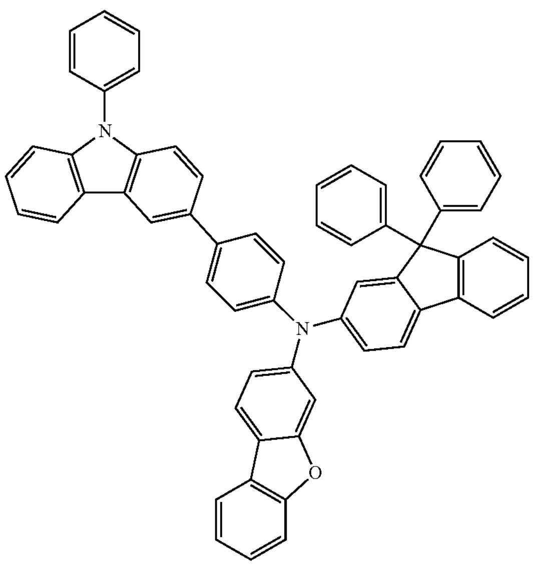
HT8
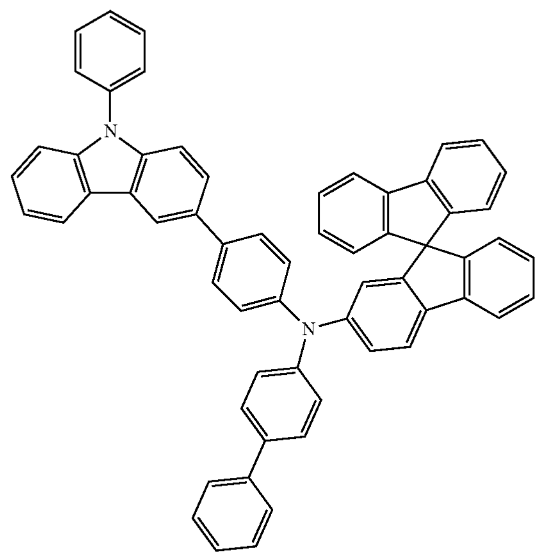
HT9
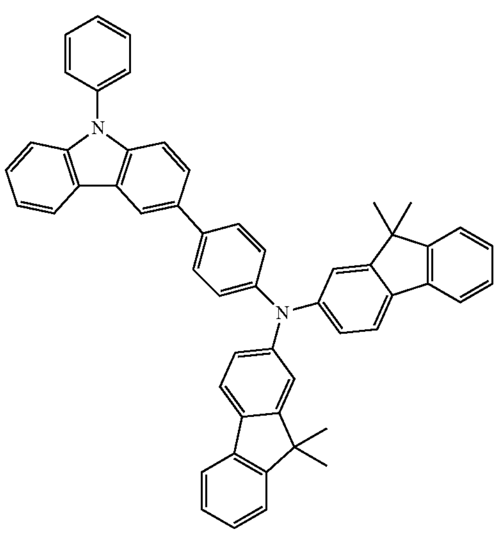
HT10
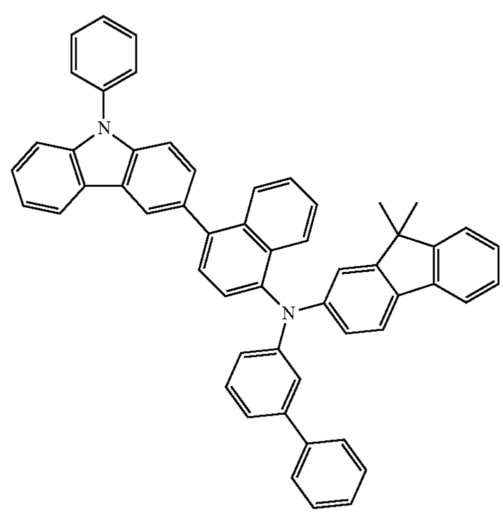

-continued
HT11
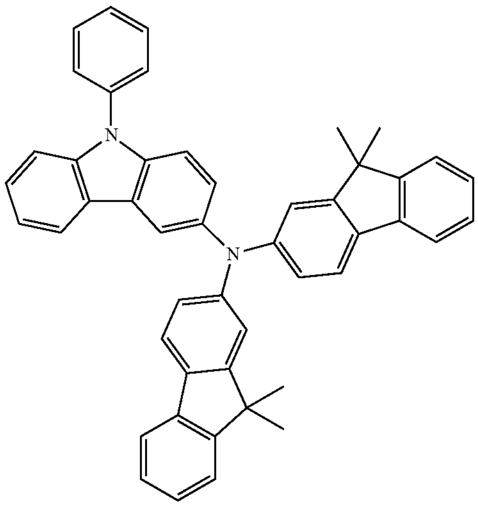
HT12
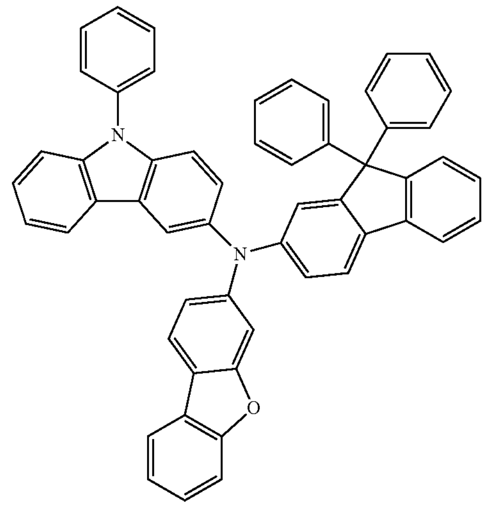
HT13
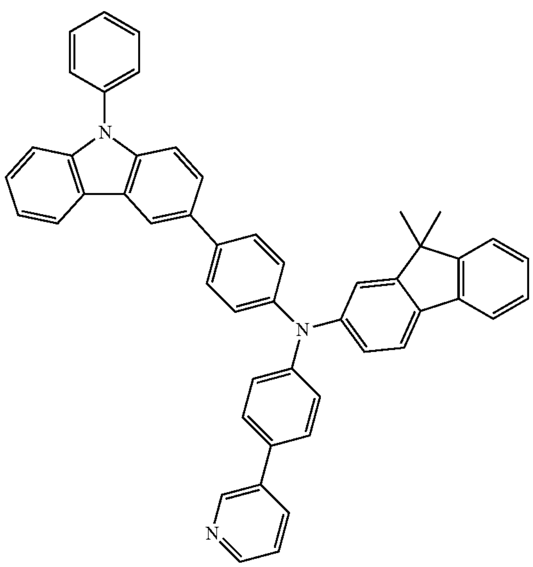
HT14
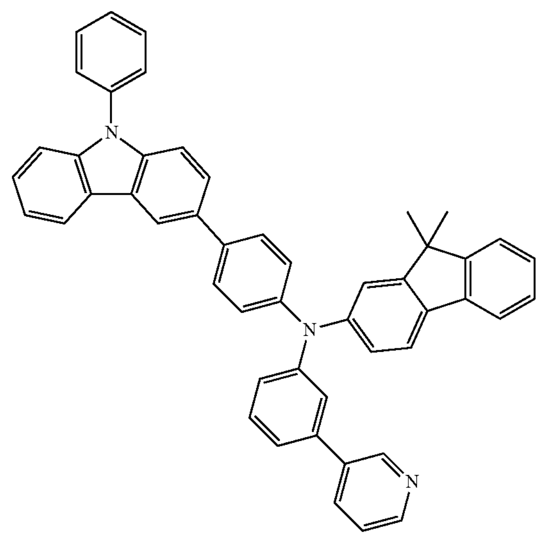
HT15
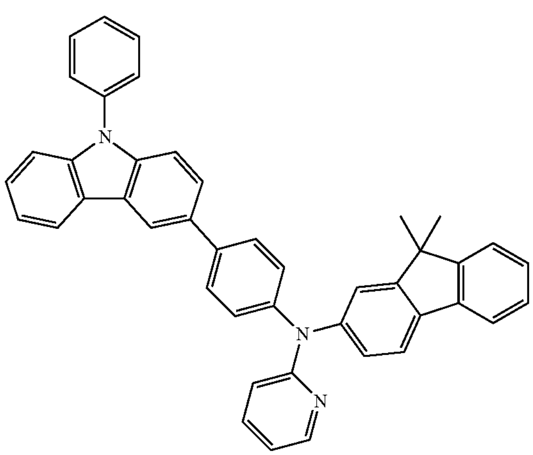
HT16
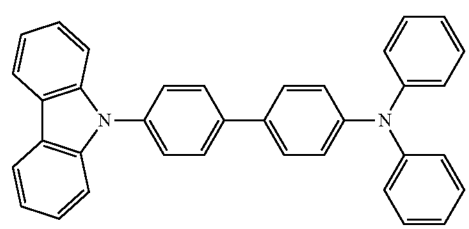

-continued
HT17
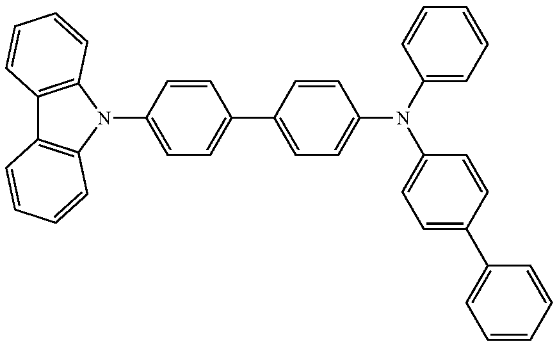
HT18
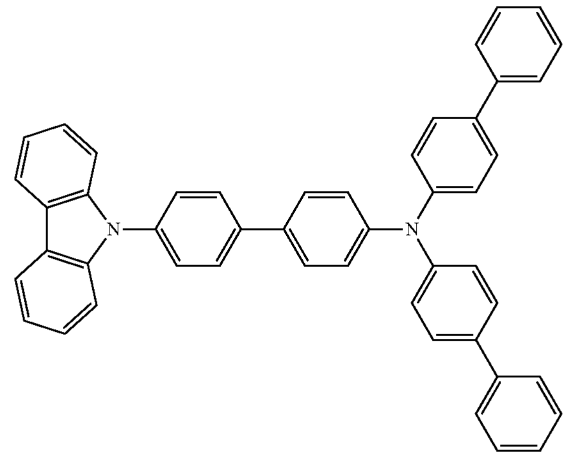
HT19
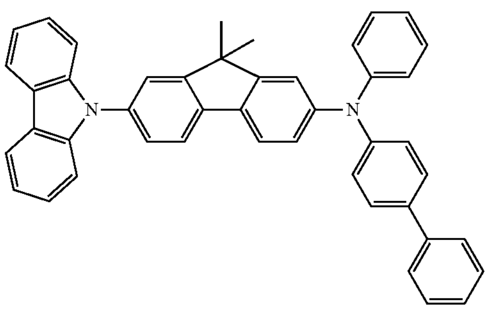
HT20
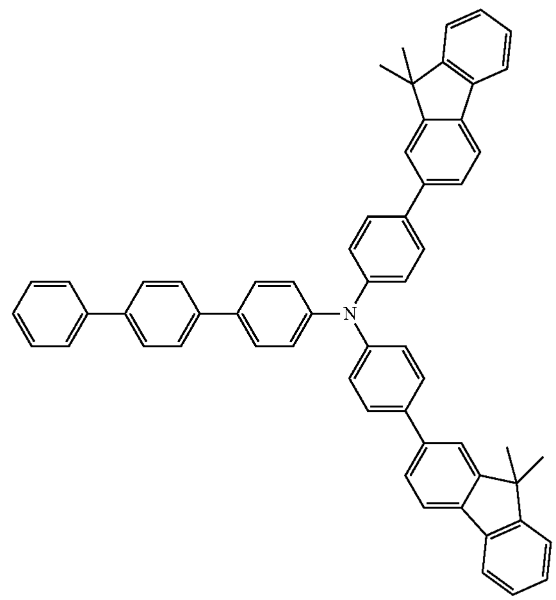
HT21
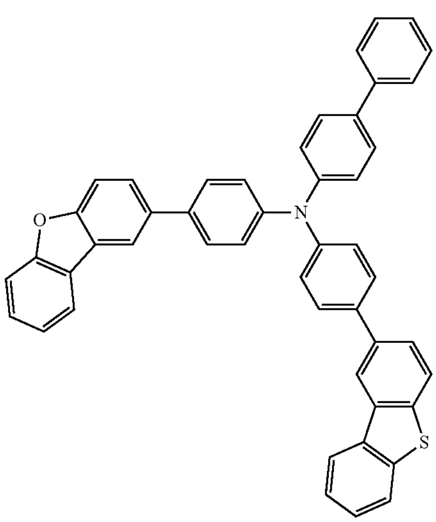
HT22
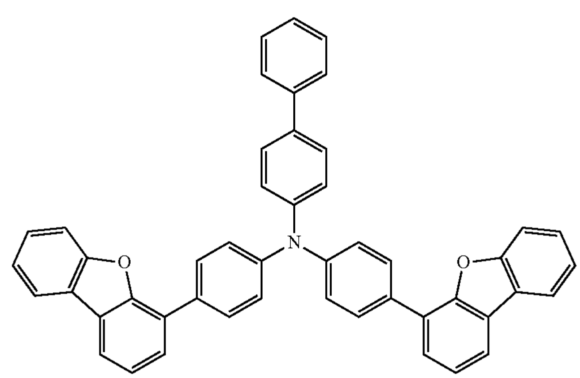

-continued
HT23
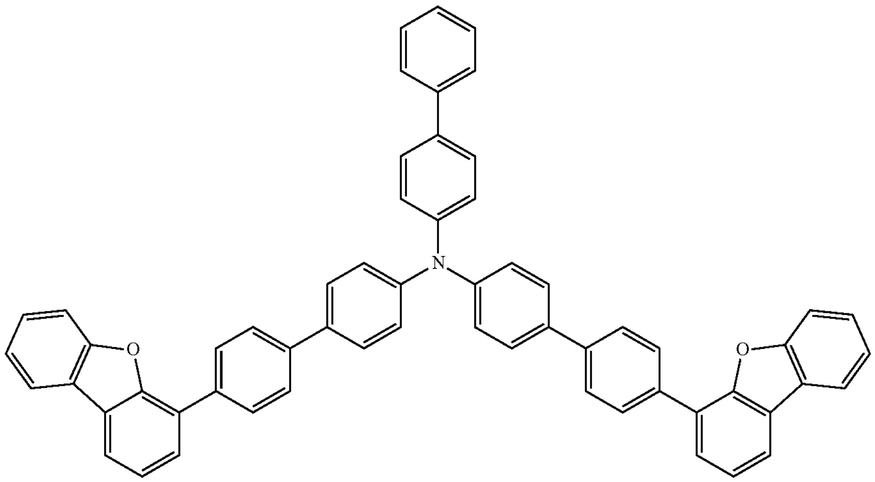
HT24
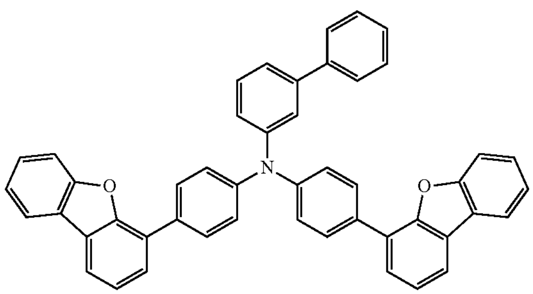
HT25
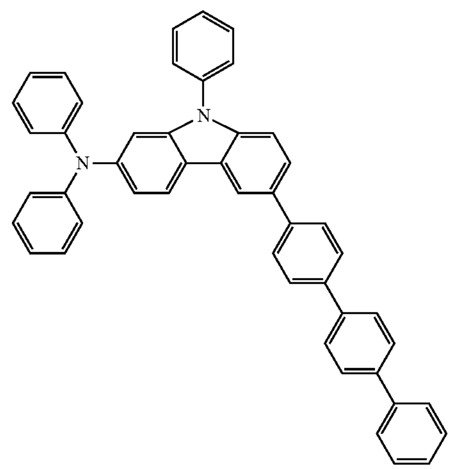
HT26
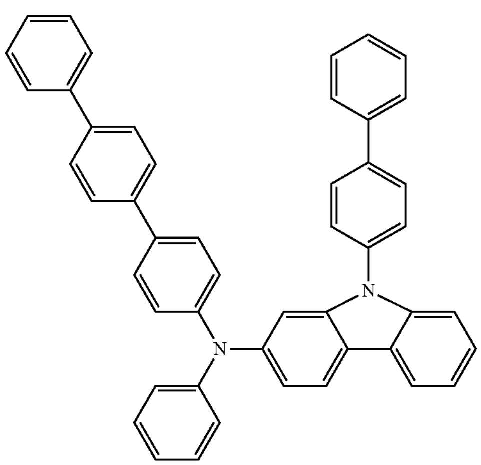
HT27
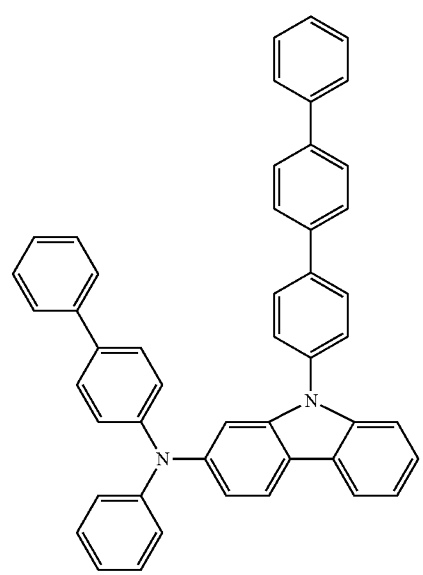

-continued
HT28
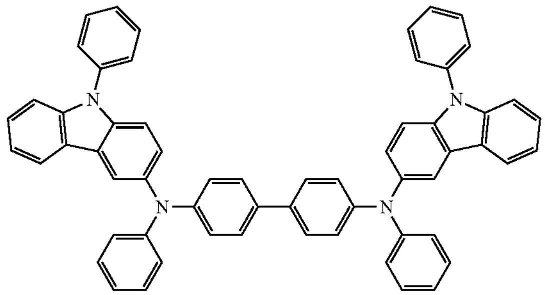
HT29
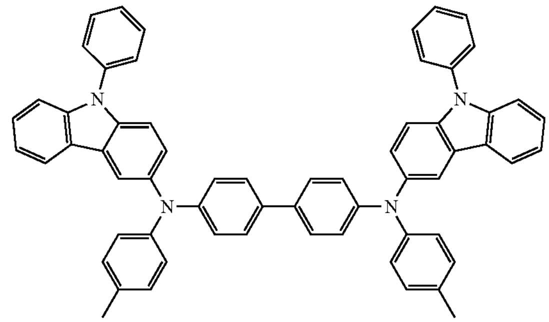
HT30
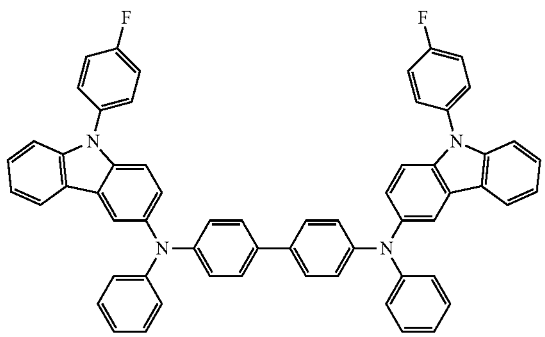
HT31
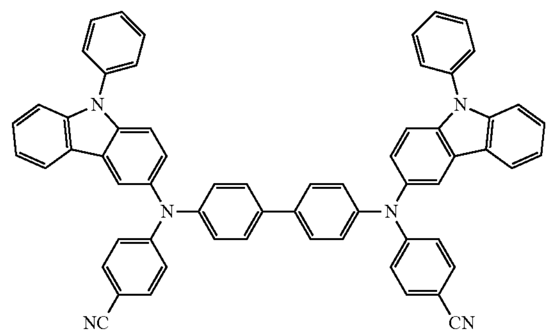
HT32
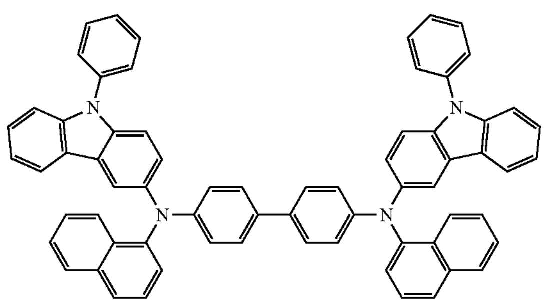
HT33
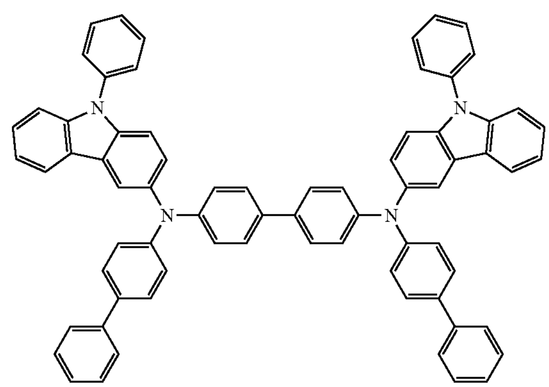
HT34
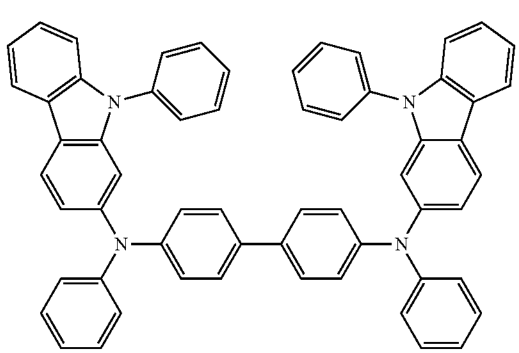
HT35
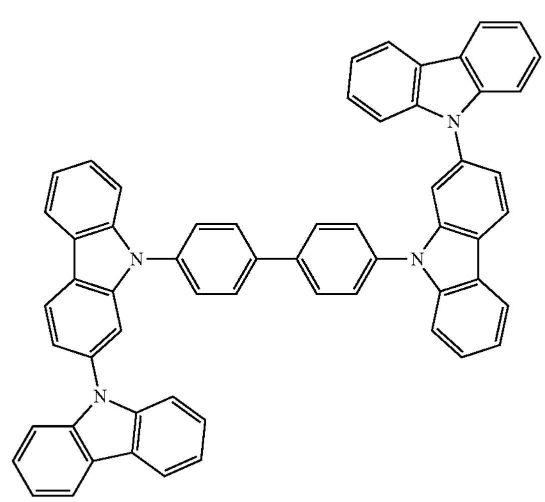

-continued

HT36

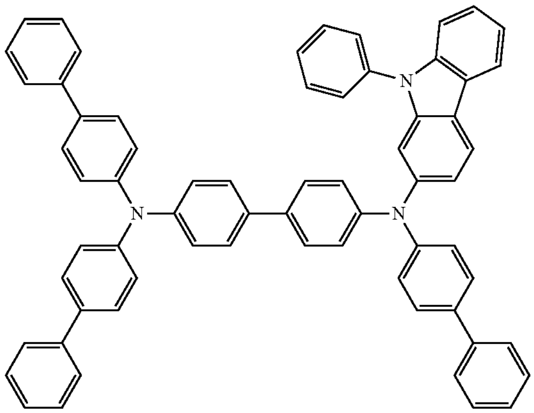

HT37

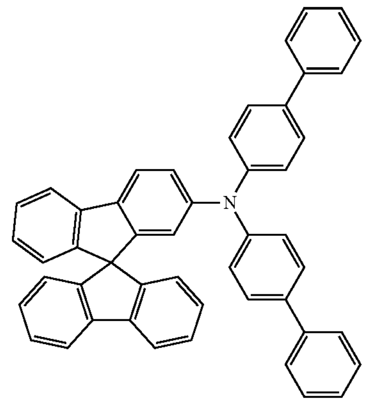

HT38

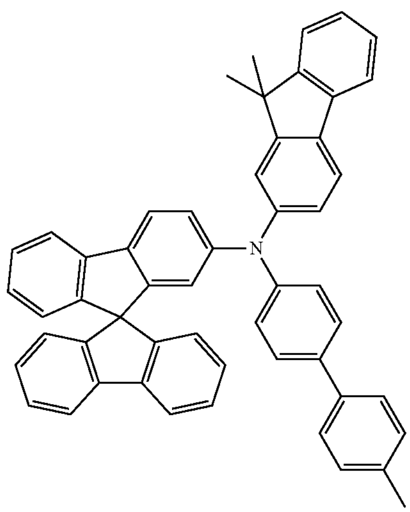

HT39

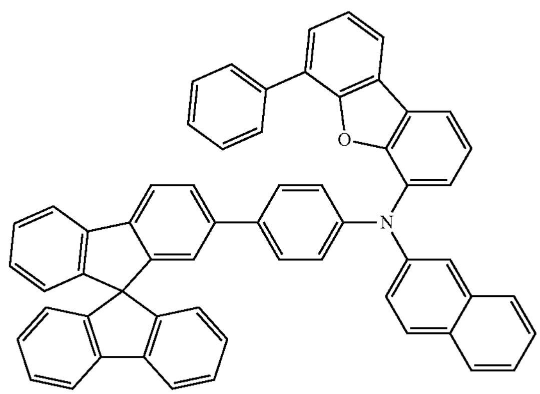

A thickness of the hole transport region may be in a range of about 100 Å to about 10,000 Å, for example, about 100 Å to about 1,000 Å. When the hole transport region includes at least one selected from a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer; and the electron blocking layer may block or reduce the flow of electrons from an electron transport region. The emission auxiliary layer and the electron blocking layer may each independently include any of the materials described above (e.g., any of the materials included in the hole transport region).

[p-Dopant]

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

According to one embodiment, a lowest unoccupied molecular orbital (LUMO) energy level of the p-dopant may be −3.5 eV or less, but embodiments are not limited thereto.

The p-dopant may include at least one selected from a quinone derivative, a metal oxide, and a cyano group-containing compound, but embodiments are not limited thereto.

For example, the p-dopant may include at least one selected from the group consisting of:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and a compound represented by Formula 221 below:
but is not limited thereto:

HAT-CN

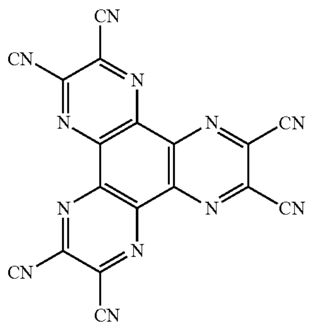

F4-TCNQ

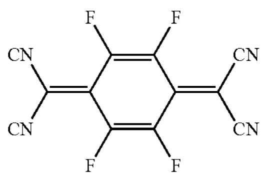

Formula 221

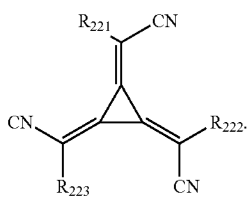

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, provided that at least one selected from $R_{221}$ to $R_{223}$ may have a substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in the Organic Layer 150]

When the organic light-emitting device 10 is a full color organic light-emitting device, the emission layer may be patterned into a red emission layer, a green emission layer, and/or a blue emission layer, according to a sub pixel. In various embodiments, the emission layer may have a stacked structure of two or more layers selected from a red emission layer, a green emission layer, and a blue emission layer, in which the two or more layers contact each other or are separated from each other. In various embodiments, the emission layer may include two or more materials selected from a red-light emission material, a green-light emission material, and a blue-light emission material, in which the two or more materials are mixed with each other in a single layer to emit white light.

In one embodiment, the emission layer of the organic light-emitting device 10 may be a first-color-light emitting-emission layer;

the organic layer may further include at least one second-color-light emitting-emission layer;

where the first-color light and the second-color light may be identical to or different from each other; and the first-color light and the second-color light may be emitted in a mixed-color light.

Herein, when the first-color light and the second-color light are different from each other, a maximum emission wavelength of the first-color light is different from a maximum emission wavelength of the second-color light.

In various embodiments, the mixed-color light may be white light, but is not limited thereto.

In one embodiment, the emission layer of the organic light-emitting device 10 may be a first-color-light emitting-emission layer;

the organic layer may further include at least one second-color-light emitting-emission layer and at least one third-color-light emitting-emission layer;

the first-color light, the second-color light, and the third-color light may be identical to or different from each other;

the first-color light, the second-color light, and the third-color light may be emitted in a mixed-color light.

Herein, when the first-color light, the second-color light, and the third-color light are different from each other, a maximum emission wavelength of the first-color light, a maximum emission wavelength of the second-color light, and a maximum emission wavelength of the third-color light are different from each other.

In various embodiments, the mixed-color light may be white light, but is not limited thereto.

The emission layer may include a host and a dopant. The dopant may be at least one selected from a phosphorescent dopant and a fluorescent dopant.

An amount of the dopant in the emission layer may be, for example, in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. When the thickness of the emission layer is within any of these ranges, excellent (or suitable) light-emission characteristics may be obtained without a substantial increase in driving voltage.

[Host in the Emission Layer]

The host may include the first compound represented by Formula 1.

[Fluorescent Dopant in the Emission Layer]

The fluorescent dopant may include the second compound represented by Formula 2.

[Electron Transport Region in the Organic Layer 150]

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer (ETL), and an electron injection layer, but is not limited thereto.

For example, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein in each of these structures, constituting layers are sequentially stacked in this stated order from an emission layer. However, the structure of the electron transport layer is not limited thereto.

The electron transport region (e.g., a buffer layer, a hole blocking layer, an electron control layer, or an electron transport layer in the electron transport region) may include a metal-free compound containing at least one π electron-depleted nitrogen-containing ring.

The "π electron-depleted nitrogen-containing ring" may refer to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzoimidazole, an isobenzothiazole, a benzoxazole, an isobenzoxazole, a triazole, a tetrazole, an oxadiazole, a triazine, thiadiazol, an imidazopyridine, an imidazopyrimidine, and an azacarbazole, but are not limited thereto.

For example, the electron transport region may include a compound represented by Formula 601:

$$[Ar_{601}]_{xe11}\text{-}[(L_{601})_{xe1}\text{-}R_{601}]_{xe21}.$$ <Formula 601>

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be selected from a $C_1$-$C_{10}$ alkyl group, a $C_1$-$C_{10}$ alkoxy group, a phenyl group, a biphenyl group, a terphenyl group, and a naphthyl group, and xe21 may be an integer selected from 1 to 5.

In one embodiment, at least one selected from $Ar_{601}$(s) (where the number of $Ar_{601}$(s) equals to xe11) and/or at least one selected from $R_{601}$(s) (where the number of $R_{601}$(s) equals to xe21) may include the π electron-depleted nitrogen-containing ring as described above.

In one embodiment, ring $Ar_{601}$ in Formula 601 may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, thiadiazol group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, thiadiazol group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked to each other via a single bond.

In various embodiments, $Ar_{601}$ in Formula 601 may be an anthracene group.

In various embodiments, a compound represented by Formula 601 may be represented by Formula 601-1:

Formula 601-1

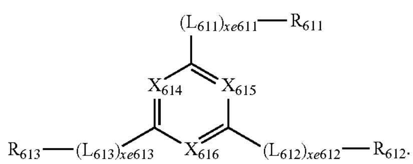

In Formula 601-1, $X_{614}$ may be N or $C(R_{614})$, $X_{615}$ may be N or $C(R_{615})$, $X_{616}$ may be N or $C(R_{616})$, at least one selected from $X_{614}$ to $X_{616}$ may be N, descriptions of $L_{611}$ to $L_{613}$ may each independently be understood by referring to the description provided above in connection with $L_{601}$, descriptions of xe611 to xe613 may each independently be understood by referring to the description provided above in connection with xe1, descriptions of $R_{611}$ to $R_{613}$ may each independently be understood by referring to the description provided above in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but are not limited thereto.

In various embodiments, xe1 and xe611 to xe613 in Formulae 601 and 601-1 may each independently be 0, 1, or 2.

In various embodiments, $R_{601}$ and $R_{611}$ to $R_{613}$ in Formulae 601 and 601-1 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O) ($Q_{601}$) and —P(=O)($Q_{601}$)($Q_{602}$), wherein $Q_{601}$ and $Q_{602}$ may be the same as described above.

The electron transport region may include at least one compound selected from Compounds ET1 to ET36, but a material to be included in the electron transport region is not limited thereto:

ET1

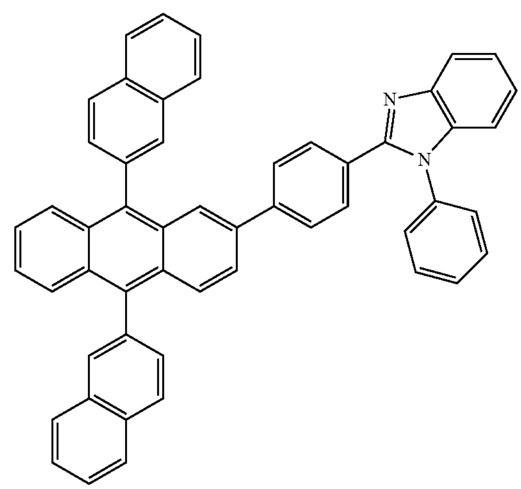

ET2

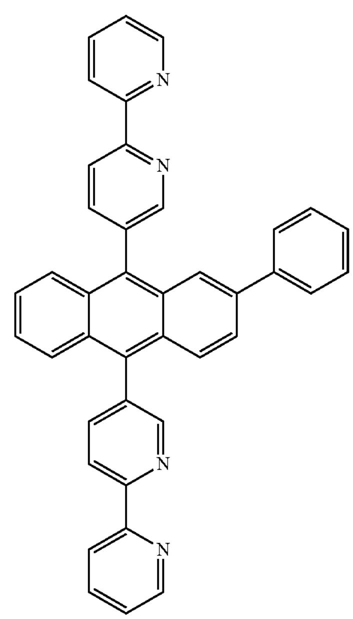

-continued
ET3
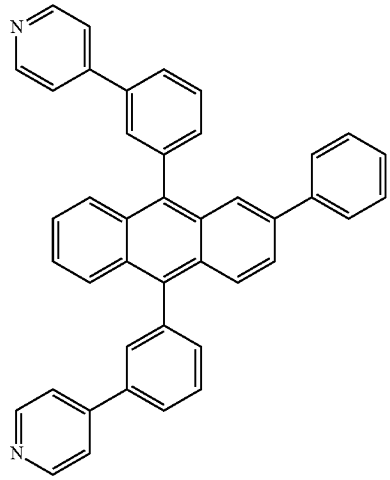
ET4
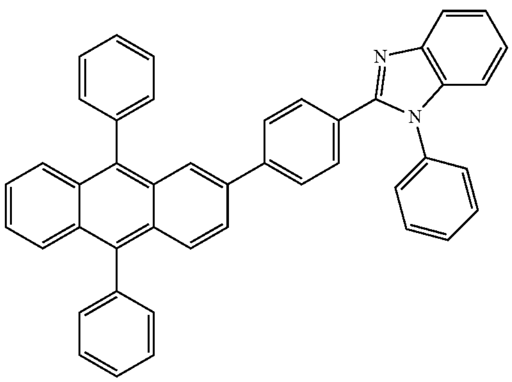
ET5
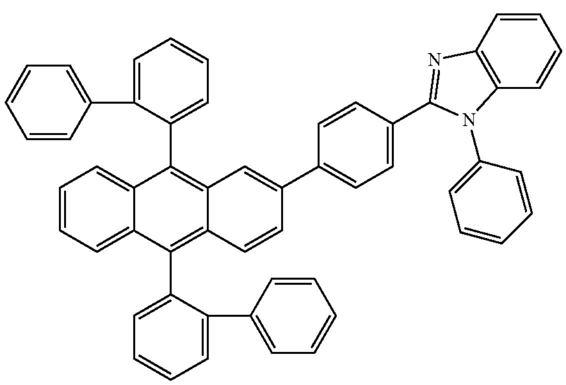
-continued
ET6
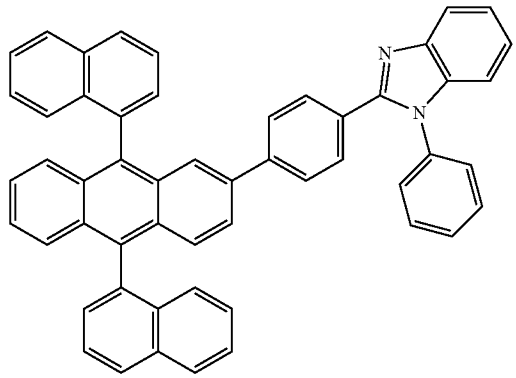
ET7
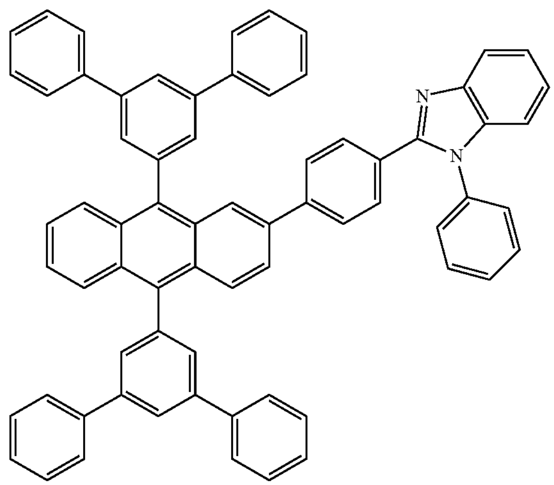
ET8
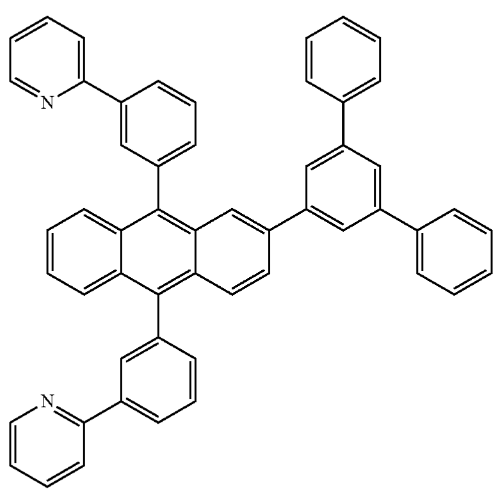

ET9
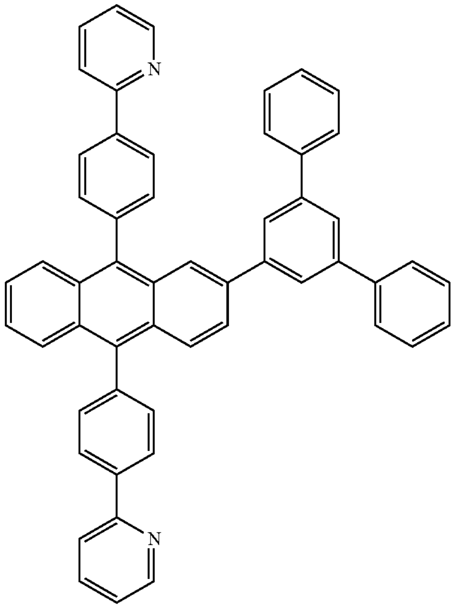
ET10
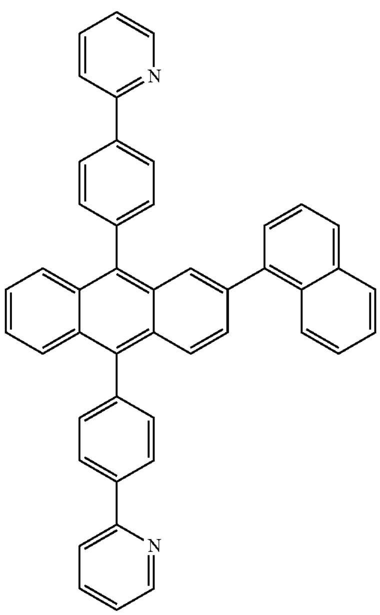
ET11
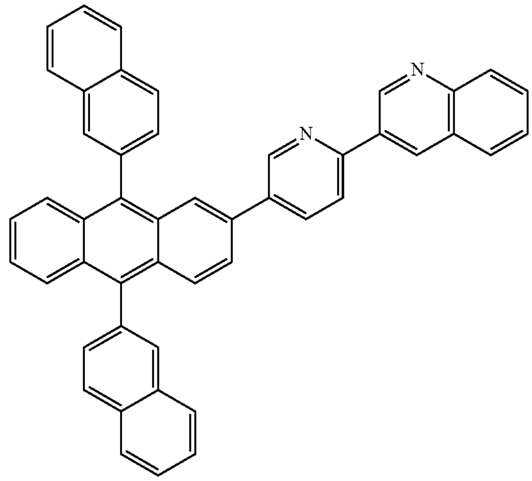
ET12
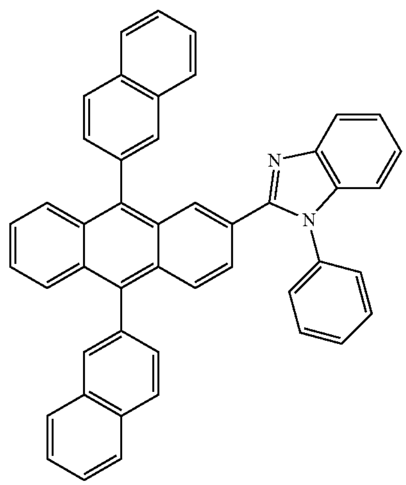
ET13
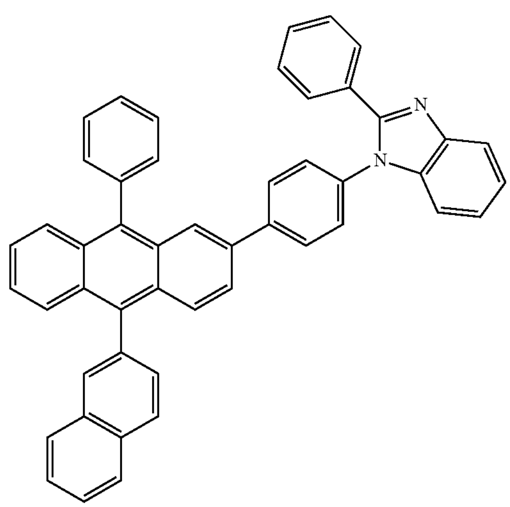

-continued
ET14
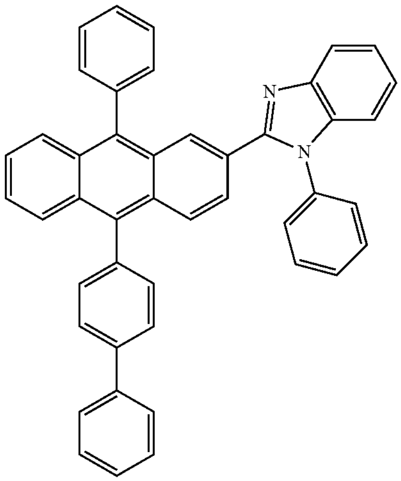
ET15
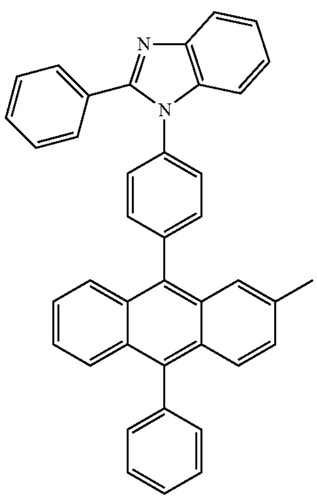
ET16
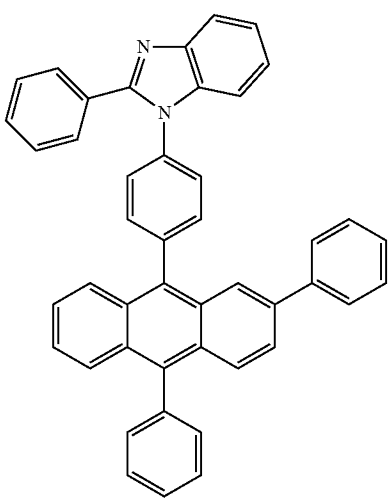
-continued
ET17
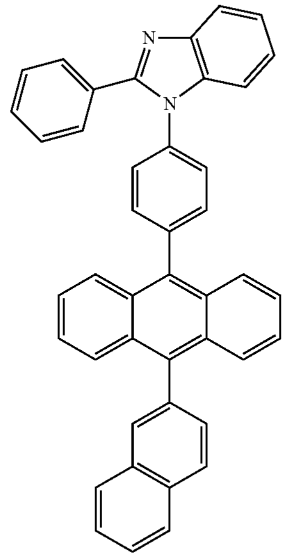
ET18
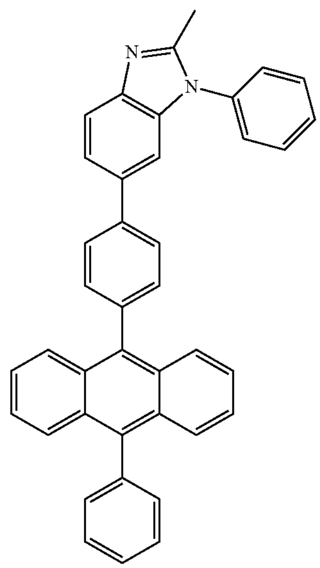
ET19
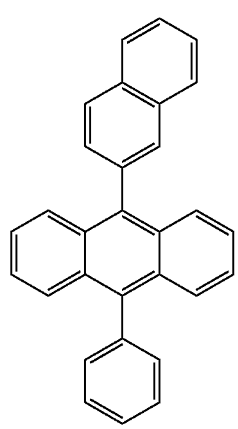

-continued
ET20
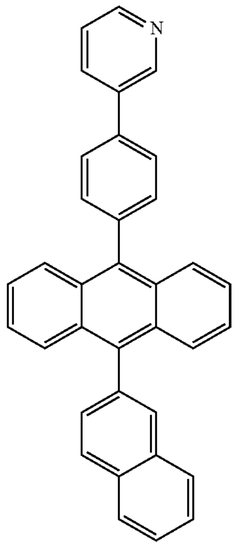
ET21
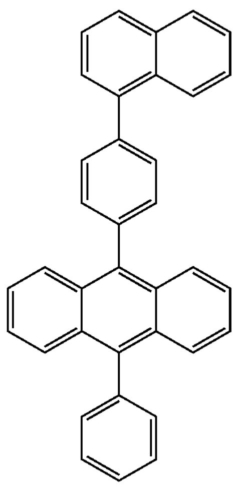
ET22
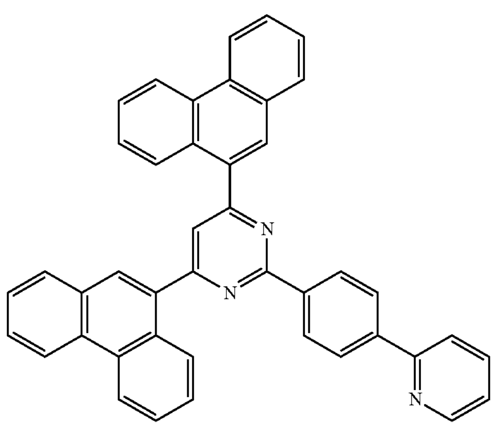
-continued
ET23
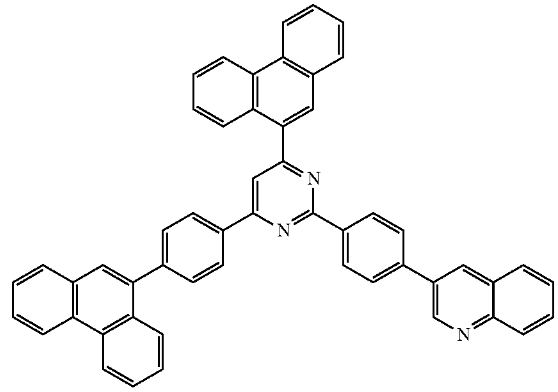
ET24
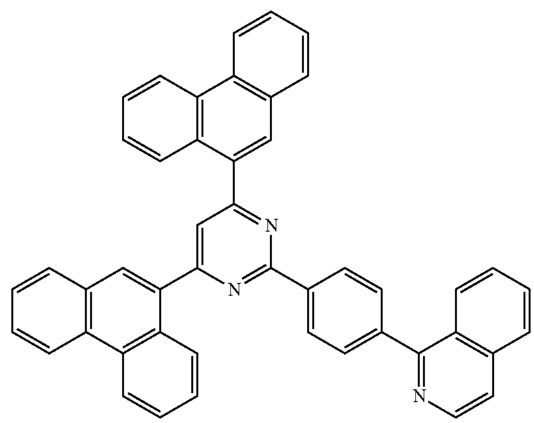
ET25
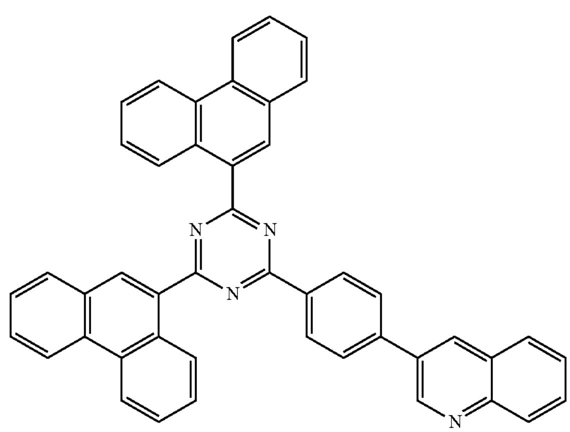

ET26
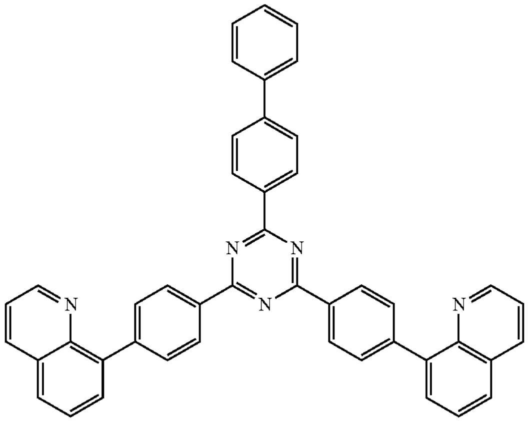
ET27
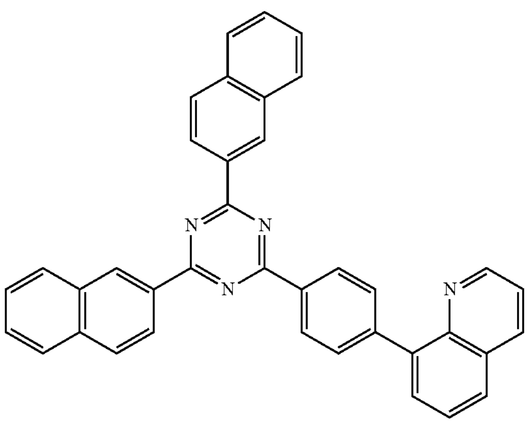
ET28
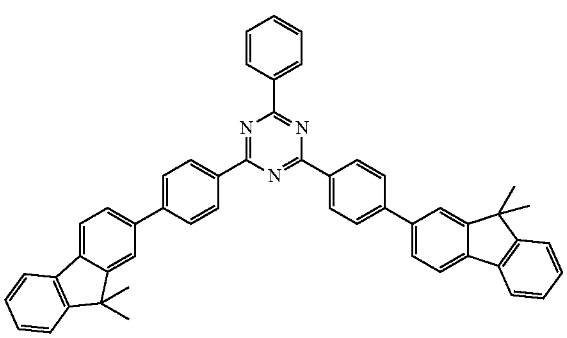
ET29
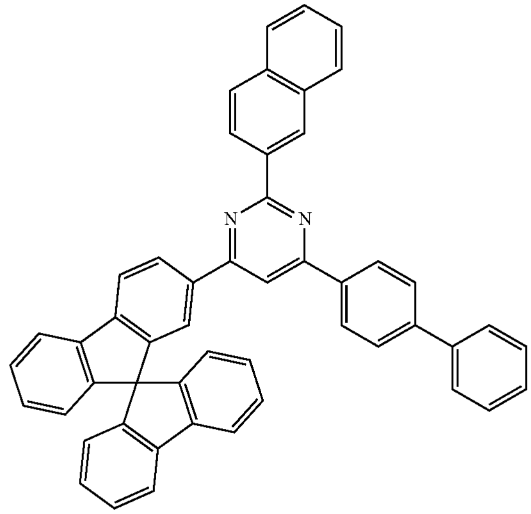
ET30
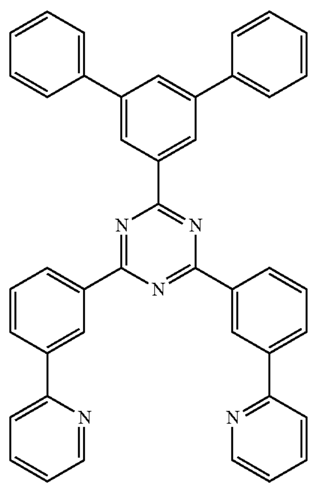
ET31
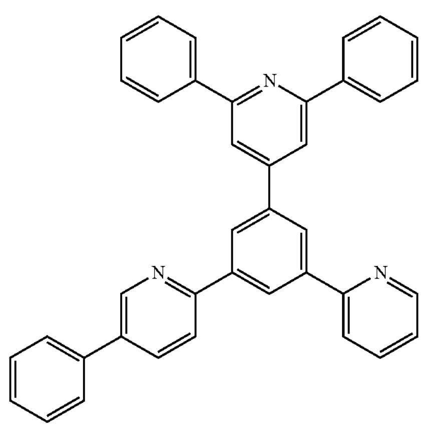

-continued
ET32
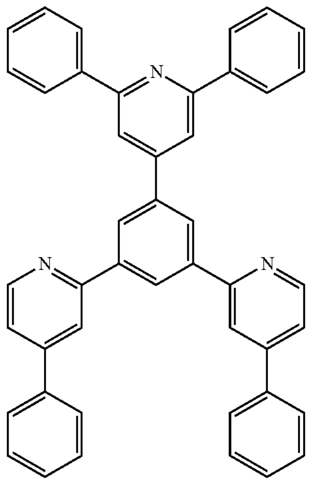
ET33
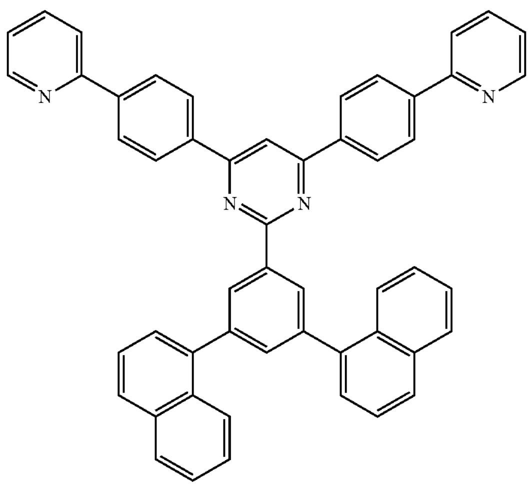
ET34
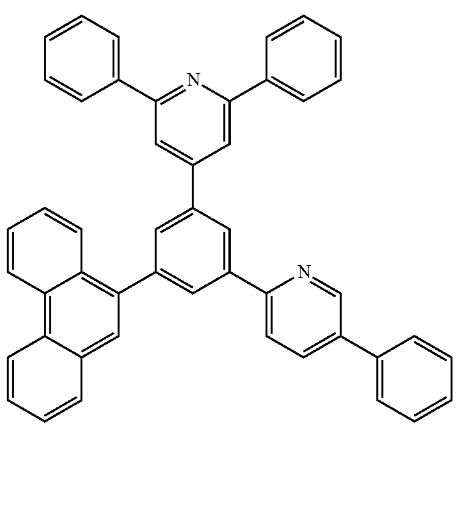
-continued
ET35
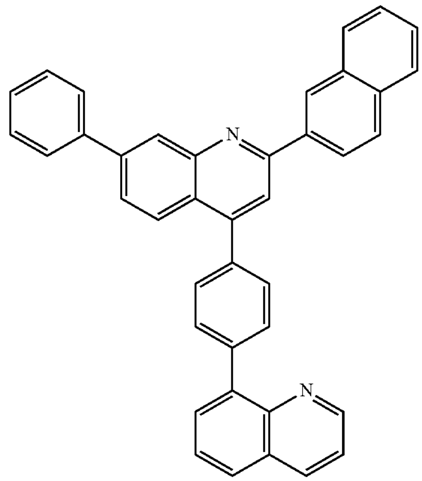
ET36
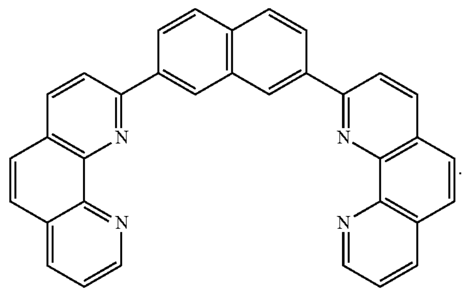
In various embodiments, the electron transport region may include at least one compound selected from BCP (2,9-Dimethyl-4,7-diphenyl-1,10-phenanthroline), Bphen (4,7-Diphenyl-1,10-phenanthroline), $Alq_3$, Balq, TAZ (3-(Biphenyl-4-yl)-5-(4-tert-butylphenyl)-4-phenyl-4H-1,2,4-triazole), and NTAZ.
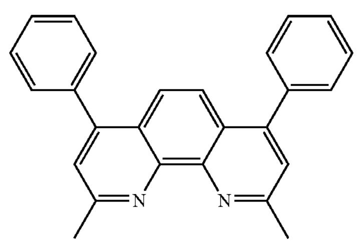
BCP
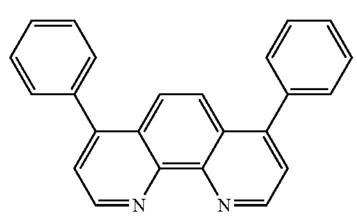
Bphen -continued

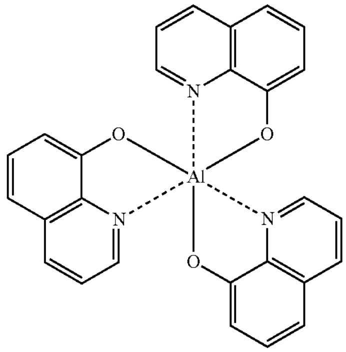

$Alq_3$

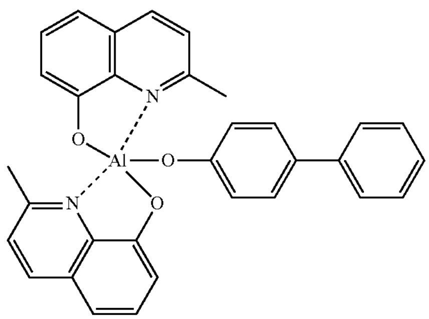

BAlq

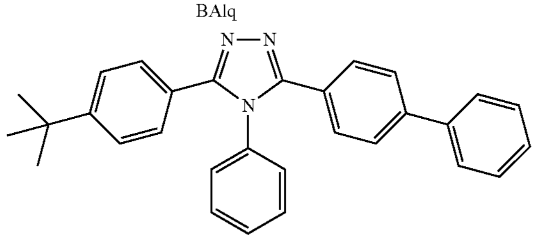

TAZ

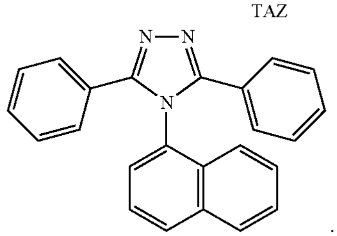

NTAZ

A thickness of the buffer layer, the hole blocking layer, and the electron control layer may be each independently in a range of about 20 Å to about 1,000 Å, for example, about 30 Å to about 300 Å. When the thicknesses of the buffer layer, the hole blocking layer, and the electron control layer are within any of these ranges, the electron transport region may have excellent hole blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory (or suitable) electron transport characteristics without a substantial increase in driving voltage.

The electron transport region (e.g., the electron transport layer in the electron transport region) may further include, in addition to the materials described above, metal-containing materials.

The metal-containing materials may include alkaline metals, alkaline earth metals, rare-earth-metals, alkaline metal compounds, alkaline earth-metal compounds, rare-earth metal compounds, alkaline metal complexes, alkaline earth-metal complexes, rare-earth metal complexes, or any combinations thereof.

The alkaline metal may be selected from Li, Na, K, Rb, and Cs. In one embodiment, the alkaline metal may be Li, Na, or Cs. In various embodiments, the alkaline metal may be Li or Cs, but is not limited thereto.

The alkaline earth metal may be selected from Mg, Ca, Sr, and Ba.

The rare-earth metal may be selected from Sc, Y, Ce, Tb, Yb, Gd, and Tb.

The alkaline metal compounds, the alkaline earth-metal compounds, and the rare-earth metal compounds may be selected from oxides and halides (e.g., fluorides, chlorides, bromides, and/or iodines) of the alkaline metals, the alkaline earth-metals, and rare-earth metals, respectively.

The alkaline metal compound may be selected from alkaline metal oxides (such as $Li_2O$, $Cs_2O$, and/or $K_2O$) and alkaline metal halides (such as LiF, NaF, CsF, KF, LiI, NaI, CsI, and/or KI). In one embodiment, the alkaline metal compound may be selected from LiF, $Li_2O$, NaF, LiI, NaI, CsI, and KI, but is not limited thereto.

The alkaline earth-metal compound may be selected from BaO, SrO, CaO, $Ba_xSr_{1-x}O(0<x<1)$, and $Ba_xCa_{1-x}O$ $(0<x<1)$. In one embodiment, the alkaline earth-metal compound may be selected from BaO, SrO, and CaO, but is not limited thereto.

The rare-earth metal compound may be selected from $YbF_3$, $ScF_3$, $ScO_3$, $Y_2O_3$, $Ce_2O_3$, $GdF_3$, and $TbF_3$. In one embodiment, the rare-earth metal compound may be selected from $YbF_3$, $ScF_3$, $TbF_3$, $YbI_3$, $ScI_3$, and $TbI_3$, but is not limited thereto.

The alkaline metal complex may include a metal ion selected from a Li ion, a Na ion, a K ion, a Rb ion, and a Cs ion; and the alkaline earth-metal complex may include a metal ion selected from a Be ion, a Mg ion, a Ca ion, a Sr ion, and a Ba ion. Ligands coordinated with the metal ion of the alkaline metal complex or the alkaline earth-metal complex may each independently be selected from a hydroxy quinoline, a hydroxy isoquinoline, a hydroxy benzoquinoline, a hydroxy acridine, a hydroxy phenanthridine, a hydroxy phenyl oxazole, a hydroxy phenylthiazole, a hydroxy diphenyl oxadiazole, a hydroxy diphenylthiadiazole, a hydroxy phenylpyridine, a hydroxy phenylbenzoimidazole, a hydroxy phenylbenzothiazole, a bipyridine, a phenanthroline, and a cyclopentadiene, but are not limited thereto.

For example, the metal-containing material may include a Li complex. The Li complex may include, for example, Compound ET-D1 (lithium quinolate, LiQ) and/or Compound ET-D2.

ET-D1

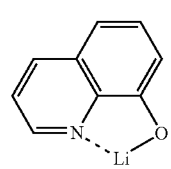

-continued

ET-D2

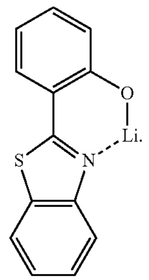

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include a reducing dopant.

The reducing dopant may include at least one selected from alkaline metals, alkaline earth-metals, rare-earth metals, alkaline metal compounds, alkaline earth-metal compounds, rare-earth metal compounds, alkaline metal complexes, alkaline earth metal complexes, and rare-earth metal complexes.

The alkaline metals, the alkaline earth metals, and the rare-earth metals may be respectively the same as the alkaline metals, alkaline earth metals, and rare-earth metals described above, but they are not limited thereto.

The alkaline metal compounds, the alkaline earth metal compounds, and the rare-earth metal compounds may be respectively the same as the alkaline metal compounds, alkaline earth metal compounds, and rare-earth metal compounds described above, but they are not limited thereto.

The alkaline metal complexes, the alkaline earth-metal complexes, and the rare-earth metal complexes may each independently include a metal ion selected from alkaline metals, alkaline earth-metals, and rare-earth metals as described above; and ligands coordinated with the metal ion selected from the alkaline metal complexes, the alkaline earth-metal complexes, and the rare-earth metal complexes may each independently be selected from hydroxy quinoline, hydroxy isoquinoline, hydroxy benzoquinoline, hydroxy acridine, hydroxy phenanthridine, hydroxy phenyl oxazole, hydroxy phenylthiazole, hydroxy diphenyl oxadiazole, hydroxy diphenylthiadiazole, hydroxy phenylpyridine, hydroxy phenylbenzoimidazole, hydroxy phenylbenzothiazole, bipyridine, a phenanthroline, and cyclopentadiene, but are not limited thereto.

The electron injection layer may include only the reducing dopant described above, or may include the reducing dopant and an organic material. When the electron injection layer includes the reducing dopant and an organic material, the reducing dopant may be homogeneously or non-homogeneously dispersed in a matrix consisting of the organic material.

A thickness of the electron injection layer may be in a range of about 1 Å to about 100 Å, for example, about 3 Å to about 90 Å. When the thickness of the electron injection layer is within any of the ranges described above, the electron injection layer may have satisfactory (or suitable) electron injection characteristics without a substantial increase in driving voltage.

[Second Electrode 190]

The second electrode 190 may be disposed (e.g., positioned) on the organic layer 150 having the structure according to embodiments of the present disclosure. The second electrode 190 may be a cathode (which is an electron injection electrode), and in this regard, a material for forming the second electrode 190 may be selected from a metal, an alloy, an electrically conductive compound, and a mixture thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but is not limited thereto. The second electrode 190 may be a transmissive electrode, a semi-transmissive electrode, or a reflective electrode.

The second electrode 190 may have a single-layer structure, or a multi-layer structure including two or more layers.

Figure 2:
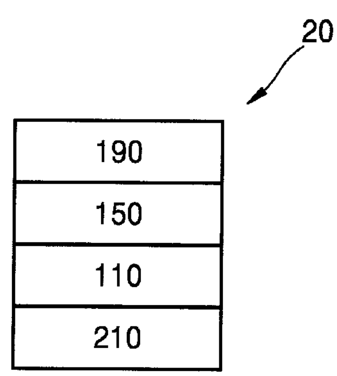
FIG. 2 is a schematic cross-sectional view of an organic light-emitting device according to an embodiment.
Figure 3:
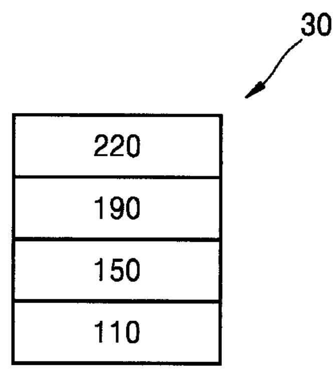
FIG. 3 is a schematic view of an organic light-emitting device according to an embodiment.
Figure 4:
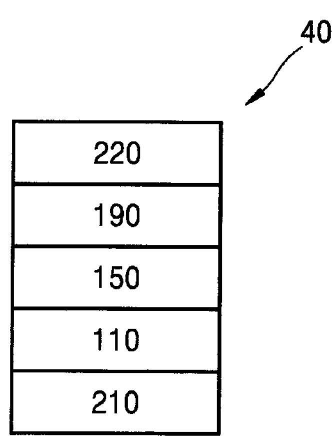
FIG. 4 is a schematic view of an organic light-emitting device according to an embodiment.

[Description of FIGS. 2 to 4]

An organic light-emitting device 20 of FIG. 2 includes a first capping layer 210, a first electrode 110, an organic layer 150, and a second electrode 190, which are sequentially stacked in this stated order; an organic light-emitting device 30 of FIG. 3 includes a first electrode 110, an organic layer 150, a second electrode 190, and a second capping layer 220, which are sequentially stacked in this stated order; and an organic light-emitting device 40 of FIG. 4 includes a first capping layer 210, a first electrode 110, an organic layer 150, a second electrode 190, and a second capping layer 220, which are sequentially stacked in this stated order.

Regarding FIGS. 2 to 4, descriptions of the first electrode 110, the organic layer 150, and the second electrode 190 may each independently be understood by referring to the descriptions thereof presented in connection with FIG. 1.

In the organic layer 150 of each of the organic light-emitting devices 20 and 40, light generated in an emission layer may pass through the first electrode 110 (which may be a semi-transmissive electrode or a transmissive electrode) and the first capping layer 210 toward the outside; and in the organic layer 150 of each of the organic light-emitting devices 30 and 40, light generated in an emission layer may pass through the second electrode 190 (which may be a semi-transmissive electrode or a transmissive electrode) and the second capping layer 220 toward the outside.

The first capping layer 210 and the second capping layer 220 may increase external luminescent efficiency according to the principle of constructive interference.

The first capping layer 210 and the second capping layer 220 may each independently be a capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphine derivatives, phthalocyanine derivatives, naphthalocyanine derivatives, alkaline metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

In various embodiments, at least one selected from the first capping layer 210 and the second capping layer 220 may each independently include a compound selected from Compounds HT28 to HT33 and Compounds CP1 to CP5, but is not limited thereto.

CP1

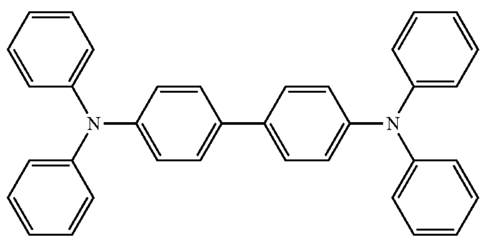

CP2

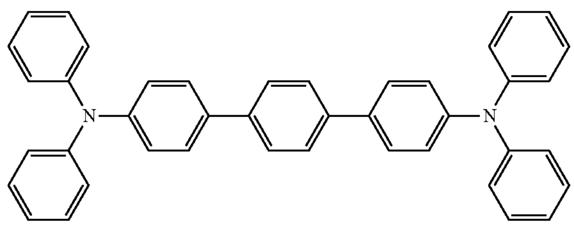

CP3

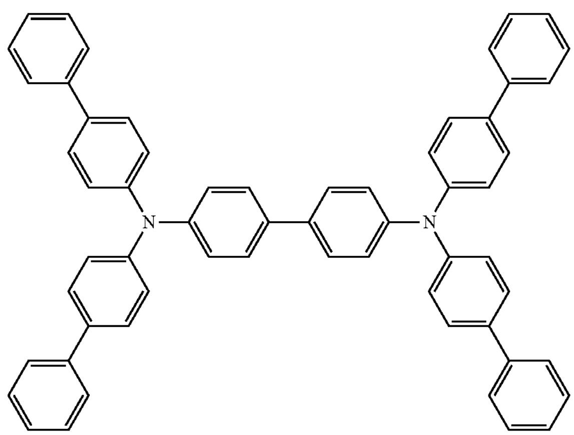

CP4

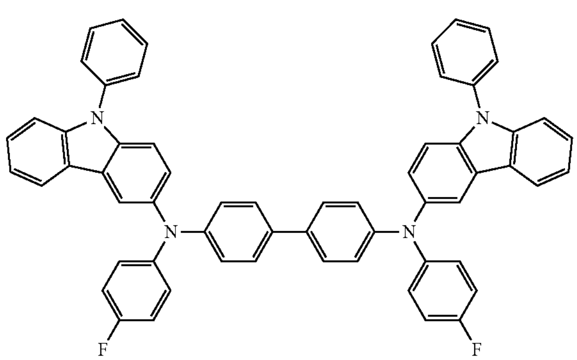

-continued

CP5

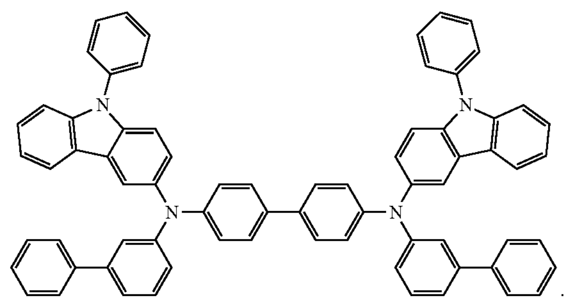

Hereinbefore, the organic light-emitting device according to one or more embodiments of the present disclosure has been described in connection with FIGS. 1-4. However, embodiments of the present disclosure are not limited thereto.

Layers constituting the hole transport region, the emission layer, and the electron transport region may be each independently be formed by using one or more suitable methods such as vacuum deposition, spin coating, casting, a Langmuir-Blodgett (LB) method, ink-jet printing, laser-printing, and/or laser-induced thermal imaging.

When a layer included in any of the hole transport region, the emission layer, and the electron transport region is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, by taking into account a compound to be included in a to-be-formed layer, and the structure of the to-be-formed layer.

When a layer included in any of the hole transport region, the emission layer, and the electron transport region is formed by spin coating, for example, the spin coating may be performed at a coating speed (or rate) of about 2000 rpm to about 5000 rpm, and at a heat treatment temperature of about 80° C. to 200° C., by taking into account a compound to be included in a to-be-formed layer, and the structure of the to-be-formed layer.

[General Definition of Substituents]

The term "$C_1$-$C_{60}$ alkyl group," as used herein, may refer to a linear or branched aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, may refer to a divalent group having the same structure as the $C_1$-$C_{60}$ alkyl group.

The term "$C_2$-$C_{60}$ alkenyl group," as used herein, may refer to a hydrocarbon group having at least one carbon double bond at one or more positions along the hydrocarbon chain of the $C_2$-$C_{60}$ alkyl group (e.g., in the middle and/or at either terminus of the $C_2$-$C_{60}$ alkyl group), and non-limiting examples thereof include an ethenyl group, a propenyl group, and a butenyl group. The term "$C_2$-$C_{60}$ alkenylene group," as used herein, may refer to a divalent group having the same structure as the $C_2$-$C_{60}$ alkenyl group.

The term "$C_2$-$C_{60}$ alkynyl group," as used herein, may refer to a hydrocarbon group having at least one carbon triple bond at one or more positions along the hydrocarbon chain of the $C_2$-$C_{60}$ alkyl group (e.g., in the middle and/or at either terminus of the $C_2$-$C_{60}$ alkyl group), and non-limiting examples thereof include an ethynyl group and a propynyl group. The term "$C_2$-$C_{60}$ alkynylene group," as used herein, may refer to a divalent group having the same structure as the $C_2$-$C_{60}$ alkynyl group.

The term "$C_1$-$C_{60}$ alkoxy group," as used herein, may refer to a monovalent group represented by —$OA_{101}$ (wherein $A_{101}$ is the $C_1$-$C_{60}$ alkyl group), and non-limiting examples thereof include a methoxy group, an ethoxy group, and an isopropoxy group.

The term "$C_3$-$C_{10}$ cycloalkyl group," as used herein, may refer to a monovalent hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, may refer to a divalent group having the same structure as the $C_3$-$C_{10}$ cycloalkyl group.

The term "$C_1$-$C_{10}$ heterocycloalkyl group," as used herein, may refer to a monovalent monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group," used herein, may refer to a divalent group having the same structure as the $C_1$-$C_{10}$ heterocycloalkyl group.

The term "$C_3$-$C_{10}$ cycloalkenyl group," as used herein, may refer to a monovalent monocyclic group that has 3 to 10 carbon atoms and at least one double bond in the ring thereof and does not have aromaticity, and non-limiting examples thereof are a cyclopentenyl group, a cyclohexenyl group, and a cycloheptenyl group. The term "$C_3$-$C_{10}$ cycloalkenylene group," used herein, may refer to a divalent group having the same structure as the $C_3$-$C_{10}$ cycloalkenyl group.

The term "$C_1$-$C_{10}$ heterocycloalkenyl group," as used herein, may refer to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-hydrofuranyl group and a 2,3-hydrothiophenyl group. The term "$C_1$-$C_{10}$ heterocycloalkenylene group," used herein, may refer to a divalent group having the same structure as the $C_1$-$C_{10}$ heterocycloalkenyl group.

The term "$C_6$-$C_{60}$ aryl group," as used herein, may refer to a monovalent group having a carbocyclic aromatic system having 6 to 60 carbon atoms, and a $C_6$-$C_{60}$ arylene group," as used herein, may refer to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused to each other.

The term "$C_1$-$C_{60}$ heteroaryl group," as used herein, may refer to a monovalent group having a carbocyclic aromatic system that has at least one heteroatom selected from N, O, Si, P, and S as a ring-forming atom, and 1 to 60 carbon atoms. The term "$C_1$-$C_{60}$ heteroarylene group," as used herein, may refer to a divalent group having a carbocyclic aromatic system that has at least one heteroatom selected from N, O, Si, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused to each other.

The term "$C_6$-$C_{60}$ aryloxy group," used herein, may refer to a monovalent group represented by —$OA_{102}$ (wherein $A_{102}$ is the $C_6$-$C_{60}$ aryl group), and a $C_6$-$C_{60}$ arylthio group may refer to a monovalent group represented by —$SA_{103}$ (wherein $A_{103}$ is the $C_6$-$C_{60}$ aryl group).

The term "monovalent non-aromatic condensed polycyclic group," as used herein, may refer to a monovalent group that has two or more rings condensed (e.g., fused) with each other, only carbon atoms as ring-forming atoms (e.g., 8 to 60 carbon atoms), and non-aromaticity in the entire molecular structure (e.g., does not have overall aromaticity). Non-limiting example of the monovalent non-aromatic condensed polycyclic group is a fluorenyl group. The term "divalent non-aromatic condensed polycyclic group," used herein, may refer to a divalent group having the same structure as the monovalent non-aromatic condensed polycyclic group.

The term "monovalent non-aromatic condensed heteropolycyclic group," as used herein, may refer to a monovalent group that has two or more rings condensed (e.g., fused) to each other, has at least one heteroatom selected from N, O, Si, P, and S, other than carbon atoms (e.g., 1 to 60 carbon atoms), as ring-forming atoms, and has non-aromaticity in the entire molecular structure (e.g., does not have overall aromaticity). An example of the monovalent non-aromatic condensed heteropolycyclic group is a carbazolyl group. The term "divalent non-aromatic condensed heteropolycyclic group," used herein, may refer to a divalent group having the same structure as the monovalent non-aromatic condensed heteropolycyclic group.

The term "$C_5$-$C_{60}$ carbocyclic group," as used herein, may refer to a monocyclic or polycyclic group having 5 to 60 carbon atoms, in which ring-forming atoms include carbon atoms only. The $C_5$-$C_{60}$ carbocyclic group may be an aromatic carbocyclic group or a non-aromatic carbocyclic group. The $C_5$-$C_{60}$ carbocyclic group may be a ring (such as a benzene), a monovalent group (such as a phenyl group), or a divalent group (such as a phenylene group). In various embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, may refer to a group having substantially the same structure as the $C_5$-$C_{60}$ carbocyclic group, except that at least one heteroatom selected from N, O, Si, P, and S is used as a ring-forming atom, in addition to carbon atoms (e.g., the number of carbon atoms may be in a range of 1 to 60).

The term "$C_6$-$C_{20}$ arene group," as used herein, may refer to a monocarbocyclic aromatic group or a polycarbocyclic aromatic group, having 6 to 20 carbon atoms, in which ring-forming atoms include carbon atoms only. The $C_6$-$C_{20}$ arene group may be a ring (such as a benzene), a monovalent group (such as a phenyl group), or a divalent group (such as a phenylene group). In various embodiments, depending on the number of substituents connected to the $C_6$-$C_{20}$ arene group, the $C_6$-$C_{20}$ arene group may be a trivalent group or a quadrivalent group.

The term "$C_1$-$C_{20}$ heteroarene group," as used herein, may refer to a group having substantially the same structure as the $C_6$-$C_{20}$ arene group, except that at least one heteroatom selected from N, O, Si, P, and S is used as a ring-forming atom, in addition to carbon atoms (e.g., the number of carbon atoms may be in a range of 1 to 20).

At least one substituent of the substituted $C_5$-$C_{60}$ carbocyclic group, substituted $C_1$-$C_{60}$ heterocyclic group, substituted $C_6$-$C_{20}$ arene group, substituted $C_1$-$C_{20}$ heteroarene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" used herein may refer to a phenyl group, the term "Me" used herein may refer to a methyl group, the term "Et" used herein may refer to an ethyl group, the term "ter-Bu" or "$Bu^t$" used herein may refer to a tert-butyl group, the term "OMe" used herein may refer to a methoxy group, and "D" may refer to deuterium. The term "$D_5$-Ph," as used herein, may refer to a group having the following structure:

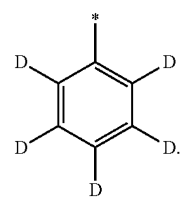

$D_5$—Ph

The "biphenyl group" used therein may refer to "a phenyl group substituted with a phenyl group." For example, the "biphenyl group" may be referred to as "a substituted phenyl group" having "a $C_6$-$C_{60}$ aryl group" as a substituent. The terms "2-biPh, 3-biPh, and 4-biPh," as used herein, respectively refer to the following structures:

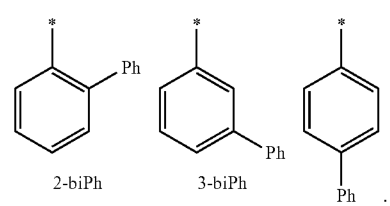

2-biPh 3-biPh 4-biPh

The "terphenyl group" used herein may refer to "a phenyl group substituted with a biphenyl group." For example, the "terphenyl group" may be referred to as "a substituted phenyl group" having "a $C_6$-$C_{60}$ aryl group substituted with a $C_6$-$C_{60}$ aryl group" as a substituent.

The terms "2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, and 5-Me-3-Py," as used herein, respectively refer to the following structures:

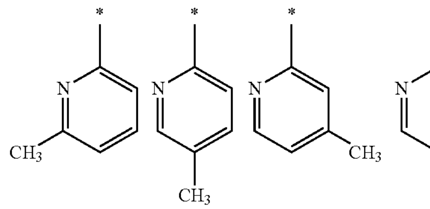

2-Me-1-Py 3-Me-1-Py 4-Me-1-Py 5-Me-1-Py

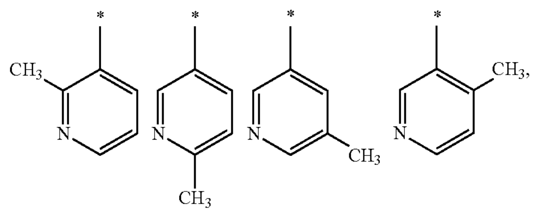

1-Me-2-Py 3-Me-2-Py 4-Me-2-Py 5-Me-2-Py

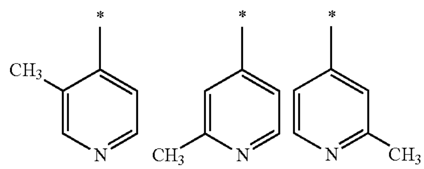

1-Me-3-Py 2-Me-3-Py 4-Me-3-Py

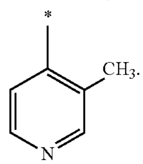

5-Me-3-Py

Symbols * and *' used herein, unless defined otherwise, refer to a binding site to a neighboring atom in a corresponding formula.

Hereinafter, a compound according to one or more embodiments of the present disclosure and an organic light-emitting device according to embodiments will be described in more detail with reference to Examples. However, these examples are provided for illustrative purposes only, and should not in any sense be interpreted as limiting the scope of the present disclosure.

EXAMPLES

Example 1-1

An anode was manufactured by cutting a 15 $\Omega cm^2$ (1200 Å) ITO glass substrate (by Corning Inc.) to a size of 50 mm×50 mm×0.7 mm, ultrasonically cleaning the glass substrate by using isopropyl alcohol and pure water, for 5 minutes each, and then irradiating UV light for 30 minutes thereto and being exposed to ozone to clean. Then, the resulting ITO anode was loaded into a vacuum deposition apparatus.

HT28 was deposited on the anode to form a hole injection layer having a thickness of 300 Å, and then, HT3 was deposited on the hole injection layer to form a hole transport layer having a thickness of 400 Å, and Compounds H1 (as a host) and D1 (as a dopant) were co-deposited on the hole transport layer at a weight ratio of 95:5 to form an emission layer having a thickness of 300 Å.

ET1 was deposited on the emission layer to form an electron transport layer having a thickness of 300 Å, and then, LiF was deposited on the electron transport layer to form an electron injection layer having a thickness of 5 Å, and then, Al was deposited on the electron injection layer to form a cathode having a thickness of 2,000 Å, thereby completing the manufacture of an organic light-emitting device.

Examples 1-2 to 1-20 and Comparative Examples 1-1 and 1-5

Organic light-emitting devices were manufactured in the same (or substantially the same) manner as in Example 1-1, except that in forming an emission layer, compounds as shown in Table 1 were used as hosts and dopants.

TABLE 1

| | Host | Dopant |
|---|---|---|
| Example 1-1 | H1 | D1 |
| Example 1-2 | H7 | D1 |
| Example 1-3 | H7 | D6 |
| Example 1-4 | H7 | D35 |
| Example 1-5 | H7 | D61 |
| Example 1-6 | H7 | D86 |
| Example 1-7 | H7 | D108 |
| Example 1-8 | H7 | D110 |
| Example 1-9 | H7 | D179 |
| Example 1-10 | H7 | D190 |
| Example 1-11 | H1 | D182 |
| Example 1-12 | H6 | D182 |
| Example 1-13 | H7 | D182 |
| Example 1-14 | H16 | D182 |
| Example 1-15 | H23 | D182 |
| Example 1-16 | H52 | D182 |
| Example 1-17 | H60 | D182 |
| Example 1-18 | H61 | D182 |
| Example 1-19 | H67 | D182 |
| Example 1-20 | H87 | D182 |
| Comparative Example 1-1 | ADN | BD1 |
| Comparative Example 1-2 | ADN | D1 |
| Comparative Example 1-3 | H1 | BD1 |
| Comparative Example 1-4 | H1 | BD2 |
| Comparative Example 1-5 | ADN | BD3 |

H1

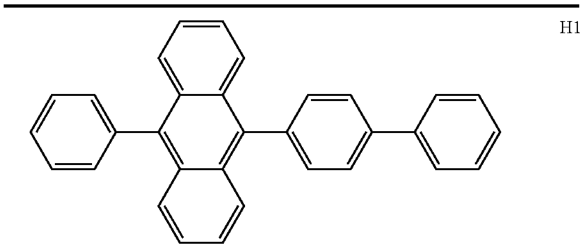

H6

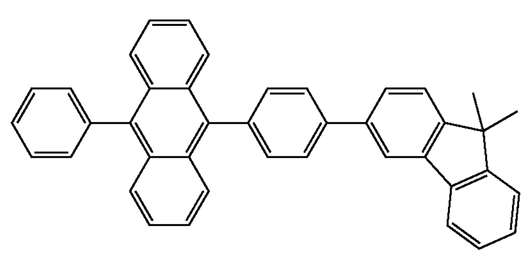

TABLE 1-continued
H7
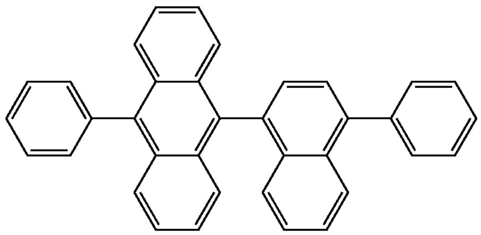
H16
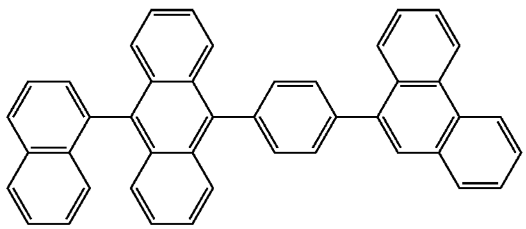
H23
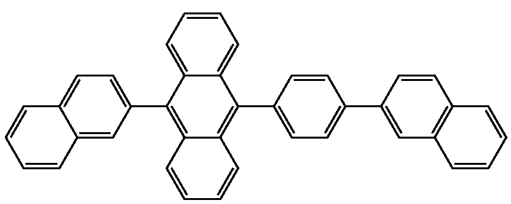
H52
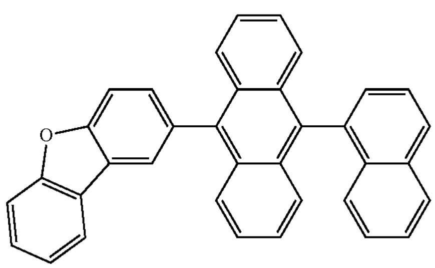
H60
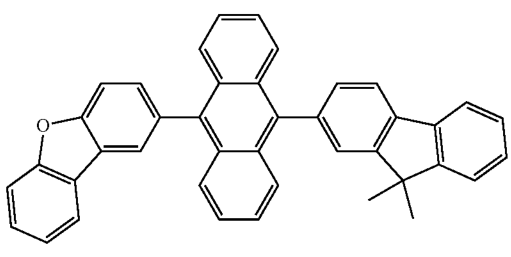
H61
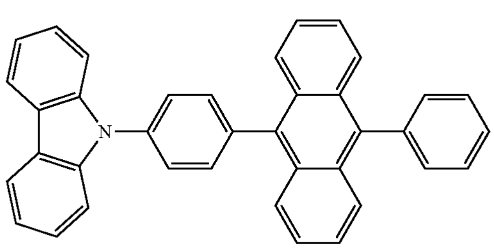
TABLE 1-continued
H67
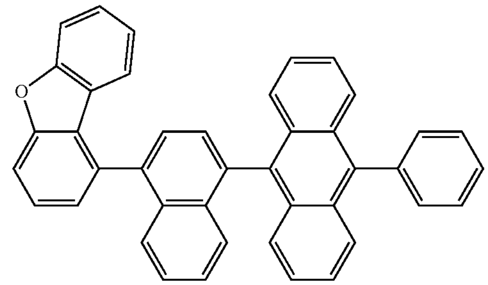
H87
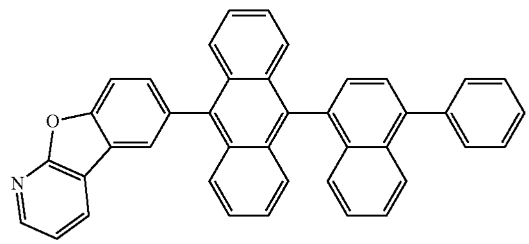 [SMILES: c1ccc(-c2ccc(-c3c4ccccc4c(-c4ccc5oc6ncccc6c5c4)c4ccccc34)c3ccccc23)cc1]
D1
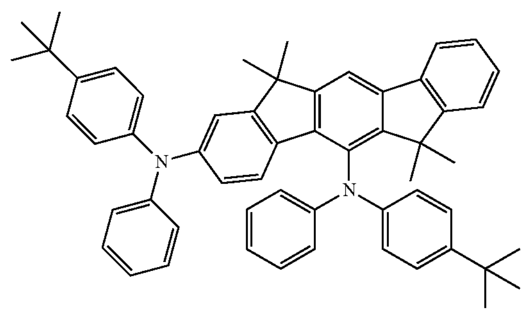 [SMILES: CC(C)(C)c1ccc(N(c2ccccc2)c2ccc3c(c2)C(C)(C)c2cc4c(c(N(c5ccccc5)c5ccc(C(C)(C)C)cc5)c2-3)C(C)(C)c2ccccc2-4)cc1]
D6
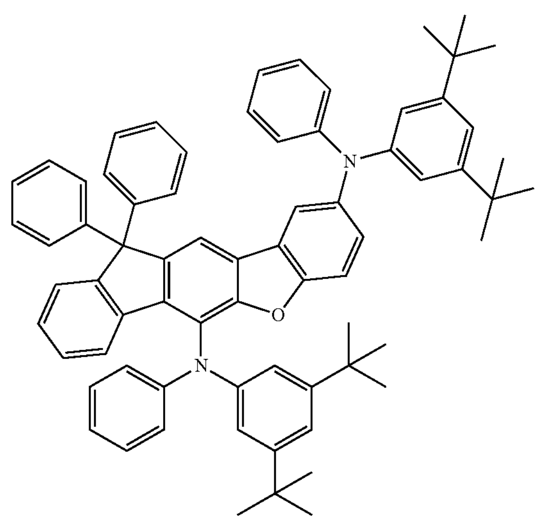 [SMILES: CC(C)(C)c1cc(N(c2ccccc2)c2ccc3oc4c(N(c5ccccc5)c5cc(C(C)(C)C)cc(C(C)(C)C)c5)c5c(cc4c3c2)C(c2ccccc2)(c2ccccc2)c2ccccc2-5)cc(C(C)(C)C)c1]
D35
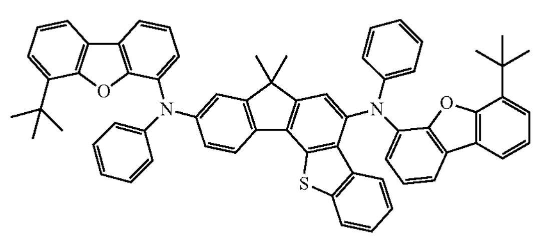 [SMILES: CC(C)(C)c1cccc2c1oc1c(N(c3ccccc3)c3ccc4c(c3)C(C)(C)c3cc(N(c5ccccc5)c5cccc6c5oc5c(C(C)(C)C)cccc56)c5c(sc6ccccc65)c3-4)cccc12]

TABLE 1-continued
D61
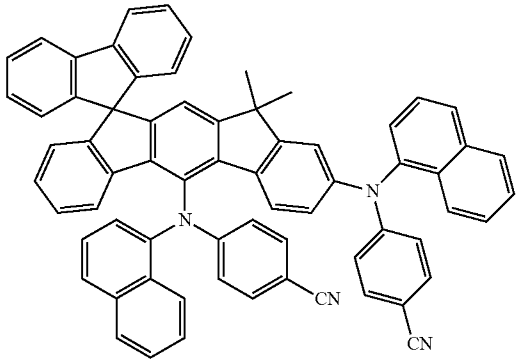 [SMILES: CC1(C)c2cc(N(c3ccc(C#N)cc3)c3cccc4ccccc34)ccc2-c2c1cc1c(c2N(c2ccc(C#N)cc2)c2cccc3ccccc23)-c2ccccc2C12c1ccccc1-c1ccccc12]
D86
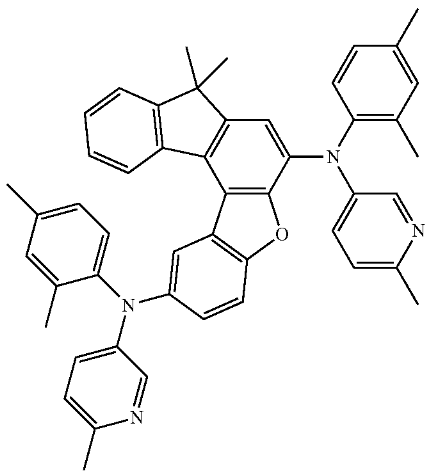
D108
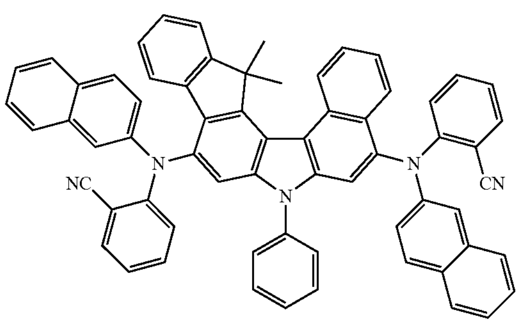 [SMILES: CC1(C)c2ccccc2-c2c(N(c3ccc4ccccc4c3)c3ccccc3C#N)cc3c(c21)c1c2ccccc2c(N(c2ccc4ccccc4c2)c2ccccc2C#N)cc1n3-c1ccccc1]
D110
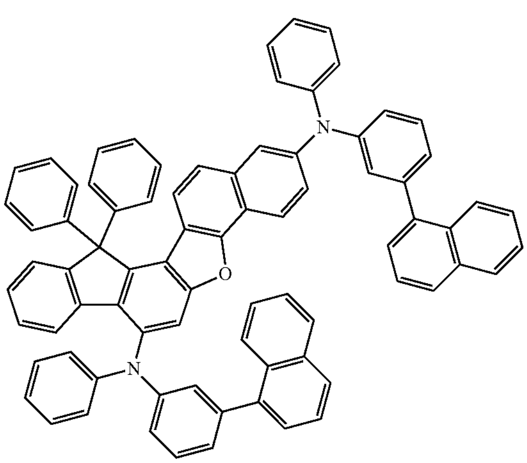 [SMILES: c1ccc(N(c2cccc(-c3cccc4ccccc34)c2)c2ccc3c(ccc4c3oc3cc(N(c5ccccc5)c5cccc(-c6cccc7ccccc67)c5)c5c(c34)C(c3ccccc3)(c3ccccc3)c3ccccc3-5)c2)cc1]
TABLE 1-continued
D179
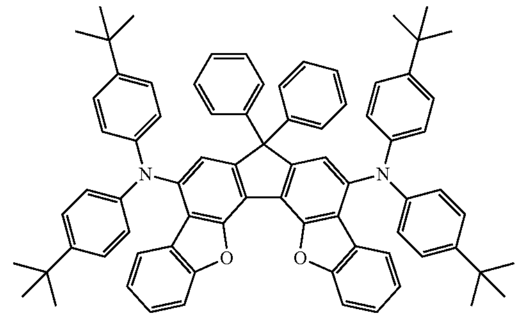 [SMILES: CC(C)(C)c1ccc(N(c2ccc(C(C)(C)C)cc2)c2cc3c(c4oc5ccccc5c24)-c2c(cc(N(c4ccc(C(C)(C)C)cc4)c4ccc(C(C)(C)C)cc4)c4c2oc2ccccc24)C3(c2ccccc2)c2ccccc2)cc1]
D182
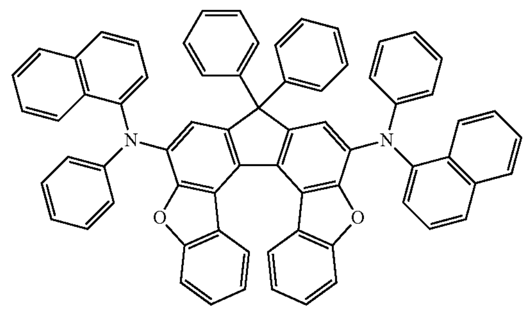 [SMILES: c1ccc(N(c2cccc3ccccc23)c2cc3c(c4c2oc2ccccc24)-c2c(cc(N(c4ccccc4)c4cccc5ccccc45)c4oc5ccccc5c24)C3(c2ccccc2)c2ccccc2)cc1]
D190
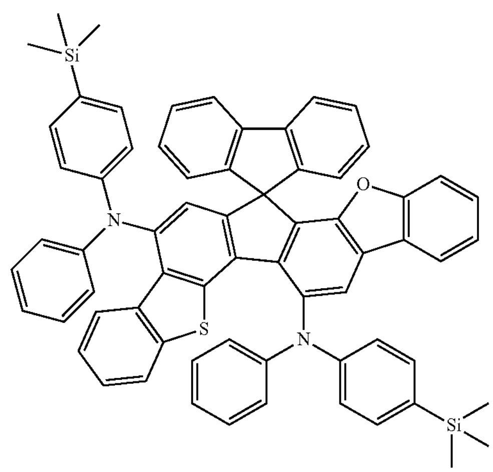 [SMILES: C[Si](C)(C)c1ccc(N(c2ccccc2)c2cc3c(oc4ccccc43)c3c2-c2c(cc(N(c4ccccc4)c4ccc([Si](C)(C)C)cc4)c4c2sc2ccccc24)C32c3ccccc3-c3ccccc32)cc1]
ADN
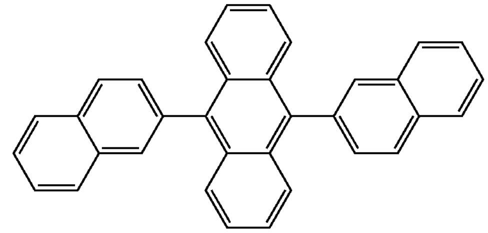 [SMILES: c1ccc2cc(-c3c4ccccc4c(-c4ccc5ccccc5c4)c4ccccc34)ccc2c1]

TABLE 1-continued

BD1

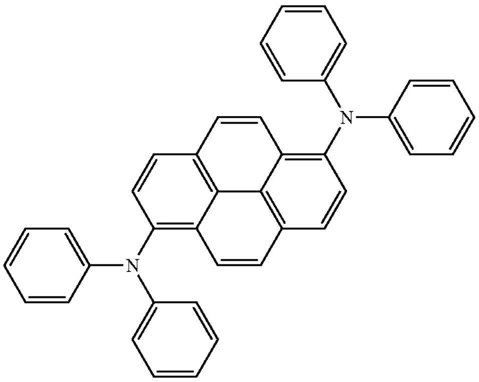 [SMILES: c1ccc(N(c2ccccc2)c2ccc3ccc4c(N(c5ccccc5)c5ccccc5)ccc5ccc2c3c54)cc1]

BD2

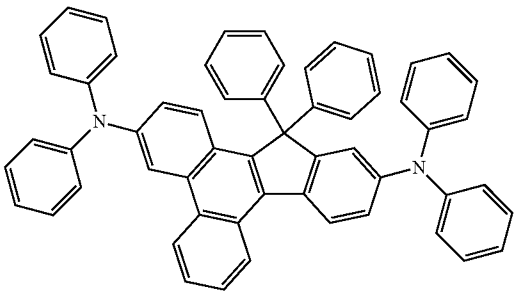 [SMILES: c1ccc(N(c2ccccc2)c2ccc3c(c2)C(c2ccccc2)(c2ccccc2)c2c-3c3ccccc3c3cc(N(c4ccccc4)c4ccccc4)ccc23)cc1]

BD3

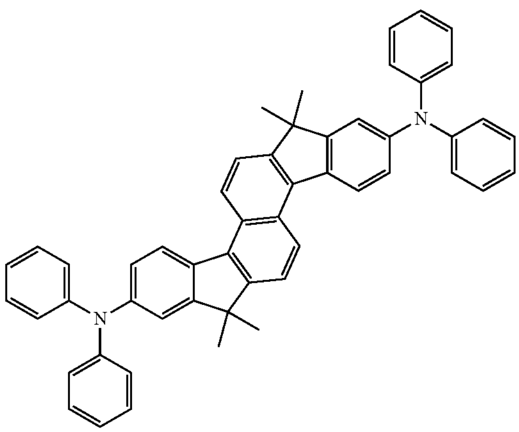 [SMILES: CC1(C)c2cc(N(c3ccccc3)c3ccccc3)ccc2-c2c1ccc1c3c(ccc21)C(C)(C)c1cc(N(c2ccccc2)c2ccccc2)ccc1-3]

Example 2-1

An anode was manufactured by cutting a 15 $\Omega cm^2$ (1,200 Å) ITO glass substrate (by Corning Inc.) to a size of 50 mm×50 mm×0.7 mm, ultrasonically cleaning the glass substrate by using isopropyl alcohol and pure water, for 5 minutes each, and then irradiating UV light for 30 minutes thereto and being exposed to ozone to clean. Then, the resulting ITO anode was loaded into a vacuum deposition apparatus.

Compound HT3 and Compound F4-TCNQ were co-deposited on the glass substrate at a weight ratio of 95:5 to form a hole injection layer having a thickness of 100 Å, and then, Compound HT3 was deposited on the hole injection layer to form a hole transport layer having a thickness of 600 Å.

Subsequently, Compounds H1 (as a host) and D1 (as a dopant) were co-deposited at a weight ratio of 95:5 to form an emission layer having a thickness of 300 Å.

Then, Compound ET1 and Liq were co-deposited on the emission layer at a weight ratio of 50:50 to form an electron transport layer having a thickness of 300 Å, and then, LiF was deposited on the electron transport layer to form an electron injection layer having a thickness of 10 Å, thereby completing the formation of an electron transport region. Then, Al was vacuum deposited to form a cathode having a thickness of 2,000 Å, thereby completing the manufacture of an organic light-emitting device.

Examples 2-2 to 2-10 and Comparative Examples 2-1 and 2-5

Organic light-emitting devices were manufactured in the same (or substantially the same) manner as in Example 2-1, except that in forming an emission layer, compounds as shown in Table 2 were used as hosts and dopants.

TABLE 2

| | Host | Dopant |
|---|---|---|
| Example 2-1 | H1 | D1 |
| Example 2-2 | H7 | D1 |
| Example 2-3 | H7 | D6 |
| Example 2-4 | H7 | D35 |
| Example 2-5 | H7 | D61 |
| Example 2-6 | H7 | D86 |
| Example 2-7 | H7 | D108 |
| Example 2-8 | H7 | D110 |
| Example 2-9 | H7 | D179 |
| Example 2-10 | H7 | D190 |
| Comparative Example 2-1 | ADN | BD1 |
| Comparative Example 2-2 | ADN | D1 |
| Comparative Example 2-3 | H1 | BD1 |
| Comparative Example 2-4 | H1 | BD2 |
| Comparative Example 2-5 | ADN | BD3 |

H1

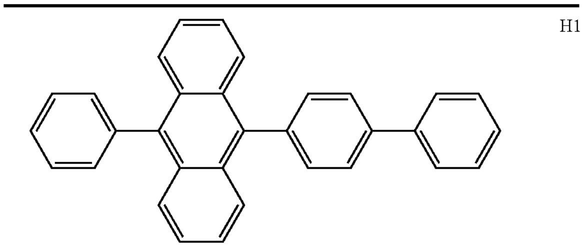

H7

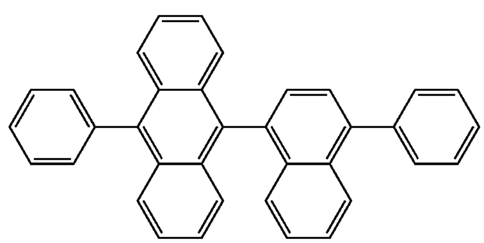

D1

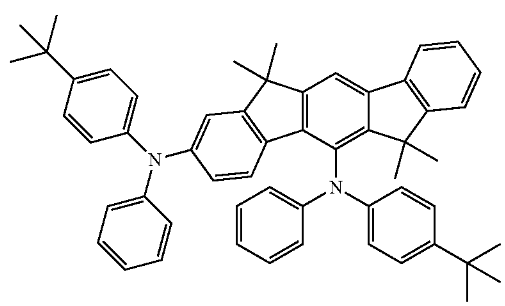 [SMILES: CC(C)(C)c1ccc(N(c2ccccc2)c2ccc3c(c2)C(C)(C)c2cc4c(c(N(c5ccccc5)c5ccc(C(C)(C)C)cc5)c2-3)C(C)(C)c2ccccc2-4)cc1]

TABLE 2-continued
D6
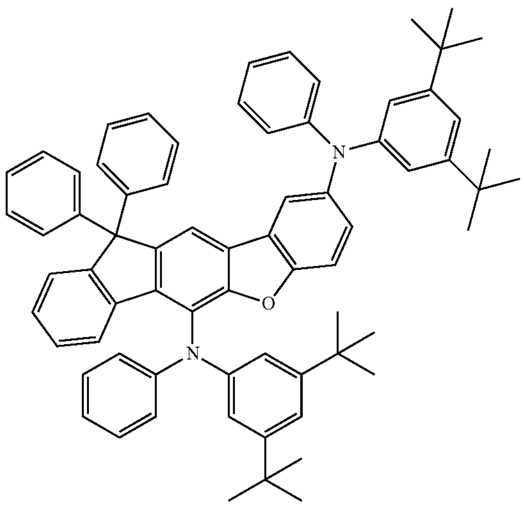 [SMILES: CC(C)(C)c1cc(N(c2ccccc2)c2ccc3oc4c(N(c5ccccc5)c5cc(C(C)(C)C)cc(C(C)(C)C)c5)c5c(cc4c3c2)C(c2ccccc2)(c2ccccc2)c2ccccc2-5)cc(C(C)(C)C)c1]
D35
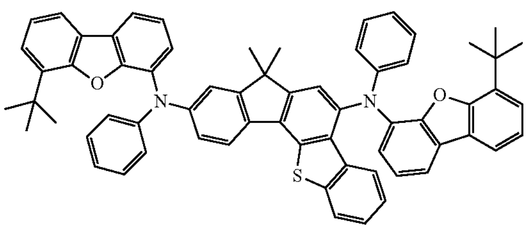 [SMILES: CC(C)(C)c1cccc2c1oc1c(N(c3ccccc3)c3ccc4c(c3)C(C)(C)c3cc(N(c5ccccc5)c5cccc6c5oc5c(C(C)(C)C)cccc56)c5c(sc6ccccc65)c3-4)cccc12]
D61
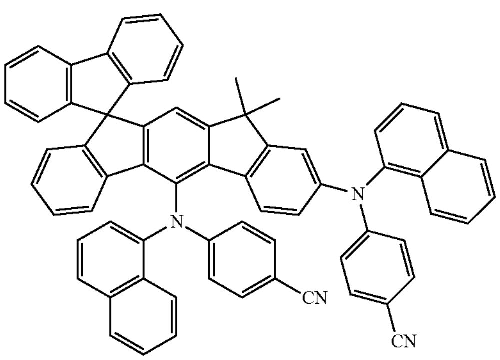 [SMILES: CC1(C)c2cc(N(c3ccc(C#N)cc3)c3cccc4ccccc34)ccc2-c2c1cc1c(c2N(c2ccc(C#N)cc2)c2cccc3ccccc23)-c2ccccc2C12c1ccccc1-c1ccccc12]
D86
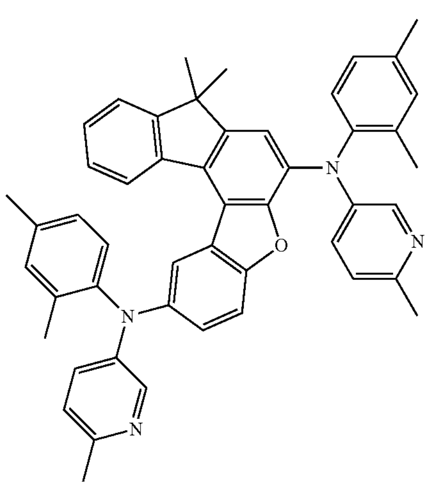
TABLE 2-continued
D108
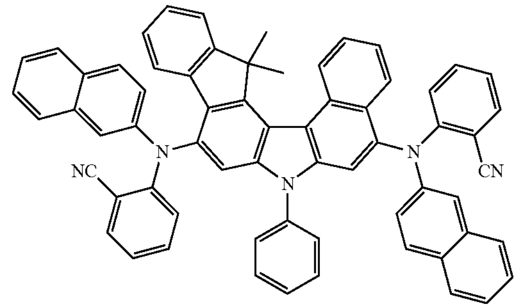 [SMILES: CC1(C)c2ccccc2-c2c(N(c3ccc4ccccc4c3)c3ccccc3C#N)cc3c(c21)c1c2ccccc2c(N(c2ccc4ccccc4c2)c2ccccc2C#N)cc1n3-c1ccccc1]
D110
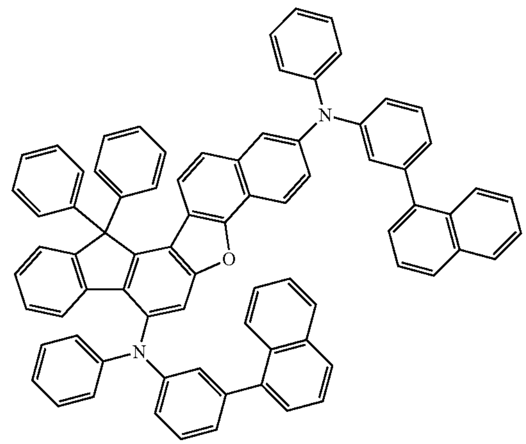 [SMILES: c1ccc(N(c2cccc(-c3cccc4ccccc34)c2)c2ccc3c(ccc4c3oc3cc(N(c5ccccc5)c5cccc(-c6cccc7ccccc67)c5)c5c(c34)C(c3ccccc3)(c3ccccc3)c3ccccc3-5)c2)cc1]
D179
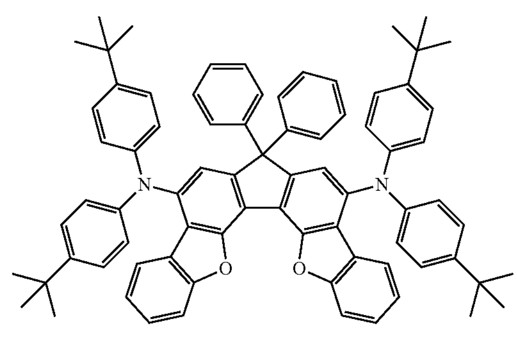 [SMILES: CC(C)(C)c1ccc(N(c2ccc(C(C)(C)C)cc2)c2cc3c(c4oc5ccccc5c24)-c2c(cc(N(c4ccc(C(C)(C)C)cc4)c4ccc(C(C)(C)C)cc4)c4c2oc2ccccc24)C3(c2ccccc2)c2ccccc2)cc1]
D190
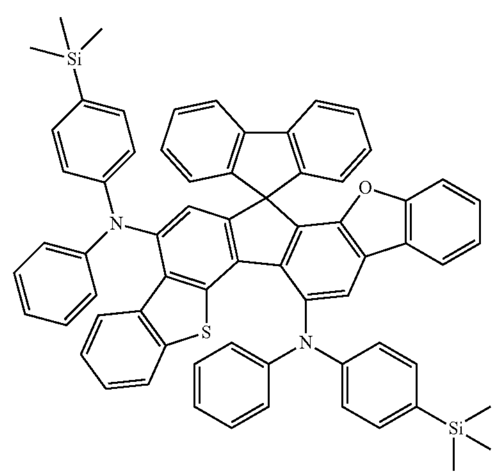 [SMILES: C[Si](C)(C)c1ccc(N(c2ccccc2)c2cc3c(oc4ccccc43)c3c2-c2c(cc(N(c4ccccc4)c4ccc([Si](C)(C)C)cc4)c4c2sc2ccccc24)C32c3ccccc3-c3ccccc32)cc1]

TABLE 2-continued

ADN

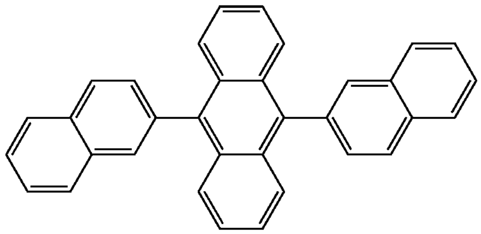 [SMILES: c1ccc2cc(-c3c4ccccc4c(-c4ccc5ccccc5c4)c4ccccc34)ccc2c1]

BD1

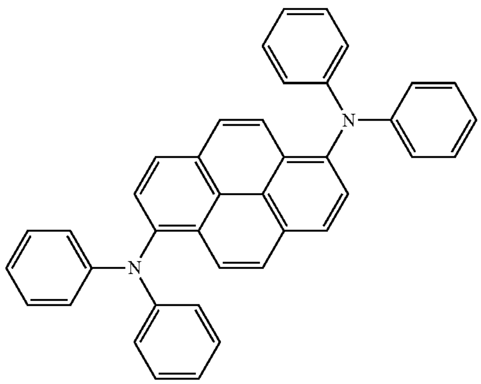 [SMILES: c1ccc(N(c2ccccc2)c2ccc3ccc4c(N(c5ccccc5)c5ccccc5)ccc5ccc2c3c54)cc1]

BD2

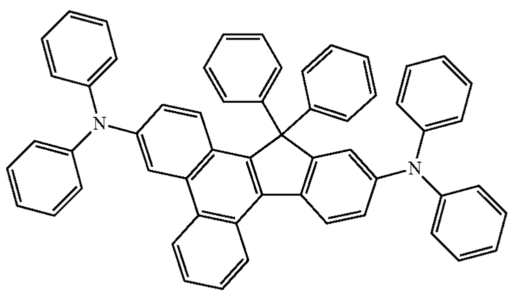 [SMILES: c1ccc(N(c2ccccc2)c2ccc3c(c2)C(c2ccccc2)(c2ccccc2)c2c-3c3ccccc3c3cc(N(c4ccccc4)c4ccccc4)ccc23)cc1]

BD3

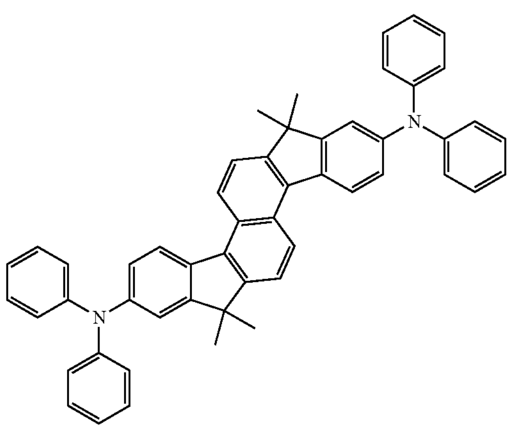 [SMILES: CC1(C)c2cc(N(c3ccccc3)c3ccccc3)ccc2-c2c1ccc1c3c(ccc21)C(C)(C)c1cc(N(c2ccccc2)c2ccccc2)ccc1-3]

Evaluation Example

Efficiency (current density at 10 mA/cm$^2$) and lifespan ($T_{90}$) (current density at 10 mA/cm$^2$) of the organic light-emitting devices manufactured according to Examples 1-1 to 1-20, Examples 2-1 to 2-10, Comparative Examples 1-1 to 1-5, and Comparative Examples 2-1 to 2-5 were evaluated by using Keithley 2400 and Minolta CS-1000A. The lifespan ($T_{90}$) refers to an amount of time that lapsed when 100% of the initial luminance was decreased to 90% (e.g., 90% of the initial luminance). Evaluation results are shown in Tables 3 and 4.

TABLE 3

| | Host | Dopant | Efficiency (cd/A) | Lifespan (Hours) |
|---|---|---|---|---|
| Example 1-1 | H1 | D1 | 5.2 | 120 |
| Example 1-2 | H7 | D1 | 5.3 | 140 |
| Example 1-3 | H7 | D6 | 5.2 | 110 |
| Example 1-4 | H7 | D35 | 5.4 | 125 |
| Example 1-5 | H7 | D61 | 5.4 | 130 |
| Example 1-6 | H7 | D86 | 5.3 | 120 |
| Example 1-7 | H7 | D108 | 5.4 | 120 |
| Example 1-8 | H7 | D110 | 5.4 | 110 |
| Example 1-9 | H7 | D179 | 5.5 | 125 |
| Example 1-10 | H7 | D190 | 5.4 | 130 |
| Example 1-11 | H1 | D182 | 5.3 | 120 |
| Example 1-12 | H6 | D182 | 5.2 | 115 |
| Example 1-13 | H7 | D182 | 5.5 | 130 |
| Example 1-14 | H16 | D182 | 5.4 | 120 |
| Example 1-15 | H23 | D182 | 5.3 | 120 |
| Example 1-16 | H52 | D182 | 5.4 | 110 |
| Example 1-17 | H60 | D182 | 5.5 | 130 |
| Example 1-18 | H61 | D182 | 5.3 | 120 |
| Example 1-19 | H67 | D182 | 5.3 | 120 |
| Example 1-20 | H87 | D182 | 5.4 | 125 |
| Comparative Example 1-1 | ADN | BD1 | 4.5 | 35 |
| Comparative Example 1-2 | ADN | D1 | 4.7 | 60 |
| Comparative Example 1-3 | H1 | BD1 | 4.6 | 80 |
| Comparative Example 1-4 | H1 | BD2 | 4.8 | 60 |
| Comparative Example 1-5 | ADN | BD3 | 4.8 | 70 |

TABLE 4

| | Host | Dopant | Efficiency (cd/A) | Lifespan (Hours) |
|---|---|---|---|---|
| Example 2-1 | H1 | D1 | 5.4 | 130 |
| Example 2-2 | H7 | D1 | 5.5 | 140 |
| Example 2-3 | H7 | D6 | 5.4 | 120 |
| Example 2-4 | H7 | D35 | 5.6 | 140 |
| Example 2-5 | H7 | D61 | 5.5 | 135 |
| Example 2-6 | H7 | D86 | 5.5 | 140 |
| Example 2-7 | H7 | D108 | 5.6 | 120 |
| Example 2-8 | H7 | D110 | 5.5 | 120 |
| Example 2-9 | H7 | D179 | 5.7 | 130 |
| Example 2-10 | H7 | D190 | 5.5 | 150 |
| Comparative Example 2-1 | ADN | BD1 | 4.6 | 50 |
| Comparative Example 2-2 | ADN | D1 | 4.8 | 80 |
| Comparative Example 2-3 | H1 | BD1 | 4.8 | 100 |
| Comparative Example 2-4 | H1 | BD2 | 4.9 | 90 |
| Comparative Example 2-5 | ADN | BD3 | 4.8 | 90 |

From the results shown in Table 3, it can be seen that the organic light-emitting devices of Examples 1-1 to 1-20 had better efficiency and lifespan characteristics than the organic light-emitting devices of Comparative Examples 1-1 to 1-5.

From the results shown in Table 4, it can be seen that the organic light-emitting devices of Examples 2-1 to 2-10 had better efficiency and characteristics than the organic light-emitting devices of Comparative Examples 2-1 to 2-5.

An organic light-emitting device according to embodiments of the present disclosure may have improved efficiency and lifespan characteristics.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" or "over" another element, it can be directly on the other element or intervening elements may also be present. In contrast, when an element is referred to as being "directly on" or "directly contacting" another element, there are no intervening elements present.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode; and an organic layer between the first electrode and the second electrode, the organic layer comprising an emission layer, wherein the organic layer comprises a first compound represented by Formula 1 and a second compound represented by Formula 2:

<Formula 1>

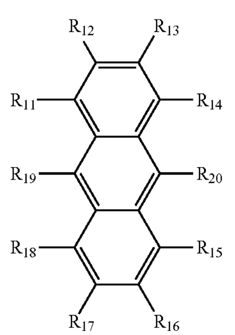

-continued

<Formula 1A>

$$*-(L_{101})_{a101}-R_{101}$$

<Formula 2>

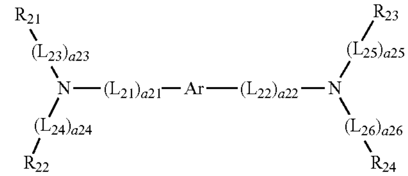

<Formula 2A>

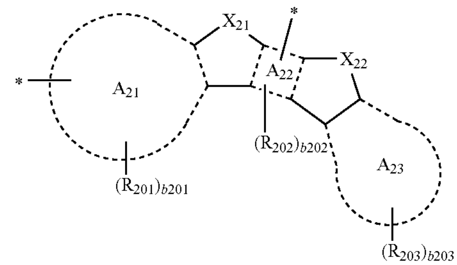

<Formula 2B>

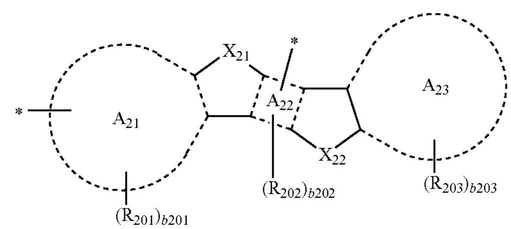

wherein, in Formulae 1, 2, 2A, 2B, and 1A, $R_{11}$ to $R_{20}$ are each independently selected from a group represented by Formula 1A, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, provided that at least one selected from $R_{11}$ to $R_{20}$ is a group represented by Formula 1A;

$L_{101}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a101 is selected from 0, 1, 2, and 3;

$R_{101}$ is selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$);

Ar is selected from a group represented by Formula 2A and a group represented by Formula 2B;

$X_{21}$ is selected from oxygen, sulfur, N($R_{204}$), and C($R_{204}$)($R_{205}$);

$X_{22}$ is selected from oxygen, sulfur, N($R_{206}$), and C($R_{206}$)($R_{207}$);

$A_{21}$ is selected from a $C_5$-$C_{20}$ carbocyclic group and a $C_1$-$C_{20}$ heterocyclic group;

$A_{22}$ is selected from a $C_6$-$C_{20}$ arene group and a $C_1$-$C_{20}$ heteroarene group;

$A_{23}$ is selected from a $C_5$-$C_{20}$ carbocyclic group and a $C_1$-$C_{20}$ heterocyclic group;

$L_{21}$ to $L_{26}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 to a26 are each independently selected from 0, 1, 2, and 3;

$R_{21}$ to $R_{24}$ are each independently selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group; wherein $R_{21}$ and $R_{22}$ are optionally linked to each other to form a saturated ring or an unsaturated ring, and $R_{23}$ and $R_{24}$ are optionally linked to each other to form a saturated ring or an unsaturated ring;

$R_{201}$ to $R_{207}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$) and —P(═O)($Q_1$)($Q_2$); wherein $R_{204}$ and $R_{205}$ are optionally linked to each other to form a saturated ring or an unsaturated ring, and $R_{206}$ and $R_{207}$ are optionally linked to each other to form a saturated ring or an unsaturated ring;

b201 to b203 are each independently selected from 1, 2, 3, 4, 5, 6, 7, 8, 9, and 10;

$Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and

* indicates a binding site to a neighboring atom.

2. The organic light-emitting device of claim 1, wherein $R_{11}$ to $R_{20}$ are each independently selected from a group represented by Formula 1A, hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$), wherein $Q_1$ to $Q_3$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

3. The organic light-emitting device of claim 1, wherein $R_{101}$ is selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.
4. The organic light-emitting device of claim 1, wherein $R_{101}$ is selected from groups represented by Formulae 5-1 to 5-128:
5-1
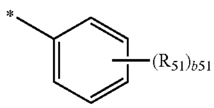
5-2
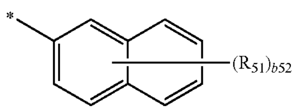
5-3
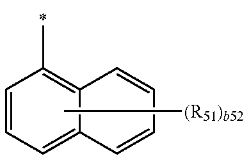
5-4
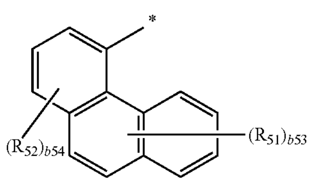
5-5
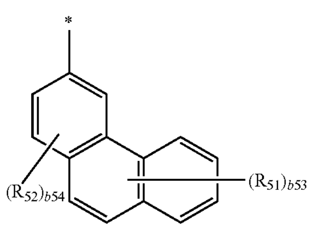
5-6
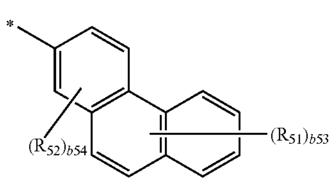
5-7
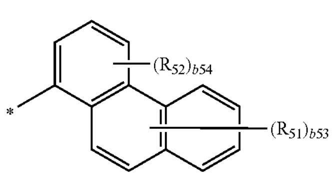
5-8
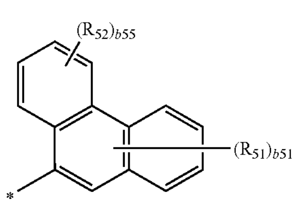
-continued
5-9
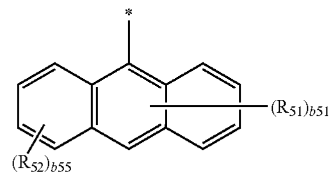
5-10
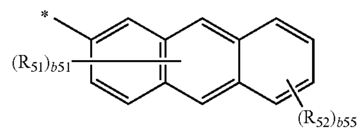
5-11
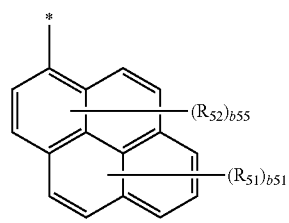
5-12
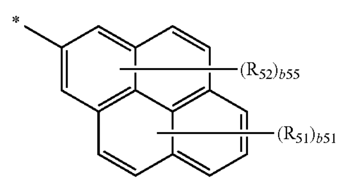
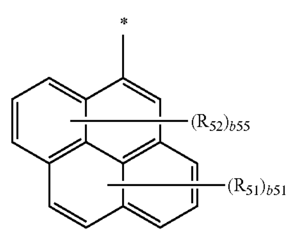
5-14
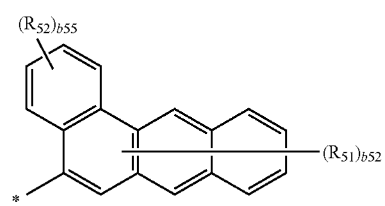
5-15
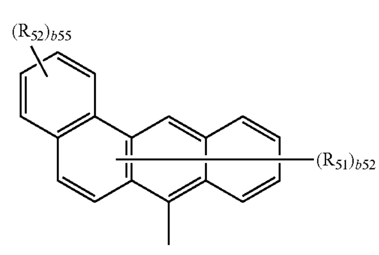

-continued
5-16
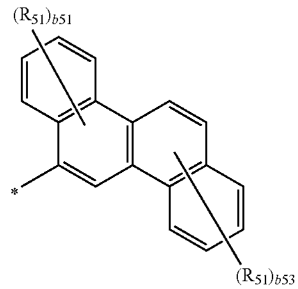
5-17
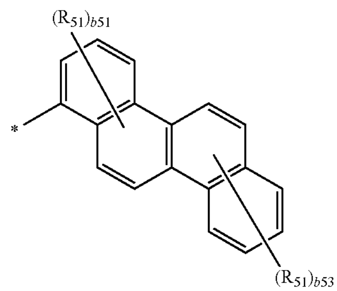
5-18
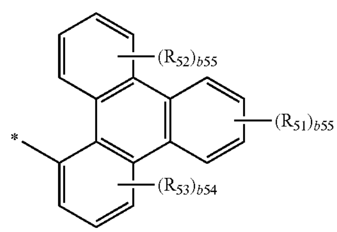
5-19
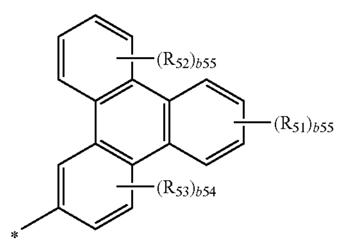
5-20
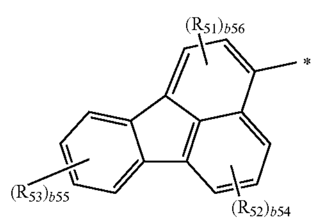
5-21
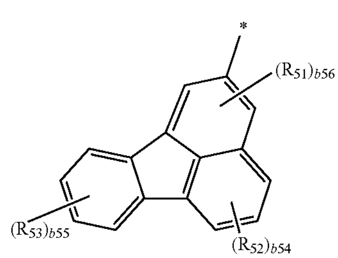
-continued
5-22
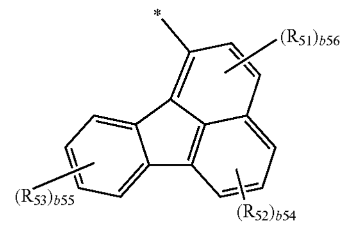
5-23
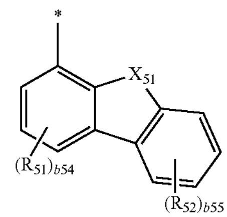
5-24
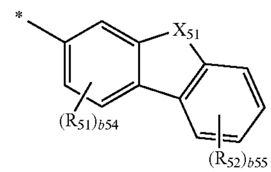
5-25
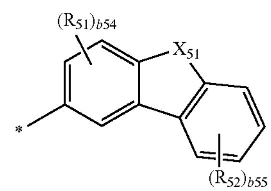
5-26
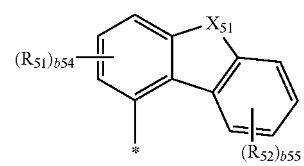
5-27
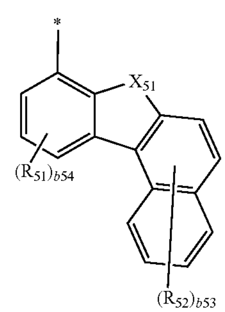
5-28
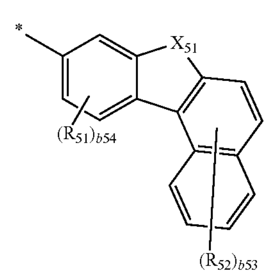

-continued
5-29
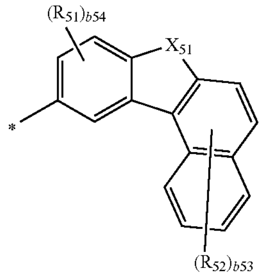
5-30
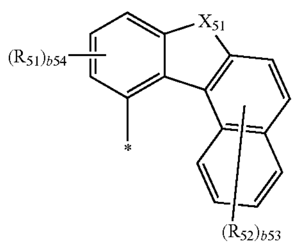
5-31
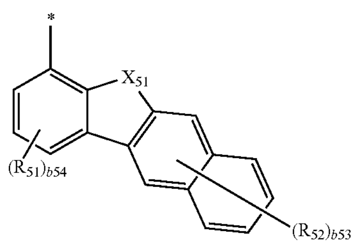
5-32
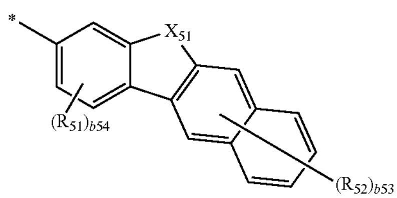
5-33
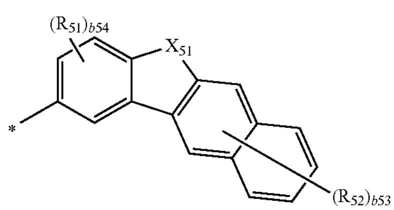
5-34
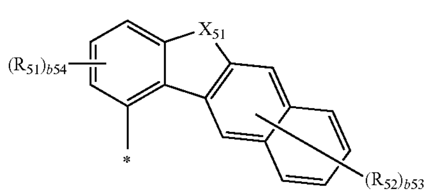
5-35
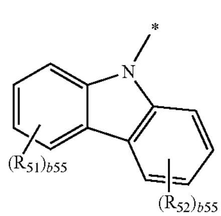
-continued
5-36
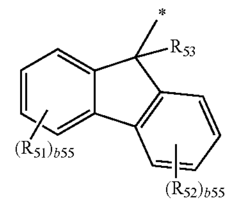
5-37
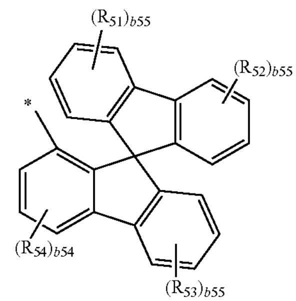
5-38
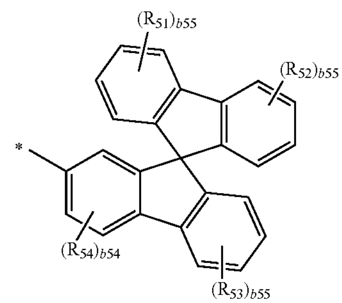
5-39
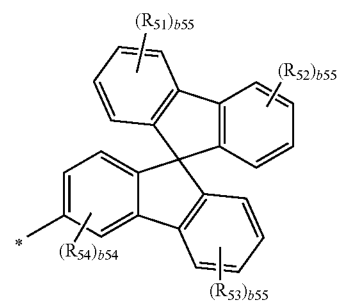
5-40
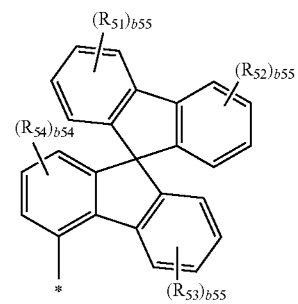

-continued
5-41
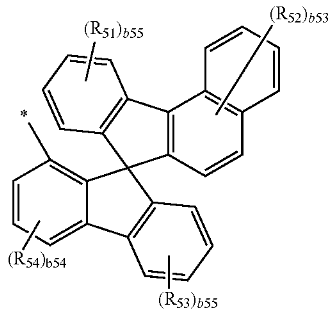
5-42
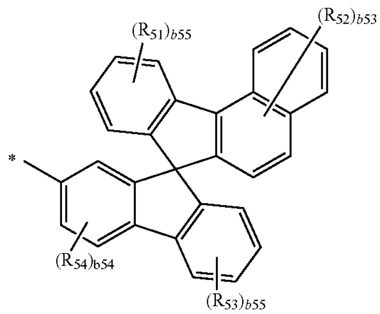
5-43
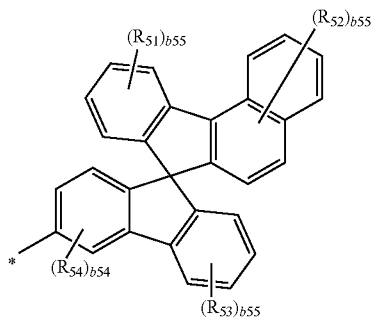
5-44
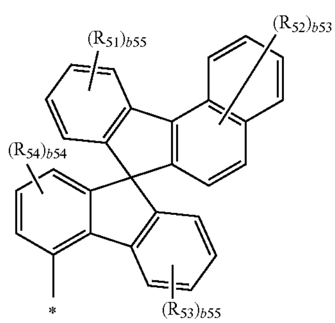
5-45
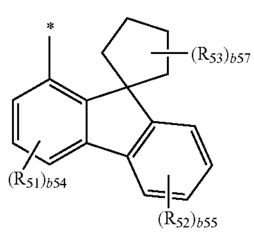
-continued
5-46
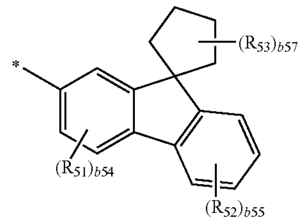
5-47
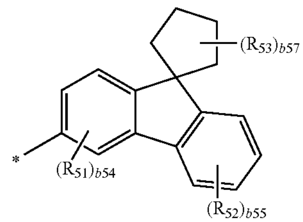
5-48
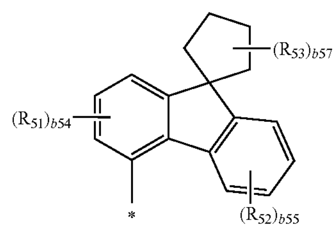
5-49
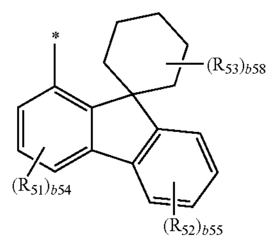
5-50
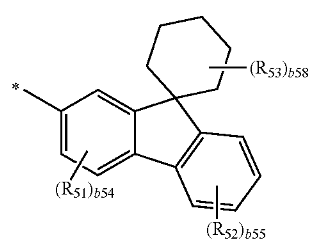
5-51
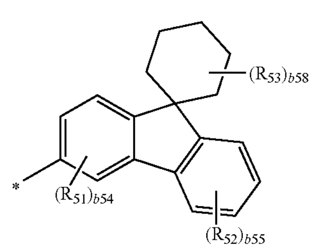

-continued
5-52
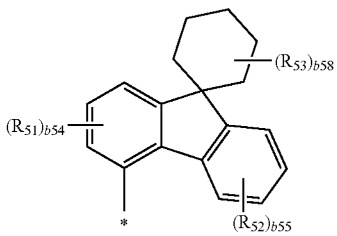
5-53
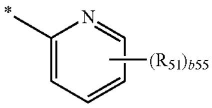
5-54
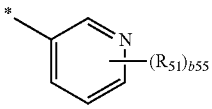
5-55
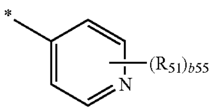
5-56
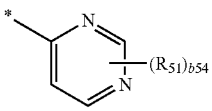
5-57
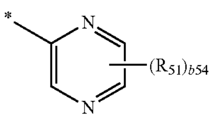
5-58
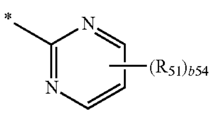
5-59
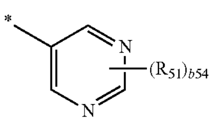
5-60
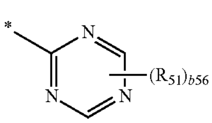
5-61
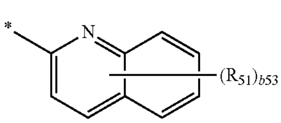
5-62
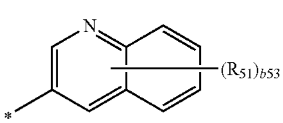
-continued
5-63
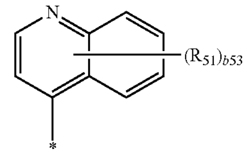
5-64
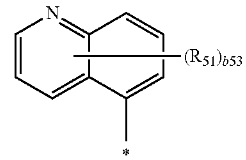
5-65
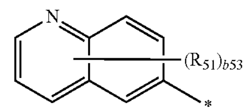
5-66
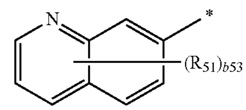
5-67
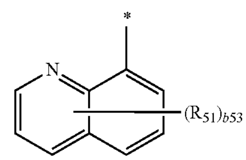
5-68
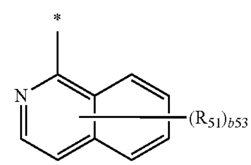
5-69
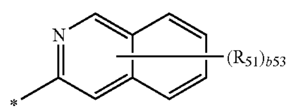
5-70
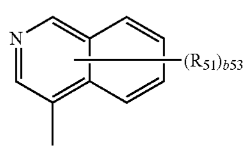
5-71
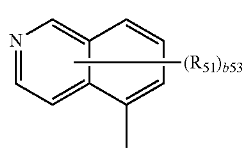
5-72
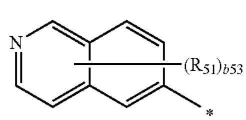

-continued
5-73
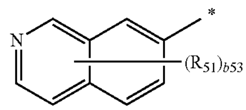
5-74
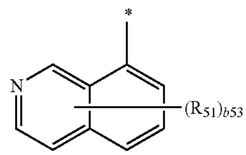
5-75
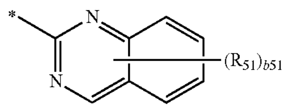
5-76
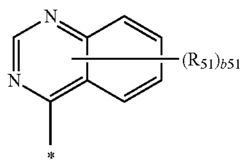
5-77
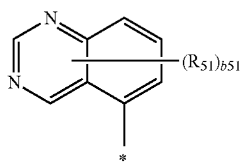
5-78
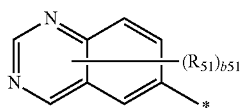
5-79
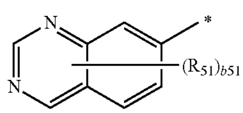
5-80
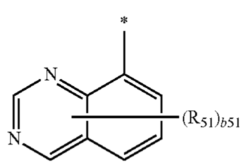
5-81
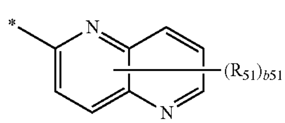
5-82
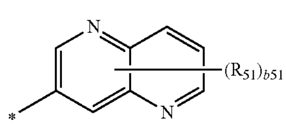
5-83
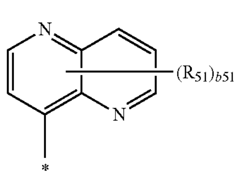
-continued
5-84
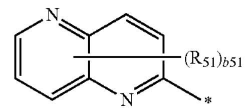
5-85
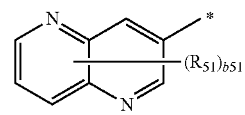
5-86
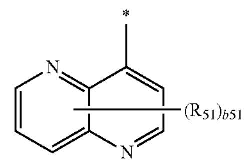
5-87
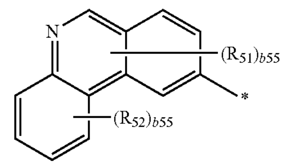
5-88
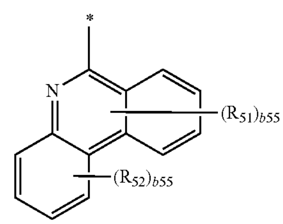
5-89
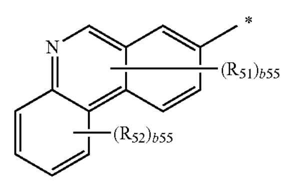
5-90
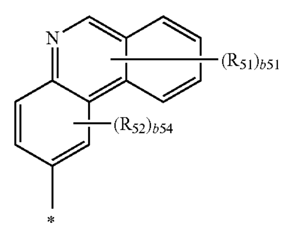
5-91
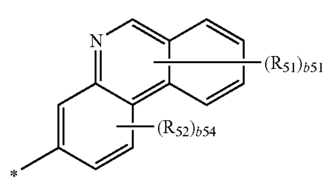
5-92
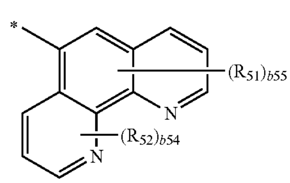

-continued
5-93
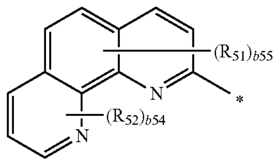
5-94
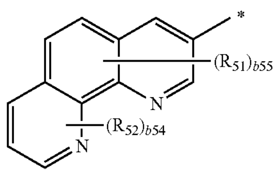
5-95
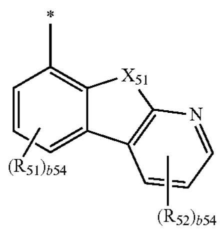
5-96
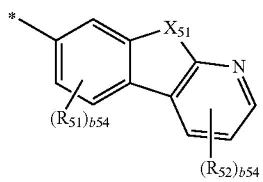
5-97
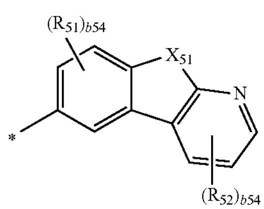
5-98
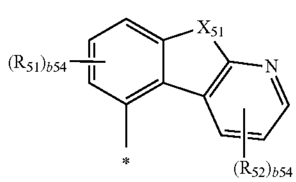
5-99
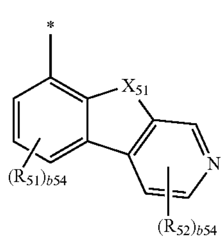
5-100
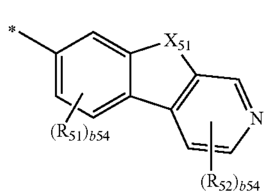
-continued
5-101
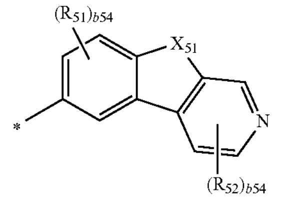
5-102
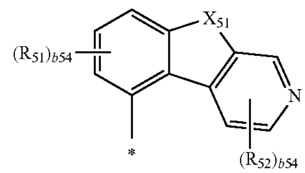
5-103
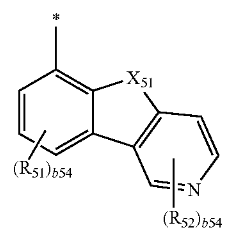
5-104
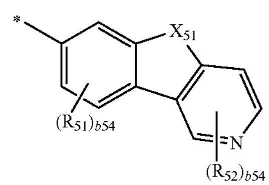
5-105
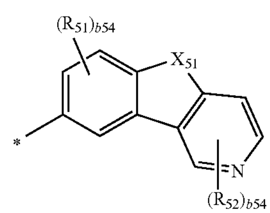
5-106
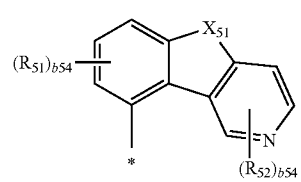
5-107
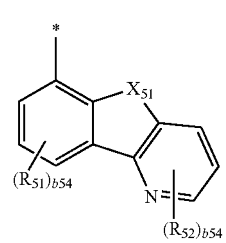

-continued
5-108
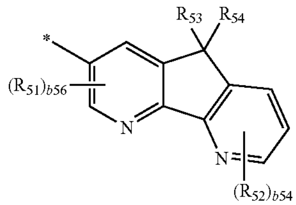
5-109
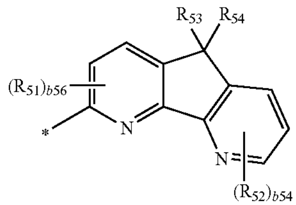
5-110
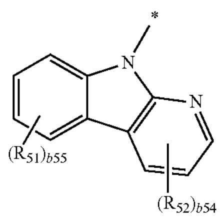
5-111
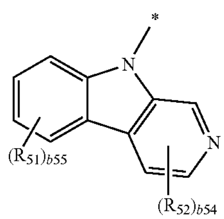
5-112
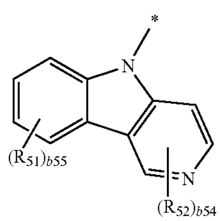
5-113
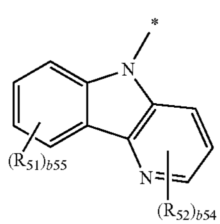
5-114
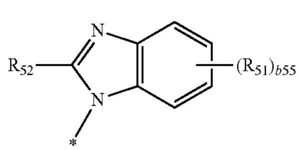
-continued
5-115
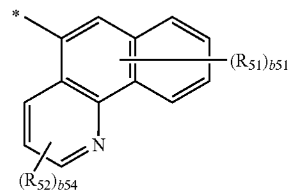
5-116
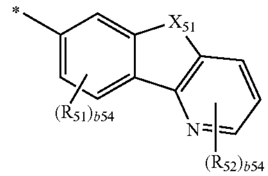
5-117
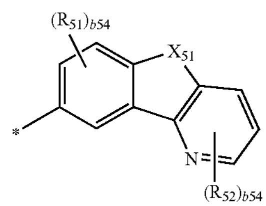
5-118
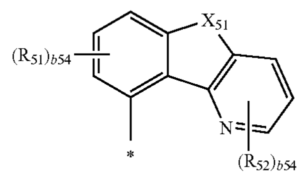
5-119
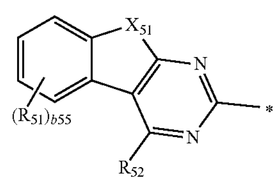
5-120
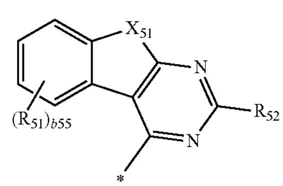
5-121
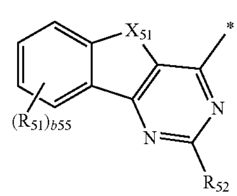
5-122
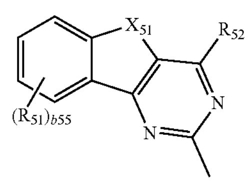

-continued 5-123

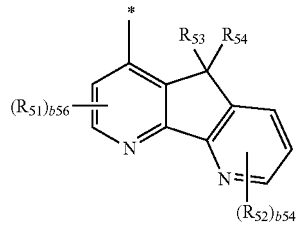

5-124

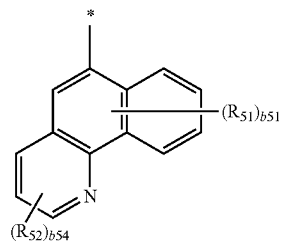

5-125

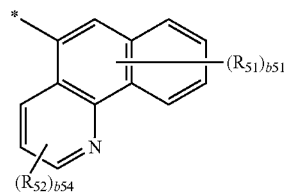

5-126

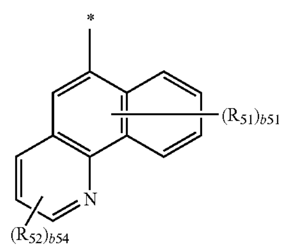

5-127

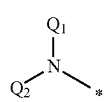

5-128

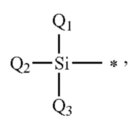

wherein, in Formulae 5-1 to 5-128, $X_{51}$ is selected from O, S, N($R_{53}$), and C($R_{53}$)($R_{54}$);

$R_{51}$ to $R_{54}$ are each independently selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, —$CDH_2$, —$CD_2H$, —$CD_3$, —$CFH_2$, —$CF_2H$, —$CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_6$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$), $Q_1$ to $Q_3$ and $Q_{31}$ to $Q_{33}$ are each independently a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group and a naphthyl group;

b51 is selected from 1, 2, 3, 4, and 5;

b52 is selected from 1, 2, 3, 4, 5, 6, and 7;

b53 is selected from 1, 2, 3, 4, 5, and 6;

b54 is selected from 1, 2, and 3;

b55 is selected from 1, 2, 3, and 4;

b56 is selected from 1 and 2;

b57 is selected from 1, 2, 3, 4, 5, 6, 7, and 8;

b58 is selected from 1, 2, 3, 4, 5, 6, 7, 8, 9, and 10; and

* indicates a binding site to a neighboring atom.

5. The organic light-emitting device of claim 1, wherein $A_{21}$ and $A_{23}$ are each independently selected from a benzene group, a naphthalene group, a phenanthrene group, an anthracene group, a triphenylene group, a pyrene group, a chrysene group, a furan group, a thiophene group, a pyrrole group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, furopyridine group, thienopyridine group, a cyclopentapyridine group, a pyrrolopyridine group, a dibenzofuran group, a dibenzothiophene group, a fluorene group, a carbazole group, a benzofuropyrrole group, a benzothienopyrrole group, an indenopyrrole group, an indolopyrrole group, a benzofurothiophene group, a benzothienothiophene group, an indenothiophene group, an indolothiophene group, a benzofurofuran group, a benzothienofuran group, an indenofuran group, an indolofuran group, a benzofurothiophene group, a benzothienothiophene group, an indenothiophene group, an indolothiophene group, a benzofuropyridine group, a benzothienopyridine group, an indenopyridine group, an indolopyridine group, a benzofuropyrimidine group, a benzothienopyrimidine group, an indenopyrimidine group, an indolopyrimidine group, a benzofuroindole group, a benzothienoindole group, an indenoindole group, an indoloindole group, a benzofurobenzofuran group, a benzothienobenzofuran group, an indenobenzofuran group, an indolobenzofuran group, a benzofurobenzothiophene group, a benzothienobenzothiophene group, an indenobenzothiophene group, an indolobenzothiophene group, a benzofuroquinoline group, a benzothienoquinoline group, an indenoquinoline group, an indoloquinoline group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a cyclopentanaphthalene group, a spiro-bifluorene group, and a spiro-fluorene-indene group.

6. The organic light-emitting device of claim 1, wherein $A_{21}$ and $A_{23}$ are each independently selected from a benzene group, a naphthalene group, a phenanthrene group, a pyridine group, a quinoline group, an isoquinoline group, a benzoquinoline group, a benzoisoquinoline group, a dibenzofuran group, a dibenzothiophene group, a fluorene group, a carbazole group, and an indolopyridine group.

7. The organic light-emitting device of claim 1, wherein $A_{22}$ is selected from a benzene group, a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, and a phenanthroline group.

8. The organic light-emitting device of claim 1, wherein $A_{22}$ is selected from a benzene group and a naphthalene group.

9. The organic light-emitting device of claim 1, wherein $L_{101}$ and $L_{21}$ to $L_{26}$ are each independently selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group, each substituted with at least one selected from deuterium, —F, —Cl, —Br, —I, a cyano group, a $C_1$-$C_{20}$ alkyl group, a $C_1$-$C_{20}$ alkoxy group, a cyclopropyl group, a cyclobutyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ are each independently selected from hydrogen, a $C_1$-$C_{20}$ alkyl group, a phenyl group, a naphthyl group, a biphenyl group, and a terphenyl group.

10. The organic light-emitting device of claim 1, wherein $R_{21}$ to $R_{24}$ are each independently selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

11. The organic light-emitting device of claim 1, wherein $R_{21}$ to $R_{24}$ are each independently selected from groups represented by Formulae 5-1 to 5-128:
5-1
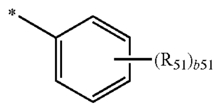
5-2
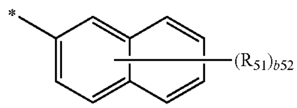
5-3
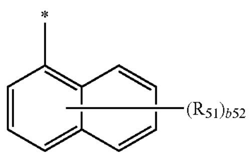
5-4
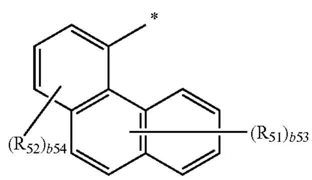
5-5
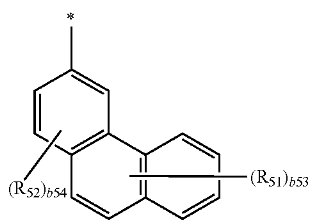
5-6
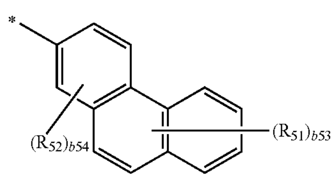
5-7
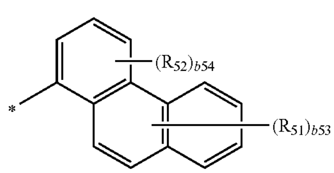
5-8
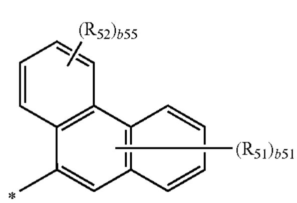
-continued
5-9
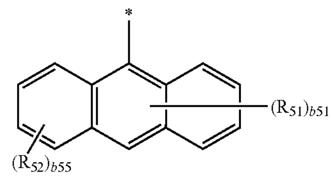
5-10
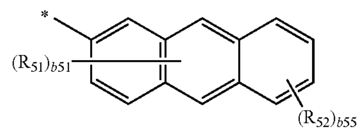
5-11
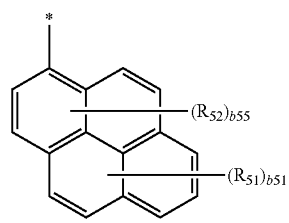
5-12
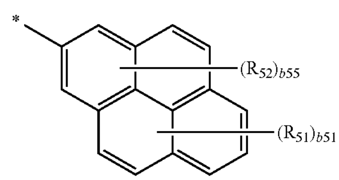
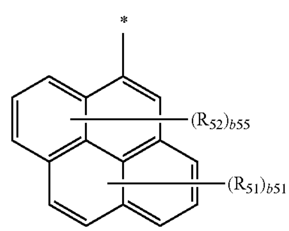
5-14
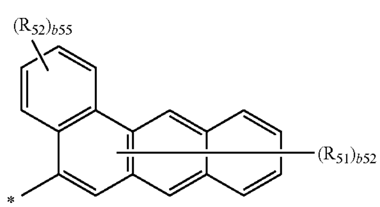
5-15
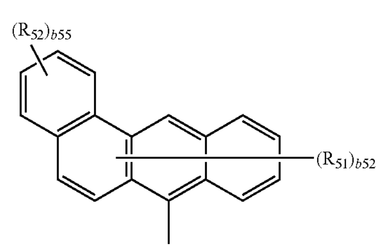

-continued
5-16
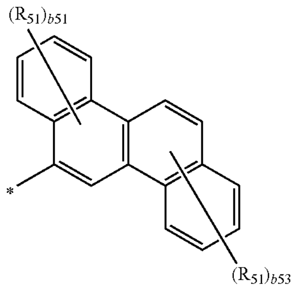
5-17
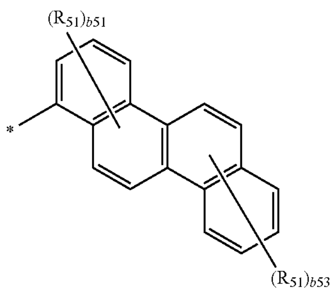
5-18
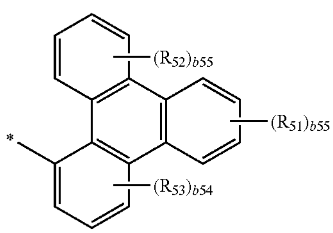
5-19
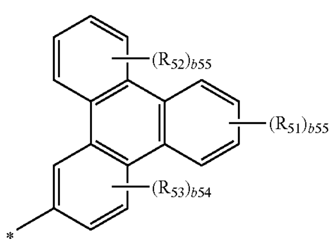
5-20
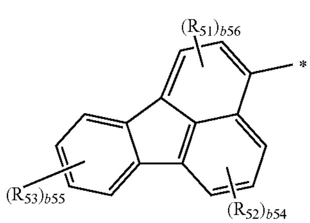
5-21
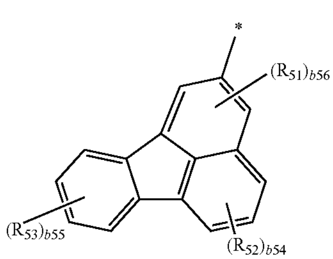
-continued
5-22
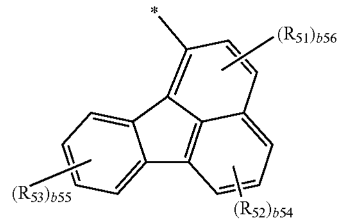
5-23
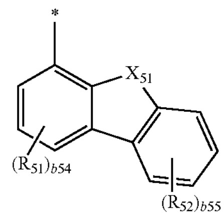
5-24
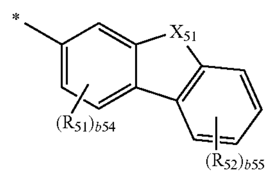
5-25
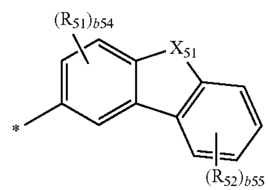
5-26
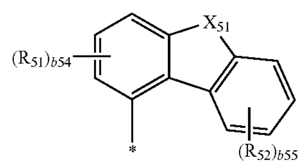
5-27
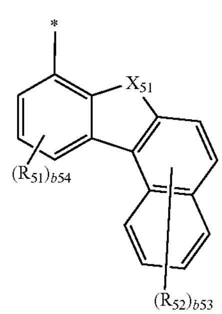
5-28
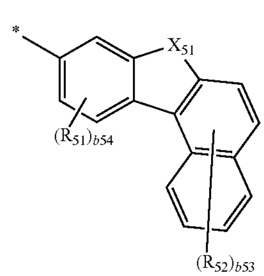

-continued
5-29
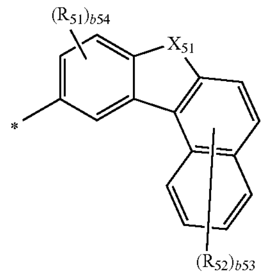
5-30
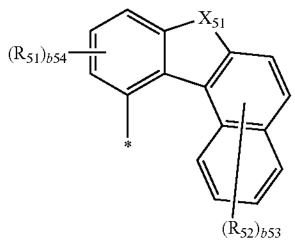
5-31
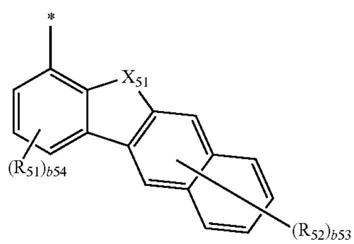
5-32
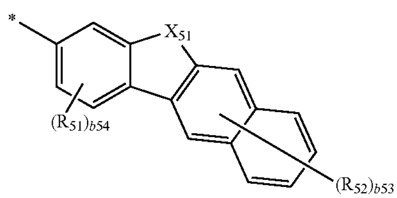
5-33
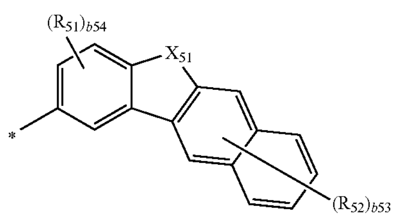
5-34
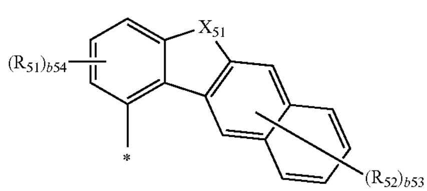
5-35
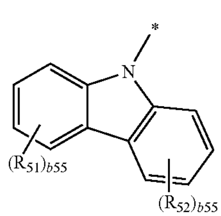
-continued
5-36
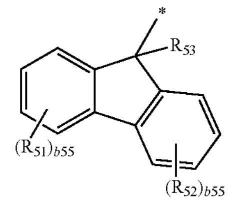
5-37
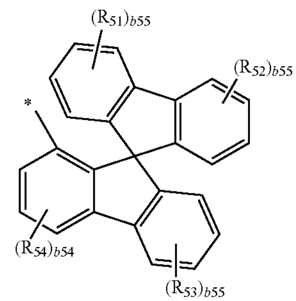
5-38
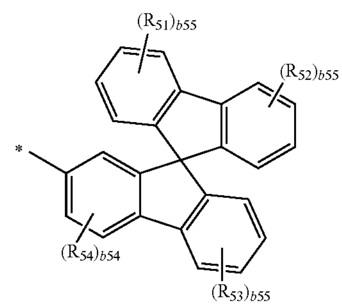
5-39
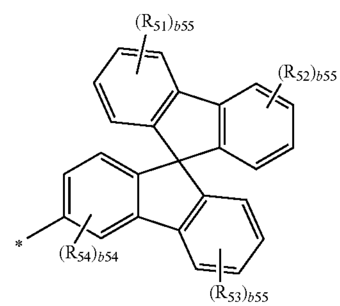
5-40
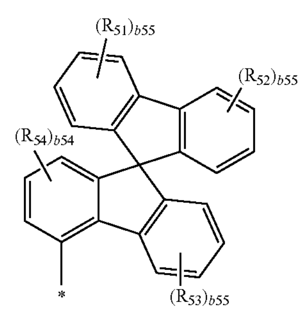

-continued
5-41
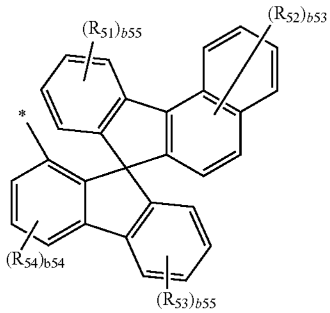
5-42
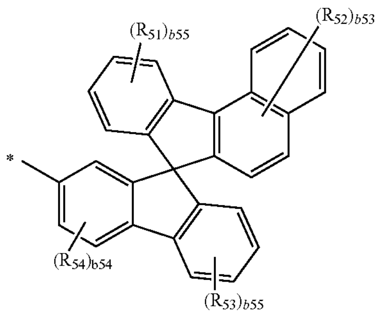
5-43
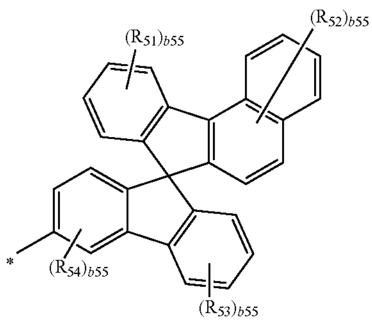
5-44
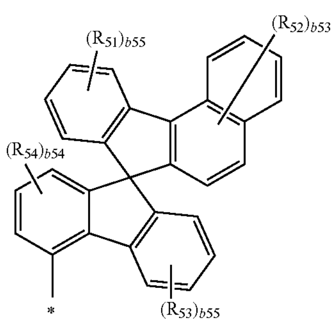
5-45
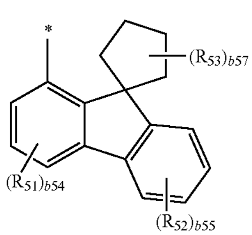
-continued
5-46
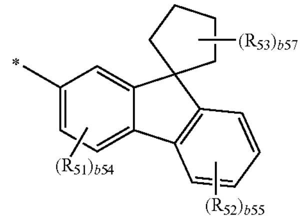
5-47
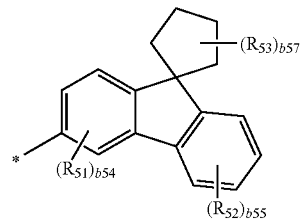
5-48
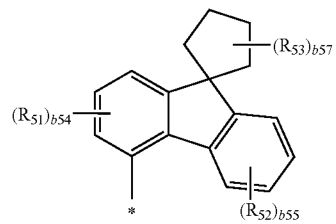
5-49
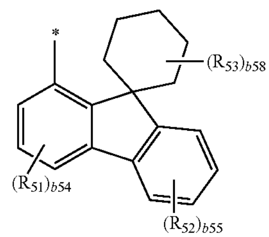
5-50
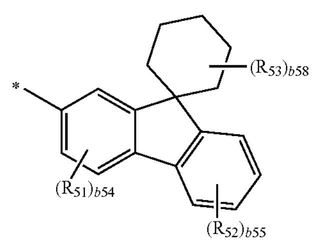
5-51
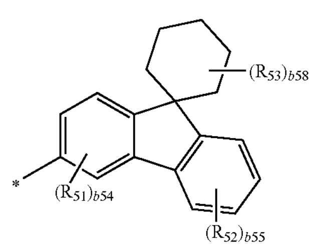

-continued
5-52
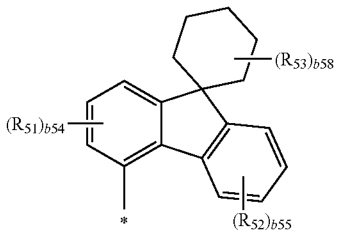
5-53
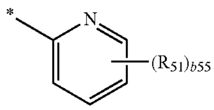
5-54
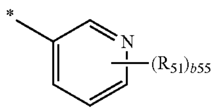
5-55
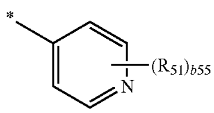
5-56
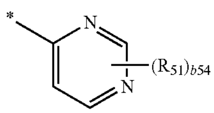
5-57
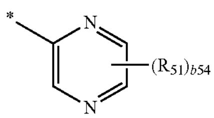
5-58
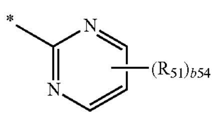
5-59
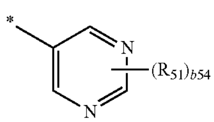
5-60
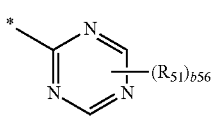
5-61
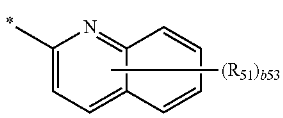
5-62
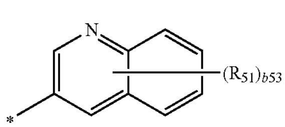
-continued
5-63
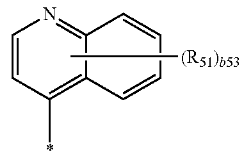
5-64
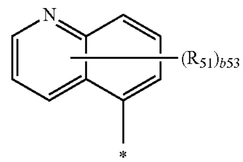
5-65
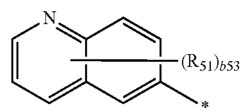
5-66
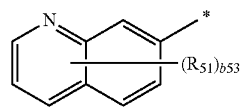
5-67
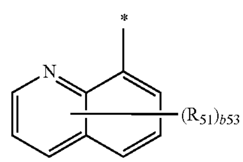
5-68
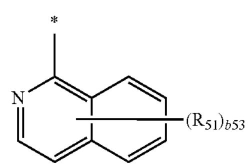
5-69
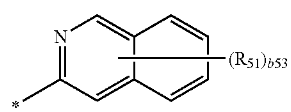
5-70
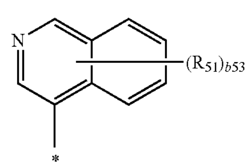
5-71
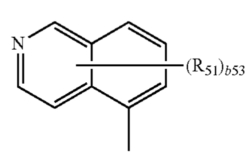
5-72
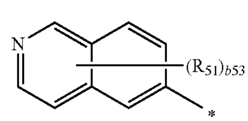

-continued
5-73
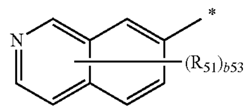
5-74
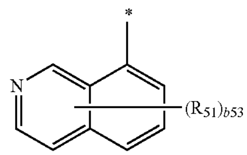
5-75
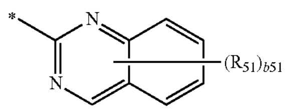
5-76
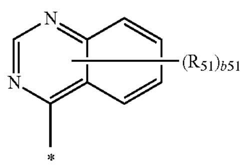
5-77
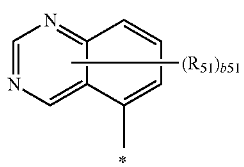
5-78
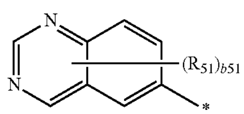
5-79
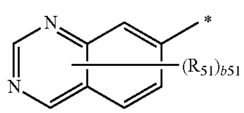
5-80
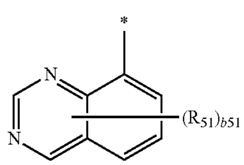
5-81
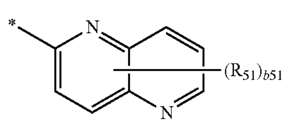
5-82
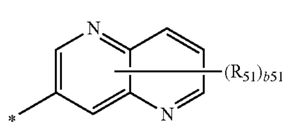
5-83
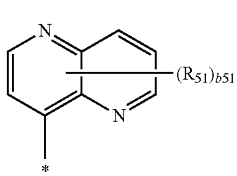
-continued
5-84
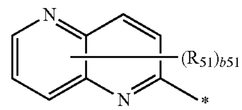
5-85
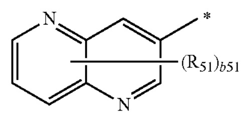
5-86
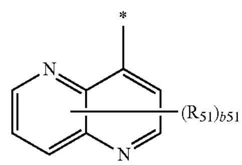
5-87
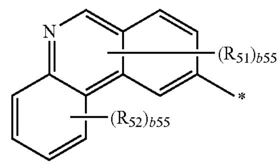
5-88
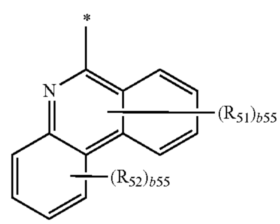
5-89
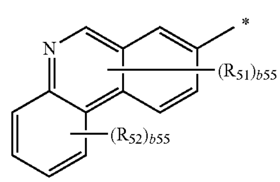
5-90
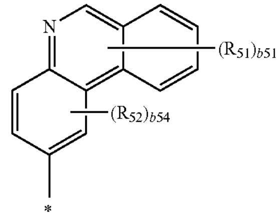
5-91
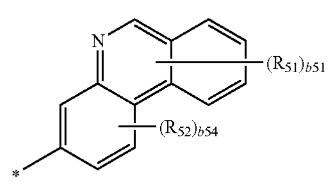
5-92
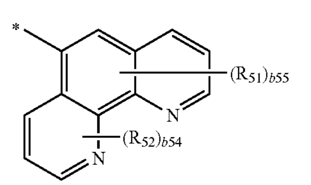

-continued
5-93
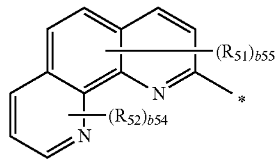
5-94
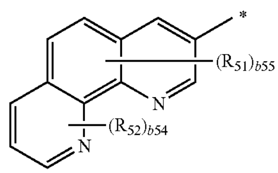
5-95
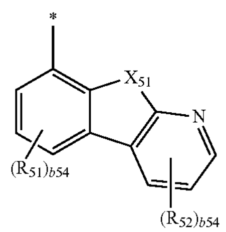
5-96
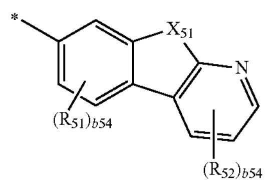
5-97
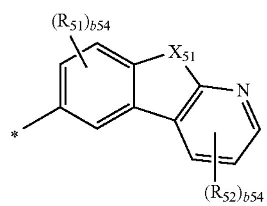
5-98
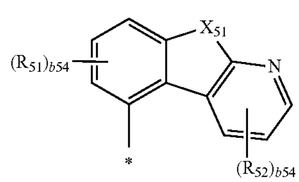
5-99
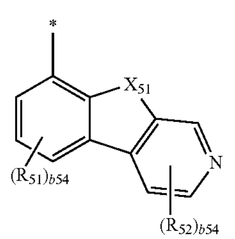
5-100
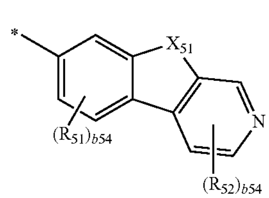
-continued
5-101
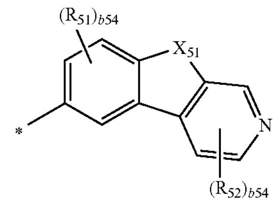
5-102
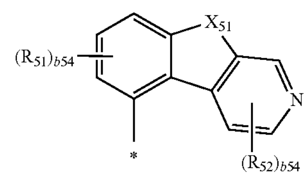
5-103
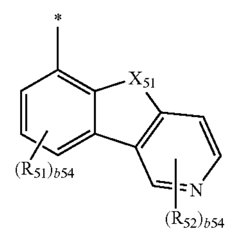
5-104
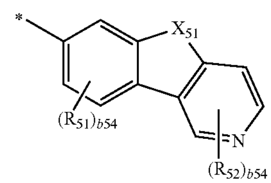
5-105
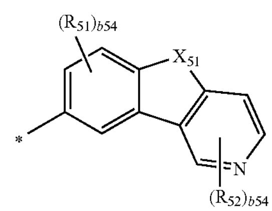
5-106
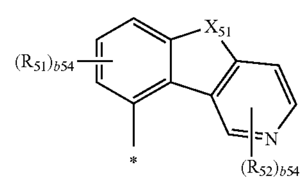
5-107
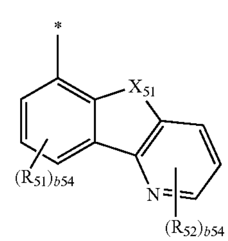

-continued
5-108
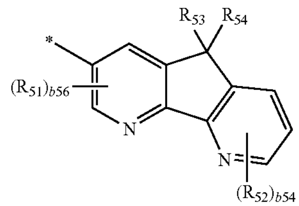
5-109
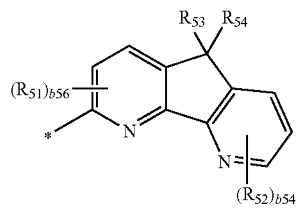
5-110
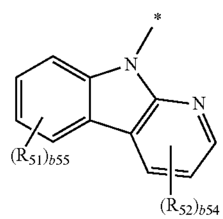
5-111
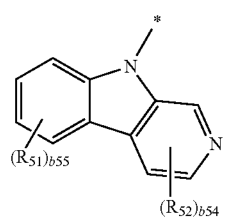
5-112
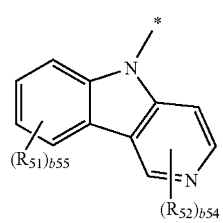
5-113
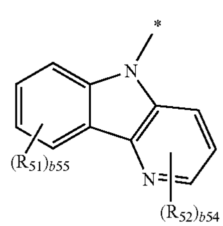
5-114
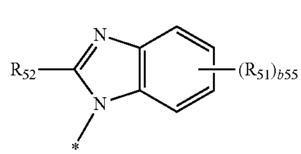
-continued
5-115
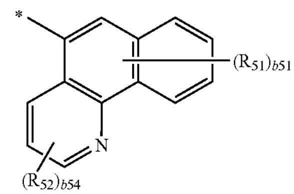
5-116
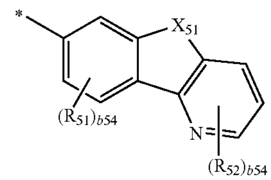
5-117
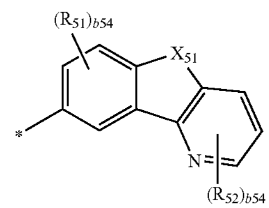
5-118
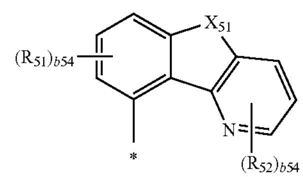
5-119
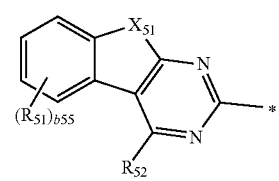
5-120
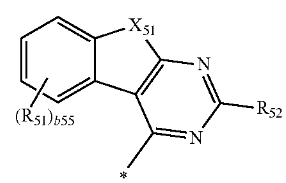
5-121
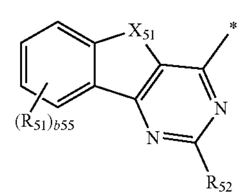
5-122
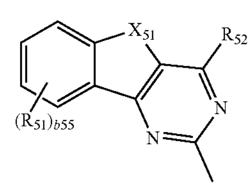

-continued 5-123

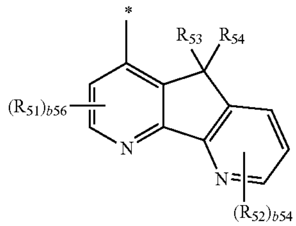

5-124

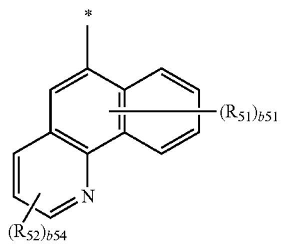

5-125

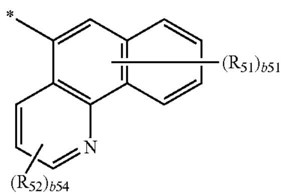

5-126

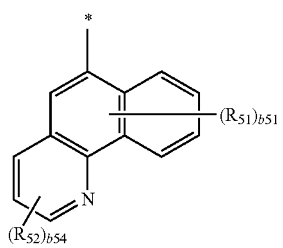

5-127

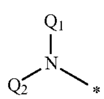

5-128

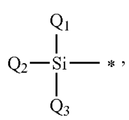

wherein, in Formulae 5-1 to 5-128, $X_{51}$ is selected from O, S, $N(R_{53})$, and $C(R_{53})(R_{54})$;

$R_{51}$ to $R_{54}$ are each independently selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, —$CDH_2$, —$CD_2H$, —$CD_3$, —$CFH_2$, —$CF_2H$, —$CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_6$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$;

$Q_1$ to $Q_3$ and $Q_{31}$ to $Q_{33}$ are each independently selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group, and a naphthyl group;

b51 is selected from 1, 2, 3, 4, and 5;

b52 is selected from 1, 2, 3, 4, 5, 6, and 7;

b53 is selected from 1, 2, 3, 4, 5, and 6;

b54 is selected from 1, 2, and 3;

b55 is selected from 1, 2, 3, and 4;

b56 is selected from 1 and 2;

b57 is selected from 1, 2, 3, 4, 5, 6, 7, and 8;

b58 is selected from 1, 2, 3, 4, 5, 6, 7, 8, 9, and 10; and

* indicates a binding site to a neighboring atom.

12. The organic light-emitting device of claim 1, wherein $R_{201}$ to $R_{207}$ are each independently selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, and —$Si(Q_1)(Q_2)(Q_3)$;

$Q_1$ to $Q_3$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group;

$R_{204}$ and $R_{205}$ are optionally linked to each other to form a saturated ring or an unsaturated ring; and $R_{206}$ and $R_{207}$ are optionally linked to each other to form a saturated ring or an unsaturated ring.

13. The organic light-emitting device of claim 1, wherein $R_{201}$ to $R_{207}$ are each independently selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —N($Q_1$)($Q_2$), and —Si($Q_1$)($Q_2$)($Q_3$); and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group;

$Q_1$ to $Q_3$ are each independently selected from a methyl group, an ethyl group, an n-propyl group, an iso-propyl group, and a phenyl group;

$R_{204}$ and $R_{205}$ are optionally linked to each other to form a saturated ring or an unsaturated ring; and $R_{206}$ and $R_{207}$ are optionally linked to each other to form a saturated ring or an unsaturated ring.

14. The organic light-emitting device of claim 1, wherein the first compound represented by Formula 1 is selected from Compounds H1 to H116; and the second compound represented by Formula 2 is selected from Compounds D1 to D212:

H1

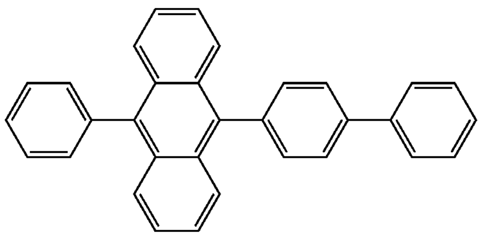

H2

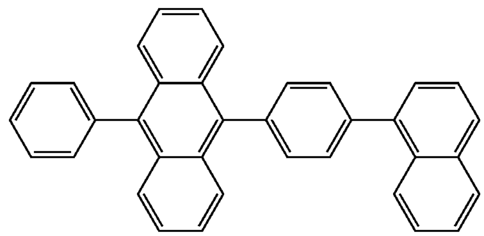

H3

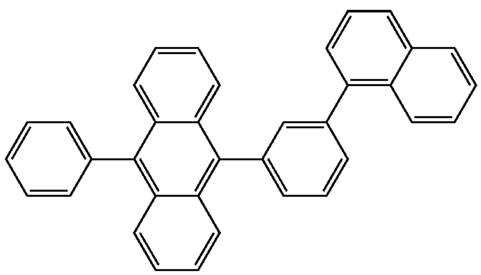

H4

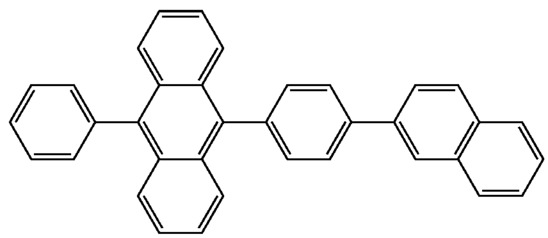

H5

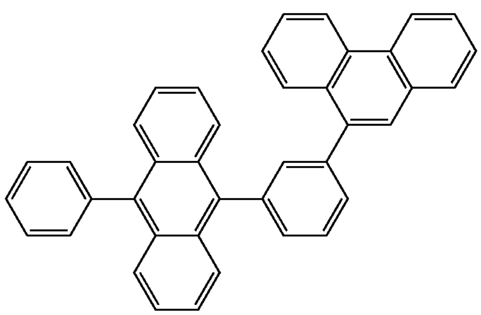

H6

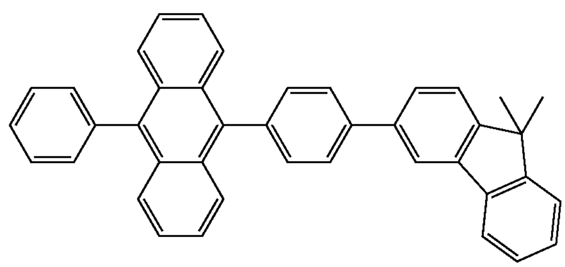

H7

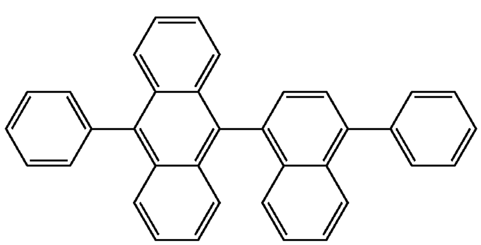

H8

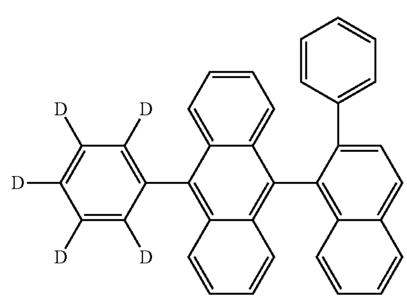

-continued
H9
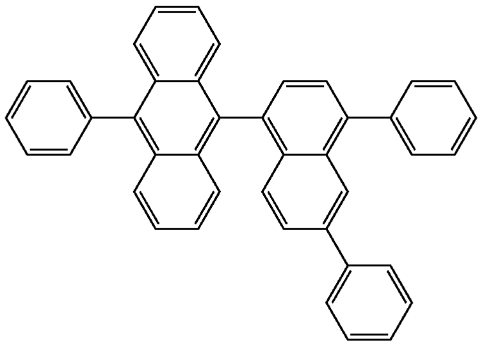
H10
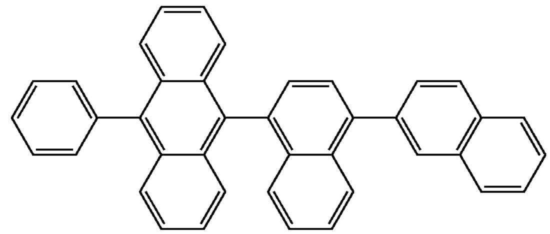
H11
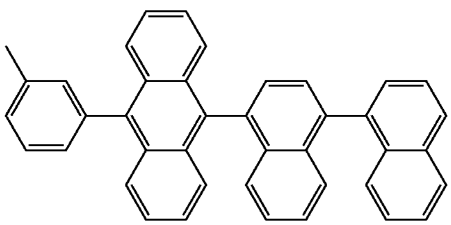
H12
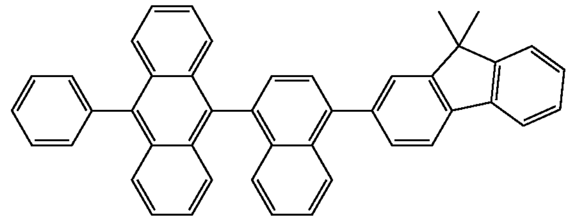
H13
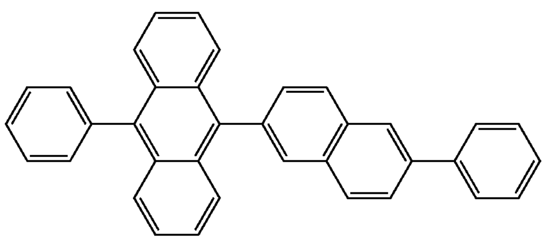
H14
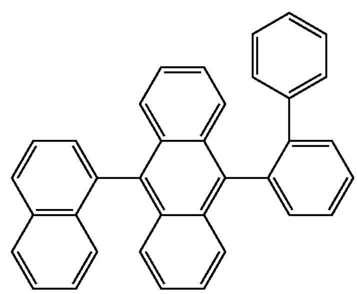
H15
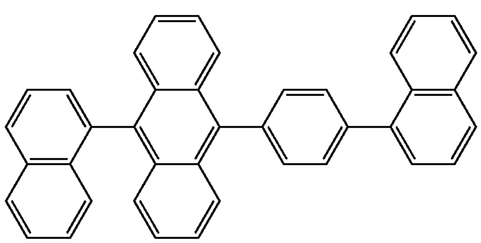
H16
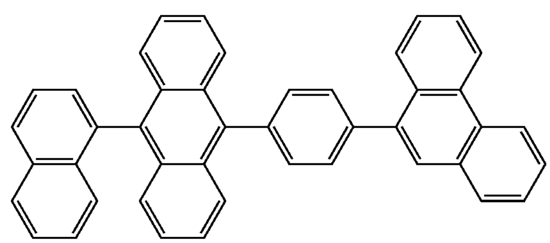
H17
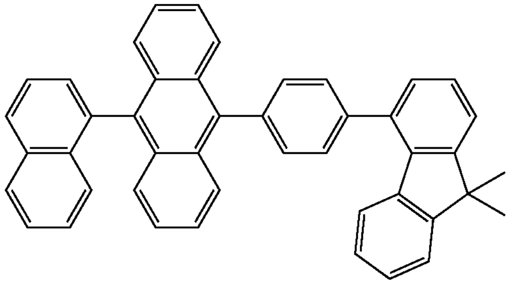
H18
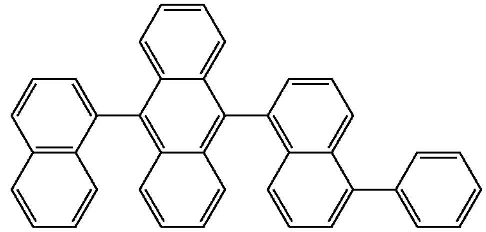

-continued
H19
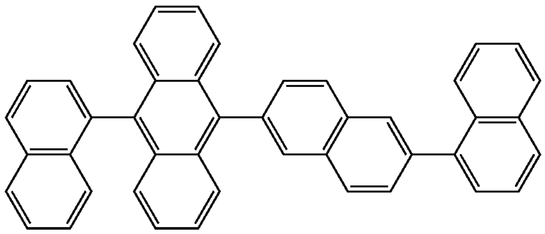
H20
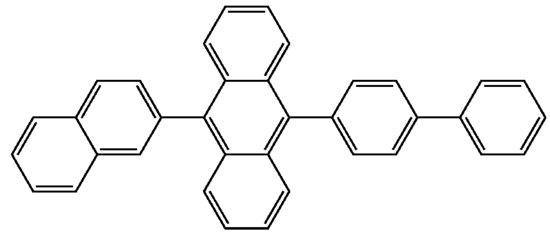
H21
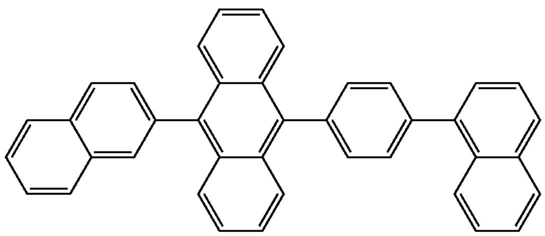
H22
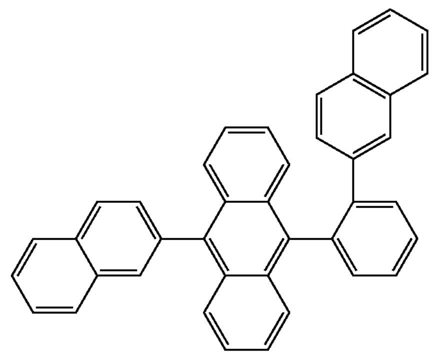
H23
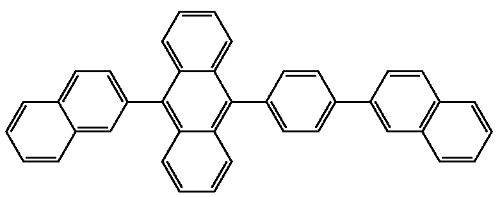
H24
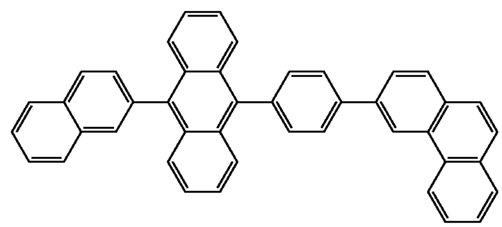
H25
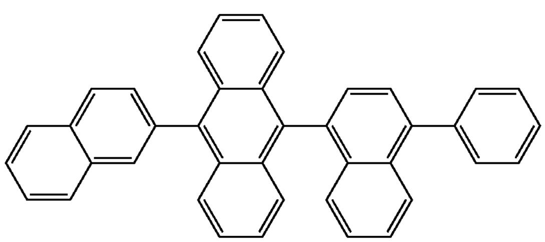
H26
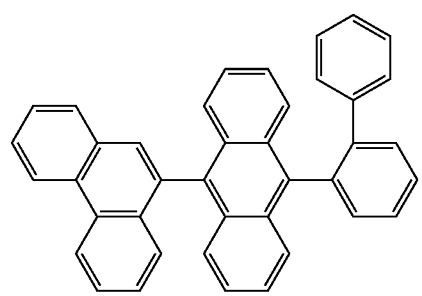
H27
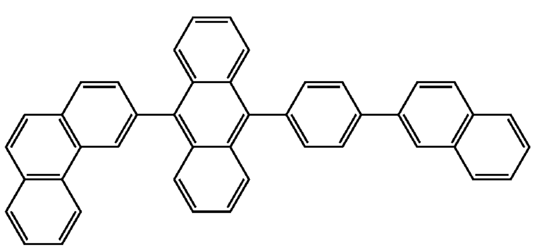
H28
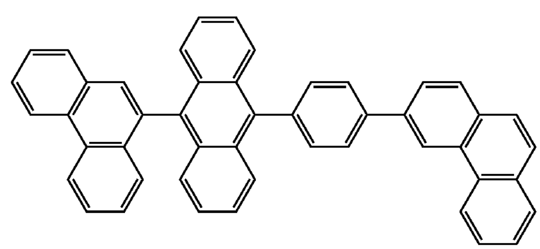

-continued
H29
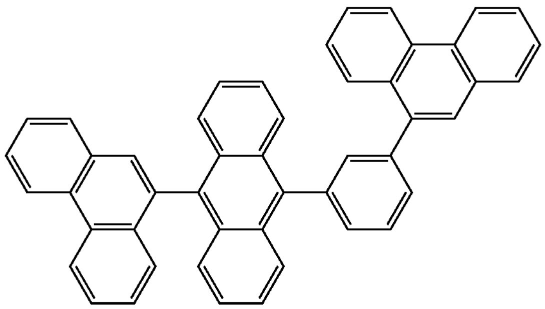
H30
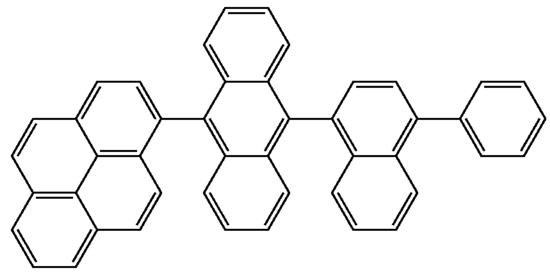
H31
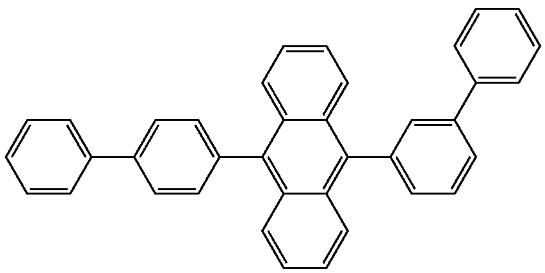
H32
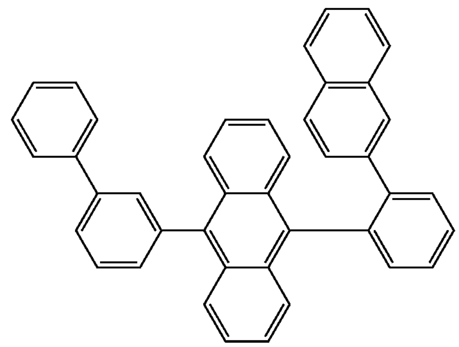
H33
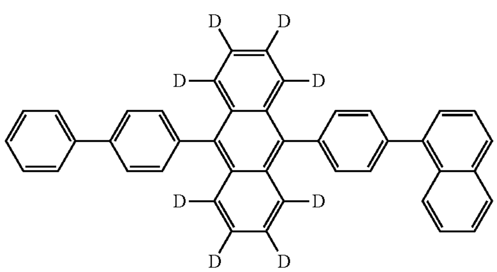
H34
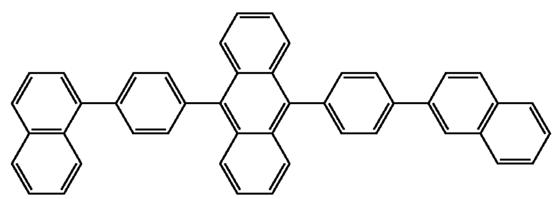
H35
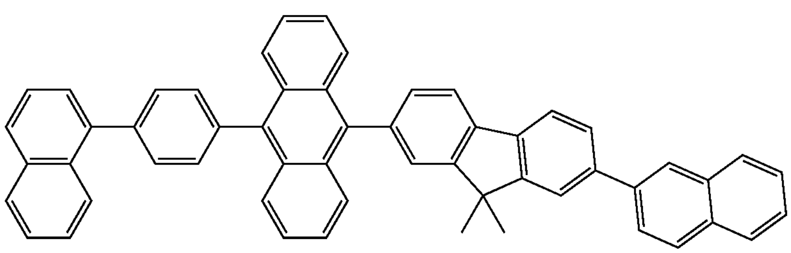
H36
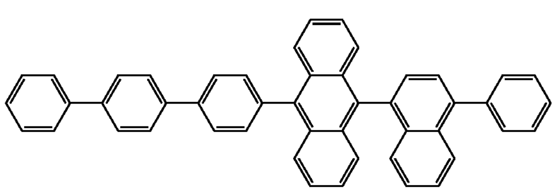
H37
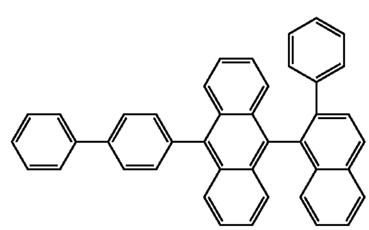

-continued
H38
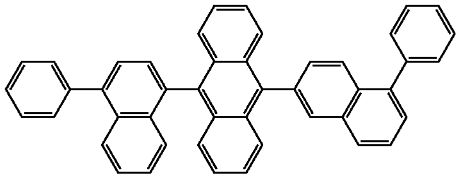
H39
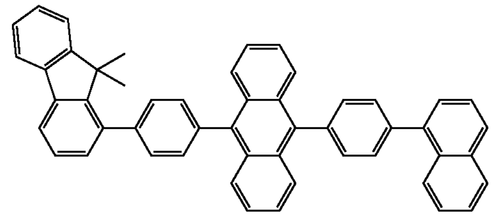
H40
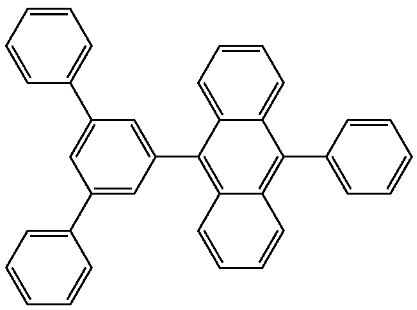
H41
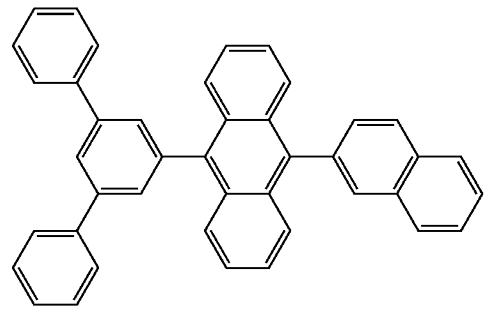
H42
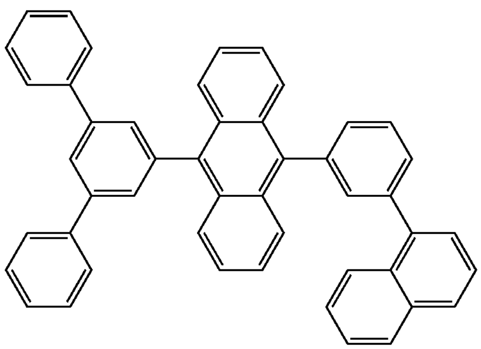
H43
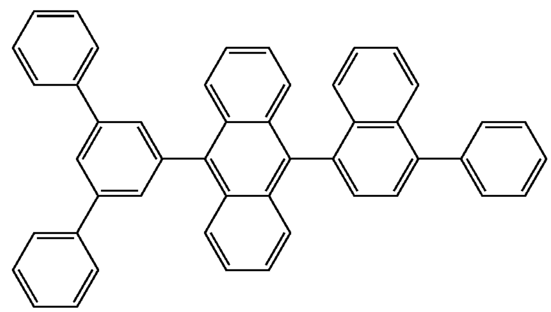
H44
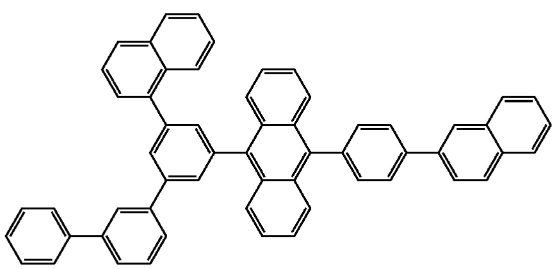
H45
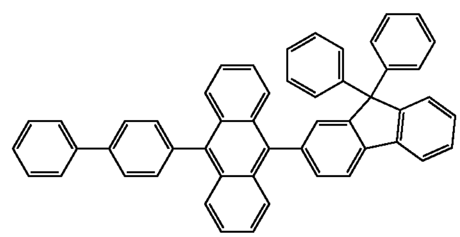
H46
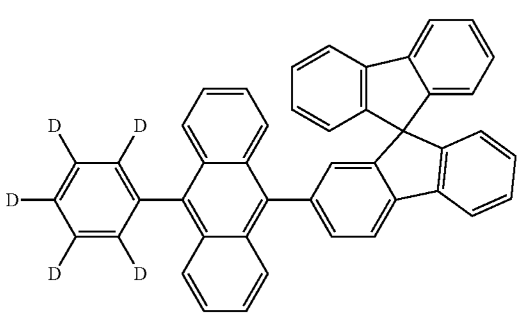
H47
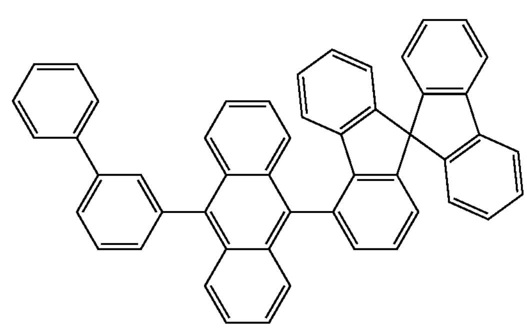

-continued
H48
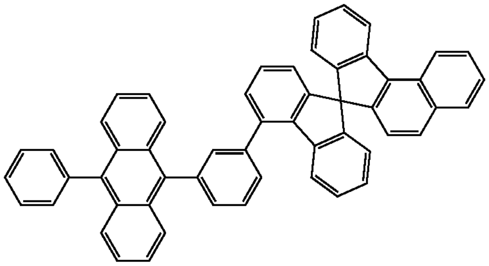
H49
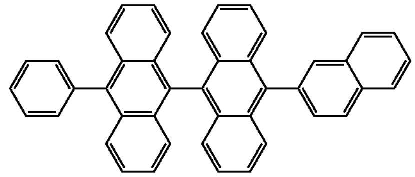
H50
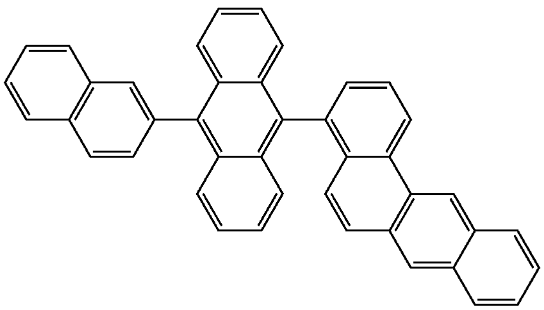
H51
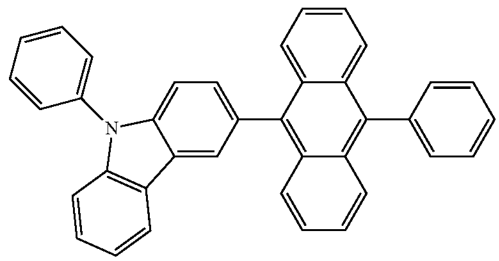
H52
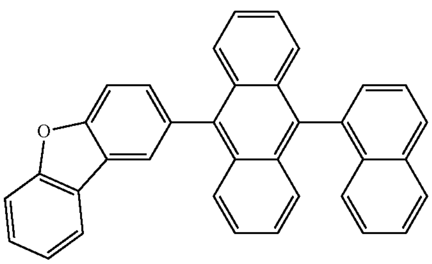
H53
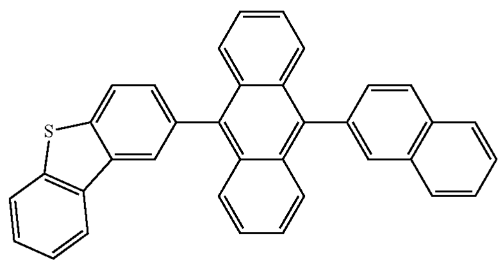
H54
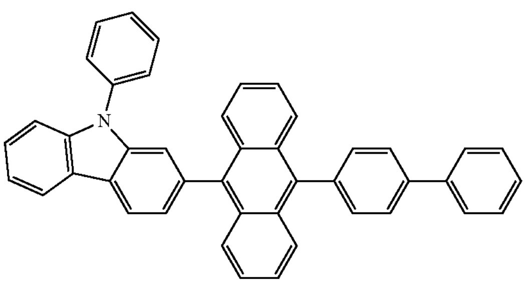
H55
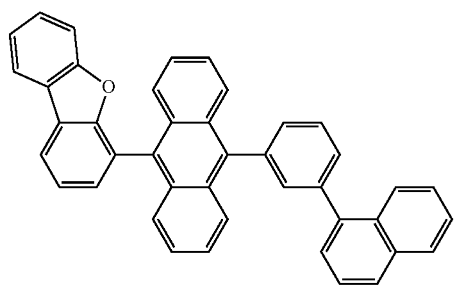
H56
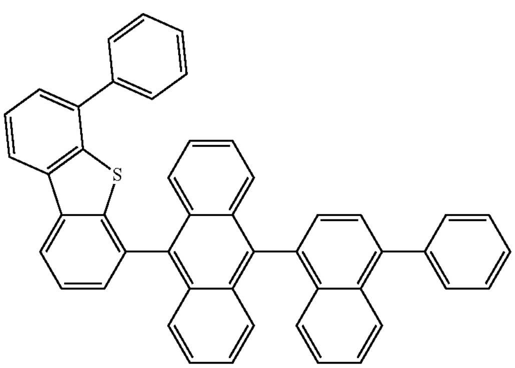
H57
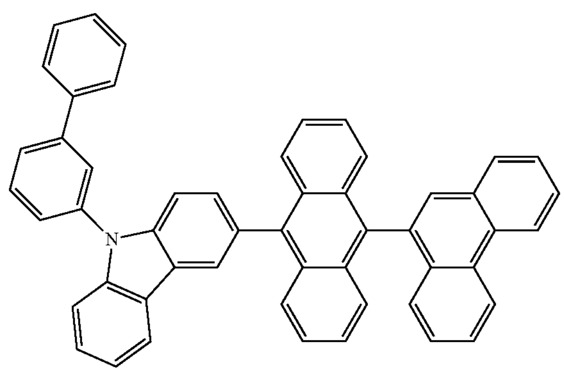

-continued
H58
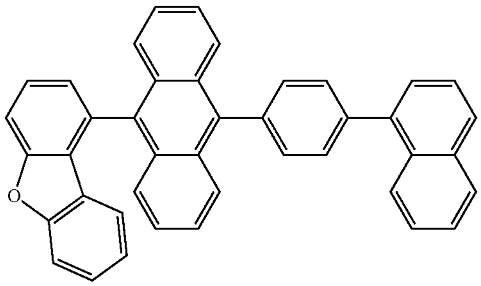
H59
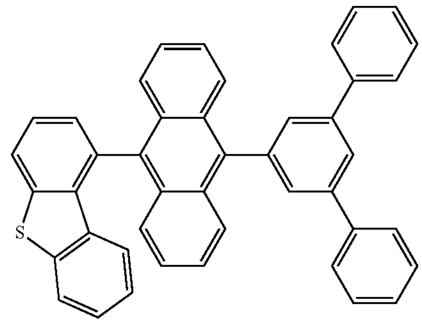
H60
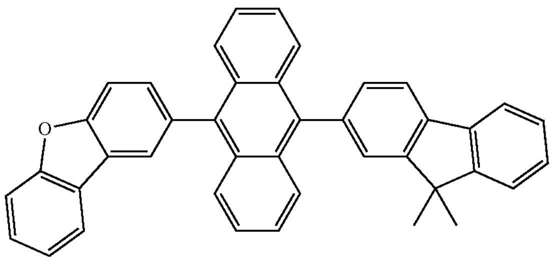
H61
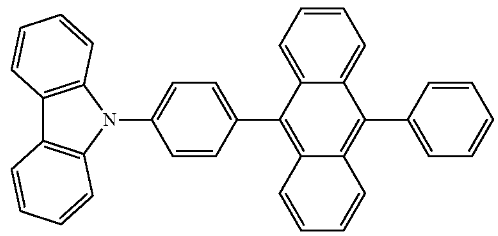
H62
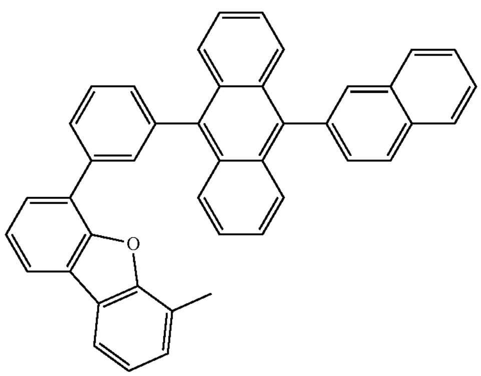
H63
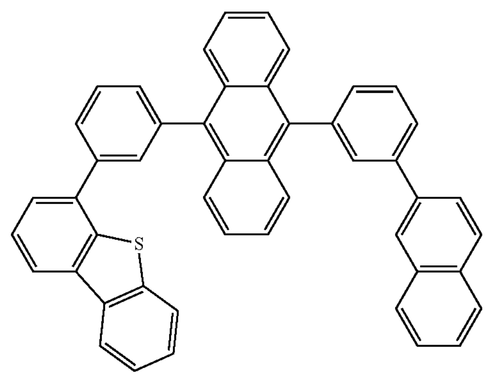
H64
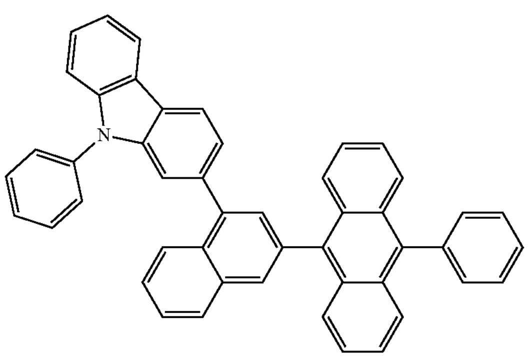
H65
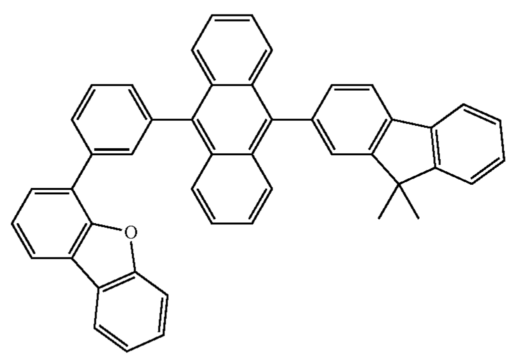

-continued
H66
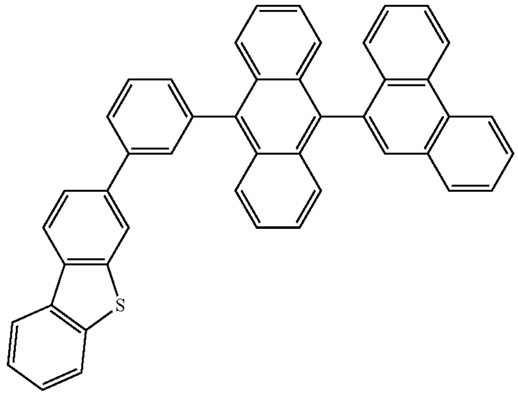
H67
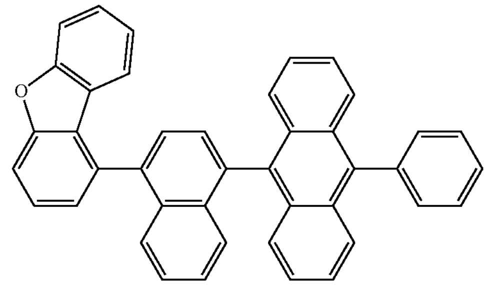
H68
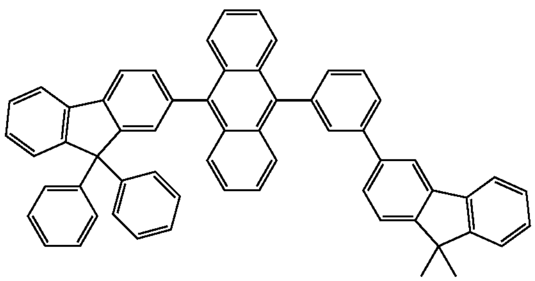
H69
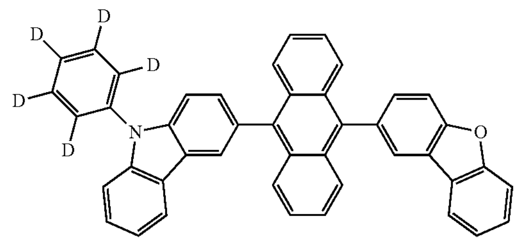
H70
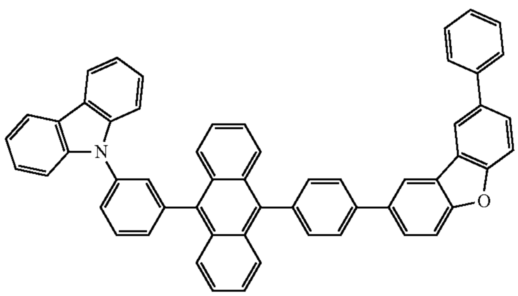
H71
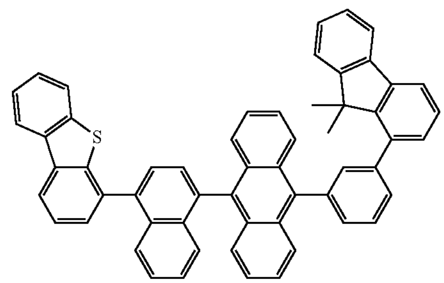
H72
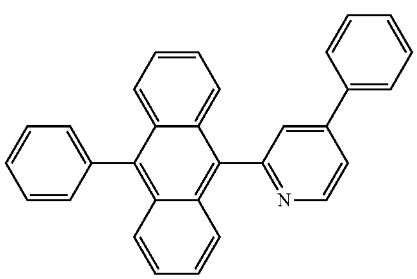
H73
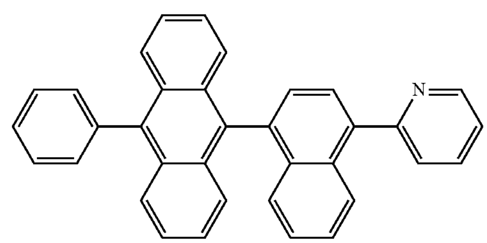
H74
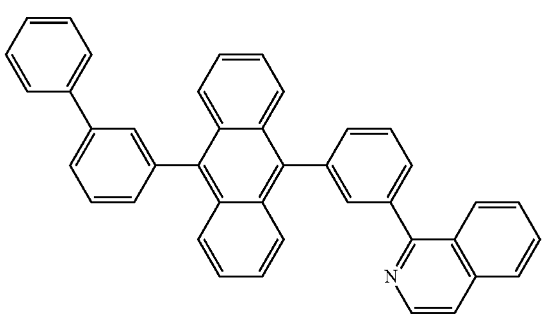
H75
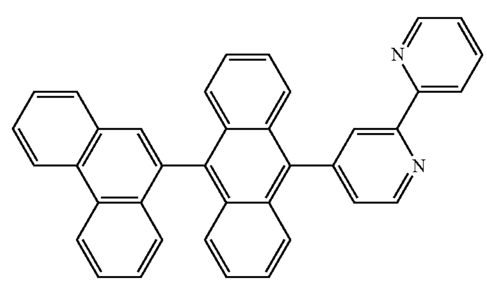

-continued
H76
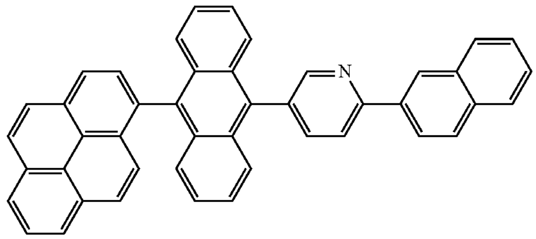
H77
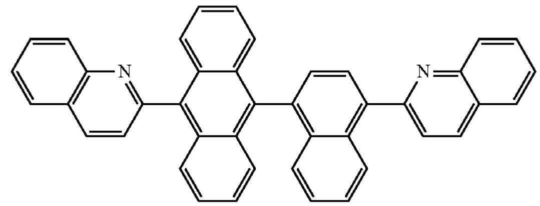
H78
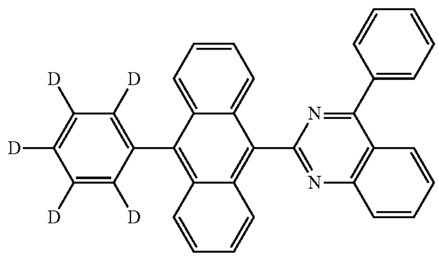
H79
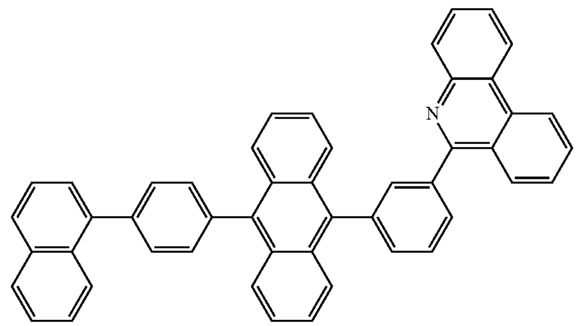
H80
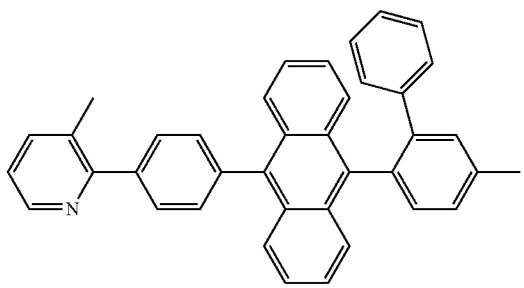
H81
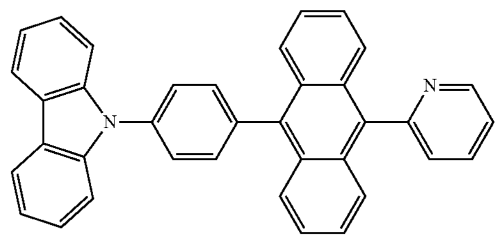
H82
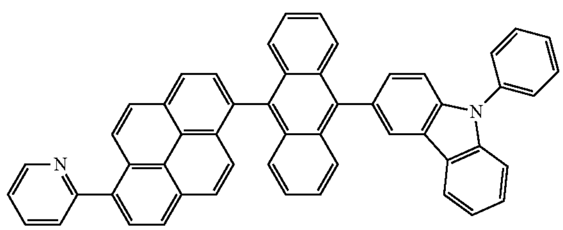
H83
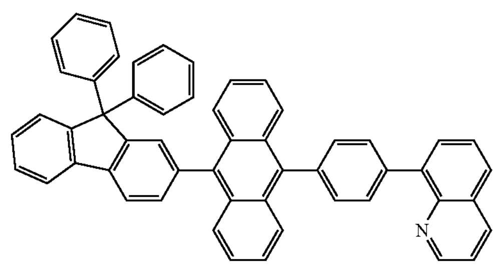
H84
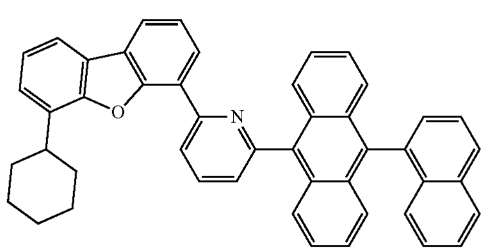
H85
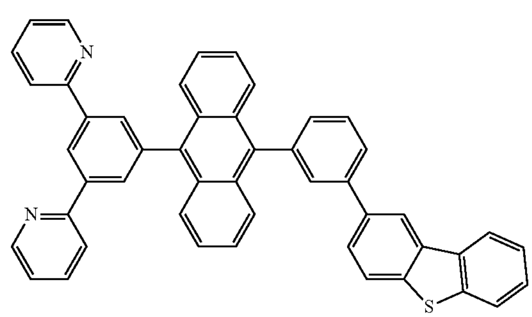

-continued
H86
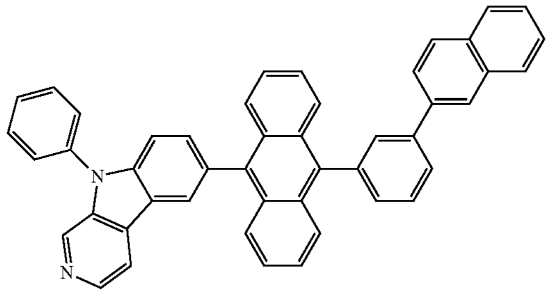
H87
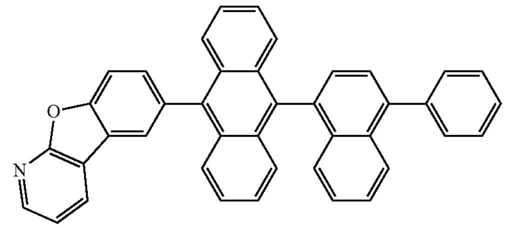
H88
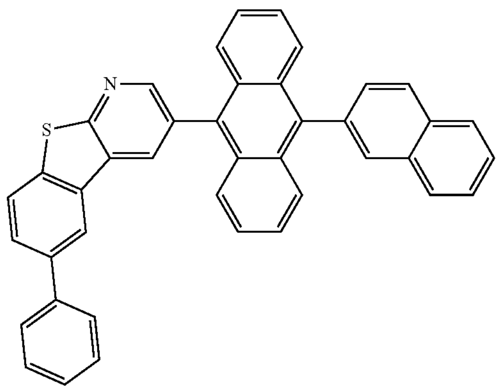
H89
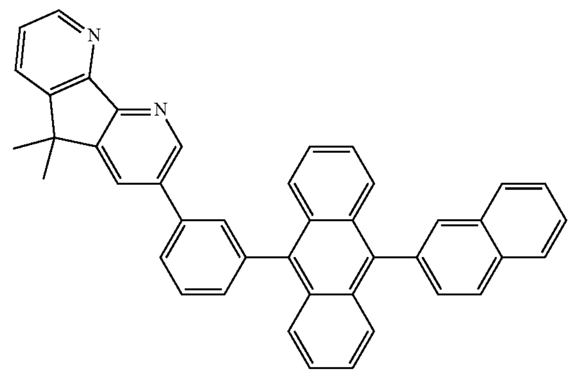
H90
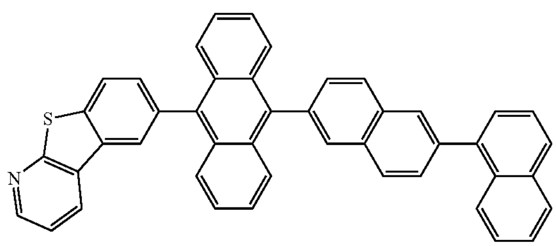
H91
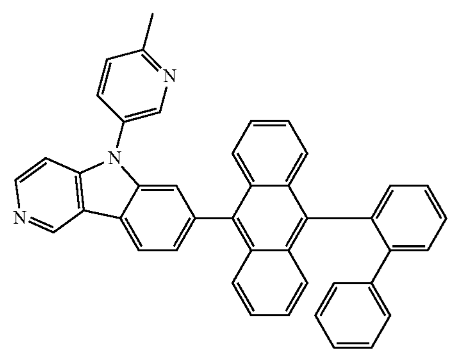
H92
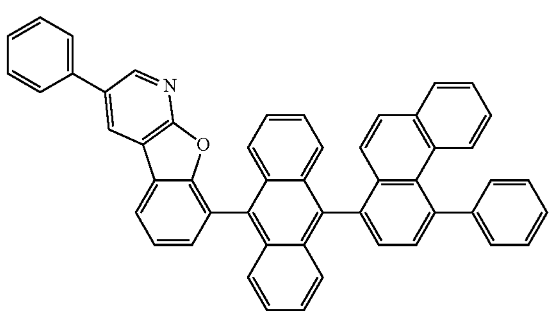
H93
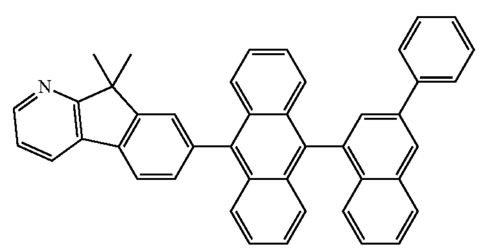

-continued
H94
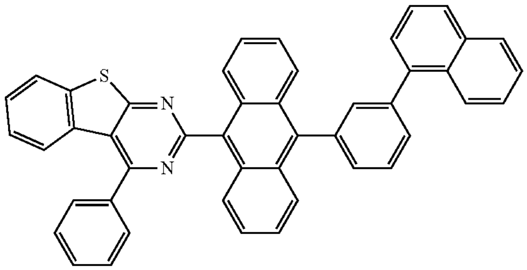
H95
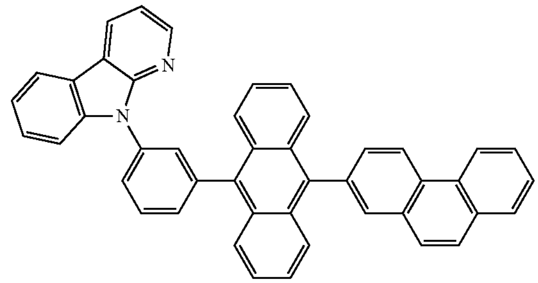
H96
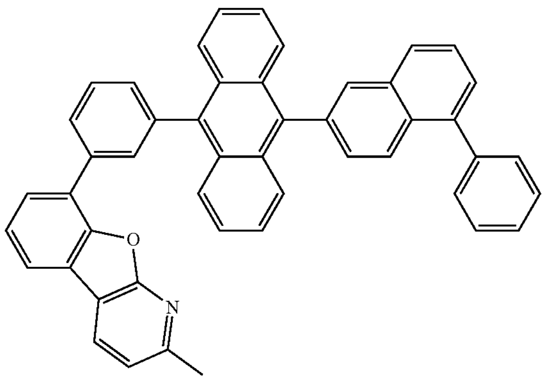
H97
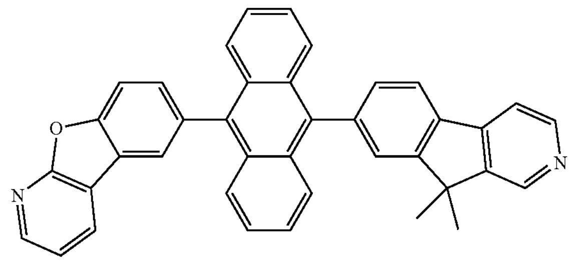
H98
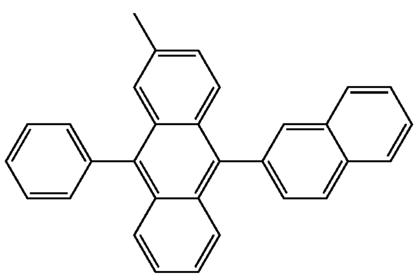
H99
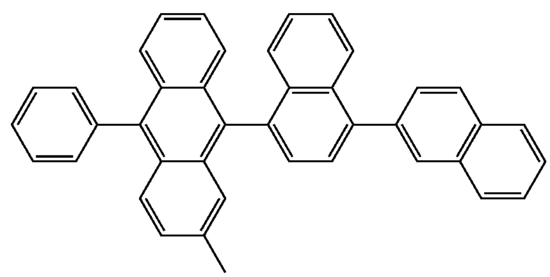
H100
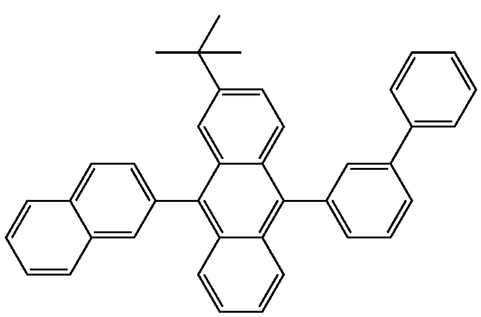
H101
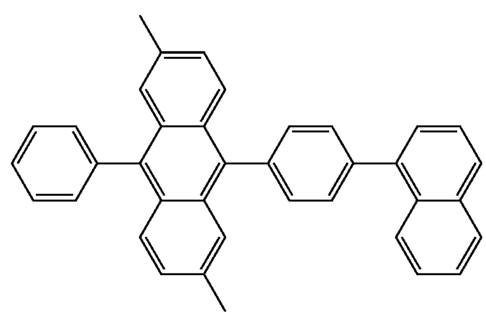

-continued
H102
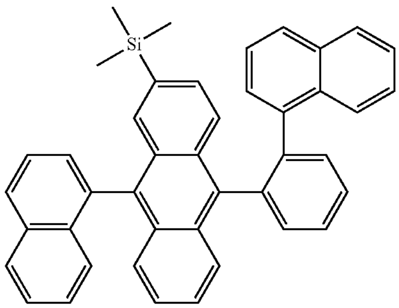
H103
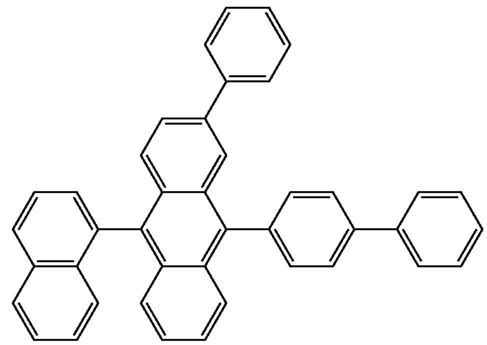
H104
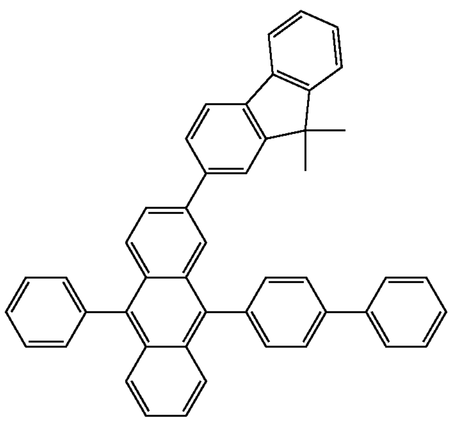
H105
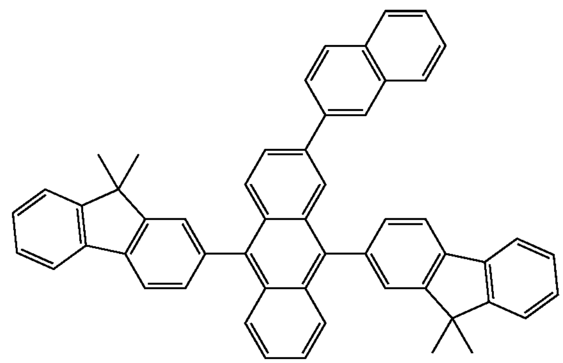
H106
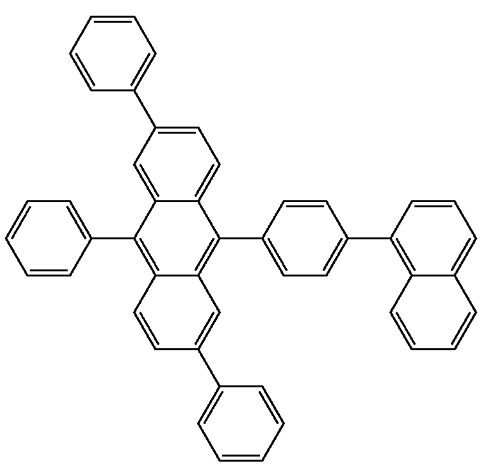
H107
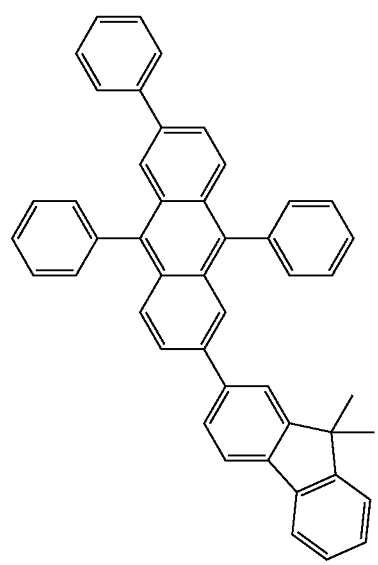

-continued
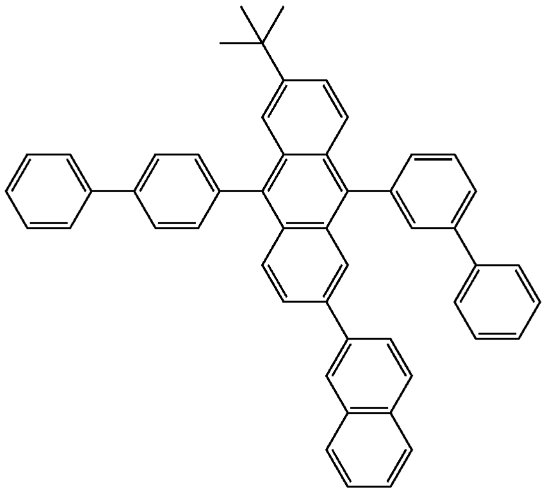
H108
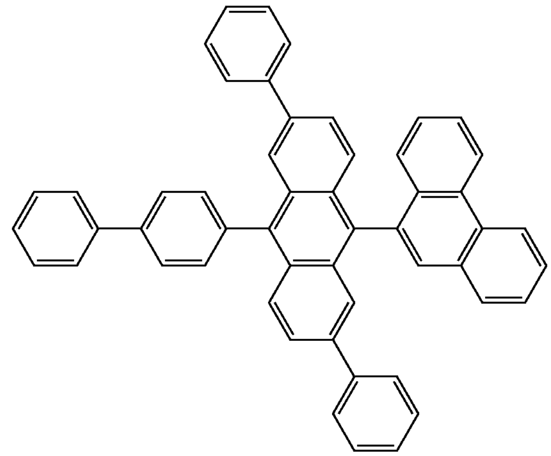
H109
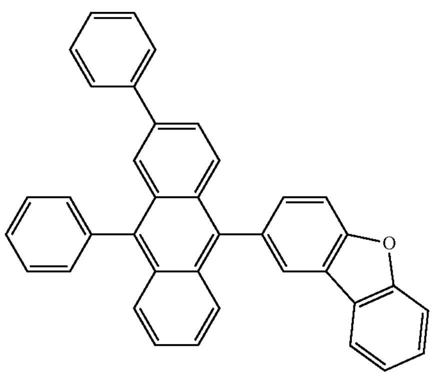
H110
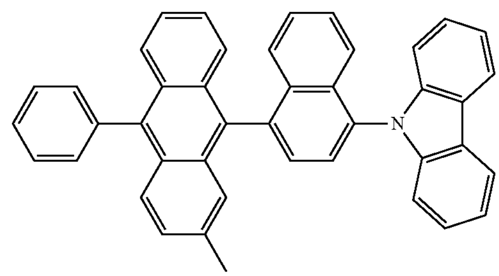
H111
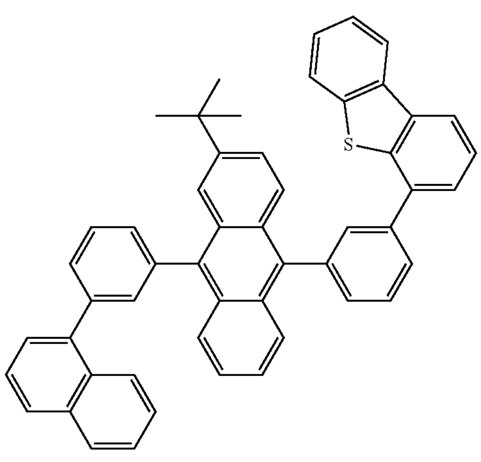
H112
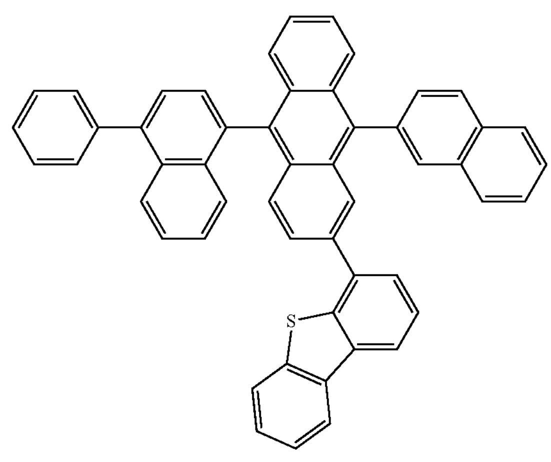
H113

-continued
H114
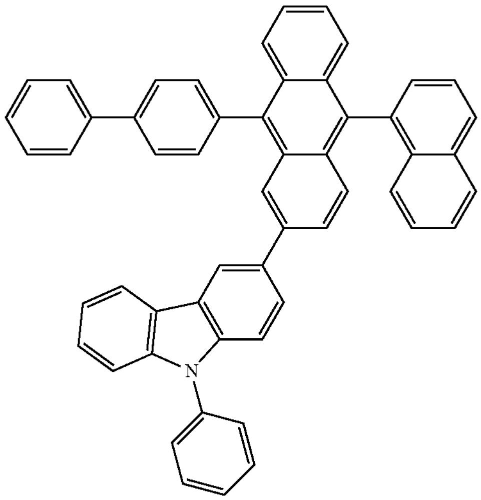
H115
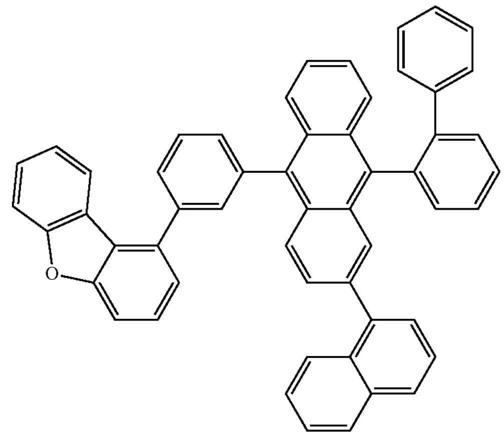
H116
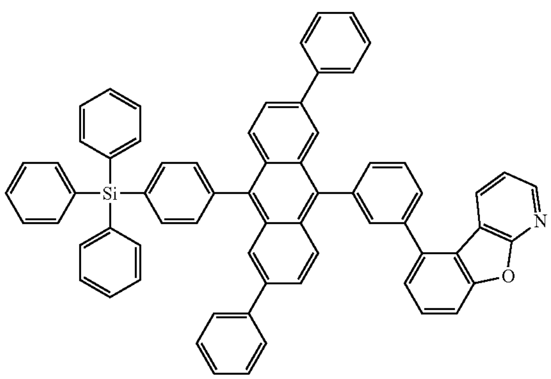
D1
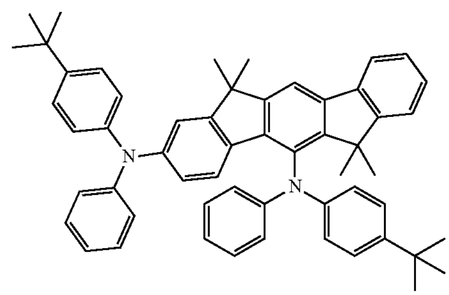
D2
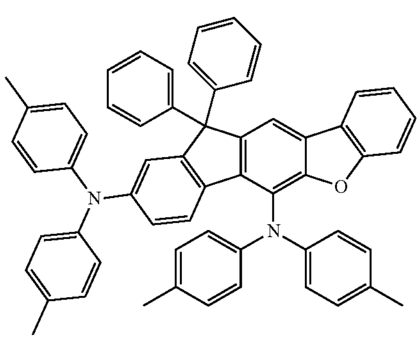
D3
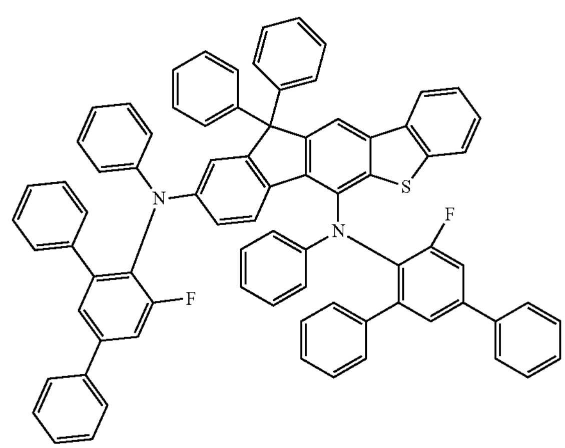

-continued
D4
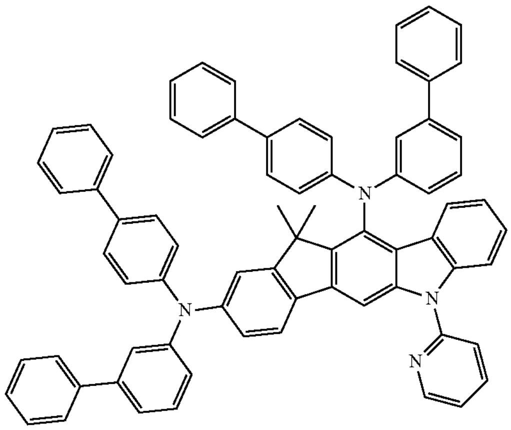
D5
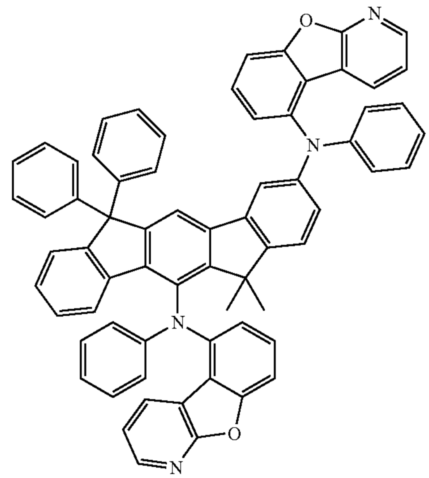
D6
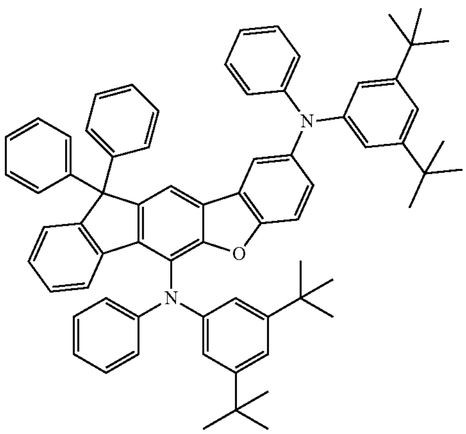
D7
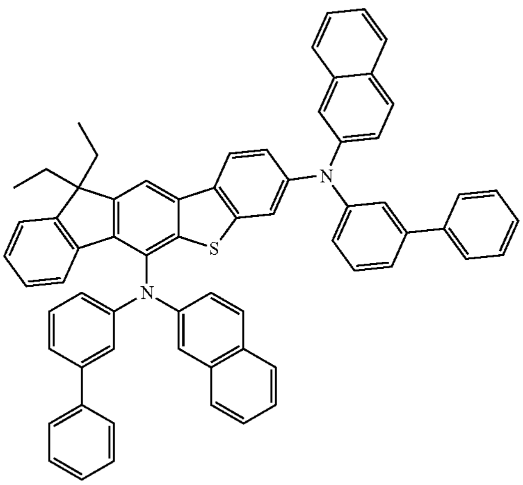
D8
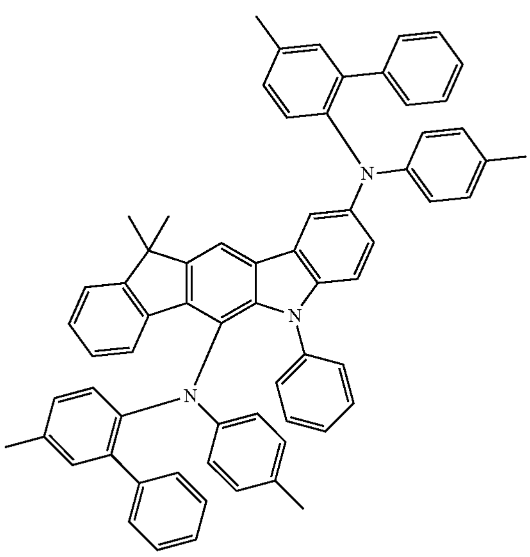
D9
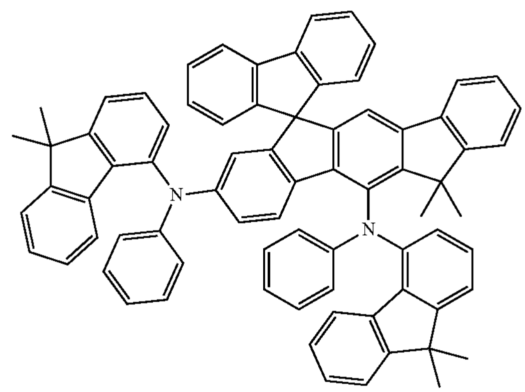

-continued
D10
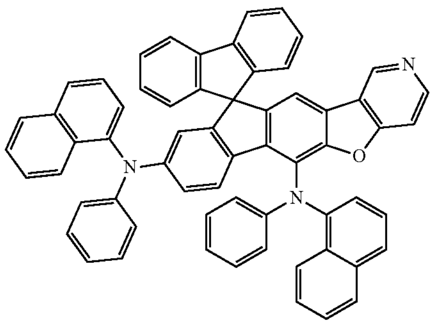
D11
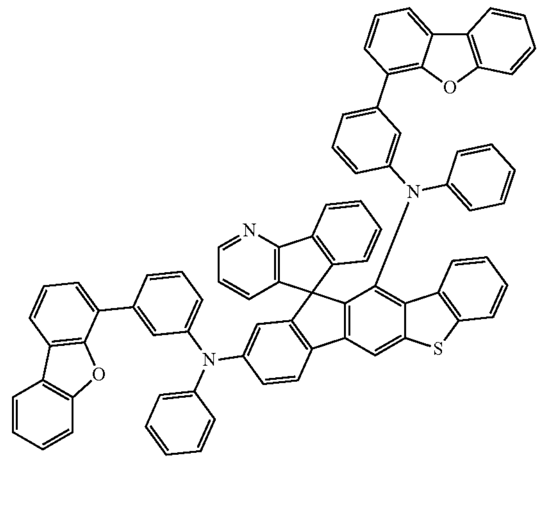
D12
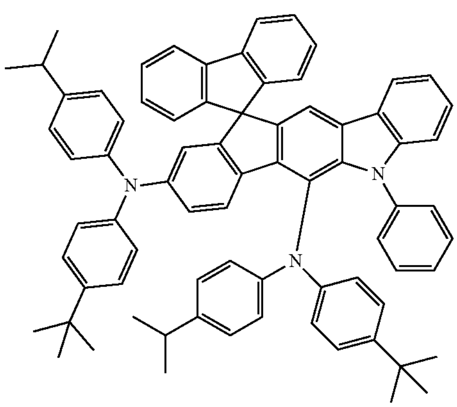
D13
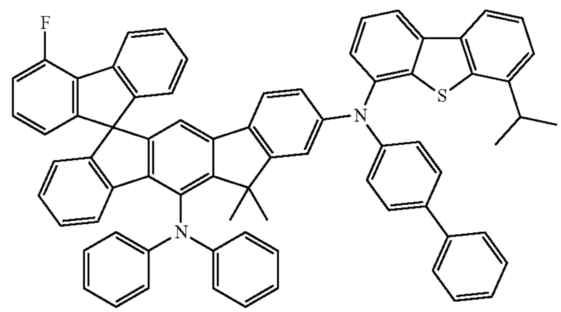
D14
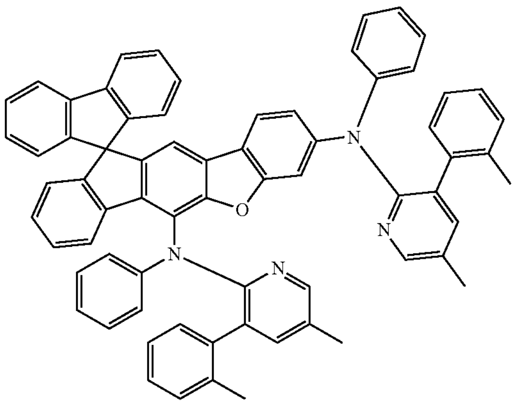
D15
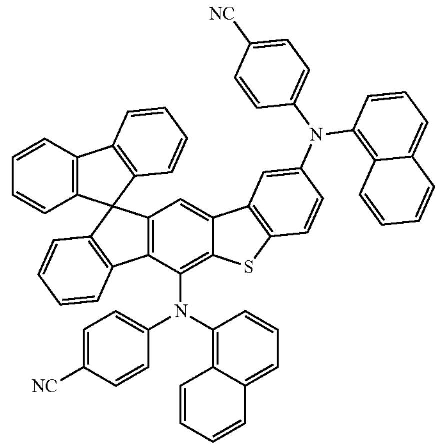

-continued
D16
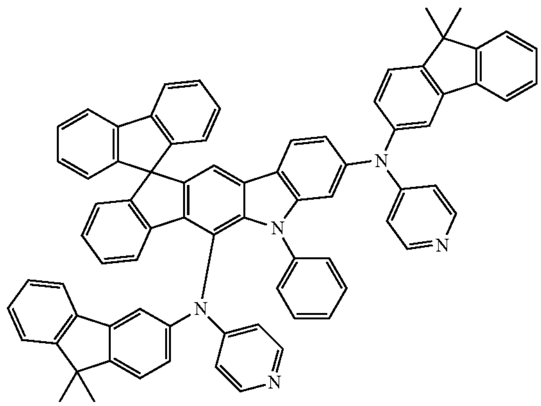
D17
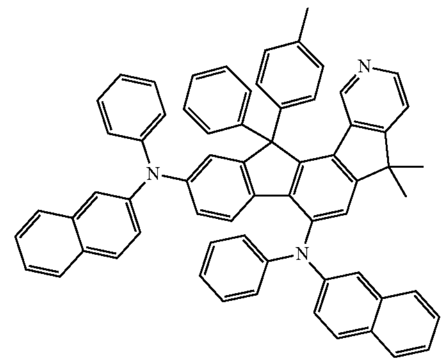
D18
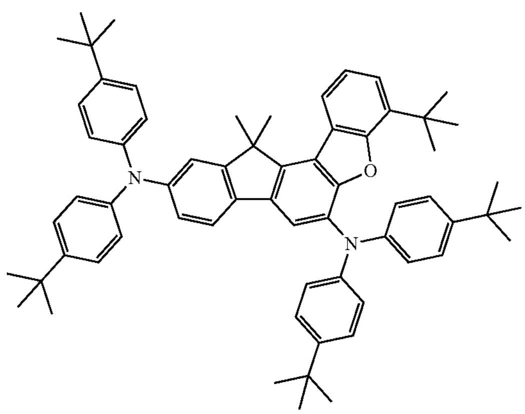
D19
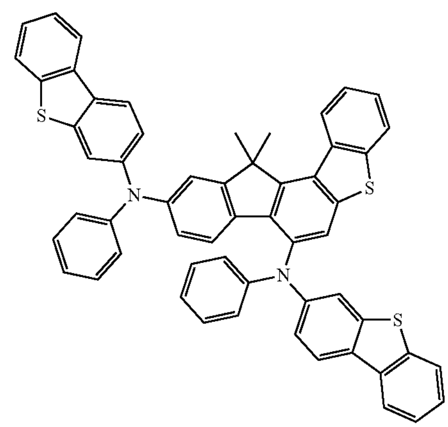
D20
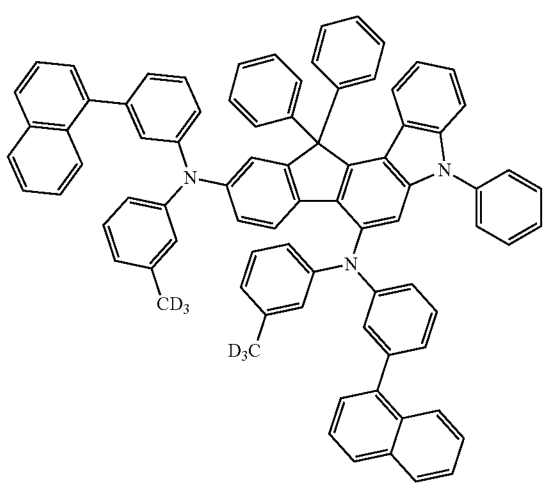
D21
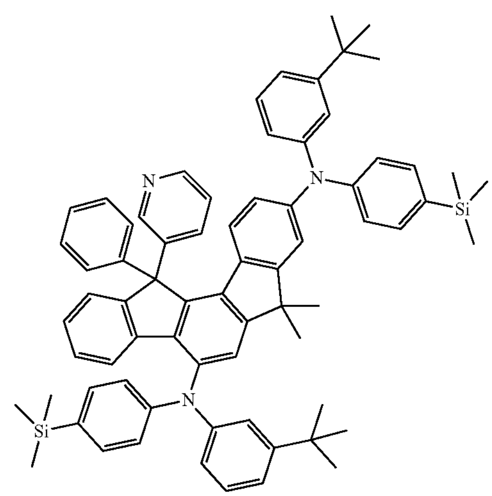

-continued
D22
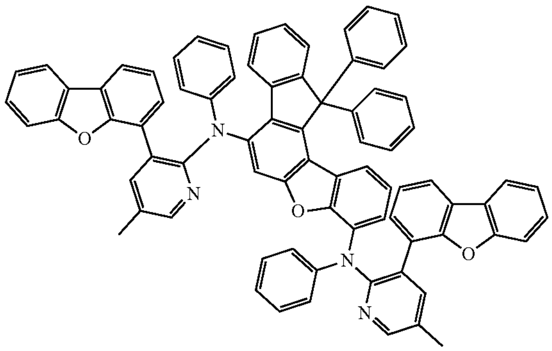
D23
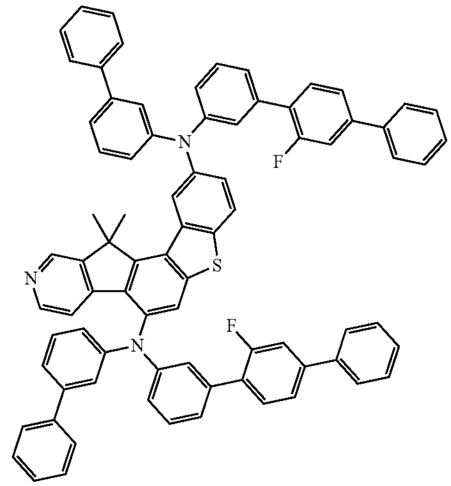
D24
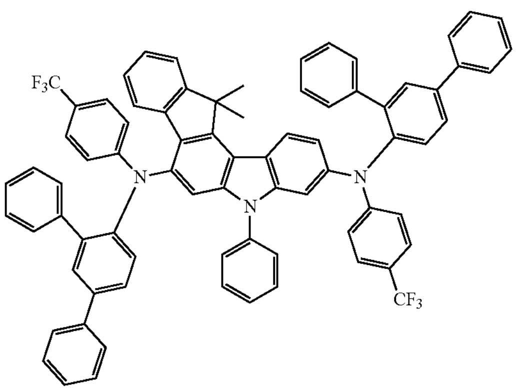
D25
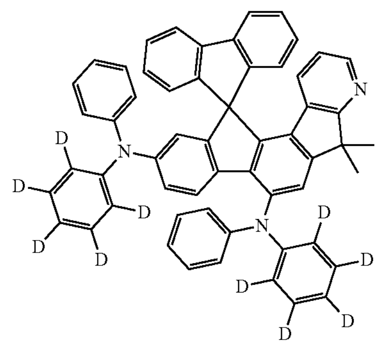
D26
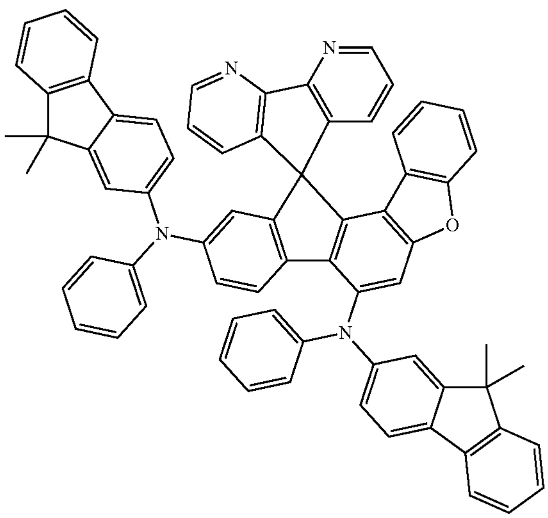

-continued
D27
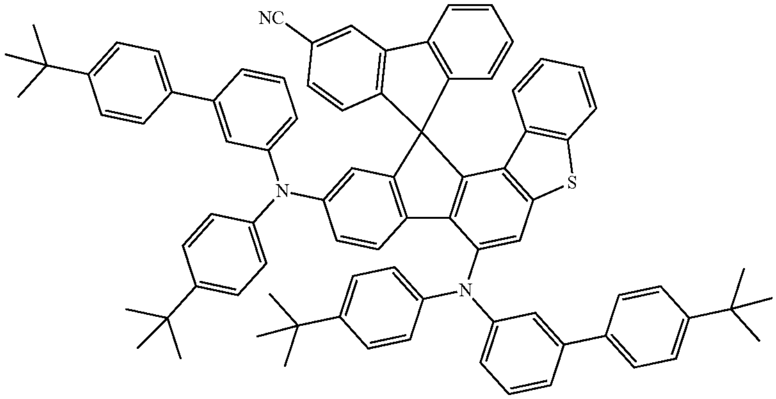
D28
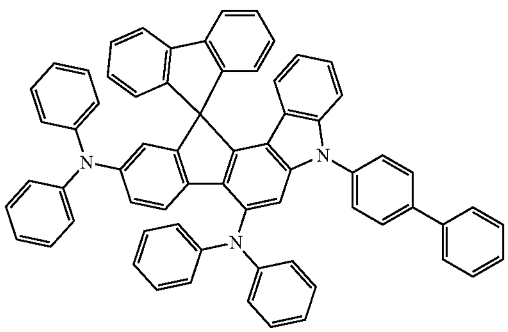
D29
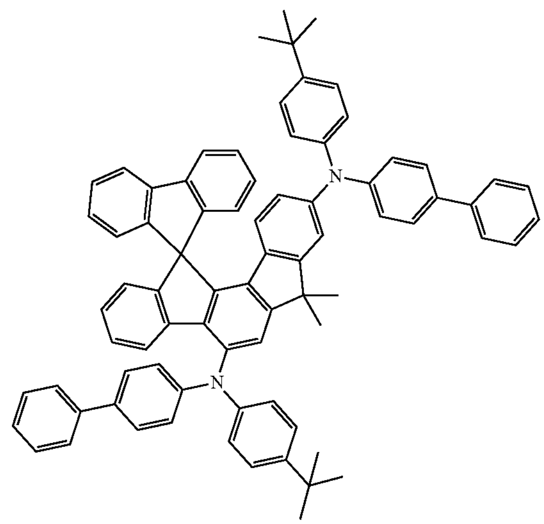
D30
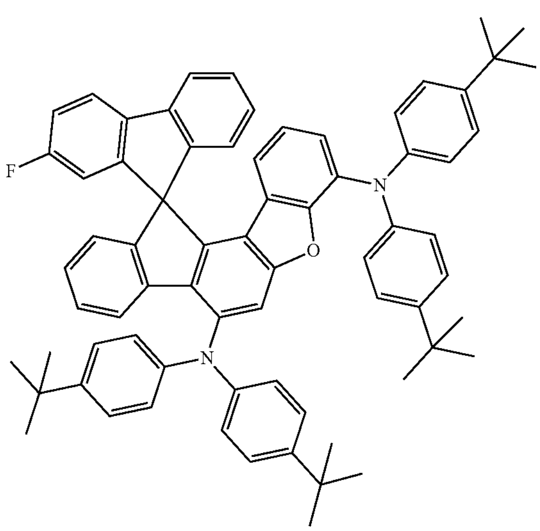
D31
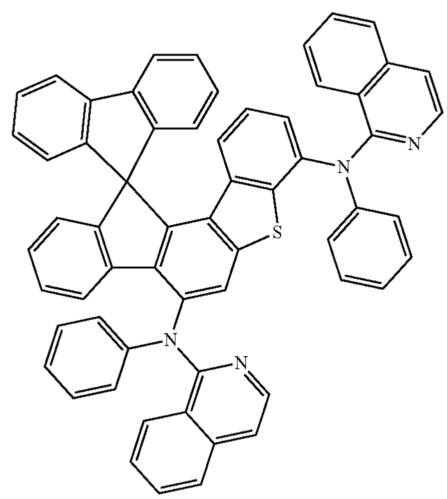

-continued
D32
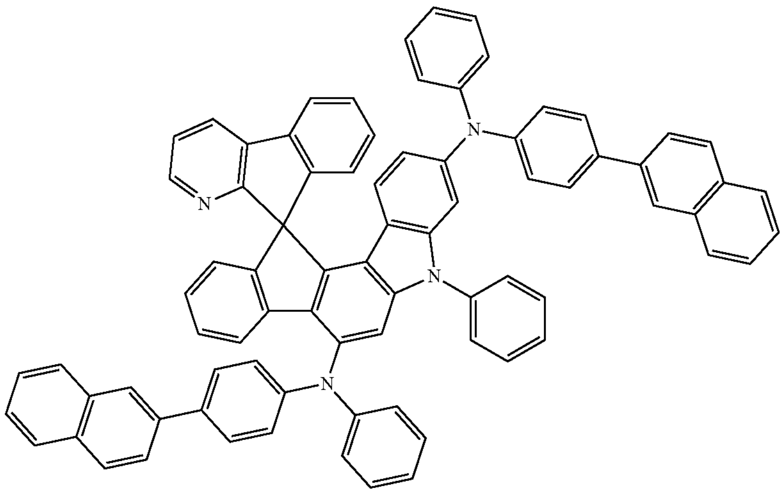
D33
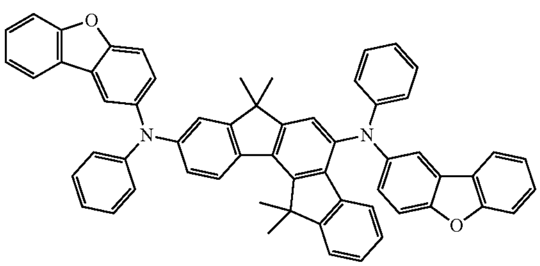
D34
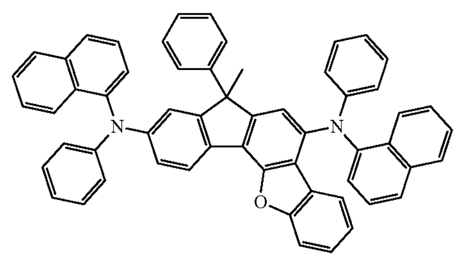
D35
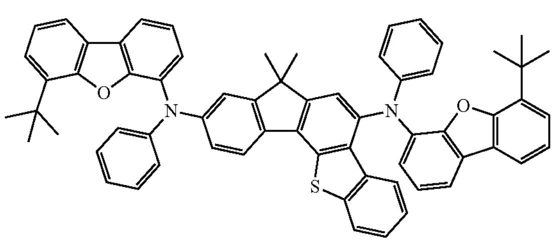
D36
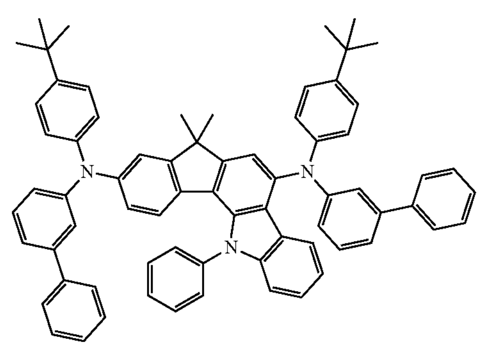
D37
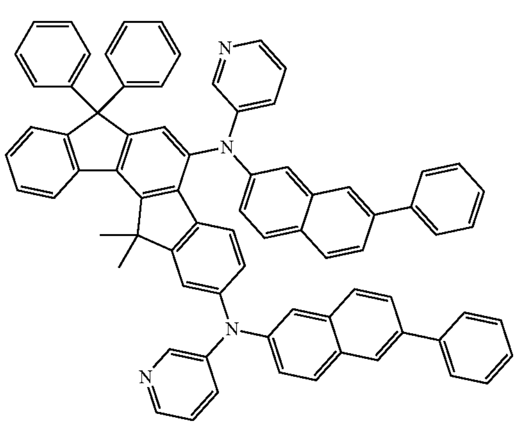
D38
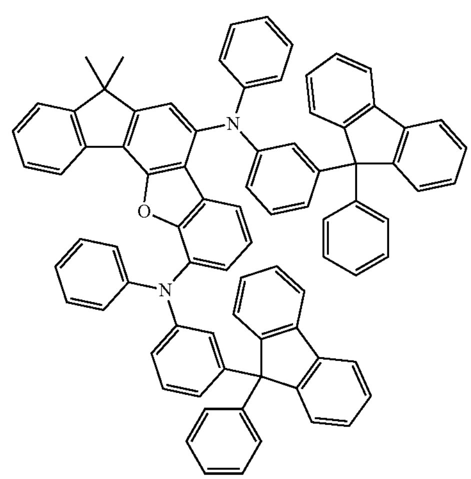

-continued
D39
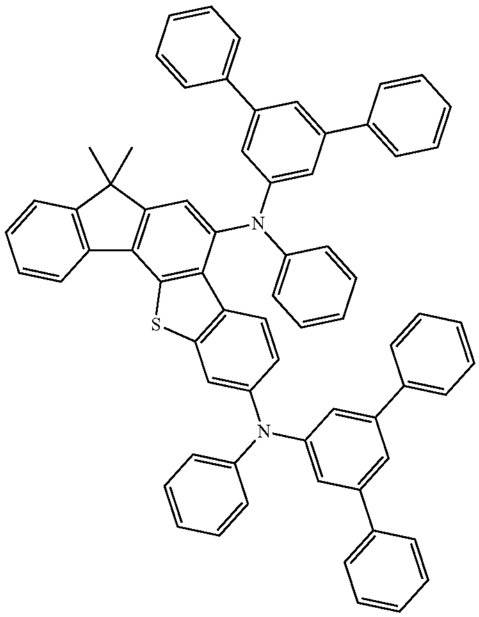
D40
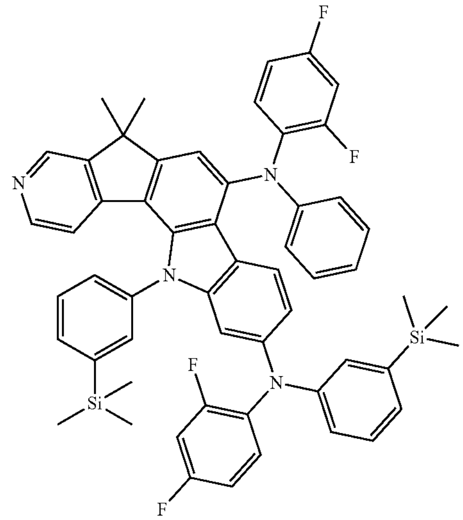
D41
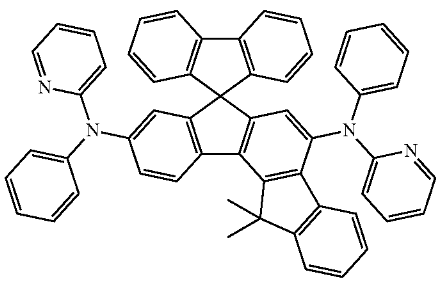
D42
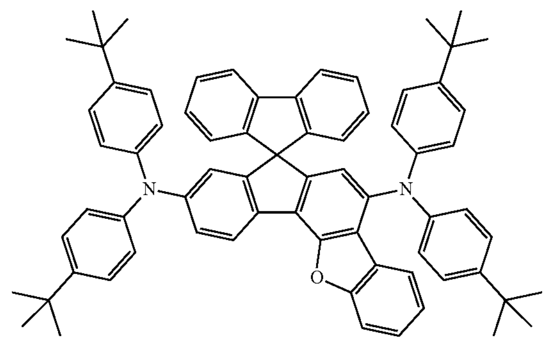
D43
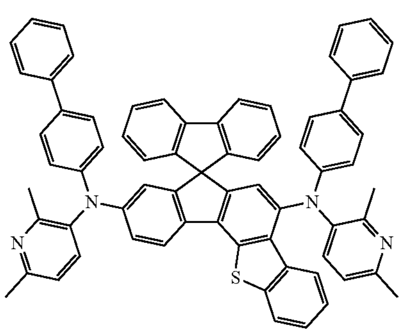
D44
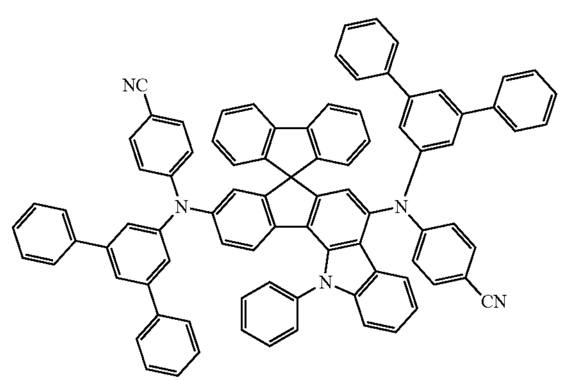

-continued
D45
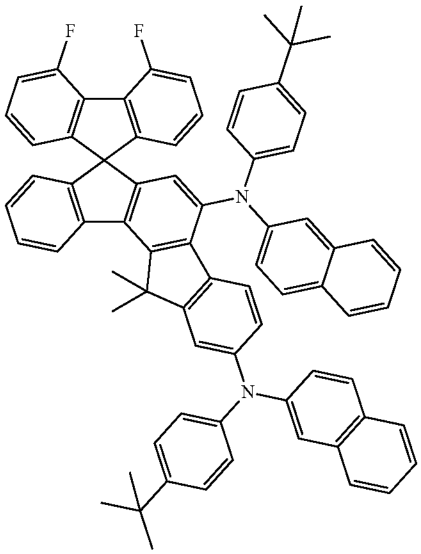
D46
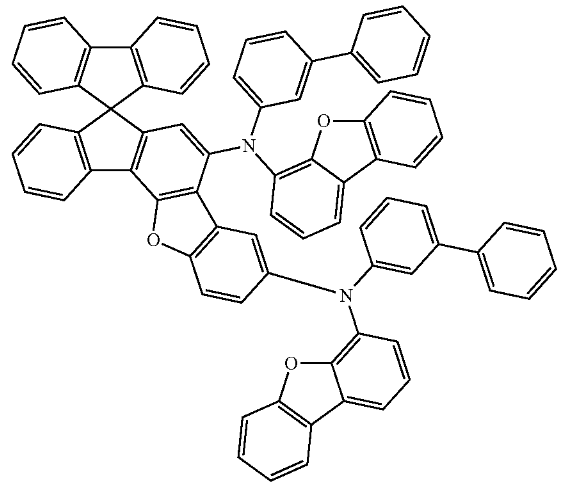
D47
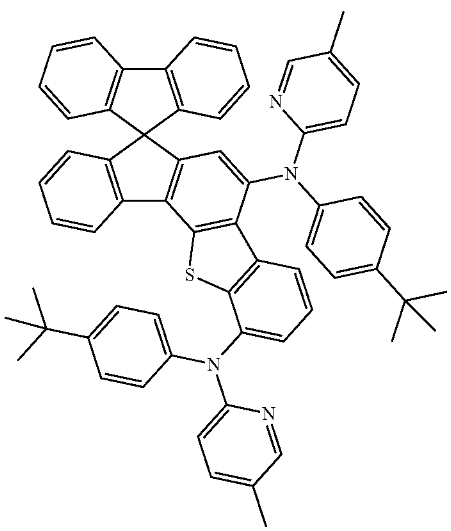
D48
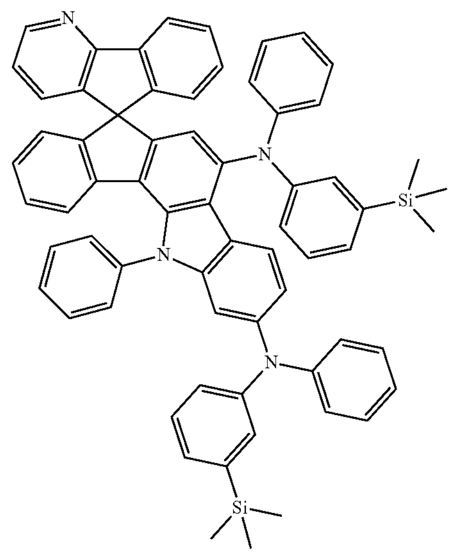
D49
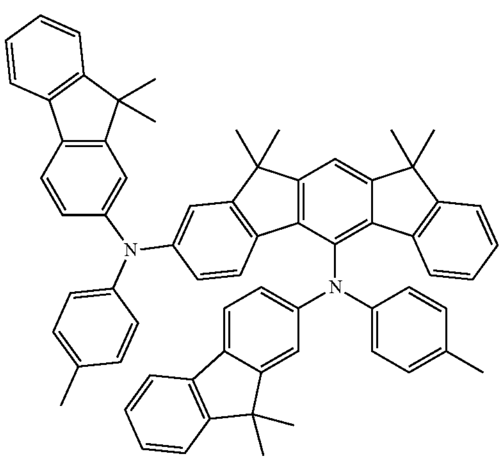
D50
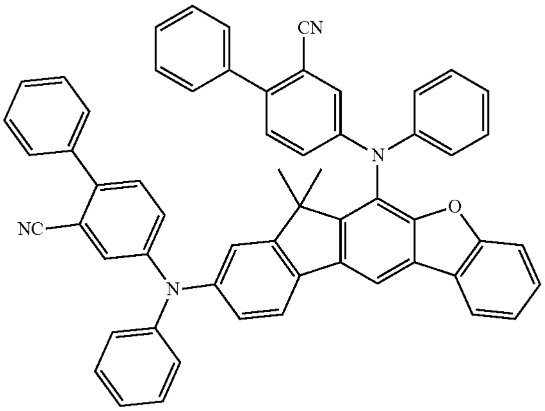

-continued
D51
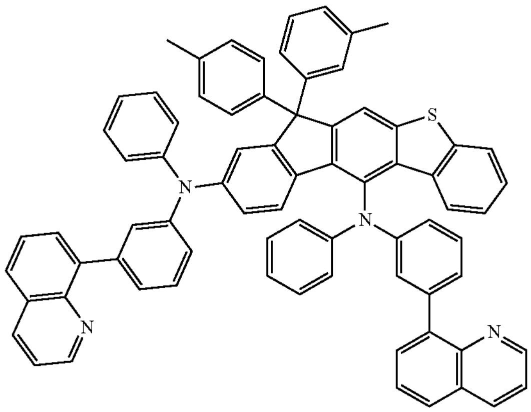
D52
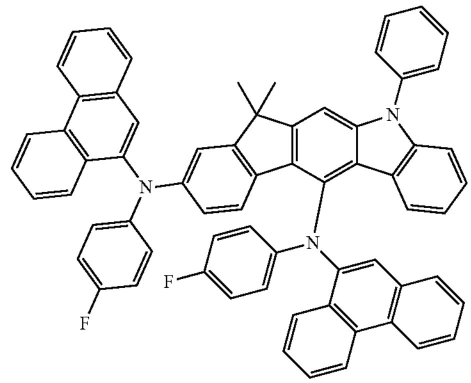
D53
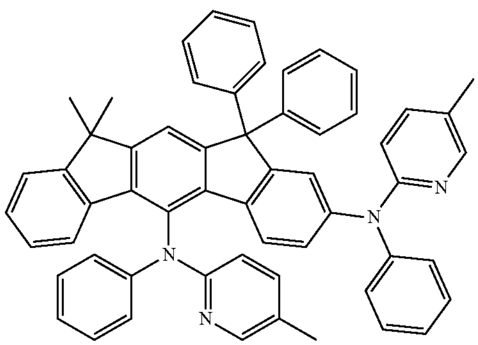
D54
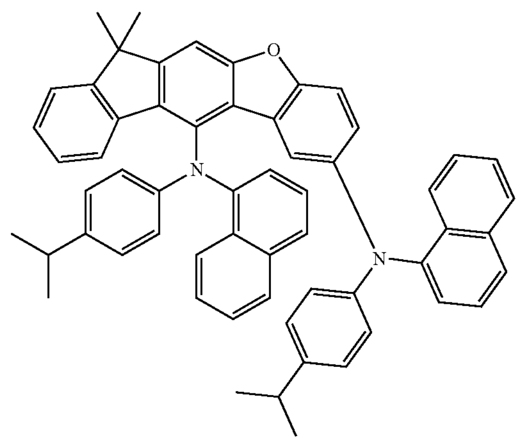
D55
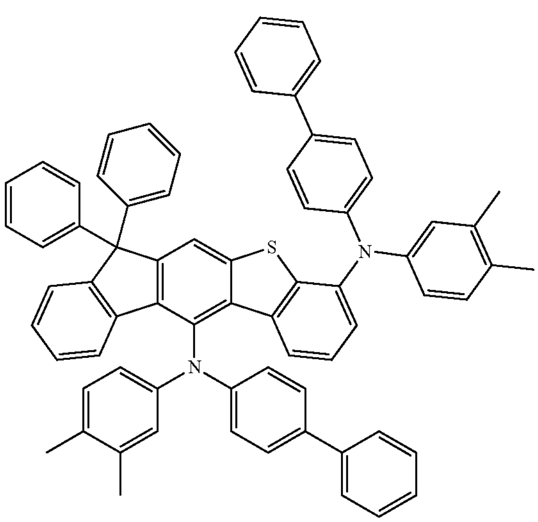
D56
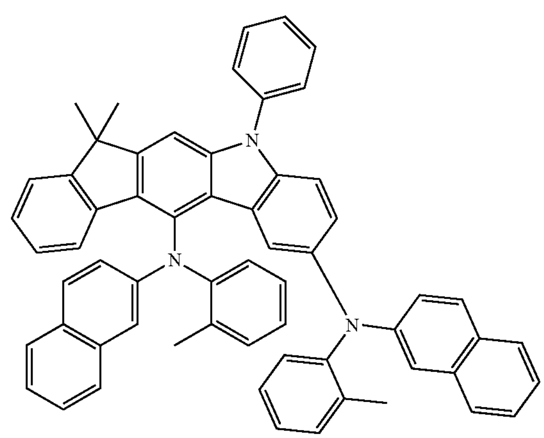

-continued
D57
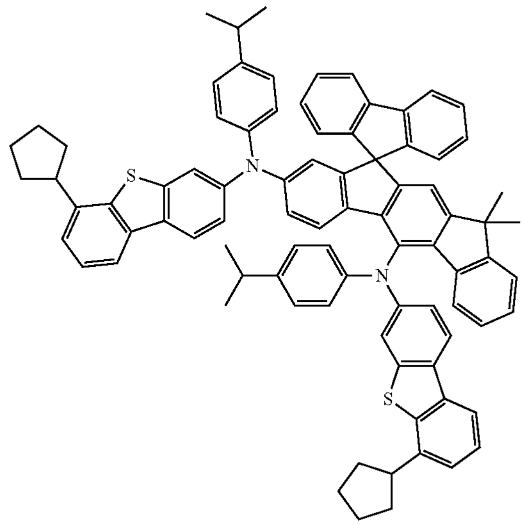
D58
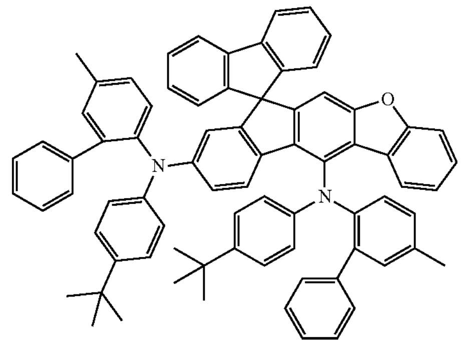
D59
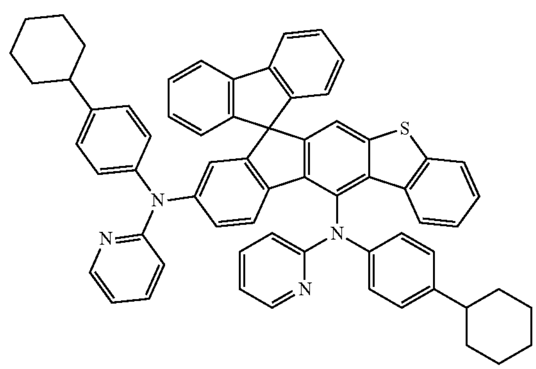
D60
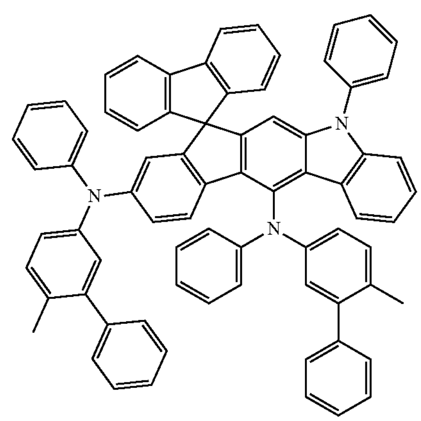
D61
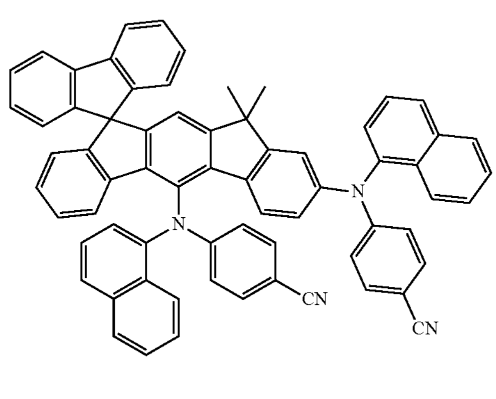
D62
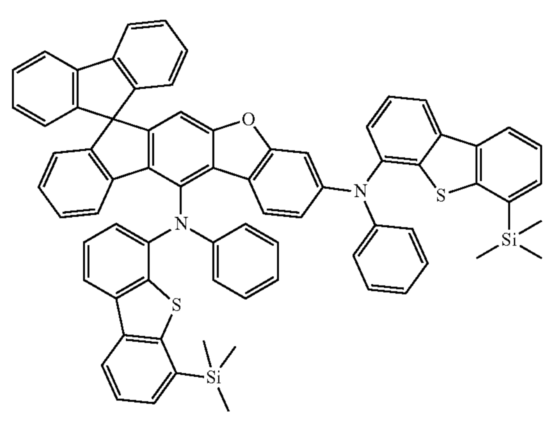

-continued
D63
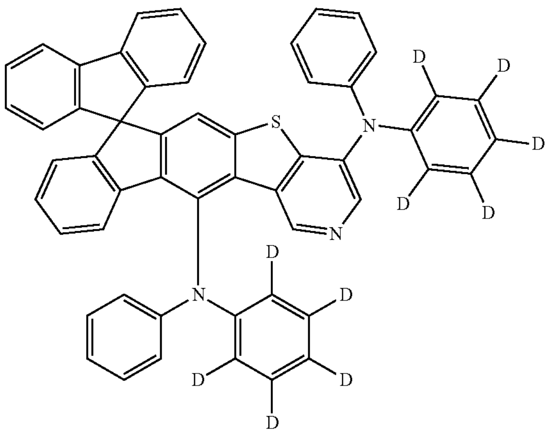
D64
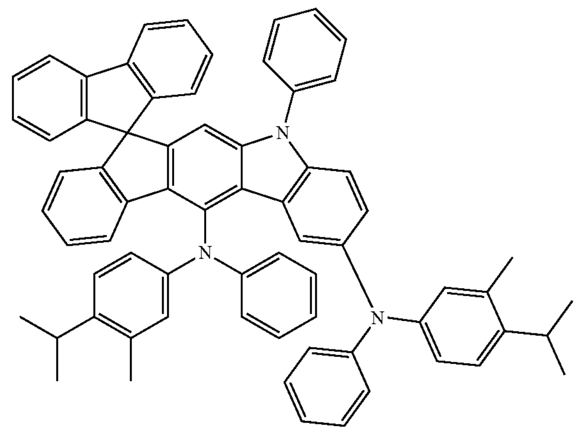
D65
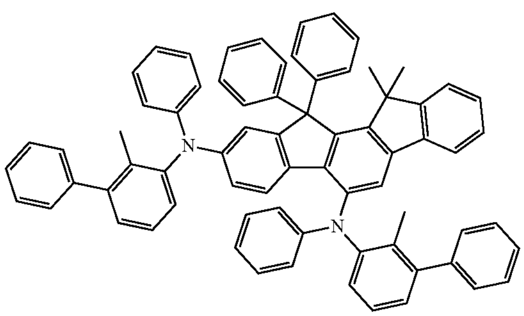
D66
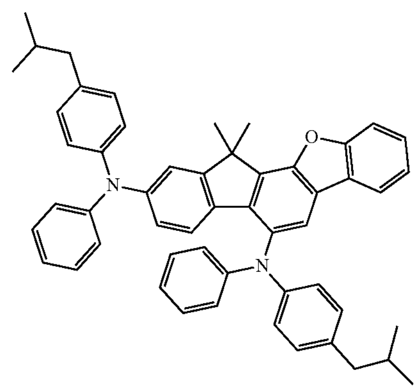
D67
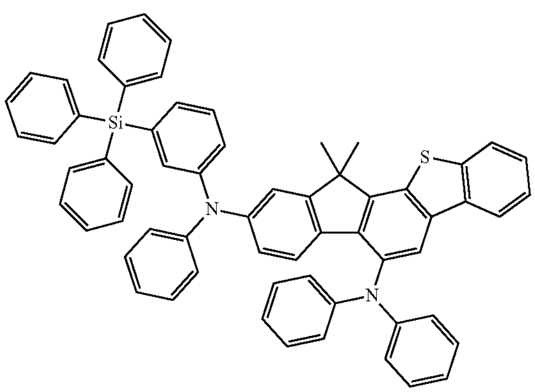
D68
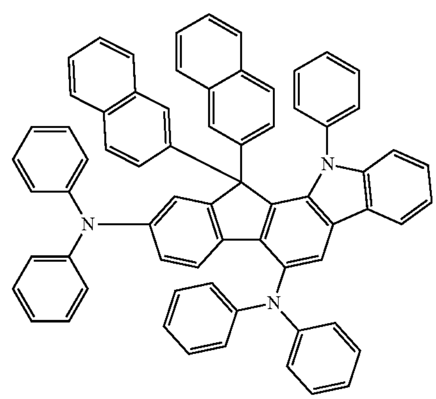

-continued
D69
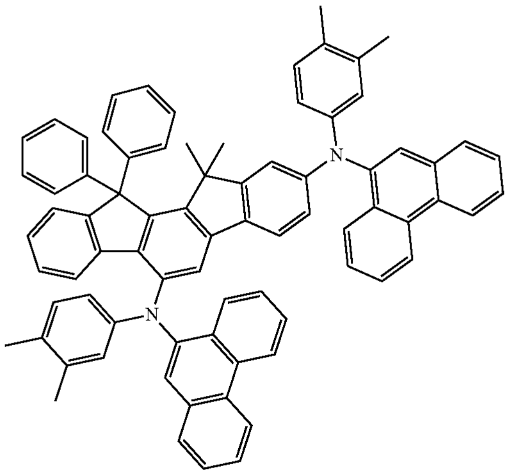
D70
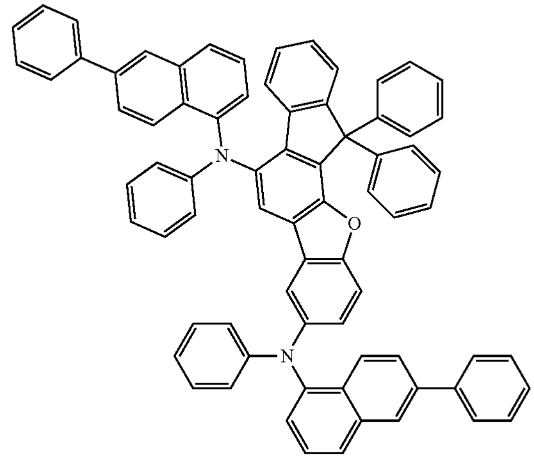
D71
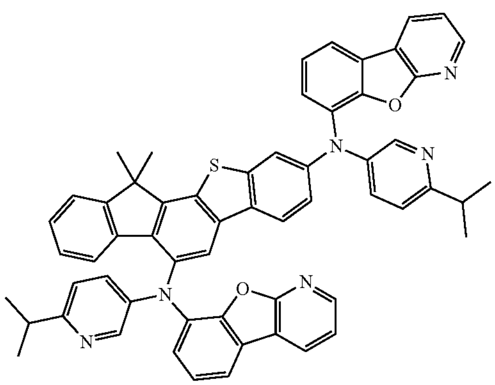
D72
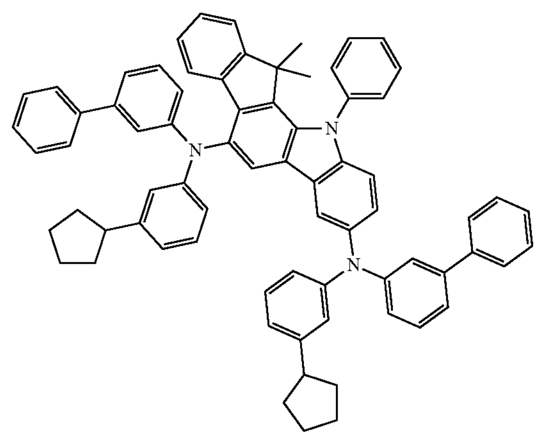
D73
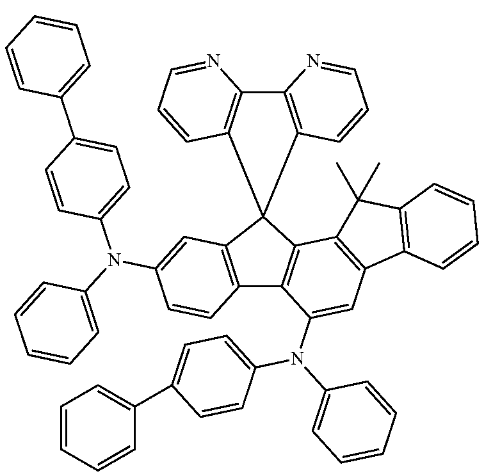
D74
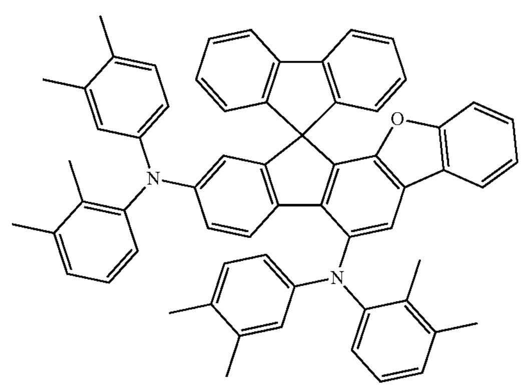

-continued
D75
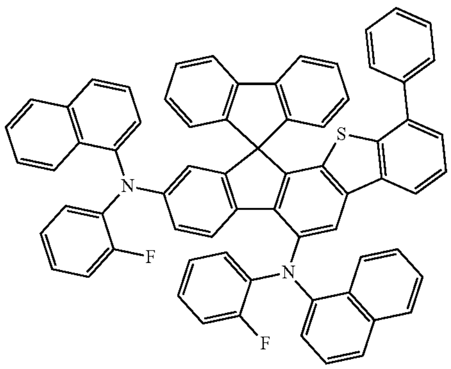
D76
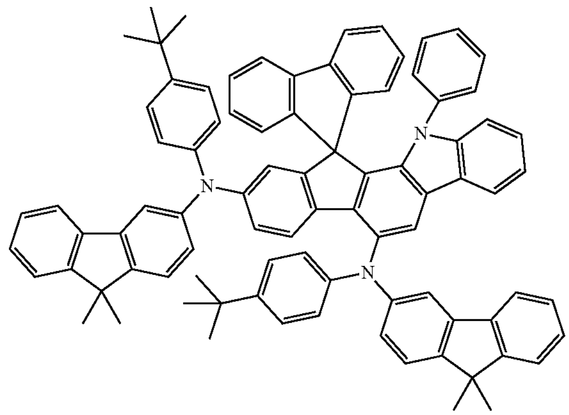
D77
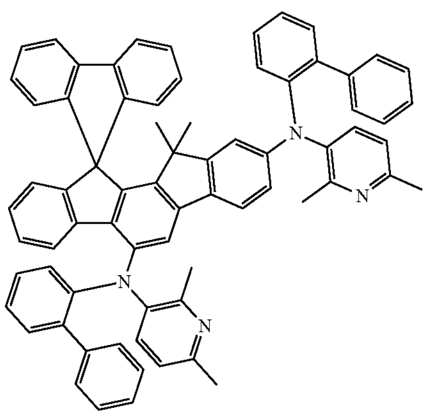
D78
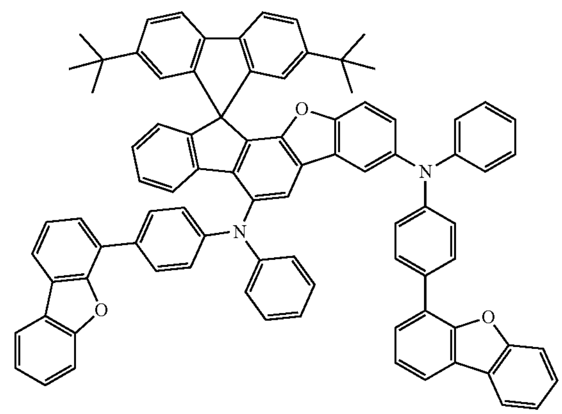
D79
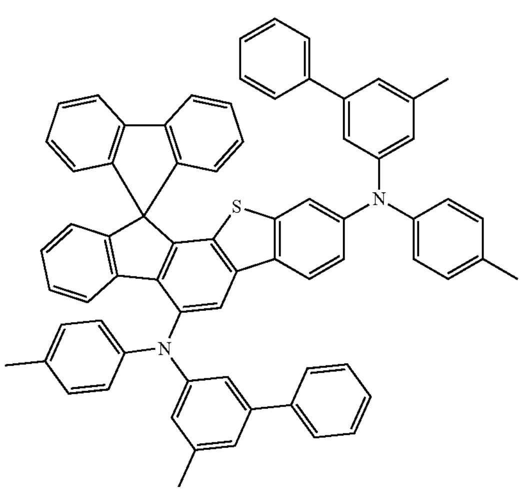
D80
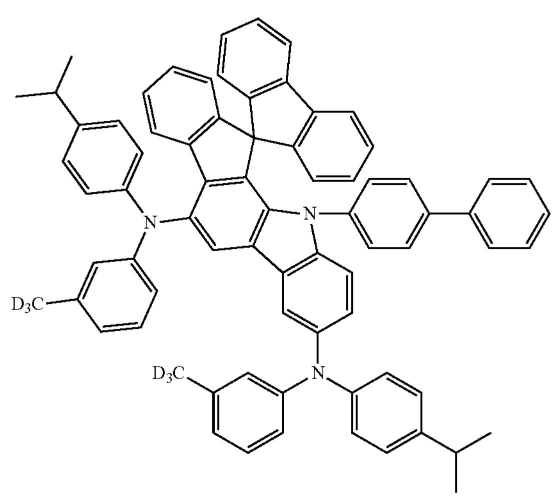

-continued
D81
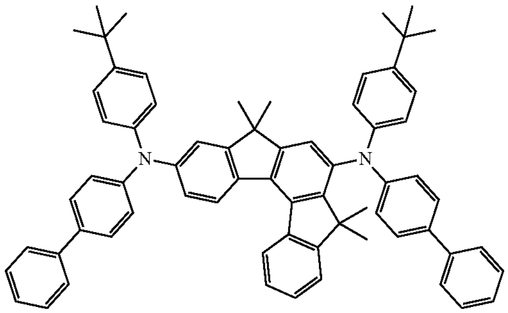
D82
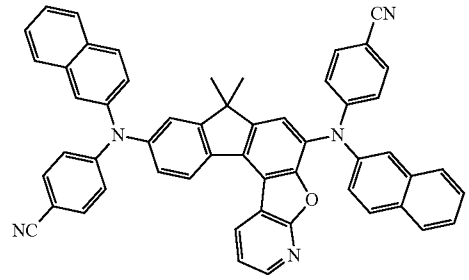
D83
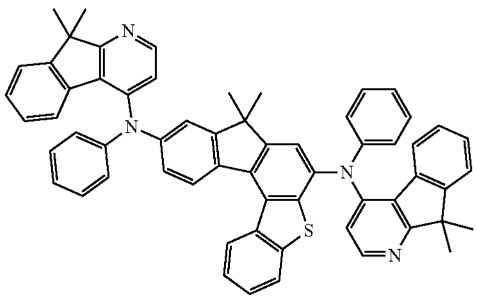
D84
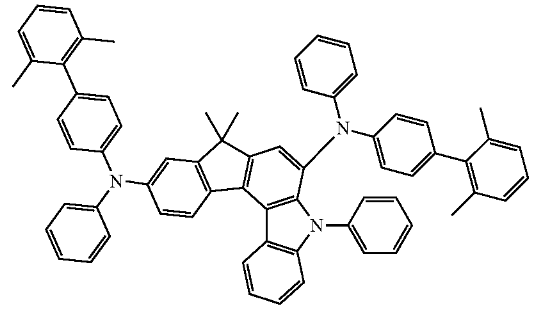
D85
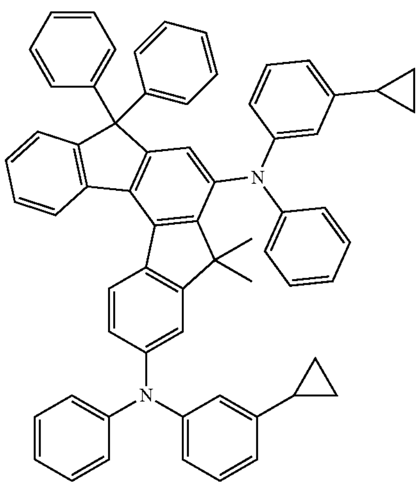
D86
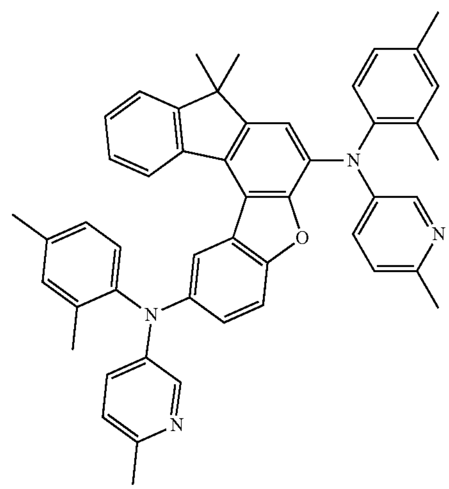
D87
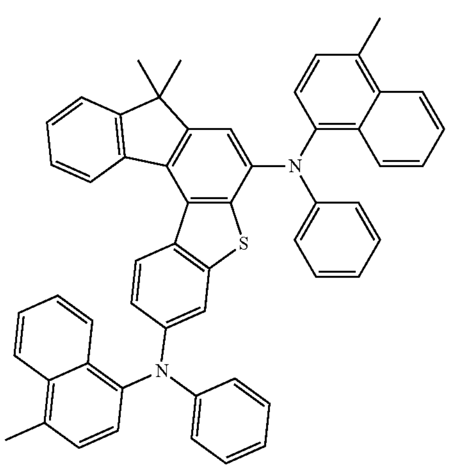
D88
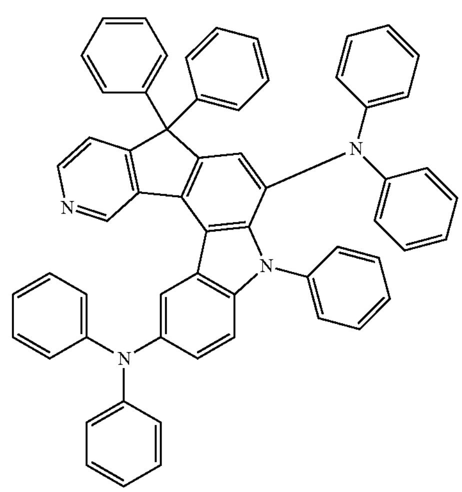

-continued
D89
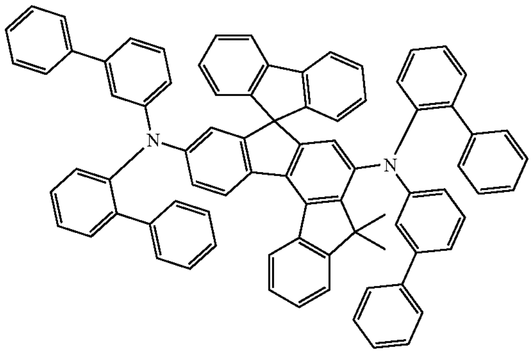
D90
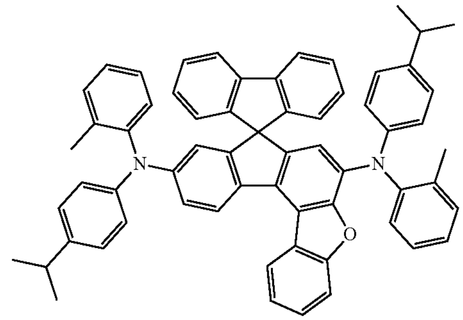
D91
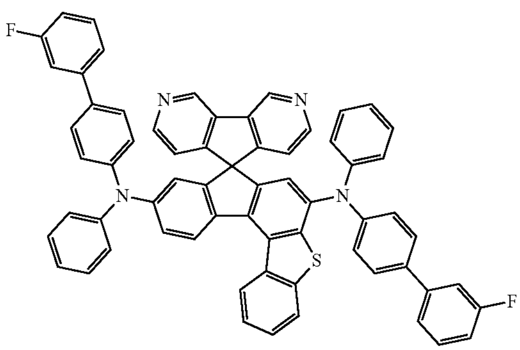
D92
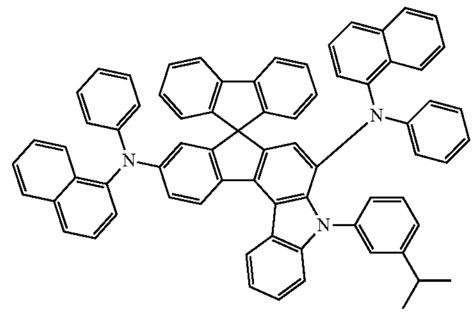
D93
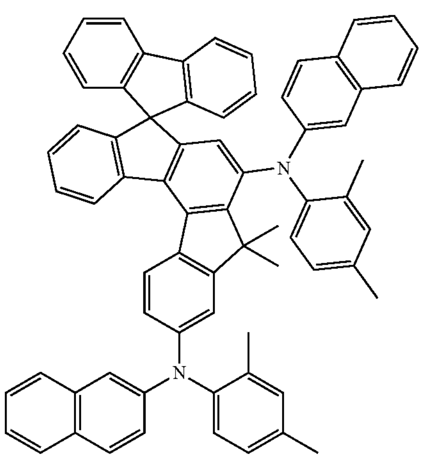
D94
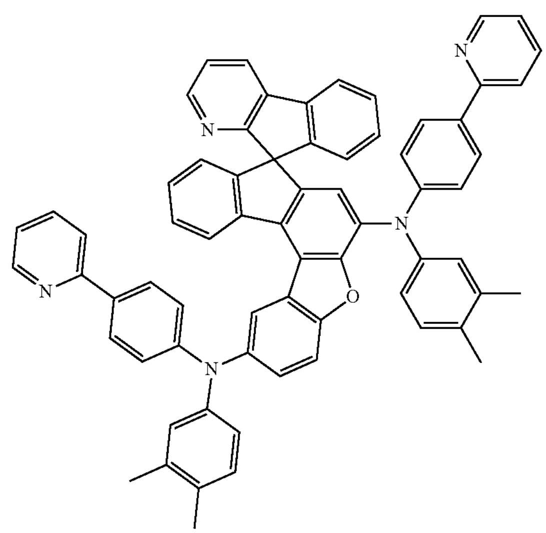

-continued
D95
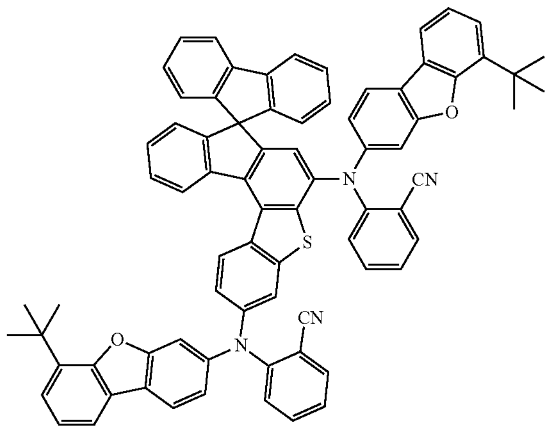
D96
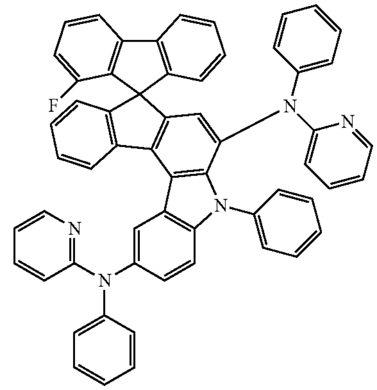
D97
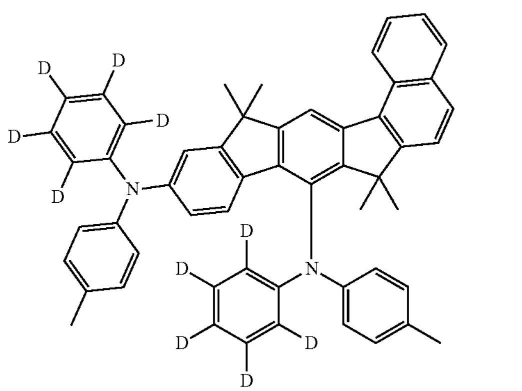
D98
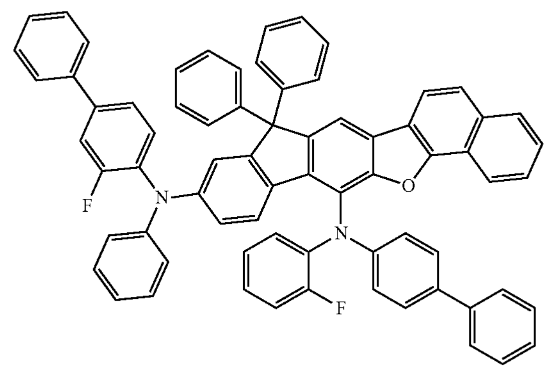
D99
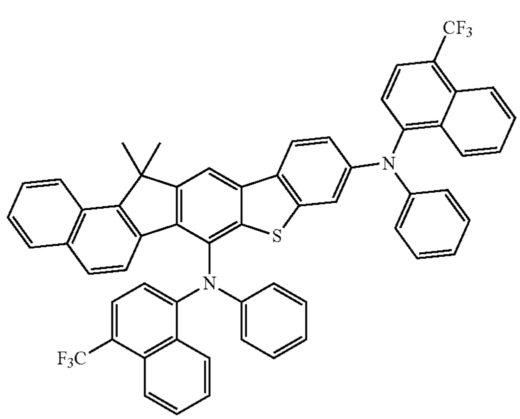
D100
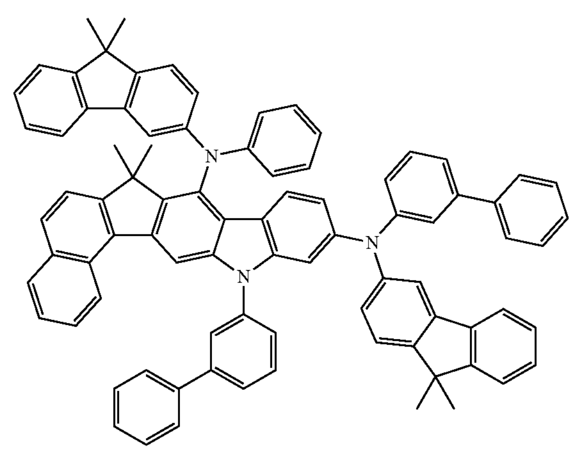

-continued
D101
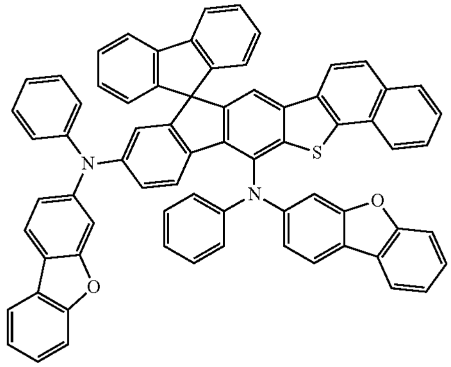
D102
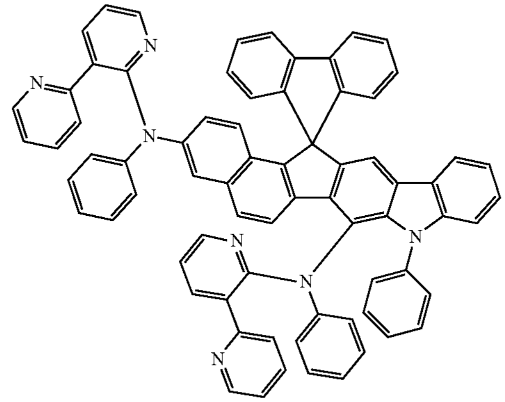
D103
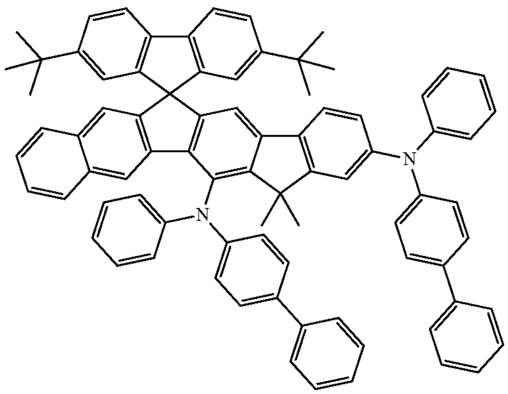
D104
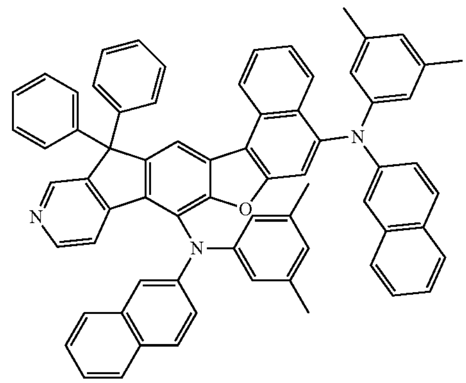
D105
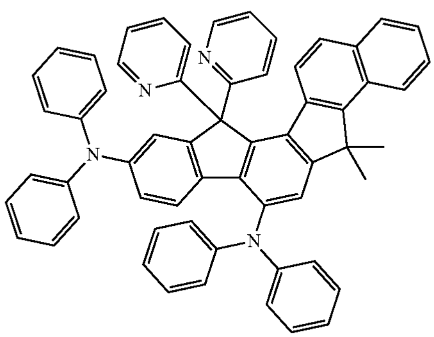
D106
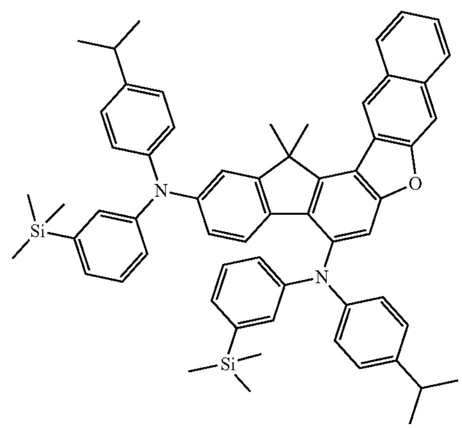
D107
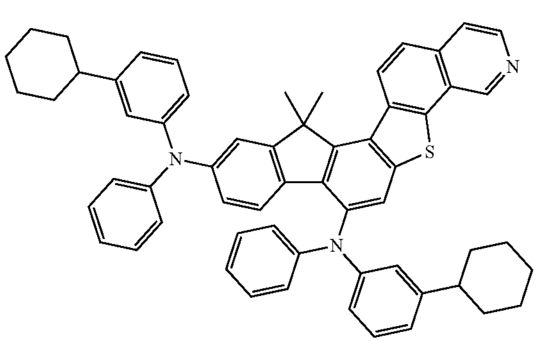
D108
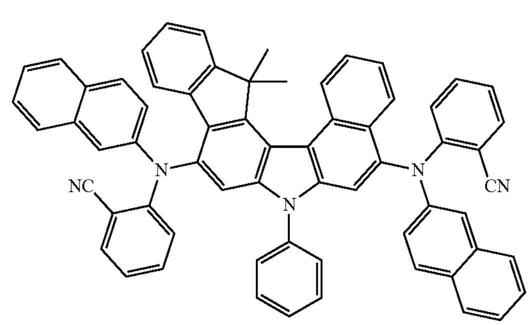

-continued
D109
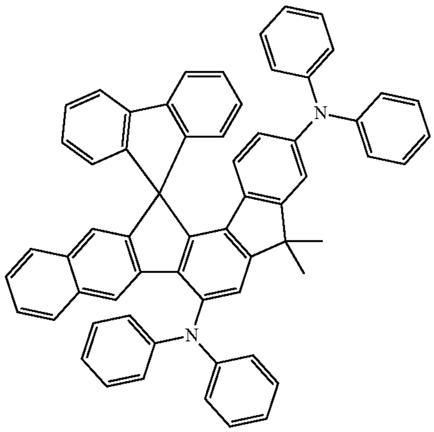
D110
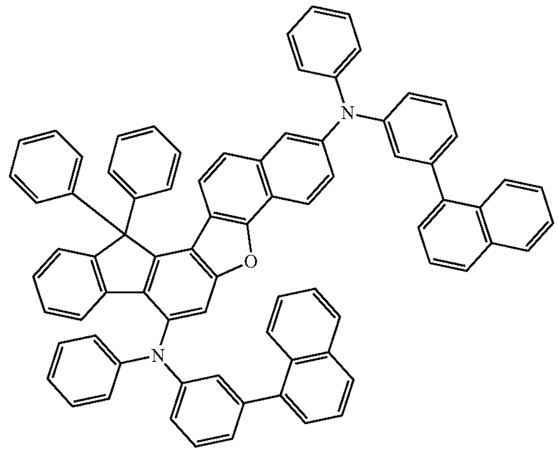
D111
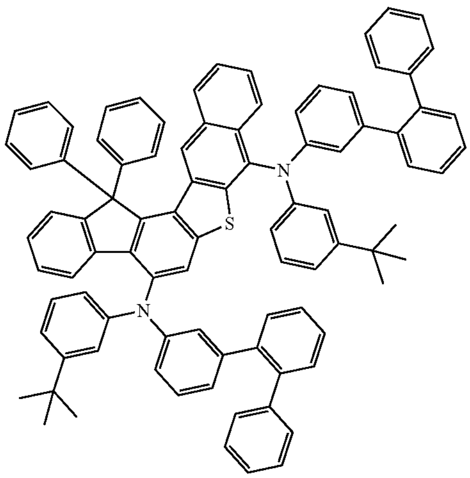
D112
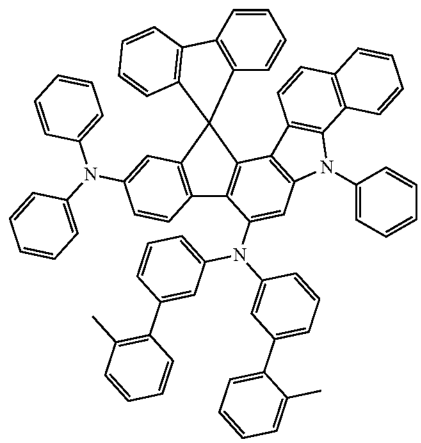
D113
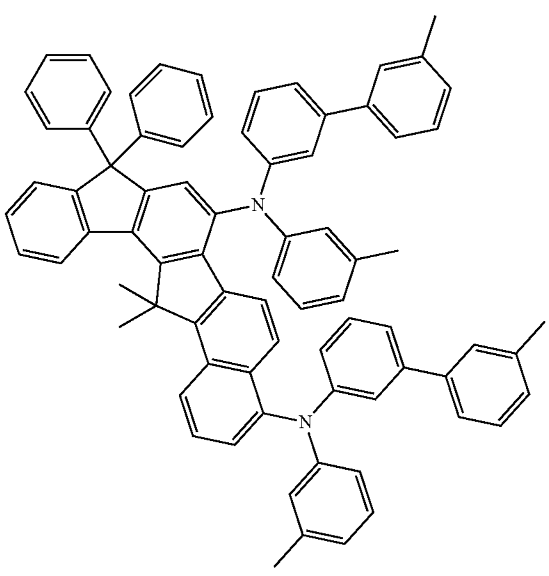
D114
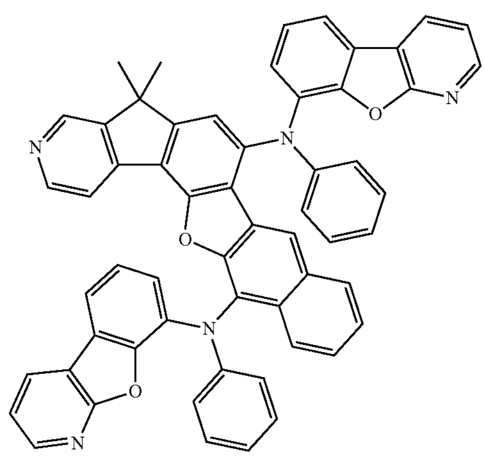

-continued
D115
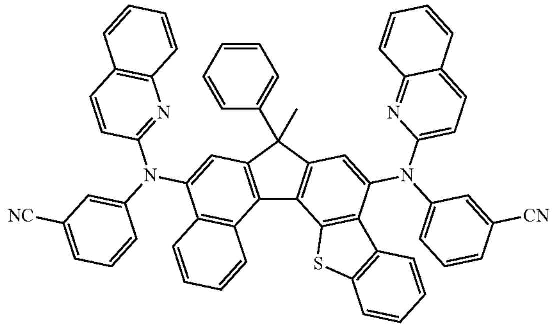
D116
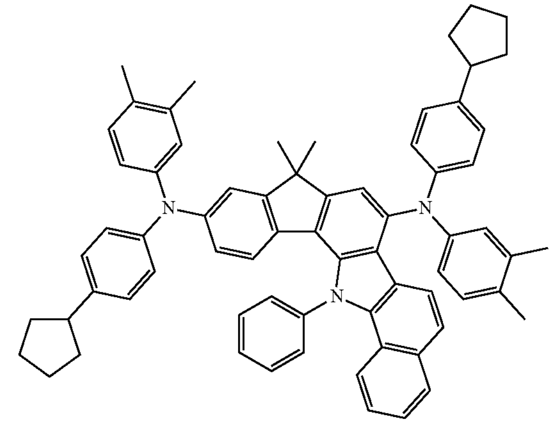
D117
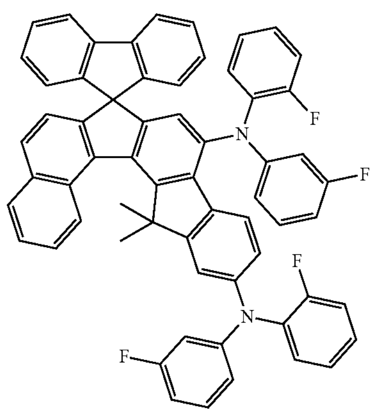
D118
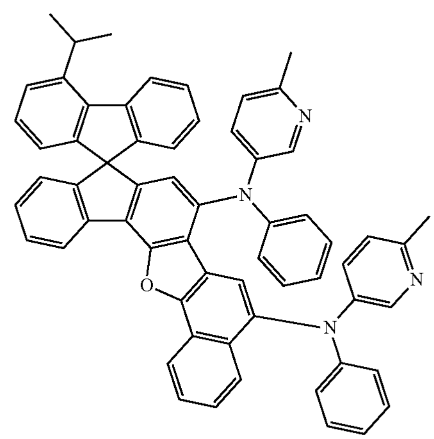
D119
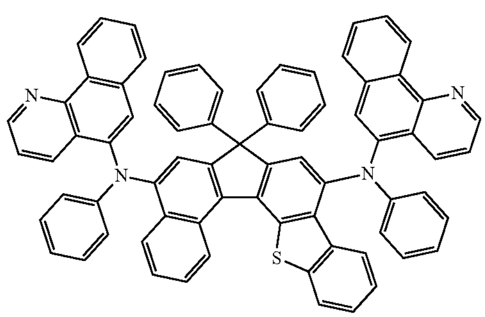
D120
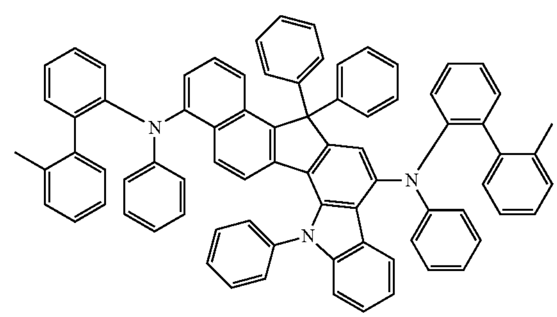
D121
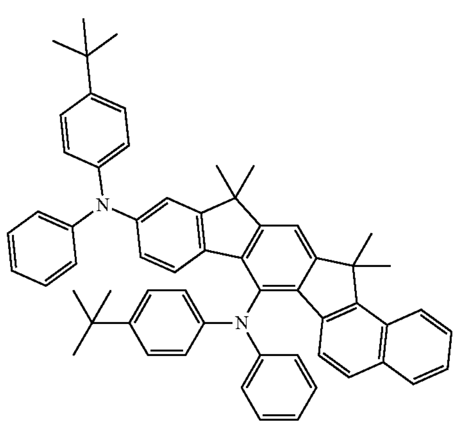
D122
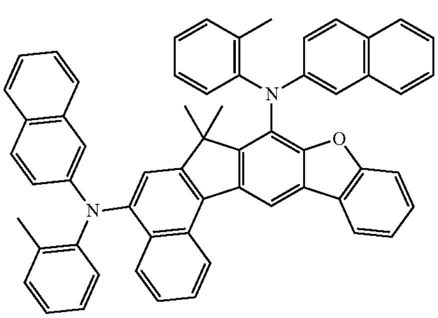

-continued
D123
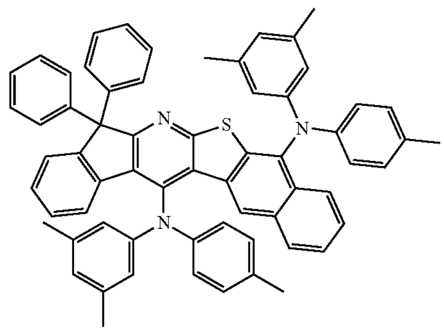
D124
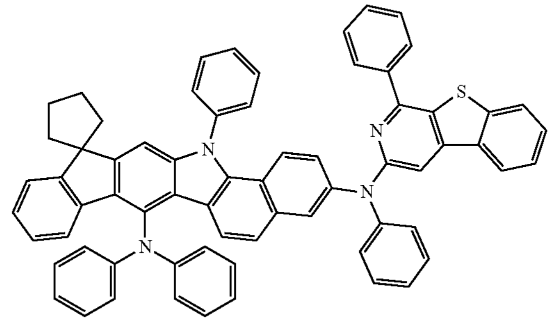
D125
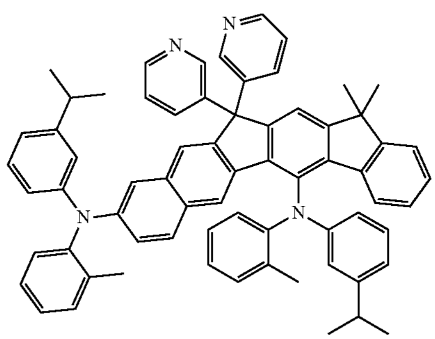
D126
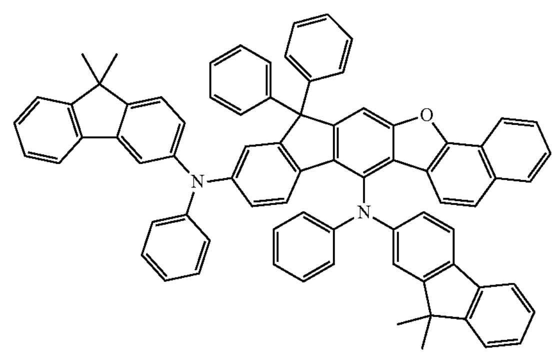
D127
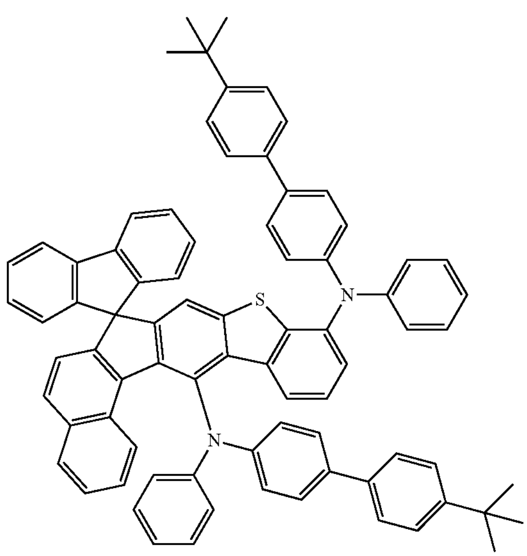
D128
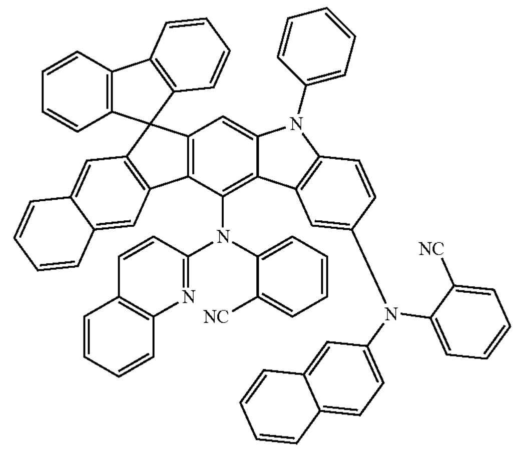

-continued
D129
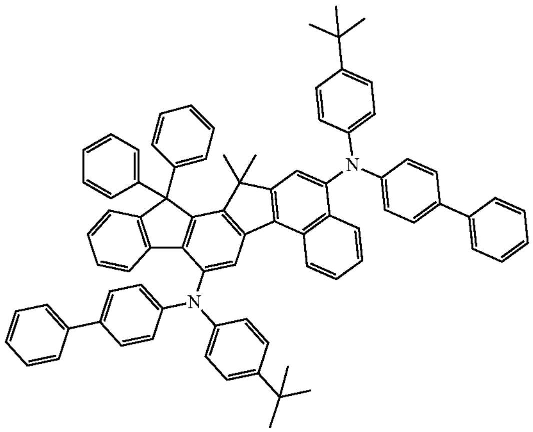
D130
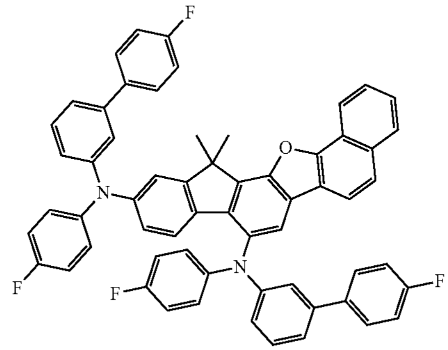
D131
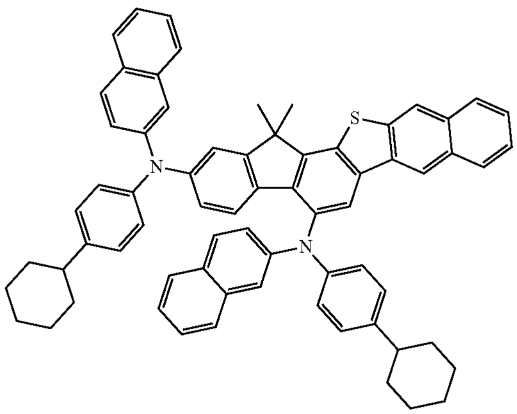
D132
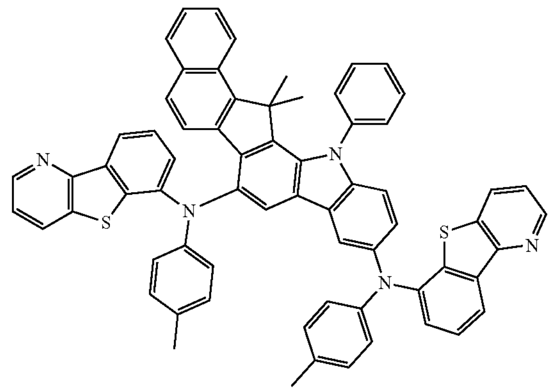
D133
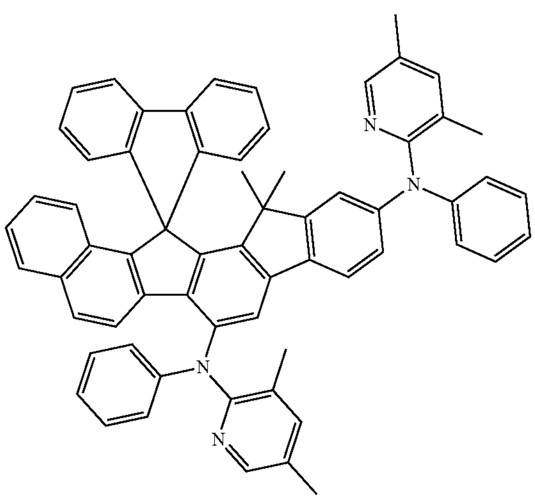
D134
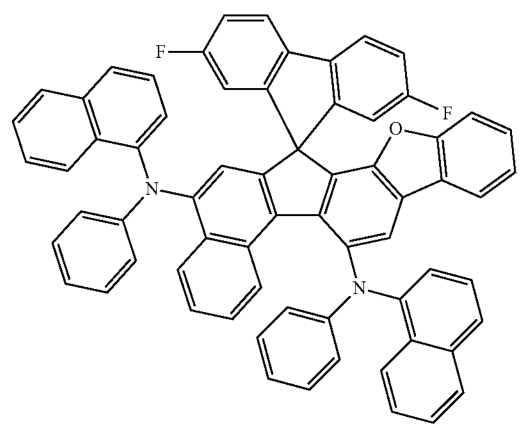

-continued
D135
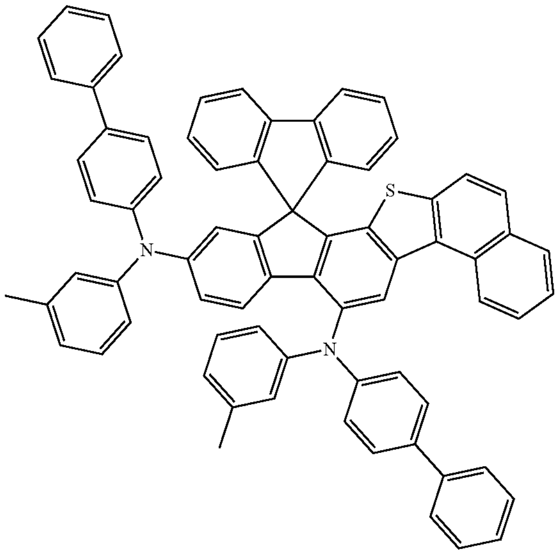
D136
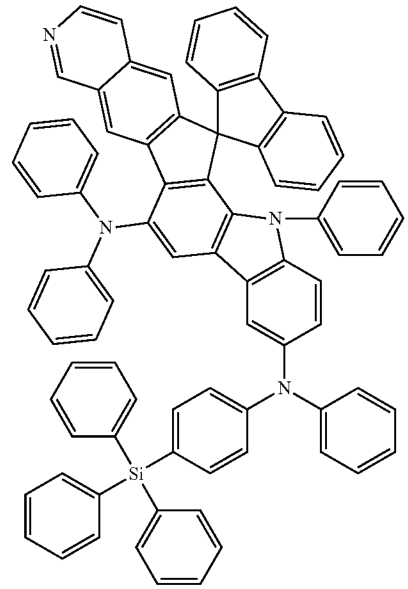
D137
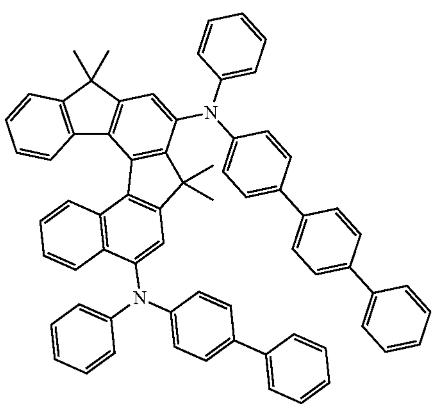
D138
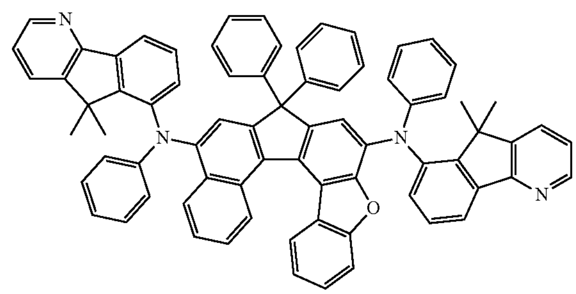
D139
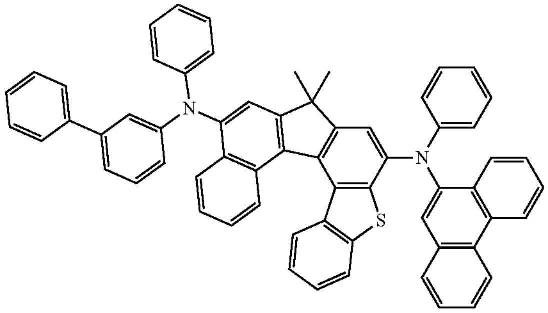
D140
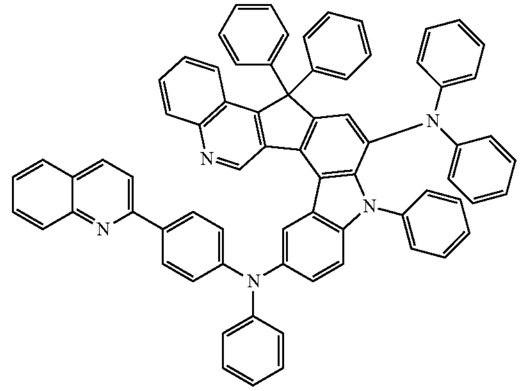

-continued
D141
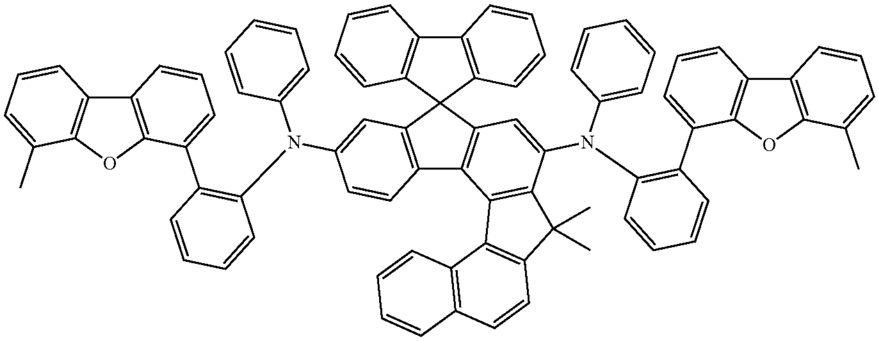
D142
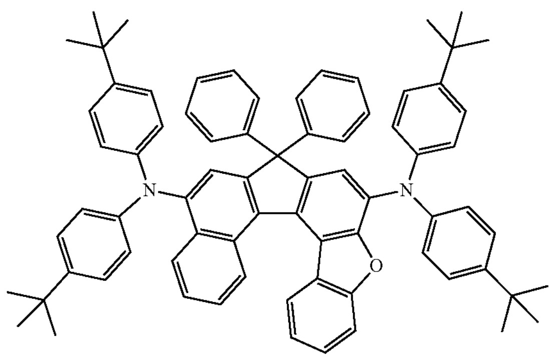
D143
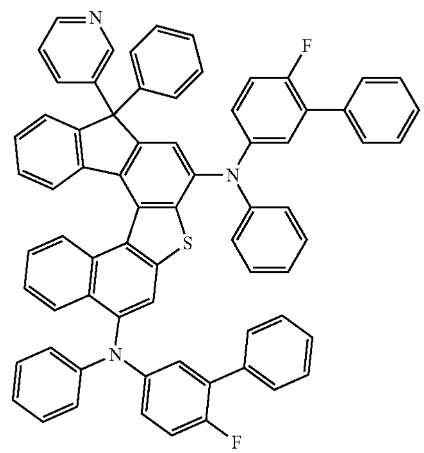
D144
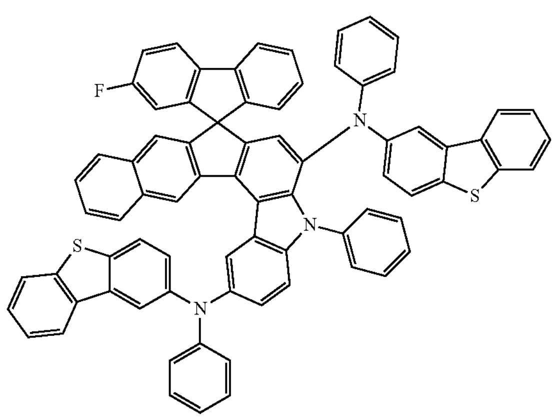
D145
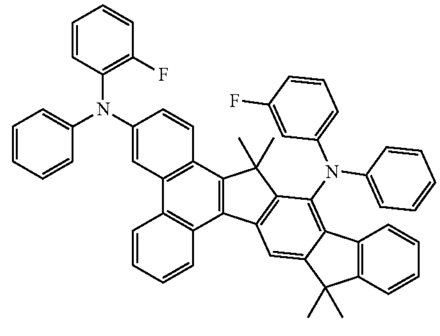
D146
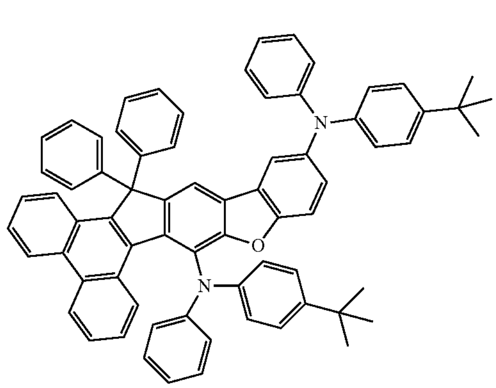
D147
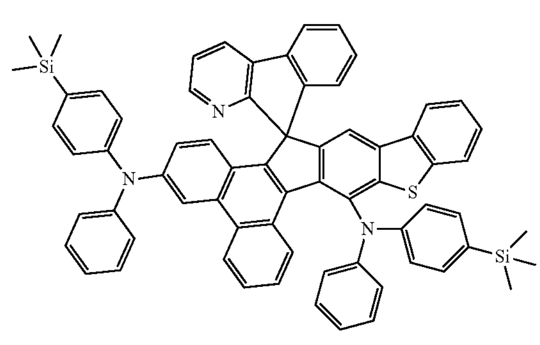

-continued
D148
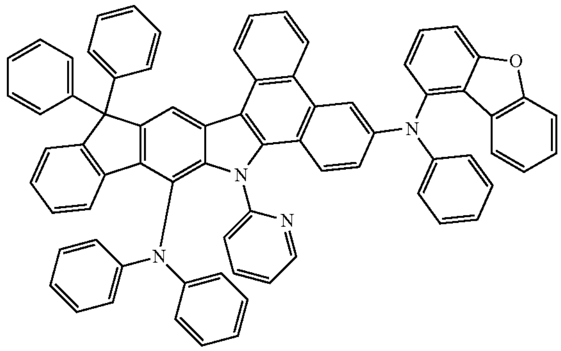
D149
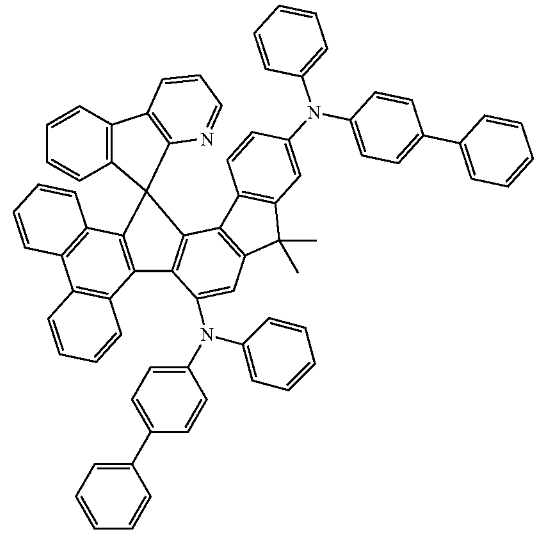
D150
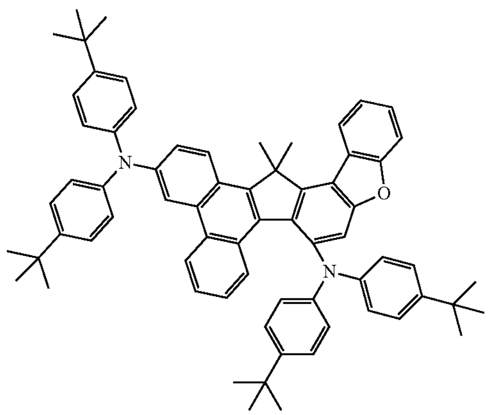
D151
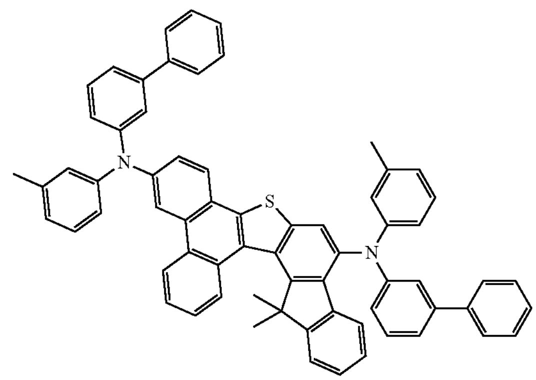
D152
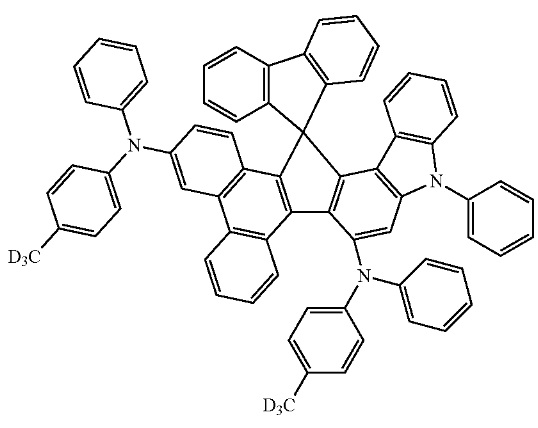
D153
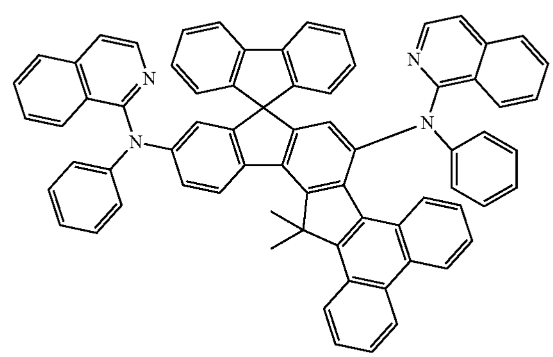

-continued
D154
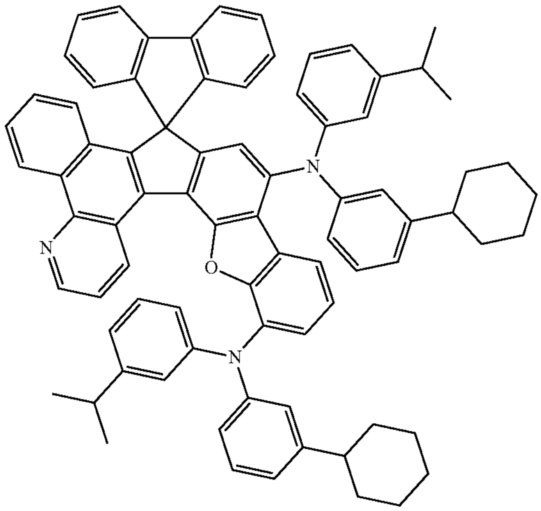
D155
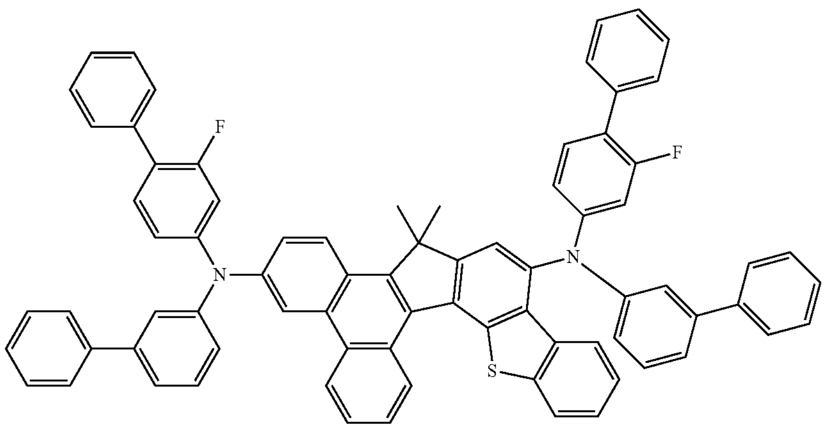
D156
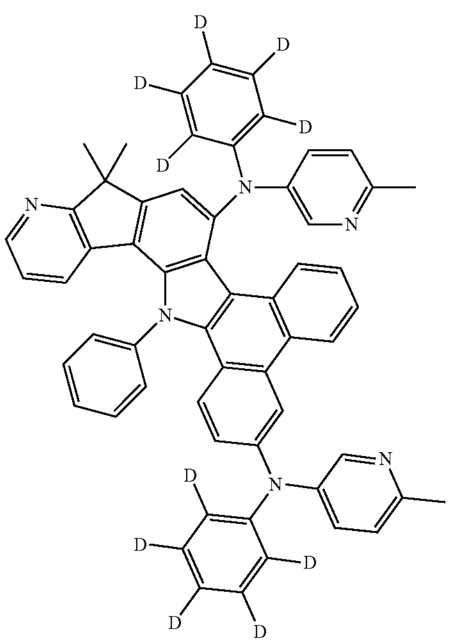
D157
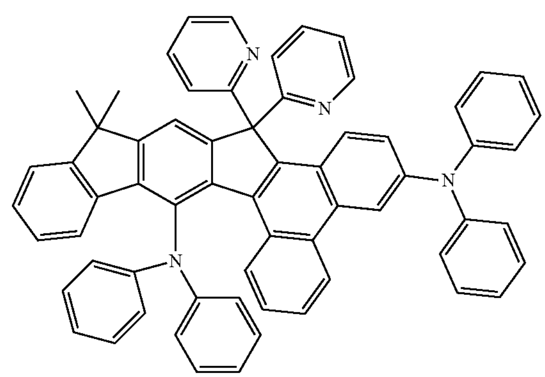

-continued
D158
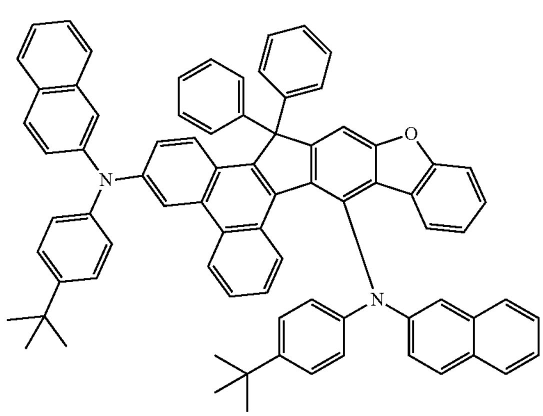
D159
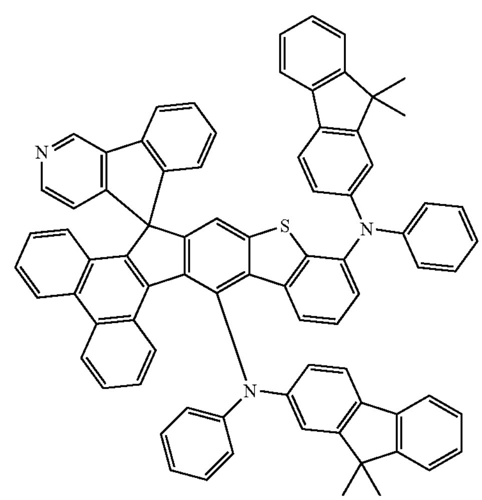
D160
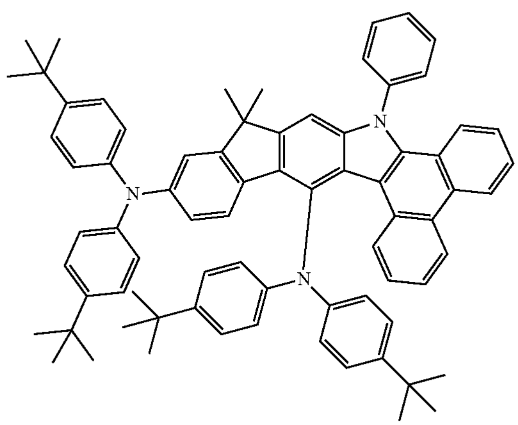
D161
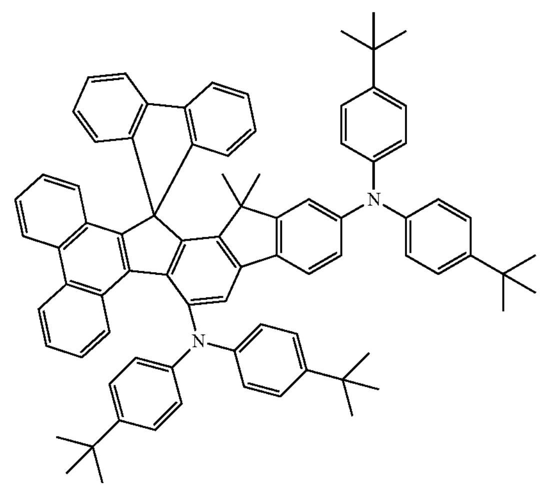
D162
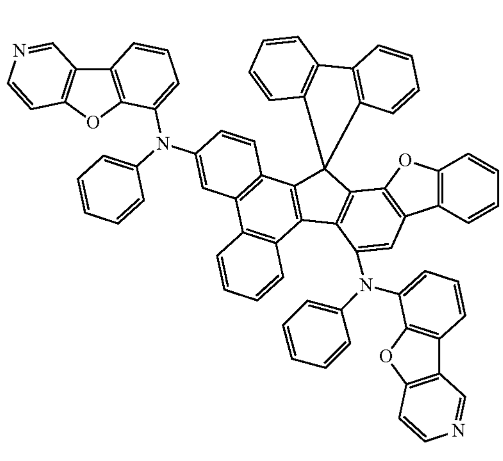
D163
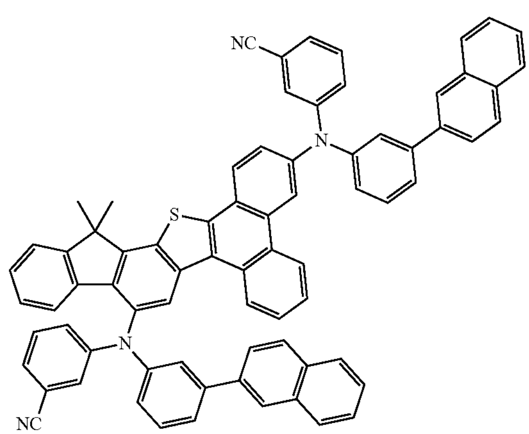

-continued
164
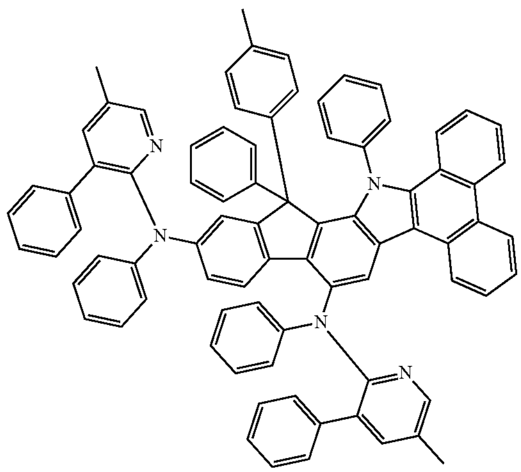
165
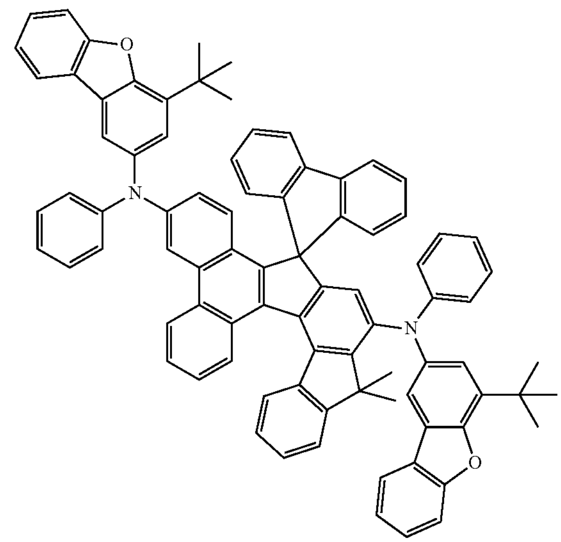
D166
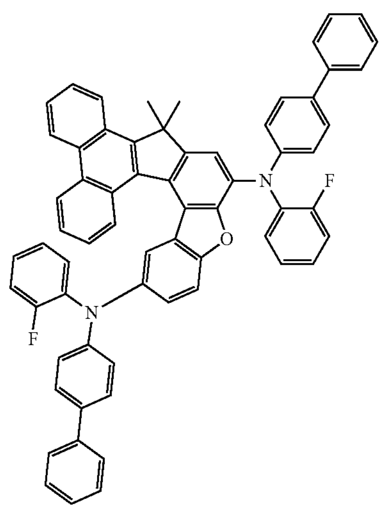
D167
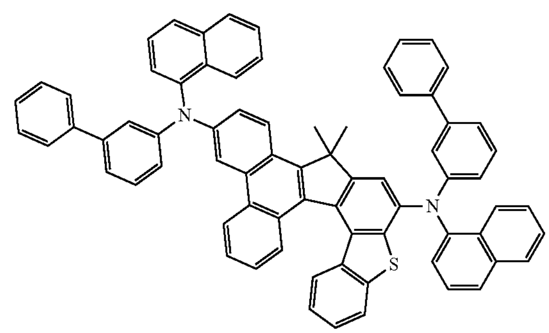
D168
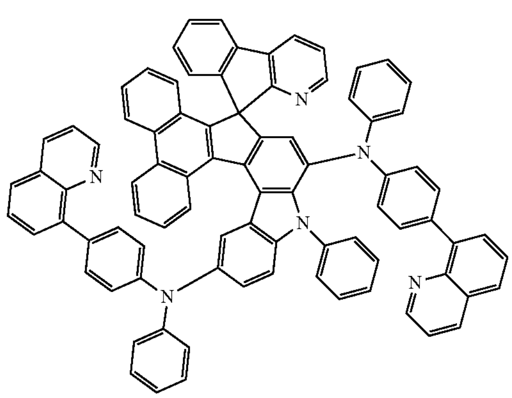
D169
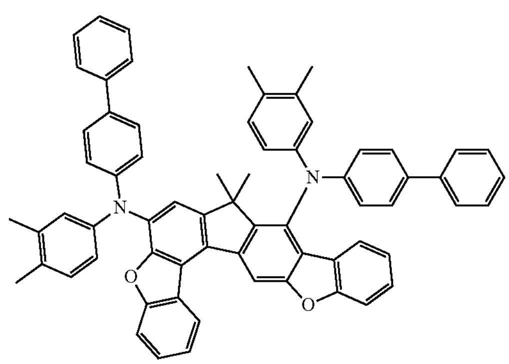

-continued
D170
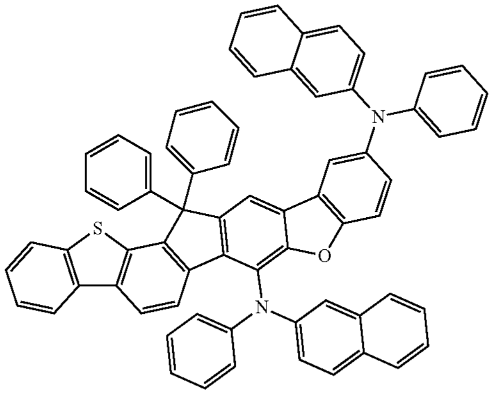
D171
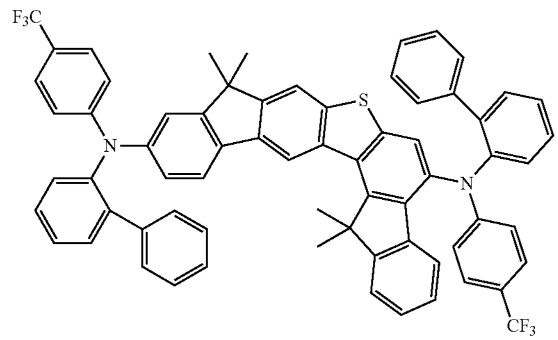
D172
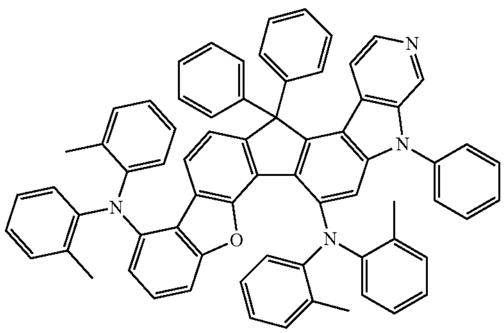
D173
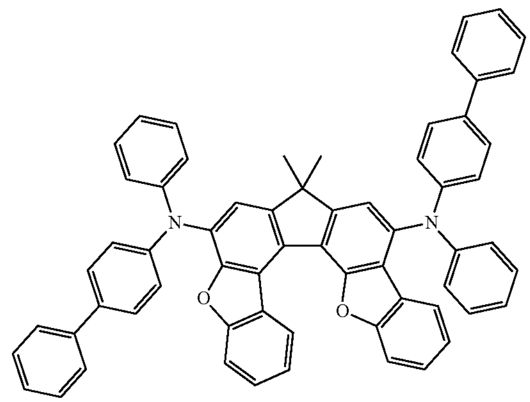
D174
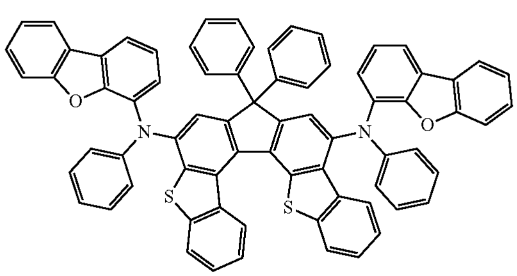
D175
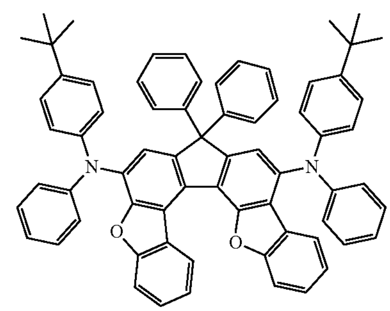
D176
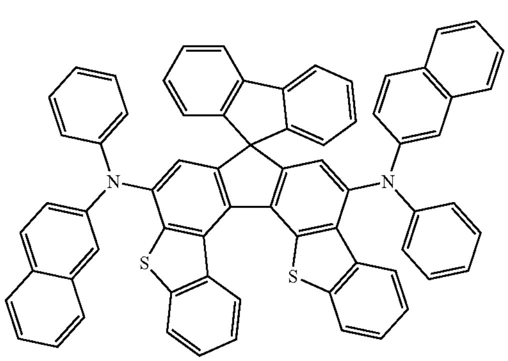
D177
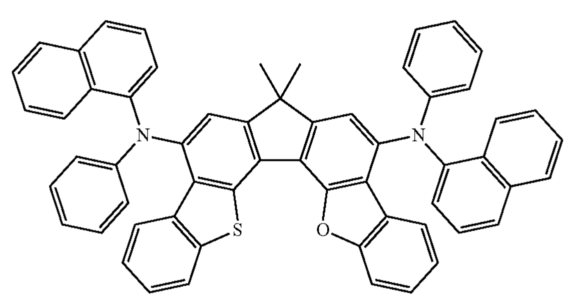

-continued
D178
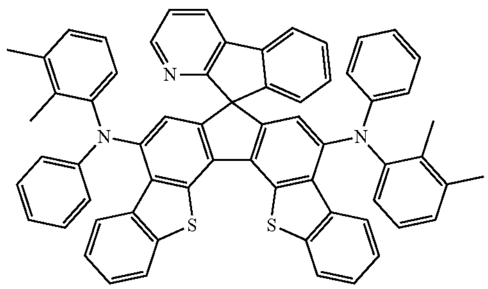
D179
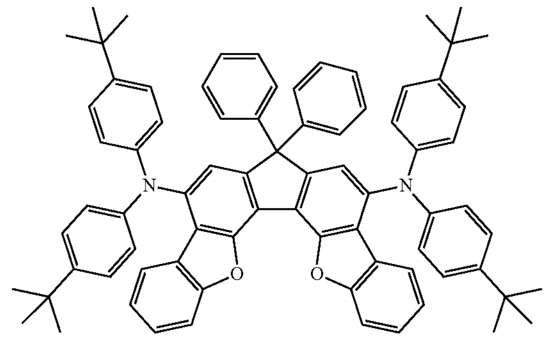
D180
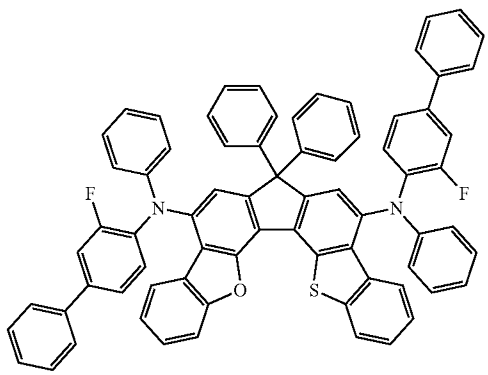
D181
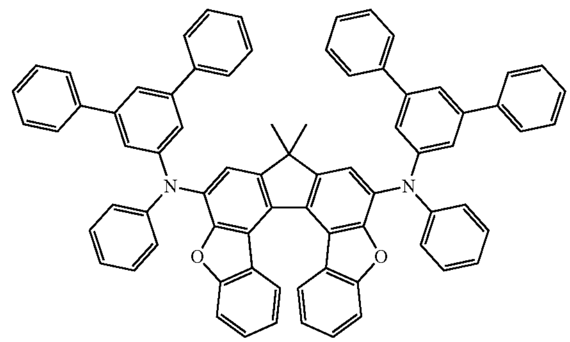
D182
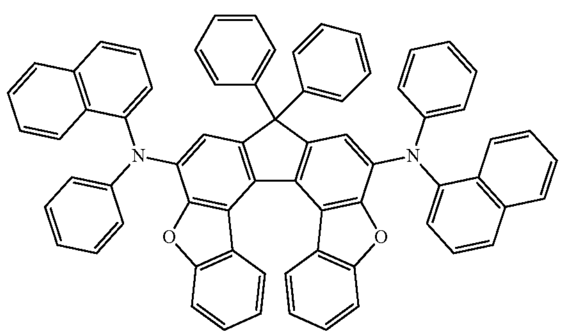
D183
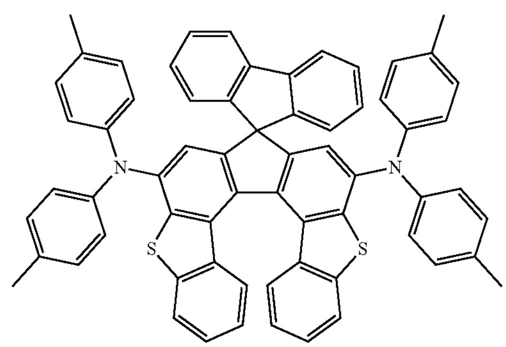
D184
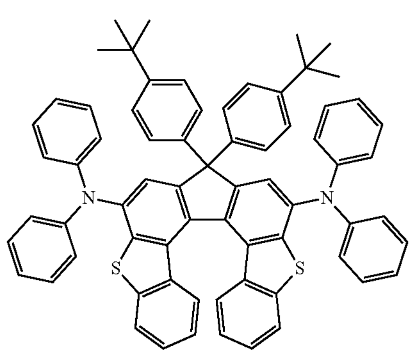
D185
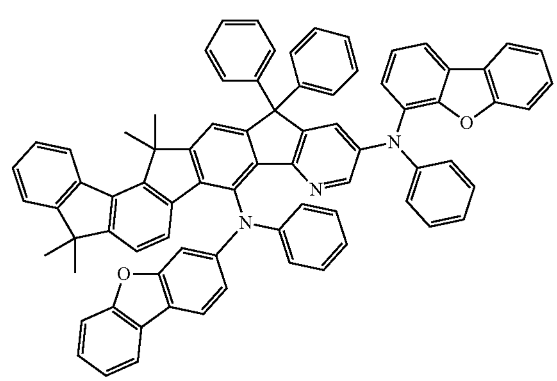

-continued
D186
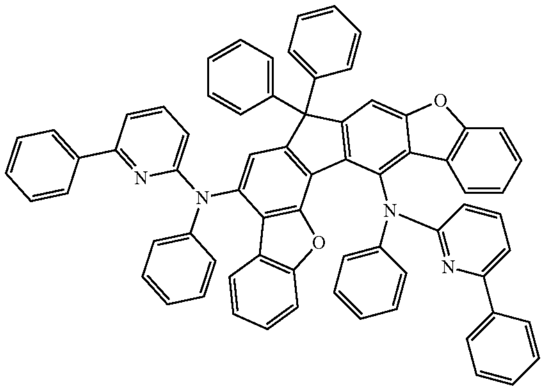
D187
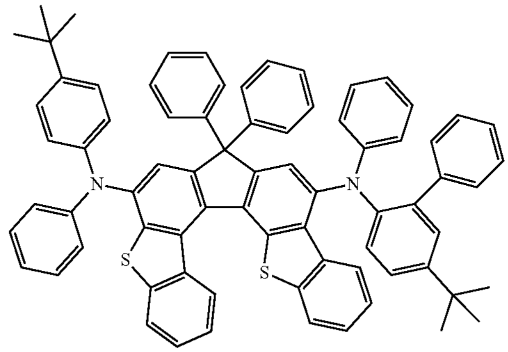
D188
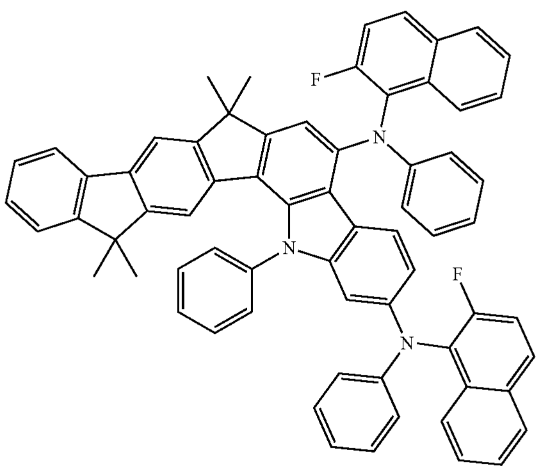
D189
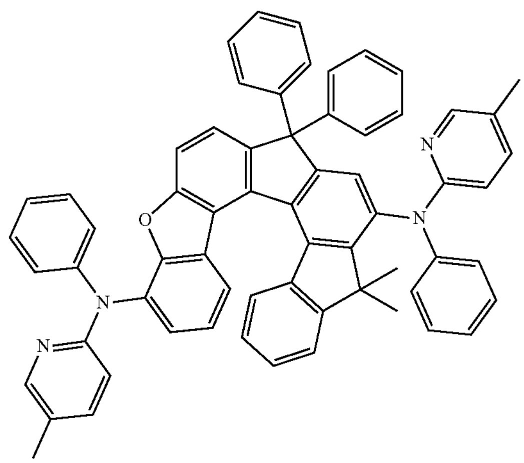
D190
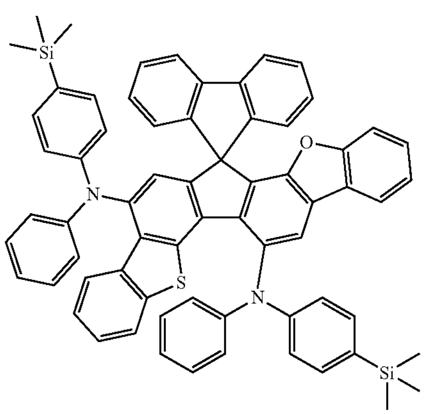
D191
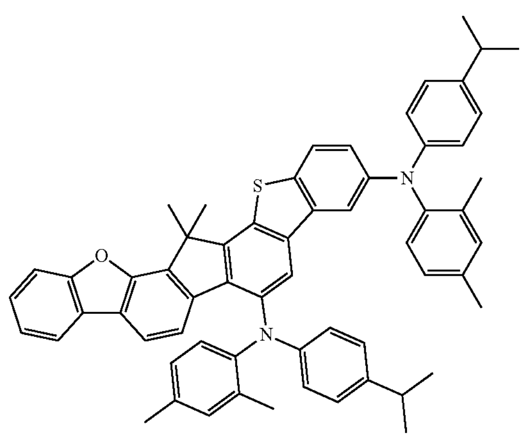

-continued
D192
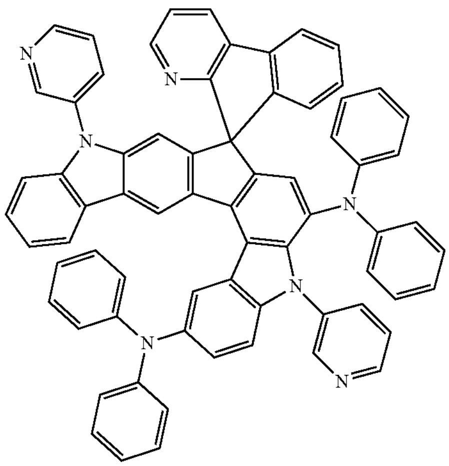
D193
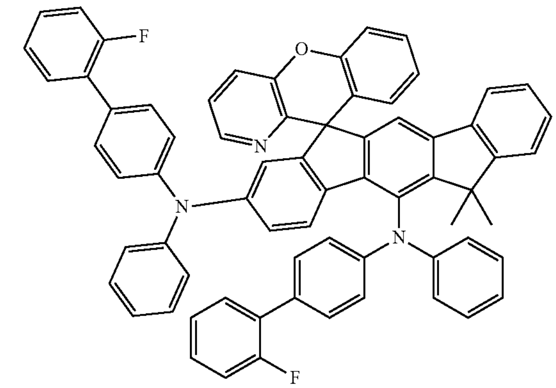
D194
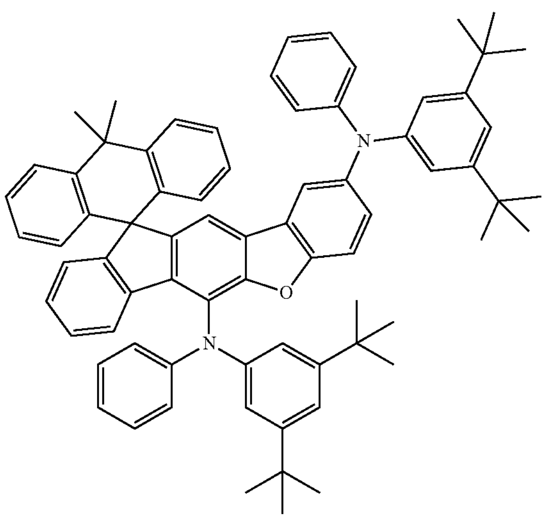
D195
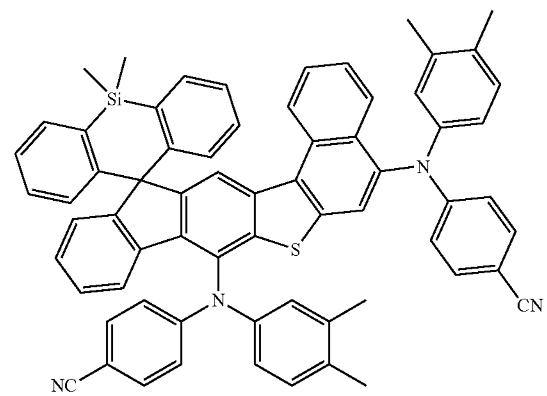
D196
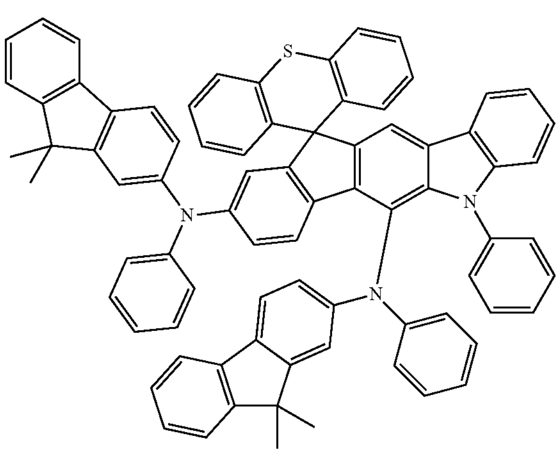
D197
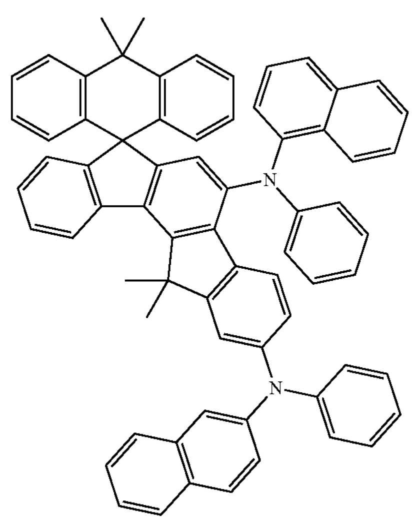

-continued
D198
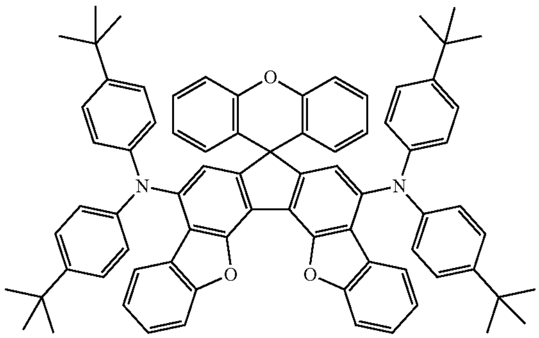
D199
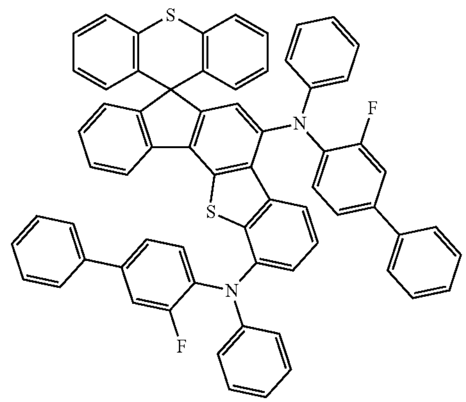
D200
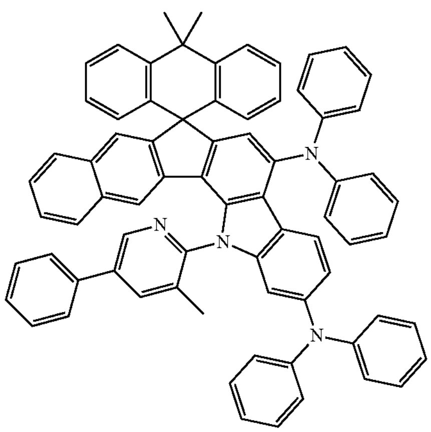
D201
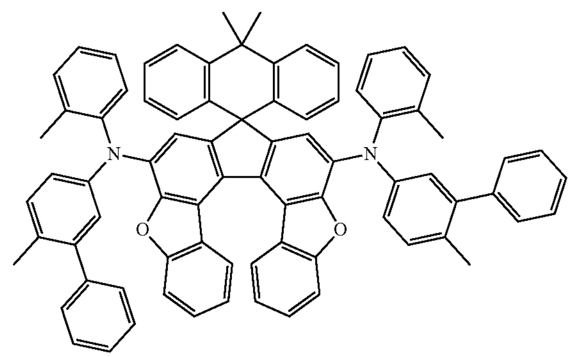
D202
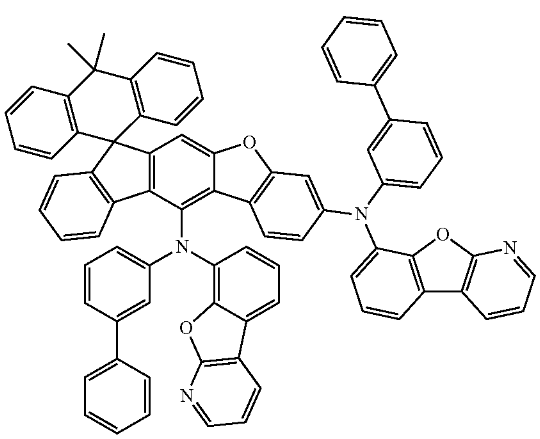
D203
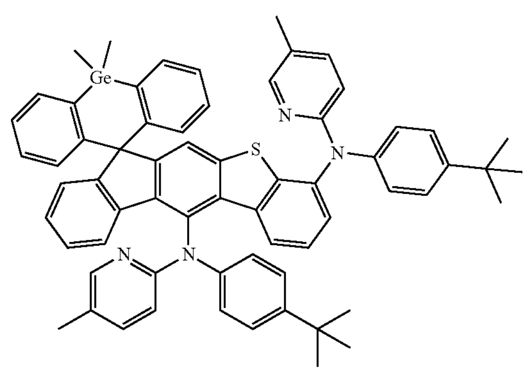

-continued
D204
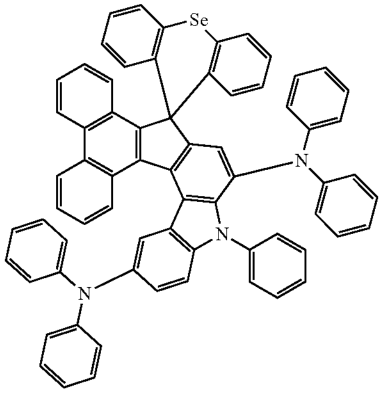
D205
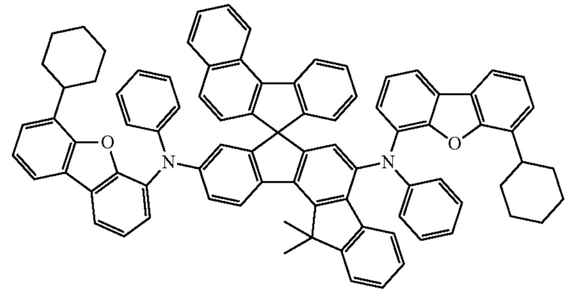
D206
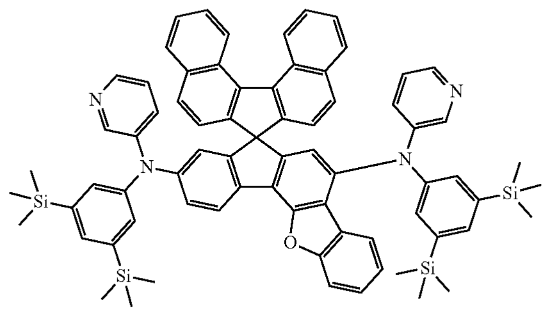
D207
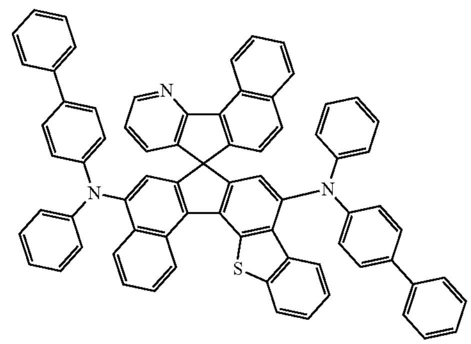
D208
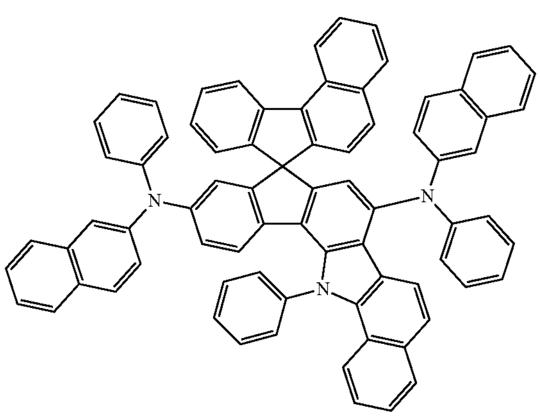
D209
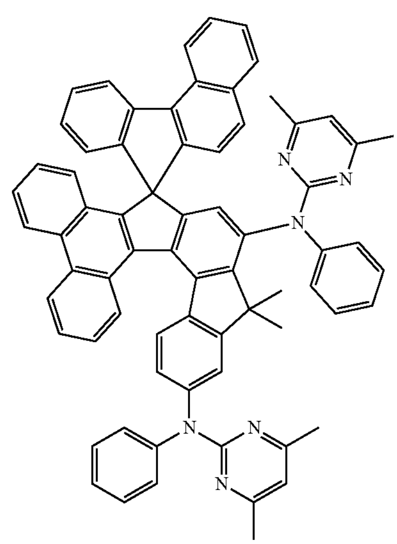

-continued

D210

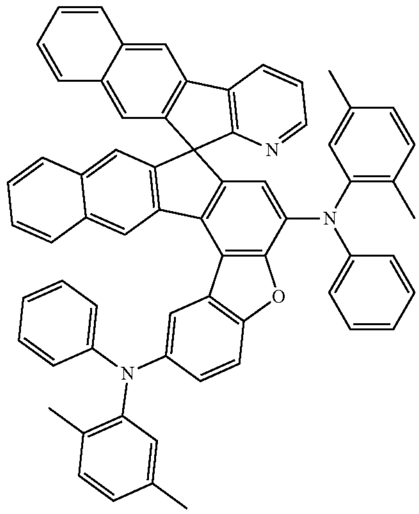

D211

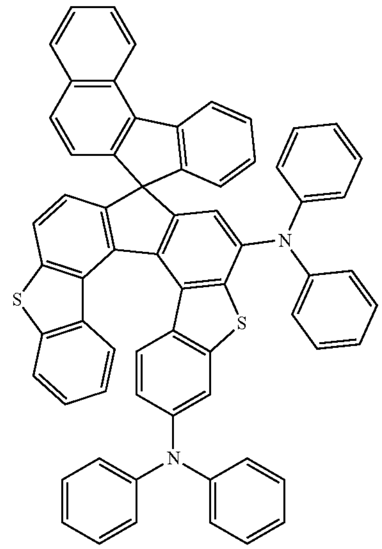

D212

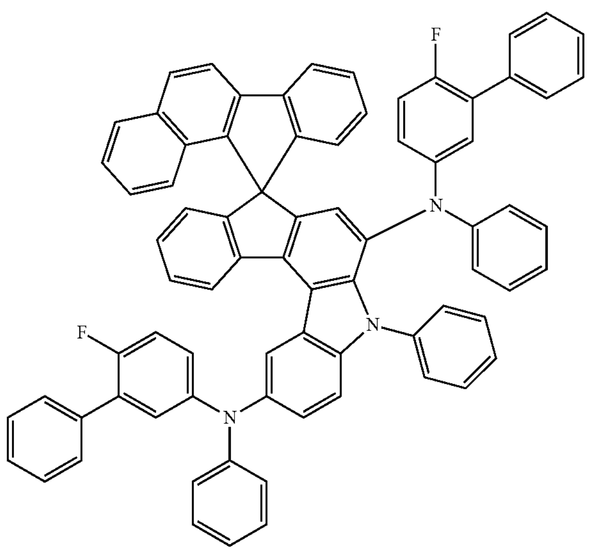

15. The organic light-emitting device of claim 1, wherein the emission layer comprises the first compound and the second compound.

16. The organic light-emitting device of claim 1, wherein the organic layer further comprises an electron transport region between the emission layer and the second electrode, the electron transport region comprising an alkaline metal, an alkaline earth metal, a rare-earth metal, an alkaline metal compound, an alkaline earth metal compound, a rare-earth metal compound, an alkaline metal complex, an alkaline earth metal complex, a rare-earth metal complex, or any combination thereof.

17. The organic light-emitting device of claim 16, wherein the electron transport region comprises an electron transport layer and an electron injection layer; and at least one selected from the electron transport layer and the electron injection layer comprises an alkaline metal, an alkaline earth metal, a rare-earth metal, an alkaline metal compound, an alkaline earth metal compound, a rare-earth metal compound, an alkaline metal complex, an alkaline earth metal complex, a rare-earth metal complex, or any combination thereof.

18. The organic light-emitting device of claim 1, wherein the organic layer further comprises a hole transport region between the emission layer and the first electrode, the hole transport region comprising a p-dopant, and a lowest unoccupied molecular orbital (LUMO) energy level of the p-dopant is −3.5 eV or less.

19. The organic light-emitting device of claim 18, wherein the p-dopant comprises a cyano group-containing compound.

20. The organic light-emitting device of claim 1, wherein the emission layer is a first-color-light emitting-emission layer;

the organic layer further comprises: i) at least one second-color-light emitting-emission layer, or ii) at least one second-color-light emitting-emission layer and at least one third-color-light emitting-emission layer;

wherein a first-color light of the first-color-light emitting-emission layer and a second-color light of the second-color-light emitting-emission layer are identical to or different from each other; or the first-color light, the second-color light, and a third-color light of the third-color-light emitting-emission layer are identical to or different from each other; and the first-color light and the second-color light are emitted in a mixed-color light;

or the first color, the second-color light, and the third-color light are emitted in a mixed-color light.

* * * * *